United States Patent
Hong et al.

(10) Patent No.: US 9,348,691 B2
(45) Date of Patent: *May 24, 2016

(54) APPARATUS FOR TRANSMITTING BROADCAST SIGNAL, APPARATUS FOR RECEIVING BROADCAST SIGNAL, AND METHOD FOR TRANSMITTING/RECEIVING BROADCAST SIGNAL THROUGH APPARATUS FOR TRANSMITTING/RECEIVING BROADCASTING SIGNAL

(71) Applicant: LG ELECTRONICS INC., Seoul (KR)

(72) Inventors: Hoteak Hong, Seoul (KR); Sangchul Moon, Seoul (KR); Woosuk Ko, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/481,342

(22) Filed: Sep. 9, 2014

(65) Prior Publication Data

US 2014/0380135 A1   Dec. 25, 2014

Related U.S. Application Data

(63) Continuation-in-part of application No. 14/202,962, filed on Mar. 10, 2014, which is a continuation of application No. 13/823,675, filed as application No. PCT/KR2011/006706 on Sep. 9, 2011.

(60) Provisional application No. 61/382,908, filed on Sep. 14, 2010.

(51) Int. Cl.
*H04N 5/445* (2011.01)
*H04N 7/173* (2011.01)
(Continued)

(52) U.S. Cl.
CPC .............. *G06F 11/10* (2013.01); *H03M 13/05* (2013.01); *H03M 13/27* (2013.01); *H04B 7/0413* (2013.01);
(Continued)

(58) Field of Classification Search
CPC ............. H04N 21/435; H04N 7/17318; H04L 1/0057; H04L 1/0003; H04L 26/2647; H04W 84/18; H04W 28/04
USPC ............. 725/54, 116; 714/776, 752; 375/295, 375/260; 370/310, 329
See application file for complete search history.

(56) References Cited

U.S. PATENT DOCUMENTS

2007/0201516 A1   8/2007   Lee et al.
2009/0028079 A1   1/2009   Song et al.
(Continued)

FOREIGN PATENT DOCUMENTS

EP   2541927 A2   1/2013
EP   2555510 A2   2/2013
(Continued)

OTHER PUBLICATIONS

Vangelista L et al: "Key technologies for 1-15 next-generation terrestrial digital television standard DVB-T2", IEEE Communications Magazine, IEEE Service Center, Piscataway, US, vol. 47, No. 10, Oct. 1, 2009, pp. 146-153, XP011283329, ISSN:0163-6804, DOI: 10.1109/MCOM.2009.5273822 *the whole document*.

Primary Examiner — Sumaiya A Chowdhury
(74) Attorney, Agent, or Firm — Dentons US LLP

(57) ABSTRACT

In order to achieve the above-described technical object of the present invention, a method of transmitting broadcast data in a transmitter is disclosed. The method may comprise Forward Error Correction (FEC) encoding transmission unit data that carries broadcast service data, interleaving the FEC-encoded transmission unit data, demultiplexing the interleaved transmission unit data, symbol-mapping the demultiplexed transmission unit data onto constellations. MIMO-encoding the mapped transmission unit data, time-interleaving the MIMO-encoded transmission unit data. building a frame including the time-interleaved transmission unit data and physical signaling data, modulating the frame by an Orthogonal Frequency Division Multiplexing (OFDM) method. Herein the physical signaling data includes information on a MIMO encoding process is applied to an associated transmission unit data.

5 Claims, 80 Drawing Sheets

(51) Int. Cl.

| | | |
|---|---|---|
| *G06F 11/00* | (2006.01) | |
| *H04L 27/00* | (2006.01) | |
| *H04K 1/10* | (2006.01) | |
| *H04B 7/00* | (2006.01) | |
| *H04W 4/00* | (2009.01) | |
| *G06F 11/10* | (2006.01) | |
| *H04B 7/04* | (2006.01) | |
| *H04L 27/26* | (2006.01) | |
| *H03M 13/05* | (2006.01) | |
| *H03M 13/27* | (2006.01) | |
| *H04H 20/42* | (2008.01) | |
| *H04L 1/00* | (2006.01) | |
| *H04N 21/2343* | (2011.01) | |
| *H04N 21/2362* | (2011.01) | |
| *H04N 21/2383* | (2011.01) | |
| *H04N 21/434* | (2011.01) | |
| *H04N 21/438* | (2011.01) | |
| *H04N 21/643* | (2011.01) | |

(52) U.S. Cl.
CPC ............ *H04H 20/42* (2013.01); *H04L 1/0041* (2013.01); *H04L 1/0042* (2013.01); *H04L 1/0057* (2013.01); *H04L 1/0071* (2013.01); *H04L 1/0072* (2013.01); *H04L 27/2601* (2013.01); *H04L 27/2627* (2013.01); *H04N 21/2362* (2013.01); *H04N 21/2383* (2013.01); *H04N 21/234327* (2013.01); *H04N 21/4345* (2013.01); *H04N 21/4382* (2013.01); *H04N 21/64322* (2013.01)

(56) References Cited

U.S. PATENT DOCUMENTS

| | | |
|---|---|---|
| 2009/0103649 A1 | 4/2009 | Vare et al. |
| 2009/0187949 A1 | 7/2009 | Vare et al. |
| 2009/0190677 A1 | 7/2009 | Jokela et al. |
| 2009/0328099 A1 | 12/2009 | Praden et al. |
| 2010/0034219 A1 | 2/2010 | Stadelmeier et al. |
| 2010/0115552 A1 | 5/2010 | Lee et al. |
| 2011/0013732 A1 | 1/2011 | Atungsiri |
| 2011/0131464 A1 | 6/2011 | Ko et al. |
| 2011/0167464 A1 | 7/2011 | Yun et al. |
| 2013/0219431 A1* | 8/2013 | Hong .................... H04H 20/42 725/54 |

FOREIGN PATENT DOCUMENTS

| | | |
|---|---|---|
| KR | 10-2009-0075796 A | 7/2009 |
| KR | 10-2009-0131663 A | 12/2009 |
| KR | 10-2010-0034147 A | 4/2010 |
| KR | 10-2010-0050184 A | 5/2010 |

* cited by examiner

FIG. 4
(a)
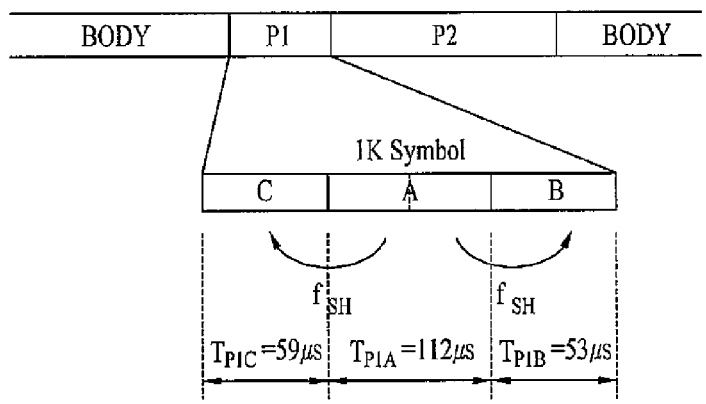
(b)
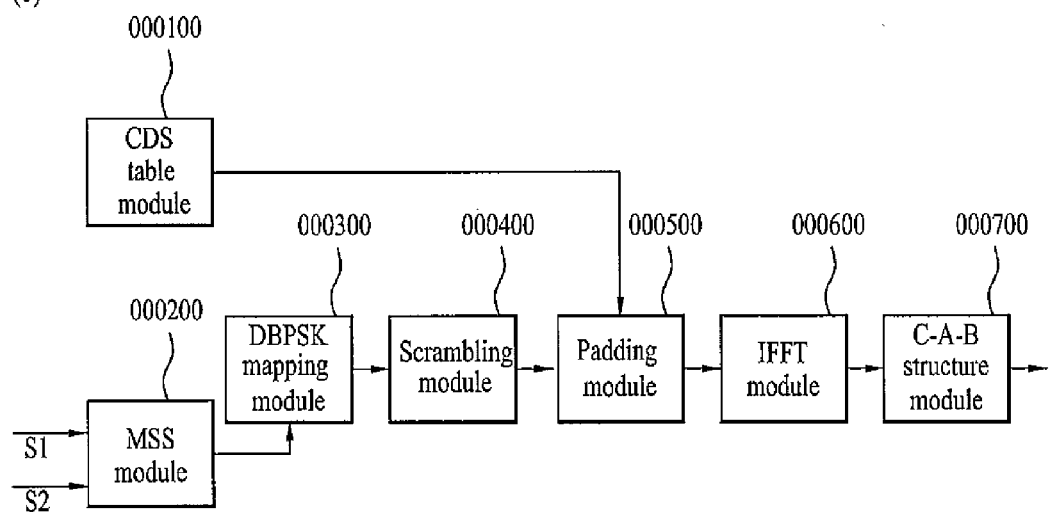

FIG. 18

| Filed | Bits |
|---|---|
| S1 | 3 |
| S2 filed 1 | 3 |
| S2 filed 2 | 1 |

FIG. 19

| Filed | Bits |
|---|---|
| PILOT_PATTERN | 4 |
| L1_PRE_SPREAD_LENGTH | 3 |

FIG. 20

| Filed | Bits |
|---|---|
| TYPE | 8 |
| BWT_EXT | 1 |
| S1 | 3 |
| S2 | 4 |
| L1_REPETITION_FLAG | 1 |
| GUARD_INTERVAL | 3 |
| PAPR | 4 |
| L1_MOD | 4 |
| L1_COD | 2 |
| L1_FEC | 2 |
| L1_POST_SIZE | 18 |
| L1_POST_INFO_SIZE | 18 |
| PILOT_PATTERN | 4 |
| TX_ID_AVAILABILITY | 8 |
| CELL_ID | 16 |
| NETWORK_ID | 16 |
| NGH_SYSTEM_ID | 16 |
| NUM_NGH_FRAMES | 8 |
| NUM_T2_FRAMES | 8 |
| L1_POST_SPREAD_LENGTH | 12 |
| NUM_DATA_SYMBOLS | 12 |
| NUM_MISO_SYMBOLS | 12 |
| MIMO_SYMBOL_INTERVAL | 12 |
| MIMO_SYMBOL_LENGTH | 12 |
| REGEN FLAG | 3 |
| L1_POST_EXTENSION | 1 |
| NUM_RF | 3 |
| CURRENT_RF_IDX | 3 |
| RESERVED | 10 |
| CRC_32 | 32 |

FIG. 21

| Filed | Bits |
|---|---|
| SUB_SLICES_PER_FRAME | 15 |
| NUM_PLP | 8 |
| NUM_AUX | 4 |
| AUX_CONFIG_RFU | 8 |
|  |  |
| for i = 0..NUM_RF-1 { |  |
| RF_IDX | 3 |
| FREQEUNCY | 32 |
| } |  |
|  |  |
| if S2 == 'xxx1' { |  |
| FEF_TYPE | 4 |
| FEF_LENGTH | 22 |
| FEF_INTERVAL | 8 |
| NEXT_NGH_SUPERFRAME | 8 |
| } |  |
|  |  |
| RESERVED_2 | 32 |
|  |  |
| for i = 0..NUM_AUX-1 { |  |
| AUX_RFU | 32 |
| } |  |

| Filed | Bits |
|---|---|
| for i = 0..NUM_PLP-1 { |  |
| PLP_ID | 8 |
| PLP_TYPE | 3 |
| PLP_PAYLOAD_TYPE | 5 |
| PLP_PROFILE | 2 |
| FF_FLAG | 1 |
| FIRST_RF_IDX | 3 |
| FIRST_FRAME_IDX | 8 |
| PLP_GROUP_ID | 8 |
| PLP_COD | 3 |
| PLP_MOD | 3 |
| PLP_MIMO_TYPE | 2 |
| PLP_ROTATION | 1 |
| PLP_FEC_TYPE | 2 |
| PLP_NUM_BLOCKS_MAX | 10 |
| FRAME_INTERVAL | 8 |
| TIME_IL_LENGTH | 8 |
| TIME_IL_TYPE | 1 |
| IN_BAND_FLAG | 1 |
| RESERVED_1 | 16 |
| } |  |

FIG. 22

| Filed | Bits |
|---|---|
| FRAME_IDX | 8 |
| SUB_SLICE_INTERVAL | 22 |
| TYPE_2_START | 22 |
| L1_CHANGE_COUNTER | 8 |
| START_RF_IDX | 3 |
| RESERVED_1 | 8 |
| | |
| if S2 == 'xxx1' { | |
|    NEXT_NGH_FRAME | 8 |
| } | |
| | |
| for i = 0..NUM_PLP-1 { | |
|    PLP_ID | 8 |
|    PLP_START | 22 |
|    PLP_NUM_BLOCKS | 10 |
|    RESERVED_2 | 8 |
| } | |
| | |
| RESERVED_3 | 8 |
| | |
| for i = 0..NUM_AUX-1 { | |
|    AUX_RFU | 48 |
| } | |

FIG. 24

| Name | No.of bits | Identifier |
|---|---|---|
| IP/MAC_location_descriptor() { | | |
| descriptor_tag | 8 | uimsbf |
| descriptor_length | 8 | uimsbf |
| system_id | 16 | uimsbf |
| PLP_GROUP_ID | 8 | uimsbf |
| PLP_ID | 8 | uimsbf |
| } | | |

FIG. 29

| | |
|---|---|
| IP_FORMAT | (1 bit) |
| NUM_PLP_IP_PAIR | (8 bits) |
| for i=0..NUM_PLP_IP_PAIR-1 { | |
| NUM_IP_PORT_ADDR | (8 bits) |
|     for i=0.. IP_PORT_ADDR-1 { | |
|     IP_ADDRESS | (32 or 48 bits) |
|     PORT_NUMBER | (16 bits) |
| } | |
| PLP_ID | (8 bits) |
| } | |

FIG. 30

```
<IP_FORMAT>IP_v4</IP_FORMAT>
<PLP_IP_PAIR>

<IP_PORT>100.1.1.1:9000</IP_PORT>
<IP_PORT>100.1.1.1:9001</IP_PORT>
<IP_PORT>100.1.1.1:9002</IP_PORT>
<PLP_ID>5</PLP_ID>

<IP_PORT>100.1.1.2:9000</IP_PORT>
<PLP_ID>10</PLP_ID>

<IP_PORT>100.1.1.3:9000</IP_PORT>
<IP_PORT>100.1.1.4:9000</IP_PORT>
<PLP_ID>7</PLP_ID>

</PLP_IP_PAIR>
```

FIG. 33

| | |
|---|---|
| ...PLP information part...<br>PLP_BOOT<br>FLAG_ESG_PRE_INFO<br>IF (FLAG_ESG_PRE_INFO) {<br>  NUM_ESG<br>  for (NUM_ESG) {<br>    PROVIDER_ID<br>    VERSION<br>    IP_ADDRESS<br>    PORT_NUMBER<br>    SESSION_ID<br>    PLP_ID<br>}} | <br>(8 bits)<br>(1 bit)<br>(8 bits)<br><br><br>(16 bits)<br>(8 bits)<br>(32 bits)<br>(16 bits)<br>(16 bits)<br>(8 bits) |

FIG. 34

| | |
|---|---|
| ...IP-PLP mapping information part...<br>PLP_BOOT<br>FLAG_ESG_PRE_INFO<br>IF (FLAG_ESG_PRE_INFO) {<br>  NUM_ESG<br>  for (NUM_ESG) {<br>    PROVIDER_ID<br>    VERSION<br>    IP_ADDRESS<br>    PORT_NUMBER<br>    SESSION_ID<br>    PLP_ID<br>}} | <br>(8 bits)<br>(1 bit)<br>(8 bits)<br><br><br>(16 bits)<br>(8 bits)<br>(32 or 48 bits)<br>(16 bits)<br>(16 bits)<br>(8 bits) |

FIG. 35

| Name | No.of bits | Identifier |
|---|---|---|
| simple_bootstrap_descriptor() { | | |
|   descriptor_tag | 8 | uimsbf |
|   descriptor_length | 8 | uimsbf |
|   bootstrap_PLP | 8 | uimsbf |
|   ESG_info_flag | 1 | bslbf |
|   IPv6_flag | 1 | bslbf |
|   reserved | 6 | bslbf |
|   if(ESG_info_flag) { | | |
|     num_ESG | 8 | uimsbf |
|     for (num_ESG) { | | |
|       provider_id | 16 | uimsbf |
|       version | 8 | uimsbf |
|       ip_address | 32 or 48 | uimsbf |
|       port | 16 | uimsbf |
|       session_id | 16 | uimsbf |
|       PLP_id | 8 | uimsbf |
|     } | | |
|   } | | |
| } | | |

FIG. 36

```
<BOOT_PLP_INFO>

<BOOTSTRAP_INFO>
<PLP_BOOT> 0x01 </PLP_BOOT>
<IP_ADDRESS> 127.1.1.1 <IP_ADDRESS>
<PORT_NUMBER> 5000 <PORT_NUMBER>
<SESSION_ID> 0x00 <SESSION_ID>
<PLP_ID> 0x01 <PLP_ID>
</BOOTSTRAP_INFO>

<ESG_PRE_INFO>
<PROVIDER_ID> 0x03 </PROVIDER_ID>
<PROVIDER_NAME> LG U+ myLGTV ESG </PROVIDER_NAME>
<VERSION> 1.0.0 <VERSION>
<IP_ADDRESS> 127.1.1.100 <IP_ADDRESS>
<PORT_NUMBER> 5000 <PORT_NUMBER>
<SESSION_ID> 0x02 <SESSION_ID>
<PLP_ID> 0x01 <PLP_ID>
</ESG_PRE_INFO>

</BOOT_PLP_INFO>
```

| ...PLP mapping loop... | |
|---|---|
| SISO/MIMO | (2 bits) |
| BANDWIDTH | (4 bits) |
| GUARD_INTERVAL | (3 bits) |
| FFT_SIZE | (3 bits) |

```
...PLP mapping loop...
...system information...                    (16 bits)
NUM_CELL                                    (32 bits)
for (NUM_CELL) {                            (8 bits)
  CELL_ID
  CENTRE_FREQUENCY
  NUM_SUBCELL                               (8 bits)
  for (NUM_SUBCELL) {                       (32 bits)
    CELL_ID_EXTENSION
    TRANSPOSER_FREQUENCY
}}
```

FIG. 45

| | |
|---|---|
| PLP_BOOT | (8 bits) |
| FLAG_ESG_PRE_INFO | (1 bit) |
| IF (FLAG_ESG_PRE_INFO) { | (8 bits) |
| NUM_ESG | |
| for (NUM_ESG) { | |
| PROVIDER_ID | (16 bits) |
| VERSION | (8 bits) |
| IP_ADDRESS | (32 or 48 bits) |
| PORT_NUMBER | (16 bits) |
| SESSION_ID | (16 bits) |
| PLP_ID | (8 bits) |
| }} | |
| L2_IP_ADDRESS | (32 or 48 bits) |
| L2_PORT_NUMBER | (16 bits) |
| L2_SESSION_ID | (16 bits) |
| L2_PLP | (8 bits) |

FIG. 73

[TI writing as a vector form]
(a)

[TI writing as a matrix form]
(b)

FIG. 82
| Order (n) | LI-PPG |
|---|---|
| 13 | 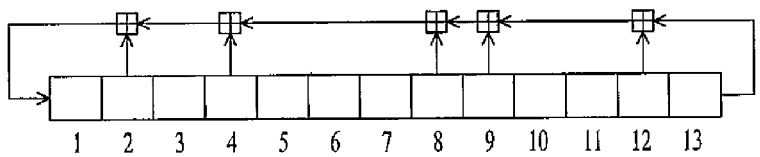 |
| 14 | 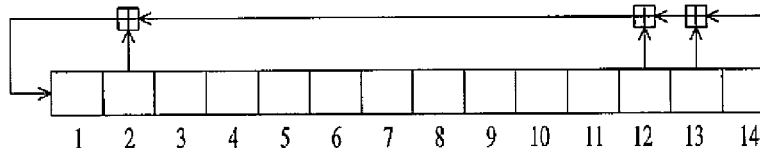 |
| 15 | 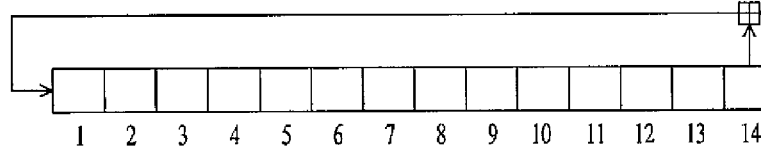 |

APPARATUS FOR TRANSMITTING BROADCAST SIGNAL, APPARATUS FOR RECEIVING BROADCAST SIGNAL, AND METHOD FOR TRANSMITTING/RECEIVING BROADCAST SIGNAL THROUGH APPARATUS FOR TRANSMITTING/RECEIVING BROADCASTING SIGNAL

This application is a continuation-in-part of U.S. patent application Ser. No. 14/202,962 filed Mar. 10, 2014, which is a continuation of U.S. patent application Ser. No. 13/823,675 filed Mar. 14, 2013, which is the National Phase of PCT/KR2011/006706 filed on Sep. 9, 2011, which claims priority under 35 U.S.C. 119(e) to U.S. Provisional Application No. 61/382,908 filed on Sep. 14, 2010, all of which are hereby expressly incorporated by reference into the present application.

DESCRIPTION

1. Field of the Invention

The present invention relates to a broadcast signal transmitting apparatus for transmitting a broadcast signal, a broadcast receiving apparatus for receiving a broadcast signal, and a method of transmitting and receiving a broadcast signal and, most particularly, to an apparatus and method for transmitting and receiving a mobile broadcast signal.

2. Background Art

As the time has neared to end (or terminate) the transmission of analog broadcast signals, diverse technologies for transmitting and receiving digital broadcast signals are being researched and developed. Herein, a digital broadcast signal may include high capacity video/audio data as compared to an analog broadcast signal, and, in addition to the video/audio data, the digital broadcast signal may also include diverse additional data.

More specifically, a digital broadcasting system for digital broadcasting may provide HD (High Definition) level images, multiple-channel sound (or audio), and a wide range of additional services. However, a data transmission efficiency for transmitting high capacity data, a robustness of transmitting and receiving network, and flexibility in a network considering mobile receiving equipments are still required to be enhanced.

As analog broadcast signal transmission comes to an end, various technologies for transmitting/receiving digital broadcast signals are being developed. A digital broadcast signal may include a larger amount of video/audio data than an analog broadcast signal and further include various types of additional data in addition to the video/audio data.

That is, a digital broadcast system can provide HD (high definition) images, multi-channel audio and various additional services. However, data transmission efficiency for transmission of large amounts of data, robustness of transmission/reception networks and network flexibility in consideration of mobile reception equipment need to be improved for digital broadcast

DETAILED DESCRIPTION OF THE INVENTION

Technical Objects

Accordingly, an object of the present invention is to provide a broadcast signal transmitting apparatus and a broadcast receiving apparatus that can transmit and receive additional broadcast signals, a method for transmitting and receiving additional broadcast signals, by using an RF signal of a conventional broadcasting system without having to ensure any additional frequency.

Another object is to provide a broadcast signal transmitting apparatus and a broadcast receiving apparatus that can transmit and receive mobile broadcast signals, a method for transmitting and receiving mobile broadcast signals, by using an RF signal of a conventional broadcasting system without having to ensure any additional frequency.

Yet another object of the present invention is to provide a broadcast signal transmitting apparatus, a broadcast signal receiving apparatus, and a method for transmitting/receiving a broadcast signal using the same that can distinguish data corresponding to a service for each component, and transmit the corresponding data to each component through separate PLPs, so that the transmitted data can be received and processed.

Yet another object of the present invention is to provide a broadcast signal transmitting apparatus, a broadcast signal receiving apparatus, and a method for transmitting/receiving a broadcast signal using the same that can signal signaling information required for servicing a broadcast signal.

Yet another object of the present invention is to provide a broadcast signal transmitting apparatus, a broadcast signal receiving apparatus, and a method for transmitting/receiving a broadcast signal using the same that can signal signaling information, so that a broadcast signal can be received in accordance with a receiver characteristic.

Yet another object of the present invention is to provide a broadcast signal transmitting apparatus, a broadcast signal receiving apparatus, and a method for transmitting/receiving a broadcast signal that can reduce an overhead of a data packet by compressing a header of the data packet, when performing an IP-based transmission of a broadcast signal, and transmitting the compressed header, and by having a receiver release the compression (or perform decompression).

Yet another object of the present invention is to provide a broadcast signal transmitting apparatus, a broadcast signal receiving apparatus, and a method for transmitting and receiving a broadcast signal, which enable fast reception of bootstrap signaling information and Electronic Service Guide (ESG) signaling information, when an Internet Protocol (IP)-based broadcast signal is received.

An object of the present invention is to provide an apparatus and method for transmitting broadcast signals to multiplex data of a broadcast transmission/reception system providing two or more different broadcast services in a time domain and transmit the multiplexed data through the same RF signal bandwidth and an apparatus and method for receiving broadcast signals corresponding thereto.

Another object of the present invention is to provide an apparatus for transmitting broadcast signals, an apparatus for receiving broadcast signals and methods for transmitting and receiving broadcast signals to classify data corresponding to services by components, transmit data corresponding to each component as a data pipe, receive and process the data Still another object of the present invention is to provide an apparatus for transmitting broadcast signals, an apparatus for receiving broadcast signals and methods for transmitting and receiving broadcast signals to signal signaling information necessary to provide broadcast signals.

Technical Solutions

In order to achieve the above-described technical object of the present invention, a method of transmitting broadcast data in a transmitter is disclosed. The method may comprise Forward Error Correction (FEC) encoding transmission unit data that carries broadcast service data, interleaving the FEC-encoded transmission unit data, demultiplexing the interleaved transmission unit data, symbol-mapping the demultiplexed transmission unit data onto constellations. MIMO-encoding the mapped transmission unit data, time-interleaving the MIMO-encoded transmission unit data. building a frame including the time-interleaved transmission unit data and physical signaling data, modulating the frame by an Orthogonal Frequency Division Multiplexing (OFDM) method. Herein the physical signaling data includes information on a MIMO encoding process is applied to an associated transmission unit data.

Effects of the Invention

According to the present invention, a transmitter may perform transmission by generating a PLP for each component configuring a service, and a receiver may identify and decode the PLP, which is received for each component. Thus, the present invention may respond to the mobile broadcast communication environment with more flexibility.

The transmitter of the present invention may distinguish one component as a component of a base layer and as a component of at least one enhancement layer, and may transmit the distinguished component. And, the receiver may decode only the component of the base layer so as to provide an image with basic picture quality, or the receiver may decode the component of the base layer along with the component of at least one enhancement layer so as to provide an image with higher picture quality. Thus, the present invention may provide images having diverse picture qualities in accordance with the receiver characteristic.

By compressing a header of the data packet, when performing an IP-based transmission of a broadcast signal, and transmitting the compressed header, and by having the receiver recover the compressed header, the present invention may reduce the overhead of an IP-based data packet. Thus, IP-based broadcasting may be efficiently supported in a mobile environment.

By using a MIMO system, the present invention may increase data transmission efficiency and may enhance robustness in broadcast signal transmission/reception.

In addition, since bootstrap signaling information and ESG signaling information are transmitted in specific PLPs, a receiver can provide a fast service by acquiring a bootstrap and an ESG rapidly according to the present invention.

Therefore, according to the present invention, the present invention may provide a method and apparatus for transmitting/receiving a broadcast signal that can receive a digital broadcast signal without any error even in a mobile receiving equipment or an indoor environment.

The present invention can process data according to service characteristics to control QoS for each service or service component, thereby providing various broadcast services.

The present invention can achieve transmission flexibility by transmitting various broadcast services through the same RF signal bandwidth.

The present invention can improve data transmission efficiency and increase robustness of transmission/reception of broadcast signals using a MIMO system.

According to the present invention, it is possible to provide broadcast signal transmission and reception methods and apparatus capable of receiving digital broadcast signals without error even with mobile reception equipment or in an indoor environment.

BRIEF DESCRIPTION OF THE DRAWINGS

FIG. 18 illustrates an exemplary syntax structure of P1 signaling information according to an embodiment of the present invention, FIG. 19 illustrates an exemplary syntax structure of AP1 signaling information according to an embodiment of the present invention, FIG. 20 illustrates an exemplary syntax structure of L1-pre signaling information according to an embodiment of the present invention, FIG. 21 illustrates an exemplary syntax structure of configurable L1-post signaling information according to an embodiment of the present invention, FIG. 22 illustrates an exemplary syntax structure of dynamic L1-post signaling information according to an embodiment of the present invention, FIG. 24 illustrates an exemplary syntax structure of an IP/MAC_location_descriptor according to the fourth embodiment of the present invention, FIG. 29 illustrates a syntax of a binary data format including IP-PLP mapping information according to an embodiment of the present invention, FIG. 30 illustrates a syntax of an XML format including IP-PLP mapping information according to an embodiment of the present invention, FIG. 33 illustrates a syntax structure of an L1 signaling information region according to an embodiment of the present invention, FIG. 34 illustrates a syntax of a binary data format including bootstrap and ESG signaling information according to an embodiment of the present invention, FIG. 35 illustrates a syntax of a PSI/SI data format including bootstrap and ESG signaling information according to an embodiment of the present invention, FIG. 36 illustrates a syntax of an XML data format including bootstrap and ESG signaling information according to an embodiment of the present invention, FIG. 45 illustrates a syntax of L2 signaling information according to an embodiment of the present invention.

FIG. 73 illustrates a process of generating TI output memory indexes according to another embodiment of the present invention.

FIG. 82 illustrates a random generator according to another embodiment of the present invention.

BEST MODE FOR CARRYING OUT THE PRESENT INVENTION

Reference will now be made in detail to the preferred embodiments of the present invention, examples of which are illustrated in the accompanying drawings. Wherever possible, the same reference numbers will be used throughout the drawings to refer to the same or like parts. And, the scope and spirit of the present invention will not be limited only to the exemplary embodiments presented herein.

Although the terms used in the present invention are selected from generally known and used terms, the detailed meanings of which are described in relevant parts of the description herein. It should be noted that the terms used herein may vary depending upon the intentions or general practice of anyone skilled in the art and also depending upon the advent of a novel technology. Some of the terms mentioned in the description of the present invention have been selected by the applicant at his or her discretion, terms used herein. Furthermore, it is required that the present invention is understood, not simply by the actual terms used but by the meaning of each term lying within.

The present invention relates to an apparatus and method for transmitting and receiving an additional broadcast signal, while sharing an RF frequency band with related art broadcast system, such as a conventional terrestrial broadcast system (or also referred to as a T2 system), e.g., DVB-T2. In the present invention, the additional broadcast signal may correspond to an extension (or enhanced) broadcast signal and/or a mobile broadcast signal.

In the description of the present invention, an additional broadcast signal refers to as signal that is processed and transmitted in accordance with a non-MIMO (Multi Input Multi Output) method or a MIMO method. Herein, a MISO (Multi Input Single Output) method, a SISO (Single Input Single Output) method, and so on, may correspond to the non-MIMO method.

Hereinafter, 2 antennae may be given as an example of the multi antennae of the MISO method or the MIMO for simplicity of the description of the present invention. And, such description of the present invention may be applied to all types of systems using 2 or more antennae.

Figure 1:
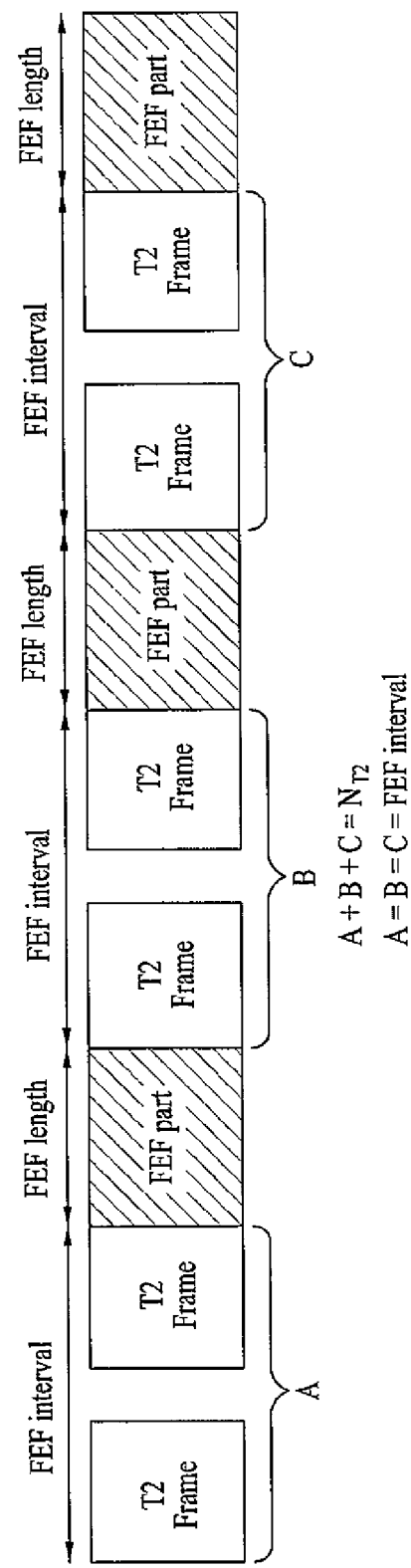
FIG. 1 illustrates a structure of a super frame according to an embodiment of the present invention.

FIG. 1 illustrates an exemplary super frame structure according to the present invention. The super frame of FIG. 1 transmits an additional broadcast signal (e.g., mobile broadcast signal). A super frame may be configured of a plurality of frames, and the frames belonging to one super frame may be transmitted by using the same transmission method. The super frame according to the embodiment of the present invention may be configured of multiple T2 frames (also referred to as a terrestrial broadcast frame) and additional non-T2 frames for the additional broadcast signal. Herein, a non-T2 frame may include an FEF (Future Extension Frame) part being provided by the related art T2 system. The FEF part may not be contiguous and may be inserted in-between the T2 frames. The additional broadcast signal may be included in the T2 frame or FEF part, so as to be transmitted.

When a mobile broadcast signal is transmitted through FET part, the FEF part will be referred to as an NGH (Next Generation Handheld) frame.

At this point, 1 NGH frame may be transmitted for each N number of T2 frames (i.e., NGH-T2 frame ratio=1/N or N:1), and the T2 frame and the NGH frame may be alternately transmitted (i.e., NGH-T2 frame ratio=1/2 or 1:1). If the NGH-T2 frame ratio is equal to 1/N, the time consumed by the receiver in order to receive an NGH frame after receiving a previous NGH frame is equivalent to the time corresponding to N number of T2 frames.

Meanwhile, among the components configuring a broadcast service, the present invention may divide a video component to multiple video components and may transmit the divided video components. For example, a video component may be divided into a basic video component and an extension video component, and may then be transmitted accordingly.

According to an embodiment of the present invention, in order to enhance transmission stability, the basic video component may be transmitted in a non-MIMO method, and the extension video component may be transmitted in an MIMO method in order to provide an enhanced throughput.

In the present invention, the basic video component will hereinafter be referred to as a video component of a base layer, and the extension video component will hereinafter be referred to as a video component of an enhancement layer. Additionally, for simplicity of the description, in the present invention, the video component of the base layer will be used in combination with video data of the base layer (or data of the base layer), and the video component of the enhancement layer will be used in combination with video data of the enhancement layer (or data of the enhancement layer).

According to an embodiment of the present invention, the present invention may encode video data by using an SVC (Scalable Video Coding) method, thereby dividing the encoded video data into video data of the base layer (or base layer video data) and video data of the enhancement layer (or enhancement layer video data). Herein, the SVC method is merely exemplary. And, therefore, other arbitrary video coding methods having scalability may also be used herein.

The data of the base layer (or the base layer data) correspond to data for images having basic picture quality. Herein, although the base layer data are robust against the communication environment, the base layer data have low picture quality. And, the data of the enhancement layer (or the enhancement layer data) correspond to additional data for images of higher picture quality and may, therefore, provide images having high picture quality. However, the enhancement layer data are weak against the communication environment.

In the present invention, video data for terrestrial broadcasting may be divided into base layer data and enhancement layer data, and video data for mobile broadcasting may be divided into base layer data and enhancement layer data in order to flexibly respond to the mobile broadcasting communication environment.

The receiver may decode only video layer of the base data (or base layer video data), so as to provide an image having basic picture quality, or the receiver may decode both the base layer video data and the video layer of the enhancement data (or enhancement layer video data), so as to provide an image having a higher picture quality.

According to an embodiment of the present invention the enhancement layer video data may be transmitted through an FEF, and the base layer data may be transmitted through the T2 frame and/or FEF.

In the present invention, an audio component may include an audio component of a base layer (or base layer audio component) for providing basic sound quality, such as 2 channel or 2.1 channel, and an audio component of an enhancement layer (or enhancement layer audio component) for providing additional sound quality, such as 5.1 channel or MPEG-Surround.

According to an embodiment of the present invention, a signal frame may refer to any one of a T2 frame, an FEF transmitting a mobile broadcast signal (i.e., NGH frame), a T2 frame transmitting base layer video data, and an FEF transmitting enhancement layer video data. In the description of the present invention, the signal frame and the transmission frame will be used to have the same meaning.

In the present invention, a PLP (physical layer pipe) corresponding to an identifiable data (or stream) unit. Also, the PLP may be considered as a physical layer TDM (Time Division Multiplex) channel, which transmits (or delivers) one or more services. More specifically, each service may be transmitted and received through multiple RF channels. Herein, the PLP may represent a path through which such service is being transmitted or may represent a stream being transmitted through such path. The PLP may also be located in slots being distributed to multiple RF channels at predetermined time intervals, and the PLP may also be distributed in a single RF channel at predetermined time intervals. Therefore, signal frame may transmit a PLP, which is distributed to a single RF channel based upon a time reference. In other words, one PLP may be distributed to a single RF channel or multiple RF channels based upon a time reference.

In the present invention, one service may be transmitted to one PLP, and components configuring a service may be divided (or differentiated), so that each of the differentiated components can be transmitted to a different PLP. If service components configuring a single service are differentiated from one another so as to be respectively transmitted to a different PLP, the receiver may gather (or collect) the multiple components, so as to combine the collected components to a single service. In the present invention, the service component and the component will be used to have the same meaning.

Figure 2:
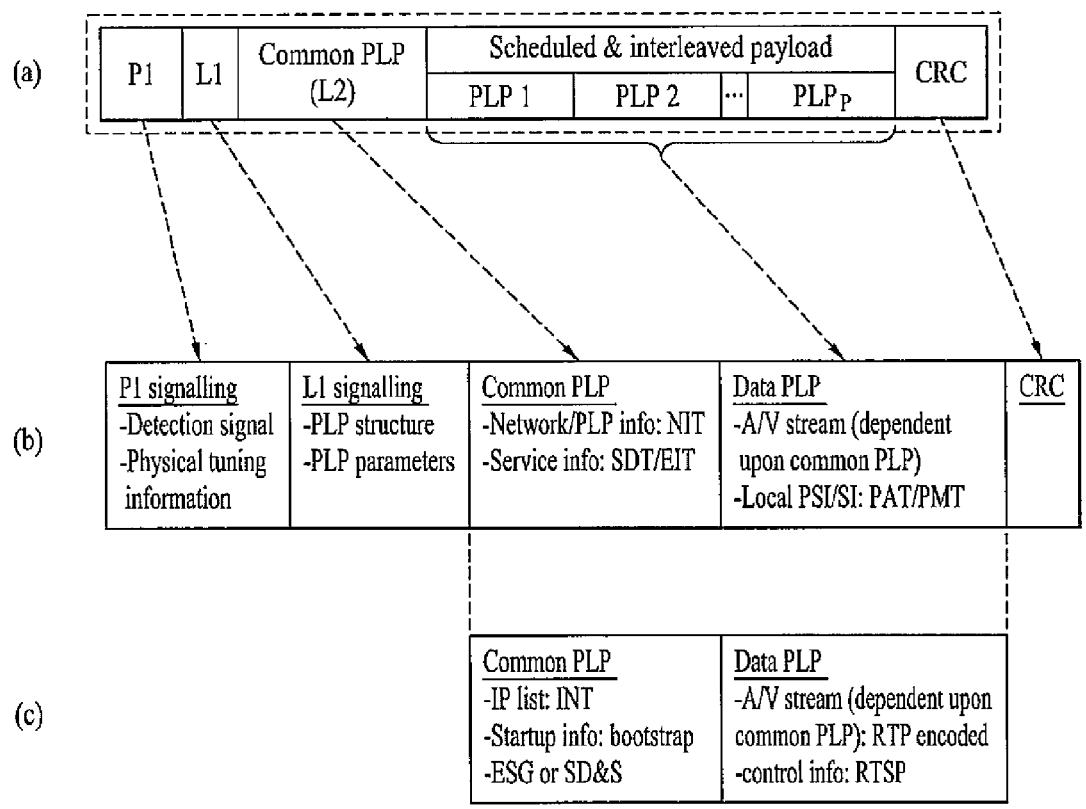
FIG. 2 illustrates a structure of a signal frame according to an embodiment of the present invention.

FIG. 2 illustrates a structure of a signal frame according to an embodiment of the present invention.

The signal frame of FIG. 2 represents a structure of a signal frame over a physical layer. The signal frame includes a P1 signaling information region (or part), an L1 signaling information region, and a PLP region. More specifically, the P1 signaling information region may be allocated to a foremost portion of the corresponding signal frame, and, then, the L1 signaling information region and the PLP region may be sequentially allocated after the P1 signaling information region. In the description of the present invention, only the information being included in the L1 signaling information region may be referred to as L1 signaling information, or signaling information being included in the P1 signaling information region and signaling information being included in the L1 signaling information region may be collectively referred to as the L1 signaling information.

As shown in FIG. 2, P1 signaling information that is being transmitted to the P1 signaling information region may be used for detecting a signal frame (or NGH broadcast signal) and may include tuning information and information for identifying preamble itself.

Based upon the P1 signaling information, the subsequent L1 signaling information region is decoded, so as to acquire information on the PLP structure and the signal frame configuration. More specifically, the L1 signaling information includes L1-pre-signaling information and L1-post-signaling information. Herein, the L1-pre-signaling information includes information required by the receiver to receive and decode L1-post-signaling information. And, the L1-post-signaling information includes parameters required by the receiver for accessing the PLP. The L1-post-signaling information may then include Configurable L1-post-signaling information, Dynamic L1-post-signaling information, Extension L1-post-signaling information, and CRC information, and the L1-post-signaling information may further include L1 padding data. In the present invention, configurable L1-post signaling information has the same meaning as the L1-post configurable signaling information. Moreover, dynamic L1-post signaling information has the same meaning as the L1-post dynamic signaling information Meanwhile, in the signal frame, the PLP region is configured of at least one common PLP and at least one data PLP.

A common PLP may include PSI/SI (Program and System Information/Signaling Information).

Specifically, when a broadcast signal corresponds to an IP format, the common PLP may include an IP information table, such as n INT (IP/MAC notification table). In addition, the common PLP may further include start information such as bootstrap and meta data for service guide such as ESG or SD&S. In the description of the present invention, information being included in the common PLP may be referred to as L2 signaling information. The L2 signaling information may be transmitted in the common PLP or PLP data, which depends on a designer's intention.

If the L2 signaling information is transmitted in the common PLP, a region carrying the L2 signaling information may be referred to as an L2 signaling information region. The L2 signaling information region may include the common PLP.

More specifically, L1 signaling information includes information required by the broadcast signal receiver for processing a PLP within a signal frame, and the L2 signaling information includes information that can be commonly applied to multiple PLPs. Accordingly, the broadcast signal receiver may use P1 signaling information included in a P1 signaling information region, so as to decode an L1 signaling information region, thereby acquiring information on the structure of PLP included in the signal frame and information a frame structure. Most particularly, the broadcast signal receiver may be capable of knowing through which PLP each of the service components being included in the corresponding service is being transmitted by referring to the L1 signaling information and/or the L2 signaling information. Additionally, the BICM module of the broadcast signal transmitter may encode signaling information associated with a broadcast service and may transmit L1/L2 signaling information, so that the broadcast signal receiver can perform decoding. Moreover, the MICM decoder of the broadcast signal receiver may decode the L1/L2 signaling information.

At this point, when the L1 signaling information includes information on the service components, the broadcast signal receiver may recognize the information on the service components at the same time the broadcast signal receiver receives the signal frame, and the broadcast signal receiver may then apply the corresponding information. However, since the size of the L1 signaling information is limited, the size (or amount) of the information on the service components that can be transmitted from the broadcast signal transmitter may also be limited. Accordingly, the L1 signaling information region is most adequate for recognizing the information on the service components at the same time the broadcast signal receiver receives the signal frame and for transmitting information that can be applied to the broadcast signal receiver.

If the L2 signaling information includes information on the service components, the broadcast signal receiver may acquire information on the service components after the decoding of the L2 signaling information is completed. Therefore, the broadcast signal receiver may not be capable of recognizing the information on the service components at the same time the broadcast signal receiver receives the signal frame and may not be capable of modifying the corresponding information. However, since the size of the region transmitting the L2 signaling information is larger than the L1 signaling information region, the L2 signaling information region may transmit a larger amount (or size) of service component data. Accordingly, the L2 signaling information is adequate for transmitting general information on service components.

According to an embodiment of the present invention the L1 signaling information may be used along with the L2 signaling information. More specifically, the L1 signaling information may include information that can be modified (or changed) at the same time the broadcast signal receiver receives the signal frame in a PLP level, such as a high mobile performance and a high-speed data communication characteristic, or may include information of service components that can be modified (or changed) at any time during the broadcast signal transmission. Additionally, the L2 signaling information may include information on the service components and general information on channel reception, which are included in a service.

Meanwhile, if the broadcast signal corresponds to a TS format, a data PLP, which is included in the signal frame, may include audio, video, and data TS streams. Furthermore, the TS-based data PLP may include PSI/SI information such as a PAT (Program Association Table) and a PMT (Program Map Table). If the broadcast signal corresponds to an IP format, the data PLP may include audio, video, and data IP streams. At this point, IP packets, which configure each of the IP streams, may be packetized by using an RTP (Real Time Protocol) or FLUTE (File Delivery over Unidirectional Transport). Additionally, IP-based data PLP may include control information, which is packetized by using an RTSP (Real Time Streaming Protocol) method. In the present invention, a data PLP including PAT/PMT or a data PLP including control information may also be referred to a base PLP. The data PLP may include a Type1 data PLP, which is transmitted by one sub-slice for each signal frame, and a Type2 data PLP, which is transmitted by multiple sub-slices. In the description of the present invention, for simplicity of the description, P number of data PLPs will hereinafter be indicated as PLP1~PLPp. More specifically, audio, video, and data TS streams and PSI/SI information (or control information), such as PAT/PMT, are transmitted through PLP1~PLPp. The data PLPs of FIG. 2 correspond to examples after scheduling and interleaving.

In the present invention the common PLP may be decoded along with a data PLP, and the data PLP may be selectively (or optionally) decoded. More specifically, a common PLP+data PLP may always be decoded. However, in some cases data PLP1+data PLP2 may not be decoded. Information being included in the common PLP may include the PSI/SI information. Additionally, Auxiliary Data may be added to the signal frame. Moreover, CRC data may be added to the signal frame.

Figure 3:
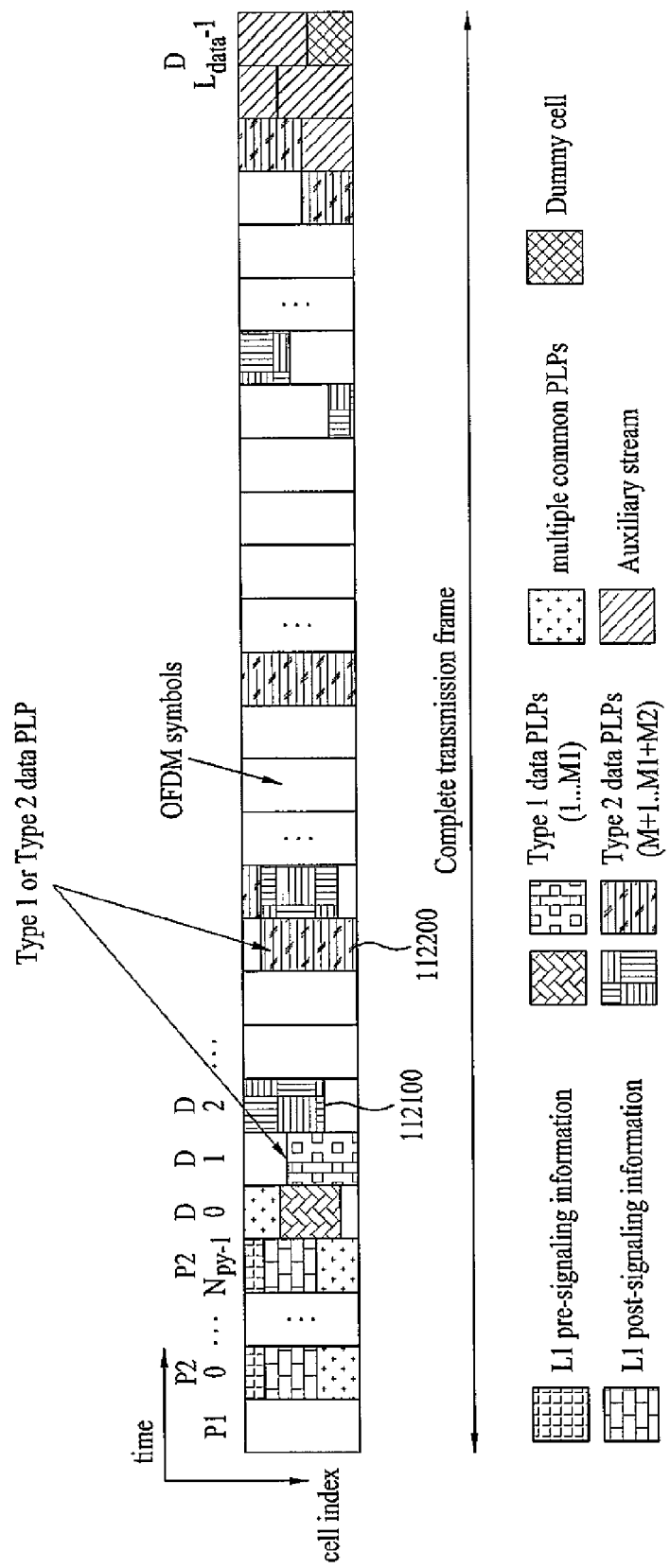
FIG. 3 illustrates a structure of a PLP-based signal frame according to an embodiment of the present invention, (a) of FIG. 4 illustrates a P1 symbol structure according to the present invention and (b) of FIG. 4 illustrates a block diagram showing an exemplary structure of a P1 symbol generator according to the present invention.

FIG. 3 illustrates a structure of a PLP-based signal frame according to an embodiment of the present invention.

The signal frame of FIG. 3 is a structure of a signal frame at a symbol level according to an embodiment of the present invention.

In light of the symbol level, the signal frame according to the present invention is divided into a preamble region and a data region. The preamble region is configured of a P1 symbol and at least one or more P2 symbols, and the data region is configured of a plurality of data symbols.

Herein, the P1 symbol transmits P1 signaling information. The at least one or more P2 symbols transmit L1-pre-signaling information, L1-post-signaling information, and signaling information being included in the common PLP (i.e., L2 signaling information). The signaling information being included in the common PLP may be transmitted through a data symbol. Therefore, in light of the signal frame over a physical layer, the preamble region includes a P1 signaling information region, an L1 signaling information region, and a portion or an entire portion of the common PLP region. In the description of the present invention a PLP transmitting PSI/SI and, more particularly, PAT/PMT will hereinafter be referred to a base PLP.

Data PLPs being transmitted through multiple data symbols may include a Type1 data PLP being transmitted, which is transmitted by one sub-slice for each signal frame, and a Type2 data PLP, which is transmitted by multiple sub-slices. According to an embodiment of the present invention, when both the Type1 data PLP and the Type2 data PLP exist in a signal frame, the Type1 data PLP is first allocated, and the Type2 data PLP is allocated afterwards.

The Type1 data PLP refers to having one sub-slice within a signal frame, i.e., one PLP being continuously transmitted within a signal frame. For example, when it is assumed that 2 type1 data PLPs (PLP1, PLP2) are being transmitted, when all of the data of PLP1 are first allocated to the corresponding signal frame, then all of the data of PLP2 are allocated afterwards, and, thereafter, the data are transmitted.

The Type2 data PLP refers to a PLP having two or more sub-slices within the signal frame. More specifically, the data of each PLP are divided into as many sections as the number of sub-slices. And, then, the divided data are distributed and transmitted to each sub-slice. For example, when it is assumed that 2 Type2 data PLP (PLP3, PLP4) exist in a single signal frame, and when it is assumed that each Type2 data PLP has 2 sub-slices, the data of PLP3 and the data of PLP4 are each divided into 2 equal sections, and the divided data are sequentially allocated to the 2 sub-slices of the corresponding PLP. At this point, according to the embodiment of the present invention, the sub-slice for PLP3 and the sub-slice for PLP4 are alternately positioned so as to be transmitted accordingly. In order to gain higher time diversity, the present invention uses the Type2 data PLP.

In the description of the present invention, one data PLP may correspond to one service, and one data PLP may also correspond to any one of the service components configuring a service, such as a video component (or also referred to as a base layer video component), an extension video component (or also referred to as an enhancement layer video component), and audio component, and a data component other than the video and audio components.

Meanwhile, the present invention may transmit separate signaling information from the transmitter, so that the receiver can identify additional broadcast signal frame, such as an NGH frame, and process the identified frame. The present invention transmits separate signaling information through a P1 symbol. And, herein, the P1 symbol will be referred to as a new_system_P1 symbol.

The new_system_P1 symbol may be different from the P1 symbol, and a plurality of new_system_P1 symbols may be used herein. At this point, according to the embodiment of the present invention, the new_system_P1 symbol is located at the beginning of the signal frame, i.e., located at a front portion of a first P2 symbol within a preamble region. In this case, the preamble region may be configured of at least one or more new_system_P1 symbols and at least one or more P2 symbols.

(a) of FIG. 4 illustrates a P1 symbol structure according to an embodiment of the present invention and (b) of FIG. 4 illustrates a block diagram of a P1 symbol generator according to an embodiment of the present invention. (a) of FIG. 4 illustrates a P1 symbol structure according to the present invention. In (a) of FIG. 4, the P1 symbol and P2 symbol portion will be referred to as a preamble region, and a body region will be referred to as a data region. The data region may be configured of a plurality of data symbols (also referred to as data OFDM symbols).

In (a) of FIG. 4, P1 symbol is generated by having each of a front portion and an end portion of an effective (or valid) symbol copied, by having a frequency shift performed as much as $+f_{sh}$, and by having the frequency-shifted copies respectively positioned at a front portion (C) and an end portion (B) of the effective symbol (A). In the present invention, the C portion will be referred to as a prefix, and the B portion will be referred to as a postfix. More specifically, P1 symbol is configured of a prefix portion, an effective symbol portion, and a postfix portion. In the description of the present invention, such P1 symbol structure will also be referred to as a C-A-B structure. At this point, according to the present invention, the P1 symbol corresponds to 1K OFDM symbol. And, according to the embodiment of the present invention, the A portion ($T_{P1A}$) may have the length of 112 us, the C portion ($T_{P1C}$) may have the length of 59 us, and the B portion ($T_{P1B}$) may have the length of 53 us.

(b) of FIG. 4 illustrates a block diagram showing an exemplary structure of a P1 symbol generator according to the present invention. Herein, (b) of FIG. 4 includes a CDS (Carrier Distribution Sequence) table module 000100, an MSS (Modulation Signaling Sequence) module 000200, a DBPSK (Differential Binary Phase Shift Keying) mapping module 000300, a scrambling module 000400, a padding module 000500, an IFFT module 000600, and a C-A-B structure module 000700. After being processed with the operations of each block included in the P1 symbol generator shown in (b) of FIG. 4, the P1 symbols shown in (a) of FIG. 4 is finally outputted from the C-A-B structure module 000700.

According to the embodiment of the present invention, the structure of the P1 symbol, shown in (a) of FIG. 4, may be modified, or the P1 symbol generator, shown in (b) of FIG. 4 may be modified, so as to generate a new_system_P1 symbol.

If the new_system_P1 symbol is generated by modifying the P1 symbol shown in (a) of FIG. 4, the new_system_P1 symbol may be generated by using at least one of the following methods. For example, the new_system_P1 symbol may be generated by modifying a frequency shift (or displacement) value ($f_{SH}$) for a prefix and a postfix. In another example, the new_system_P1 symbol may be generated by modifying (or changing) the length of the P1 symbol (e.g., $T_{P1C}$ and $T_{P1B}$ lengths). In yet another example, the new_system_P1 symbol may be generated by replacing the length of the P1 symbol from 1K to 512,256,128, and so on. In this case, the parameters (e.g., $f_{SH}$, $T_{P1C}$, $T_{P1B}$) that are used in the P1 symbol structure should be adequately corrected.

If the new_system_P1 symbol is generated by modifying the P1 symbol generator shown in (b) of FIG. 4, the new_system_P1 symbol may be generated by using at least one of the following methods. For example, the new_system_P1 symbol may be generated by using a method of changing the distribution of active carriers (e.g., a method of having the CDS table module 000100 use another CSS (Complementary Set of Sequence), which are used for the P1 symbol, through the CDS table module 000100, the MSS module 000200, and the C-A-B structure module 000700. In another example, the new_system_P1 symbol may be generated by using a method of changing a pattern for transmitting information to the P1 symbol (e.g., a method of having the MSS module 000200 use another CSS), and so on.

Meanwhile, the present invention may additionally allocate a preamble symbol to the preamble region within a signal frame, particularly an NGH frame. Hereinafter, the additional preamble signal will be referred to as an AP1 symbol (Additional Preamble symbol) for simplicity in the description of the present invention. In order to enhance the detection performance for detecting a mobile broadcast (i.e., NGH) signal, in a considerably low SNR condition or a time-selective fading condition, at least one or more AP1 symbol is added to the signal frame.

At this point, according to the embodiment of the present invention, the AP1 symbol is located between a P1 symbol and a first P2 symbol within the preamble region of a signal frame. More specifically, the P1 symbol and the AP1 symbol are consecutively transmitted. According to the embodiment of the present invention, if the P2 symbol is not transmitted to the signal frame, the AP1 symbol may be located between the P1 symbol and the first data symbol within the preamble region of the signal frame. According to another embodiment of the present invention, the P1 symbol and the AP1 symbol may be allocated to non-consecutive positions within a single signal frame, so as to be transmitted.

For example, when a signal frame includes an AP1 symbol, the preamble region of the signal frame is configured of a P1 symbol, at least one or more AP1 symbols, and at least one or more P2 symbols. And, the data region may be configured of a plurality of data symbols (or data OFDM symbols).

As described in the embodiments for generating the new_system_P1 symbol, according to the embodiment of the present invention, the AP1 symbol may be generated by modifying the structure of the P1 symbol, shown in (a) of FIG. 4, or by modifying the P1 symbol generator, shown in (b) of FIG. 4. According to the embodiment of the present invention, the AP1 symbol may be generated by modifying both the structure of the P1 symbol, shown in (a) of FIG. 4, and the P1 symbol generator, shown in (b) of FIG. 4.

As described in the embodiment of the present invention, when at least 2 or more preamble symbols are used, the present invention is advantageous in that the present invention can be more robust against a burst fading effect, which may occur in a mobile fading environment, and that a signal detection performance can be enhanced.

Figure 5:
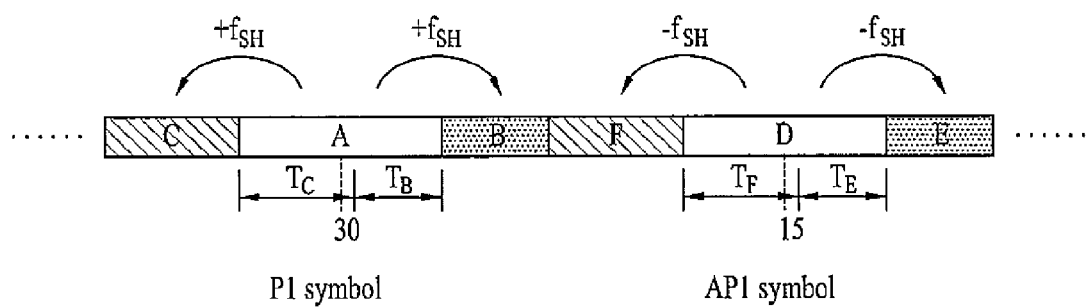
FIG. 5 illustrates a structure of a P1 symbol and a structure of an AP1 symbol according to an embodiment of the present invention.

FIG. 5 illustrates a structure of a P1 symbol and a structure of an AP1 symbol according to an embodiment of the present invention.

More specifically, FIG. 5 shows an example of generating an AP1 symbol by modifying the P1 symbol.

In FIG. 5, P1 symbol, which is shown on the left side, is generated by having each of a front portion and an end portion of an effective (or valid) symbol copied, by having a frequency shift performed as much as $+f_{sh}$, and by having the frequency-shifted copies respectively positioned at a front portion (C) and an end portion (B) of the effective symbol (A). In the present invention, the C portion will be referred to as a prefix, and the B portion will be referred to as a postfix. More specifically, P1 symbol is configured of a prefix portion, an effective symbol portion, and a postfix portion.

In FIG. 5, AP1 symbol, which is shown on the right side, is generated by having each of a front portion and an end portion of an effective (or valid) symbol copied, by having a frequency shift performed as much as $-f_{sh}$, and by having the frequency-shifted copies respectively positioned at a front portion (F) and an end portion (E) of the effective symbol (D). In the present invention, the F portion will be referred to as a prefix, and the E portion will be referred to as a postfix. More specifically, AP1 symbol is configured of a prefix portion, an effective symbol portion, and a postfix portion.

Herein, the two frequency-shift values $+f_{sh}$, $-f_{sh}$, which are used in the P1 symbol and the AP1 symbol, may have the same absolute value yet be given opposite signs. More specifically, the frequency-shift is performed in opposite directions. And, the lengths C and F, which are copied to the front portion of the effective symbol, may be set to have different values. And, the lengths B and E, which are copied to the end portion of the effective symbol, may be set to have different values. Alternatively, the lengths C and F may be set to have different values, and the lengths B and E may be set to have the same value, or vice versa. According to another embodiment of the present invention, an effective symbol length of the P1 symbol and an effective symbol length of the AP1 symbol may be differently determined. And, according to yet another embodiment of the present invention, a CSS (Complementary Set Sequence) may be used for tone selection and data scrambling within the AP1 may be scrambled by AP1.

According to the embodiment of the present invention, the lengths of C and F, which are copied to the front portion of the effective (or valid) symbol, may be set to have different values, and the lengths of B and E, which are copied to the end portion of the effective (or valid) symbol, may also be set to have different values.

The C, B, F, E lengths according to the present invention may be obtained by using Equation 1 shown below.

Length of $C$ $(T_C)$={Length of $A$ $(T_A)/2+30$}

Length of $B$ $(T_B)$={Length of $A$ $(T_A)/2-30$}

Length of $E$ $(T_F)$={Length of $D$ $(T_D)/2+15$}

Length of $E$ $(T_E)$={Length of $D$ $(T_D)/2-15$}  [Equation 1]

As shown in Equation 1, P1 symbol and AP1 symbol have the same frequency shift value. However, each of the P1 symbol and the AP1 symbol are given opposite signs. Additionally, in order to determine the lengths of C and B, the present invention determines an offset value being added to or subtracted from a value corresponding to the length of A $(T_A)/2$. And, in order to determine the lengths of F and E, the present invention determines an offset value being added to or subtracted from a value corresponding to the length of D $(T_D)/2$. Herein, each of the offset values is set up differently. According to the embodiment of the present invention, the offset value of P1 symbol is set to 30, and the offset value of AP1 symbol is set to 15. However, the values given in the above-described examples are merely exemplary. And, therefore, it will be apparent that the corresponding values may easily be varied or changed by anyone skilled in the art. Thus, the present invention will not be limited only to the values presented herein.

According to the present invention, by generating AP1 symbol and an AP1 symbol to configure the structure shown in FIG. 5, and by inserting the generated symbols to each signal frame, the P1 symbol does not degrade the detection performance of the AP1 symbol, and, conversely, the AP1 symbol does not degrade the detection performance of the P1 symbol. Additionally, the detection performance of the P1 symbol is almost identical to the detection performance of the AP1 symbol. Furthermore, by configuring the symbols so that the P1 symbol and the AP1 symbol have similar symbol structures, the complexity level of the receiver may be reduced.

At this point, the P1 symbol and the AP1 symbol may be transmitted consecutively, or each of the symbols may be allocated to different positions within the signal frame and may then be transmitted. And, in case the P1 symbol and AP1 symbol are each allocated to a different position within the signal frame, so as to be transmitted, a high time diversity effect may be gained with respect to the preamble symbol. According to the embodiment of the present invention, the P1 symbol and the AP1 symbol are consecutively transmitted.

Figure 6:
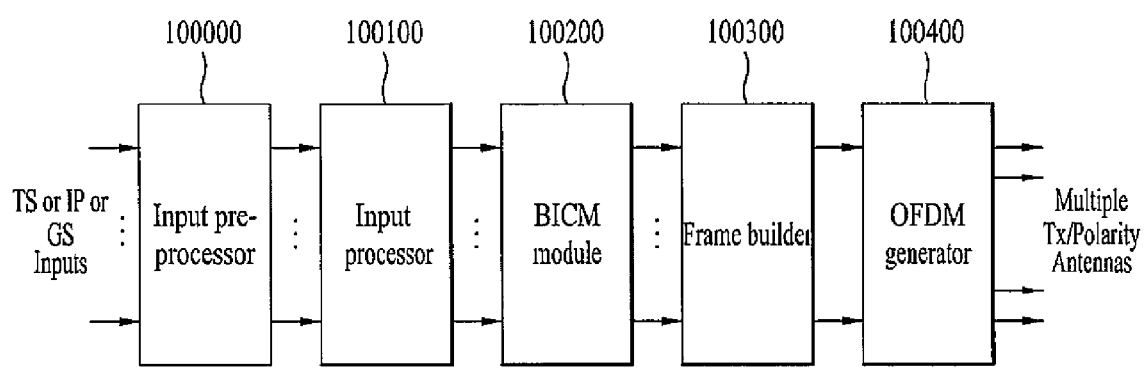
FIG. 6 illustrates a block diagram showing a broadcast signal transmitting apparatus according to an embodiment of the present invention.

FIG. 6 illustrates a block diagram showing a broadcast signal transmitting apparatus according to an embodiment of the present invention.

In the present invention, the broadcast signal transmitting apparatus may be referred to as a broadcast signal transmitter or a transmitter.

As shown in FIG. 6, the broadcast signal transmitting apparatus may include an input pre-processor 100000, an input processor 100100, a BICM module 100200, a frame builder 100300, and an OFDM generator 100400. Herein, the BICM module 100200 is also referred to as a BICM encoder.

The input stream may include at least one of a TS stream, an internet protocol (IP) stream, and a GSE (General Stream Encapsulation) stream (or also referred to as a GS stream).

The input pre-processor 100000 may receive at least one the TS stream, the IP stream, and the GS stream, so as to generate at least one or more PLPs in service units (or service component units) in order to provide robustness.

The input processor 100100 generates a BB frame including at least one or more of the PLPs generated from the input pre-processor 100000. In case the input processor 100100 receives a PLP corresponding to a service, the input processor 100100 may categorize the received PLP as PLPs corresponding to the service components and may, then, generate the BB frame.

The BICM module 100200 adds redundancy to the output of the input processor 100100, so that any error occurring over the transmission channel can be corrected, and then the BICM module 100200 performs interleaving.

The frame builder 100300 maps the plurality of PLPs to the transmission frame is cell units, so as to complete the transmission frame (or signal frame) structure.

The OFDM generator 100400 performs OFDM modulation on the input data, so as to generate a baseband signal that can be transmitted to the antenna.

Figure 7:
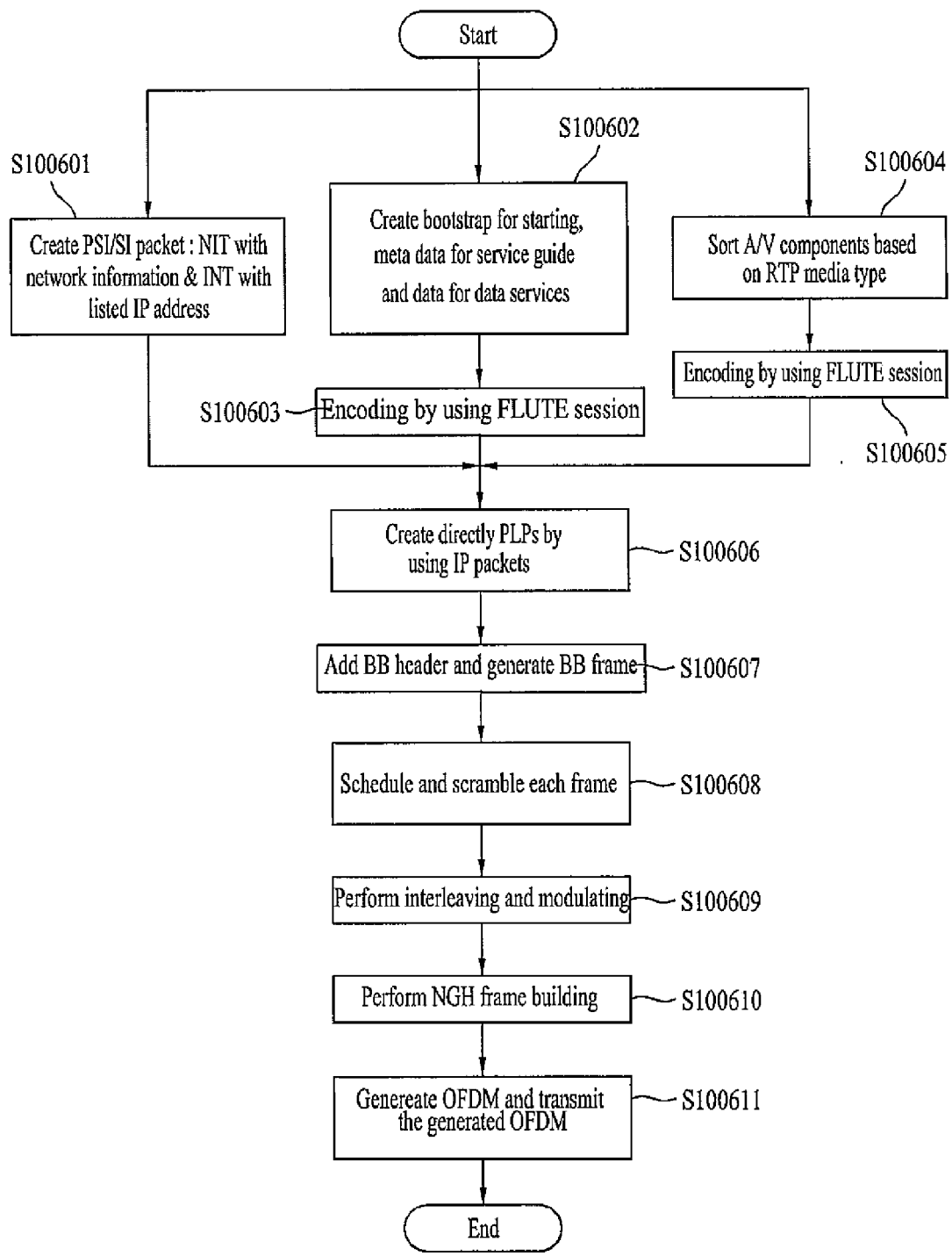
FIG. 7 illustrates a flow chart showing a method of transmitting an IP-based broadcast signal according to an embodiment of the present invention.

FIG. 7 illustrates a flow chart of a method for transmitting an IP-based broadcast signal according to an embodiment of the present invention.

More specifically, FIG. 7 illustrates a method for inputting an IP stream in an IP packet unit, sorting (or categorizing) the input IP stream with respect to each component, and transmitting the sorted (or categorized) IP stream in component PLP units.

In order to do so, IP packets including IP service information are created (or generated) (S100601). The IP service information may include an NIT, which signals network information, and may include an INT, which includes a listed IP address. The IP service information may correspond to a binary type, and FLUTE encoding or RTP encoding may be omitted. The IP service information is transmitted to a common PLP.

After creating (or generating) bootstrap information for initiation, meta data for service guide, and data for data services (S100602), the created information and data are encoded by using a FLUTE session, thereby being outputted in an IP packet format (S100603). Thereafter, the audio/video (A/V) components are sorted (or differentiated) based upon the RTP media type (S100604), then each of the differentiated (or sorted) components is encoded by using a FLUTE session or an RTP session, thereby being outputted in an IP packet format (S100605).

The process steps S100601~S100605 may be performed by the input pre-processor 100000, or may be performed in another block (not shown) and then delivered to the input pre-processor 100000.

The input processor 100100 may create PLPs by directly using IP packets that are FLUTE encoded or RTP encoded, or by directly using IP packets bypassing the FLUTE encoding or RTP encoding processes (S100606). More specifically, by omitting the GSE encapsulating process, the overhead may be reduced.

Subsequently, the input processor 100100 slices each IP stream into a predetermined number of bit units, so as to map the sliced bit units to a BB frame payload, and, then, the input processor 100100 inserts a BB header to the BB frame payload, so as to generate a BB frame (S100607).

Moreover, the input processor 100100 performs scheduling in order to map multiple PLPs to the transmission frame, and then the input processor 100100 performs scrambling on the data (i.e., bit stream) within the BB frame (S100505).

The BICM module 100200 adds redundancy to the output of the input processor 100100, so that any error occurring within the transmission channel can be corrected, and then, the BICM module 100200 performs interleaving (S100609).

The frame builder 100300 maps the multiple PLPs being outputted from the BICM module 100200 to the transmission frame in cell units in accordance with the scheduling information, thereby completing the transmission frame (NGH frame) structure (S100610). The OFDM generator 100400 performs OFDM modulation on the data within the transmission frame, thereby transmitting the OFDM-modulated data to the antenna (S100611).

The input pre-processor 100000 of FIG. 6 may categorize the data corresponding to the service to each component, and, then, the input pre-processor 100000 may perform data processing, so that the data corresponding to each component can be transmitted to a separate PLP.

The broadcast signal transmitting apparatus according to the present invention may be transmitted to one or more services in PLP units. However, the components being included in one service may be separated and transmitted in PLP units. In this case, the broadcast signal receiving apparatus may identify and process the PLPs including each component, so as to be capable of providing a single service. In order to do so, the input pre-processor 100000 according to the present invention processes data in component units.

Hereinafter, the input pre-processor processing data having an IP stream format will hereinafter be described in detail.

In case of an IP stream, unlike the description presented above, the data corresponding to the component may be divided in IP packet units. And, the PSI/SI included in the TS may correspond to service information, and the IP service information may include ESG (Electronic Service Guide; ESG) information, provider information, bootstrap information, and so on. The ESG information may include IP address information, port number information, and so on of the service component and it may be referred to as meta data. According to the embodiment of the present invention, the IP stream may be inputted/outputted in GSE (Generic Stream Encapsulation) stream units.

Figure 8:
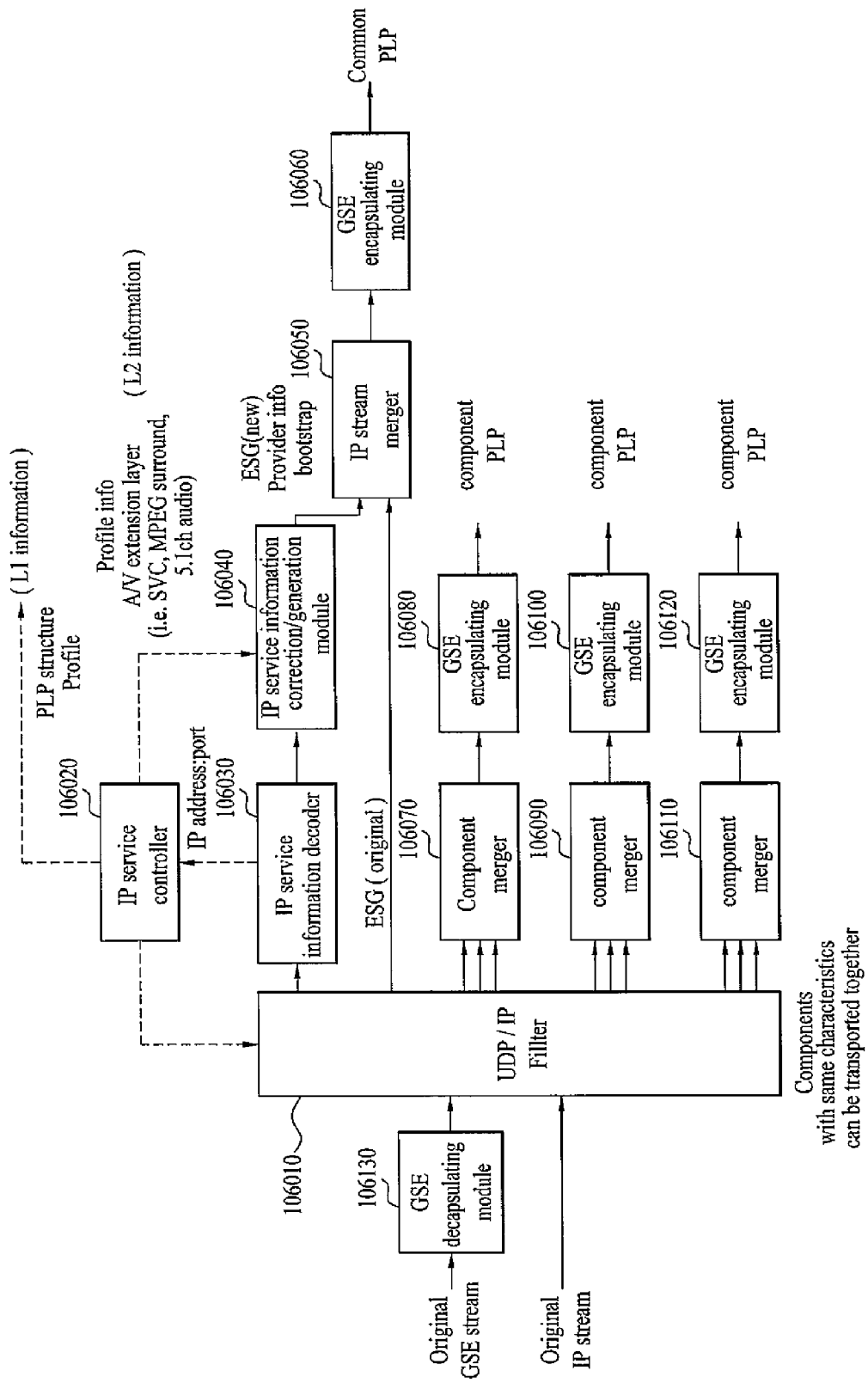
FIG. 8 illustrates a block diagram showing an input pre-processor according to an embodiment of the present invention, (a) to (c) of FIG. 9 illustrate an example of configuring a PLP in component units in an input pre-processor according to the present invention.

FIG. 8 illustrates a block diagram showing an input pre-processor according to an embodiment of the present invention.

The input pre-processor 100000 of FIG. 8 includes a UDP/IP filter 106010, an IP service controller 106020, an IP service information decoder 106030, an IP service information modifying/generating module 106040, an IP stream merger 106050, GSE encapsulating modules 106060, 106080, 106100, 106120, component mergers 106070, 106090, 106110, and a GSE decapsulating module 106130.

The input pre-processor 100000 of FIG. 8 receives a GSE stream or IP stream and differentiates the data included in the received stream for each component, thereby outputting the differentiated data to a different PLP. At this point, a PLP including IP service information may be referred to as a common PLP, and the common PLP may also be referred to as L2 signaling information or L2 information/data. The L1 signaling information may also be referred to as L1 information.

In the present invention, the GSE stream is inputted to the GSE decapsulation module 106130, and the IP stream is inputted to the UDP/IP filter 106010. The GSE decapsulation module 106130 performs GSE decapsulation on the GSE stream, so as to extract an IP stream, thereby outputting the extracted IP stream to the UDP/IP filter 106010.

The UDP/IP filter 106010 may use a UDP port number and an IP address, and so on, so as to perform filtering on the IP packets, which are included in the IP stream, for each component, thereby outputting the filtered IP packets. Since a UDP port number and an IP address are assigned (or allocated) to each of the IP packets for each component, which are included in the IP stream, the UDP/IP filter 106010 may use the UDP port number and IP address so as to identify the IP packet corresponding to each component, thereby outputting each of the identified IP packets to a separate PLP path. Hereinafter, such UDP port number and IP address may also be collectively referred to as an address or address information.

However, since a UDP port number and an IP address should be known in order to perform such filtering process, the UDP/IP filter 106010 first filters the IP service information included in the IP stream. Then, the IP service information decoder 106030 decodes the IP service information, which is filtered by the UDP/IP filter 106010, so as to acquire address information. At this point, the address information may be acquired from the ESG information among the IP service information. Additionally, the IP service controller 106020 may use the address information, which is acquired from the IP service information decoder 106030, so as to control the UDP/IP filter 106010 and to filter the IP packet corresponding to a desired component for each address, thereby outputting the filtered IP packet. Since the IP service information, which is included in the IP stream, is transmitted to a predetermined address, an immediate filtering process may be performed without any separate settings of the UDP/IP filter 106010.

The UDP/IP filter 106010 first filters the IP packets included in the IP stream for each component and then outputs the filters IP packets to a respective component merger through each PLP path. For example, IP packets corresponding to the video component are outputted to the component merger 106070, IP packets corresponding to the audio component are outputted to the component merger 106090, and IP packets corresponding to the data component are outputted to the component merger 106110. The component mergers 106070, 106090, 106110 merge the IP packets of the corresponding component. If the stream being inputted to the input pre-processor corresponds to a stream having a GSE format, the output of the component mergers 106070, 106090, 106110 is outputted as a GSE stream, after being GSE encapsulated by each GSE encapsulating module. And, if the corresponding stream has an IP format, the GSE encapsulating process may be omitted.

When configuring the PLP for each component as described above, the receiver may not be capable of searching all of the data corresponding to a single service, even when the channel is scanned. More specifically, unlike the method of configuring a PLP for each service and identifying the configured PLP as IP service information, since the PLP is configured for each component configuring a service, a component PLP that does not include any IP service information may exist in the present invention. Therefore, in the present invention, service configuration information is added to the IP service information so that the component PLPs corresponding to a service can be located and found.

The IP service information modifying/generating module 106040 may modify or generate IP service information that should be modified or added, such as ESG information, service provider information, bootstrap information, and so on and may, then, output the modified or generated IP service information. For example, service configuration information configuring a PLP for each component may be signaled to the ESG information.

The IP stream merger 106050 merges IP service information modified/generated by the IP service information modifying/generating module 106040 and IP service information, such as supplemental information, which does not require any modification, thereby outputting the merged IP service information to a common PLP path.

As shown in FIG. 8, the input pre-processor may receive an IP stream (or GSE stream) and may output data including IP service information to a common PLP path and may output data corresponding to each component to a component PLP path. Accordingly, as described above, the data corresponding to each PLP path may also be referred to as PLP data or PLP.

The input pre-processor may signal information on the components, which are configured as described above, to the L1 signaling information, so that components can be extracted in PLP units in accordance with the receiver type. More specifically, when a service type is selected in accordance with the receiver, the receiver shall process the components corresponding to the selected service. In the present invention, since a PLP is configured for each component, the information on such PLP configuration is signaled to the L1 signaling information, thereby allowing the receiver to extract the components corresponding to the selected service and to process the extracted components. Accordingly, the input pre-processor may generate information on the PLP configuration, so as to perform control operations enabling the generated information to be included in the L1 signaling information.

Figure 9:
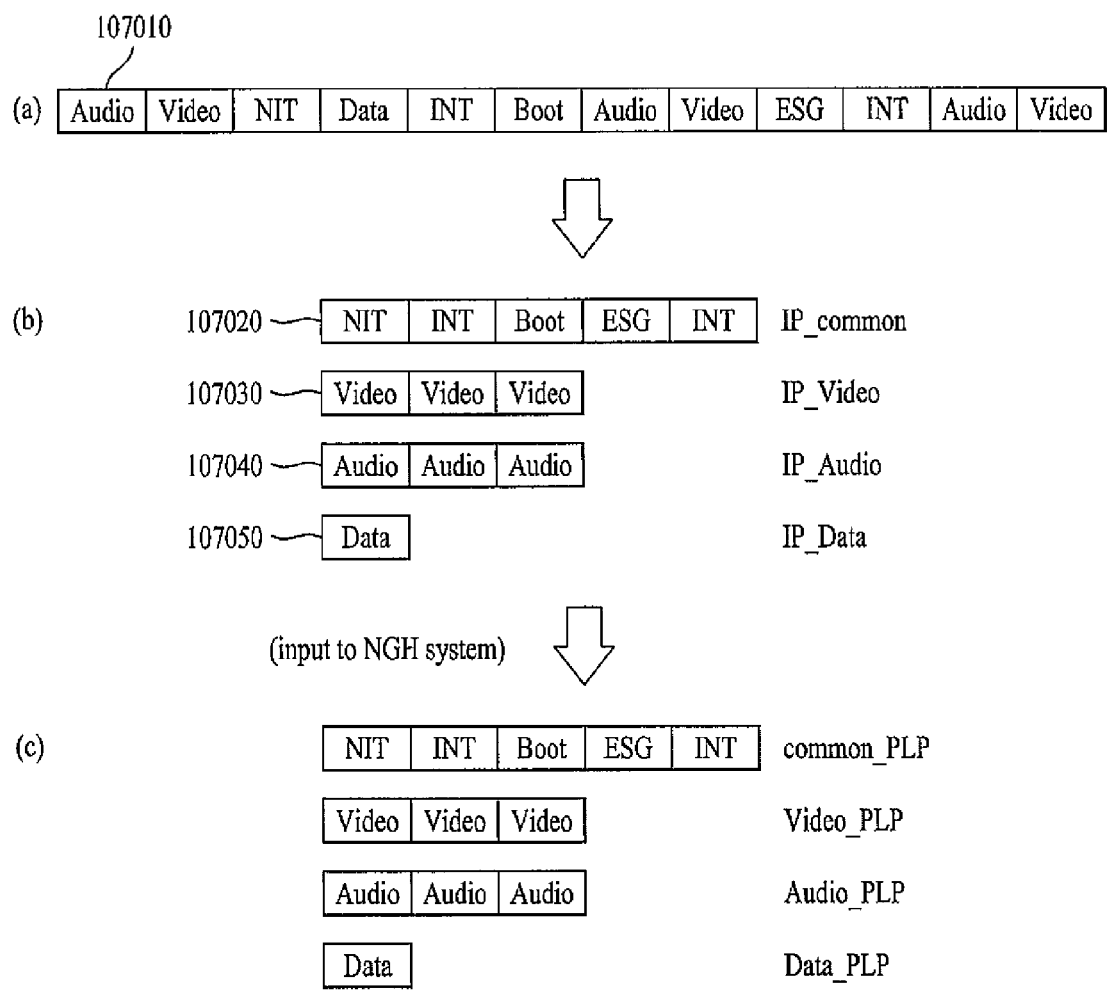

(a) to (c) of FIG. 9 illustrate an example of configuring a PLP in component units in an input pre-processor according to the present invention.

In (a) of FIG. 9, an IP stream 107010 being configured of IP packets indicates an IP stream being inputted to the UDP/IP filter 106010 of the input pre-processor shown in FIG. 8. And, each IP packet includes one of audio component data, video component data, data component data, and IP service information component data.

The input pre-processor of FIG. 9 performs the above-described pre-processing procedure on the IP packets included in the IP stream 107010, so as to differentiate the pre-processed IP packets for each component, thereby outputting each of the differentiated IP packets through a different PLP path.

Figure 14:
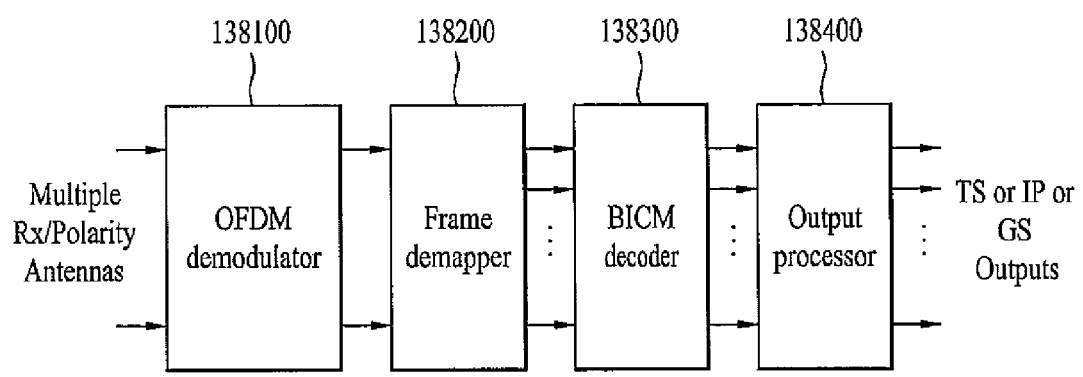
FIG. 14 illustrates a block diagram showing a broadcast signal receiving apparatus according to an embodiment of the present invention.

For example, in (b) of FIG. 14, IP packets including NIT, INT, bootstrap, ESG information are outputted through a common PLP path, thereby configuring a common IP (107020, IP_Common), and IP packets including data of the video component are outputted through a video component PLP path, thereby configuring a video component IP (107030, IP_Video). Additionally, the IP packets including data of the audio component are outputted through an audio component PLP path, thereby configuring an audio component IP (107040, IP_Audio), and the IP packets including data of the data component are outputted through a data component PLP path, thereby configuring a data component IP (107050, IP_Data). In another example, IP packets including data of 2 or more components may be outputted through a single PLP path, so as to configure a single IP. In yet another example, IP packets including data of a specific component respective to multiple services may be outputted through a single PLP path, so as to configure a single IP.

At this point, unlike in the TS-based broadcasting, in the IP-based broadcasting, a PLP is directly configured without performing null packet inserting or deleting processes. This is because a null packet is not required in the IP stream.

For simplicity in the description of the present invention, a common IP stream 107020 may be referred to as a common PLP (or PLP data), and a video component IP stream 107030 may be referred to as a video component PLP (or PLP data) like (c) of FIG. 9. Additionally, an audio component IP stream 107040 may be referred to as an audio component PLP (or PLP data), and a data component IP stream 107050 may be referred to as a data component PLP (or PLP data).

Based upon the characteristics of the IP streams, the IP streams of each PLP path of FIG. 9 are not required to maintain the same synchronization or order.

Figure 10:
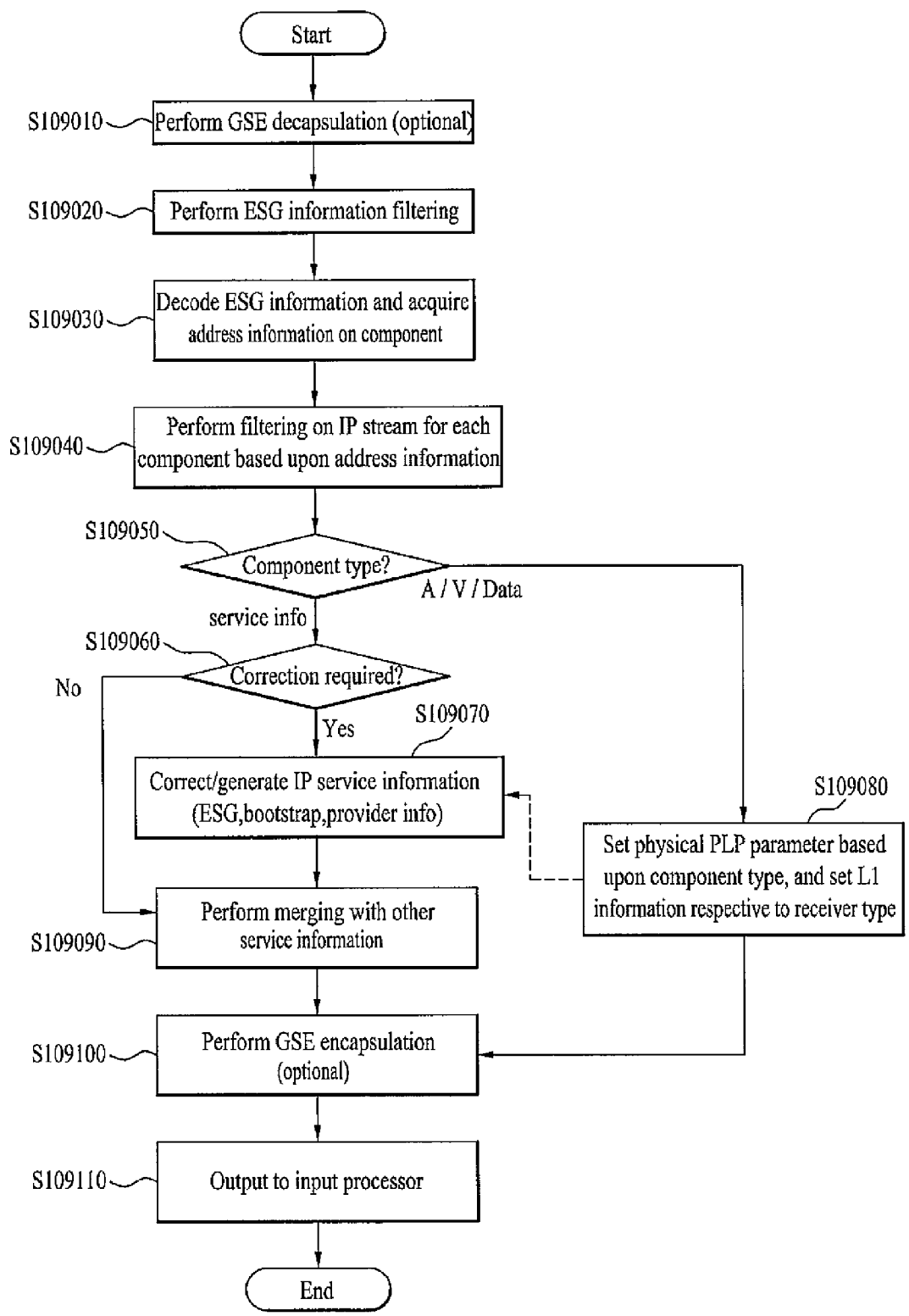
FIG. 10 illustrates a flow chart showing a pre-processing method of a broadcast signal according to an embodiment of the present invention.

FIG. 10 illustrates a flow chart showing a pre-processing method of a broadcast signal according to another embodiment of the present invention.

FIG. 10 shows a processing method of the above-described input pre-processor 100000 of FIG. 8, so that an IP stream can be divided in component units, and so that each set of component unit data can be outputted to a different PLP path.

In case the input stream corresponds to a GSE stream, the input pre-processor 100000 may use the GSE decapsulating module 106130, so as to decapsulate the GSE stream to an IP stream (S109010). In case the input stream corresponds to an IP stream, this process step (S109010) may be omitted.

The input pre-processor 100000 may use the UDP/IP filter 106010, so as to filter the ESG information of the input IP stream (S109020). Since the ESG information is transmitted from an IP stream to a predetermined address, a filtering procedure may be performed without any separate filter set-up.

The input pre-processor 100000 may use the IP service information decoder 106030, so as to decode the ESG information, which is filtered by the UDP/IP filter 106010 and to acquire address information respective to each component included in the IP stream (S109030). Thereafter, the IP service controller 106020 may set up the UDP/IP filter 106010 by using the address information, which is acquired in step (S109030), so as to filter data for each component and to output the filtered data (S109040).

The input pre-processor 100000 performs another operation in accordance with the component type of the corresponding data (S109050).

In case the component type corresponds to IP service information, i.e., when the component type corresponds to common PLP data, the input pre-processor 100000 may determine whether or not the IP service information requires modification (S109060). Thereafter, when modification is required, the corresponding IP service information (ESG information, bootstrap information, provider information, and so on) may be generated or modified (S109070). Then, by using the IP stream merger 106050, IP service information that are to be included in the data, which are transmitted to the common PLP, are merged (S109090).

In case the component type does not correspond to IP service information, i.e., in case the component type corresponds to component PLP data, the input pre-processor 100000 sets up a physical parameter based upon the component type, thereby enabling the physical parameter to be signaled to the L1 signaling information (S109080). In other words, the input pre-processor 100000 may signal information on a component PLP structure to the L1 signaling information, so that the receiver can process the component PLP corresponding to the service in accordance with the component structure of the present invention.

In case the output data format corresponds to a GSE stream, the input pre-processor 100000 performs GSE encapsulation on the processed PLP data in accordance with the component type (S109100). In case the output data format corresponds to an IP GSE stream, this step may also be omitted. Each set of the component PLP data may be outputted to a different PLP path (S109110).

The output of the input pre-processor 100000 is outputted to the input processor 100100.

In the description of the present invention, TS or IP or GSE streams may be converted to n+1 number of streams that can be independently processed through the input pre-processor 100000 or the input processor 100100. At this point, the stream that is to be independently processed may correspond to a complete (or whole) TS stream including a plurality of service components, and may also correspond to a TS stream of a minimum unit including only one service component (e.g., video or audio, and so on). Similarly, the stream that is to be independently processed may correspond to a complete (or whole) GSE stream including a plurality of service components or a GSE stream including only one service component. Furthermore, the stream that is to be independently processed may also correspond to a complete (or whole) IP stream including a plurality of service components or an IP stream including only one service component.

Meanwhile, in the present invention, the MISO method may be independently applied for each set of PLP data, and the MIMO method may also be applied.

According to an embodiment of the present invention, the BICM module 100200 may perform MIMO encoding on MIMO PLP data to be transmitted in MIMO and may perform MISO encoding on MISO PLP data to be transmitted in MISO. According to another embodiment of the present invention, the BICM module 100200 may perform MIMO encoding on MIMO PLP data to be transmitted in MIMO and the OFDM generator 10040 may perform MISO encoding on MISO PLP data to be transmitted in MISO.

Specifically, a broadcast signal transmitter and receiver for performing MISO processing and MIMO processing on a plurality of signals transmitted and received through a plurality of antennas may be considered in four embodiments. The embodiments are differentiated according to whether MISO/MIMO processing is performed on a PLP basis and the position of MISO/MIMO processing. Each embodiment will be described below in brief.

A first embodiment relates to a broadcast signal transmitter for performing MISO processing and MIMO processing independently on an input PLP data basis during BCIM encoding and a broadcast signal receiver corresponding to the broadcast signal transmitter.

A second embodiment relates to another broadcast signal transmitter for performing MISO processing and MIMO processing independently on an input PLP data basis during BCIM encoding and a broadcast signal receiver corresponding to the broadcast signal transmitter.

A third embodiment relates to a broadcast signal transmitter for performing MISO processing and MIMO processing on PLP data mapped to a frame during OFDM generation and a broadcast signal receiver corresponding to the broadcast signal transmitter.

A fourth embodiment relates to a broadcast signal transmitter for performing MIMO processing independently on MIMO PLP data to be MIMO-processed among input PLP data during BICM encoding and performing MISO processing on MISO PLP data and L1-signaling information to be MISO-processed during OFDM generation and a broadcast signal receiver corresponding to the broadcast signal transmitter.

To be more specific, according to the first embodiment, the BICM module 100200 of the broadcast signal transmitter may perform MISO encoding or MIMO encoding on input PLP data after constellation mapping, cell interleaving, and time interleaving. A BICM decoder 138300 of the broadcast signal receiver may perform the BICM encoding of the broadcast signal transmitter in a reverse order.

According to the second embodiment, the BICM module 100200 of the broadcast signal transmitter may perform MISO encoding or MIMO encoding on each input PLP data after constellation mapping and then perform cell interleaving and time interleaving on the encoded PLP data. The BICM decoder 138300 of the broadcast signal receiver may perform the BICM encoding of the broadcast signal transmitter in a reverse order.

According to the third embodiment, the OFDM generator 100400 of the broadcast signal transmitter may perform MISO encoding or MIMO encoding on PLP data received from the frame builder 100300. An OFDM demodulator 138100 of the broadcast signal receiver may perform the operation of the OFDM generator 100400 of the broadcast signal transmitter in a reverse order.

According to the fourth embodiment, the BICM module 100200 of the broadcast signal transmitter may perform MIMO encoding on MIMO PLP data to be MIMO-processed after time interleaving or constellation mapping. The OFDM generator 10040 may perform MISO encoding on MISO PLP data and L1-signaling information to be MISO-processed, mapped to a frame and perform MIMO encoding on MIMO PLP data. The BICM decoder 138300 and the OFDM demodulator 138100 of the broadcast signal receiver may perform the operations of the BICM module 100200 and the OFDM generator 100400 of the broadcast signal transmitter in a reverse order.

The following description centers on the BCIM module 100200 of the broadcast signal transmitter according to the first embodiment of the present invention.

The broadcast signal transmitter and receiver of the present invention may perform MISO processing and MIMO processing on a plurality of signals transmitted and received through a plurality of antennas. Hereinafter, a broadcast signal transmitter and receiver for processing two signals transmitted and received through two antennas will be described.

Figure 11:
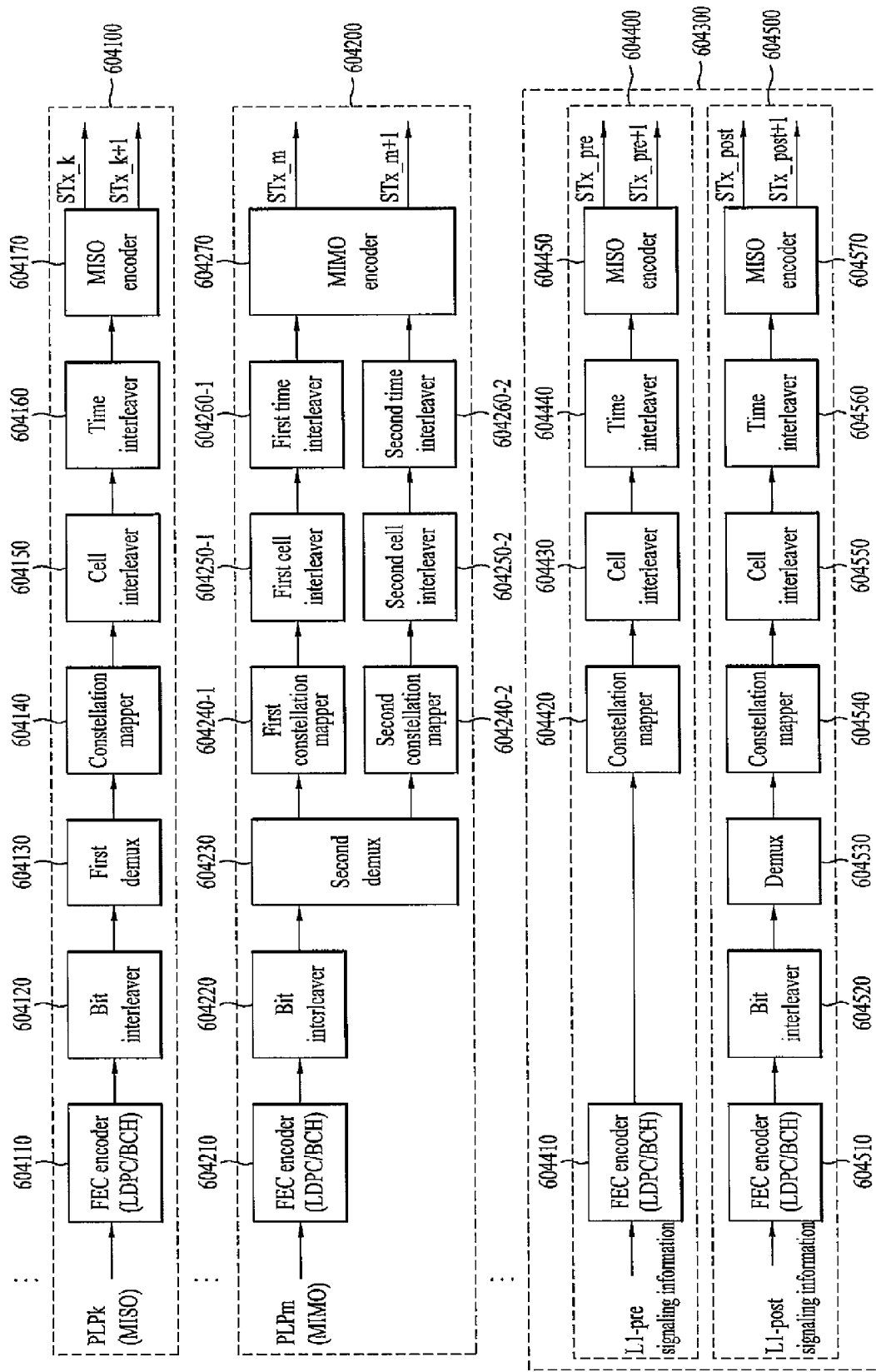
FIG. 11 illustrates a block diagram showing a BICM module according to an embodiment of the present invention.

FIG. 11 is a block diagram of a BICM module according to an embodiment of the present invention.

The BICM module illustrated in FIG. 11 is the aforedescribed BICM module according to the first embodiment. The BICM module may perform bit interleaving and error-correction encoding on a plurality of input-processed PLP data, input-processed L1 -presignaling information, and input-processed L1-post signaling information.

For the operation, the BICM encoder illustrated in FIG. 11 may apply a MISO scheme or a MIMO scheme to every PLP data independently. That is, the BICM encoder of FIG. 11 may include a first BICM encoding block 604100 for processing PLP data in MISO, a second BICM encoding block 604200 for processing PLP data in MIMO, and a third BICM encoding block 604300 for processing signaling information in MISO. The third BICM encoding block 604300 may process the signaling information in MIMO. However, since the signaling information includes information required for the receiver to recover PLP data included in a transmission frame, the signaling information requires stronger transmission-reception robustness than the PLP data. Accordingly, the signaling information is processed in MISO in an embodiment of the present invention.

Hereinafter, the data processing method of each block will be described.

The first BICM encoding block 604100 includes an FEC (Forward Error Correction) encoder 604110, a bit interleaver 604120, a first demux 604130, a constellation mapper 604140, a cell interleaver 604150, a time interleaver 604160, and an MISO encoder 604170.

The FEC encoder 604110 adds a redundancy to an input bit stream, so that the receiver can perform correction on an error occurring on the transmission channel with respect to input processed PLP data and may, then, perform bit stream encoding at a coding rate, such as 1/4, 1/3, 2/5. For example, the FEC encoder 604110 may use a BCH (Bose-Chaudhuri-Hocquenghem)/LDPC (Low Density Parity Check) code, so as to add redundancy for error correction and to perform encoding.

The bit interleaver 604120 may perform bit interleaving in a single FEC block unit on the PLP data, which are processed with FEC encoding, so that the error can have robustness against a burst error, which may occur during transmission. In this case, the bit interleaver 604120 may perform bit interleaving by using two FEC block units. And, as described above, when bit interleaving is performed by using two FEC block units, cells forming a pair in the frame builder, which will be described later on, may each be generated from a different FEC block. Therefore, the broadcast signal receiver may ensure diversity so as to enhance the receiving performance.

The first demux 604130 performs demultiplexing in a single FEC block unit. In this case, the first demux 604130 may perform demultiplexing by using two FEC blocks. As described above, when demultiplexing is performed by using two FEC blocks, the cells configuring a pair in the frame builder, may each be generated from a different FEC block. Therefore, the receiver may ensure diversity, so as to gain a more enhanced receiving performance.

The constellation mapper 604140 maps the demultiplexed bit unit PLP data to the constellation. In this case, the constellation mapper 604140 may rotate the constellation by a predetermined angle in accordance with the modulation type. The rotated constellations may be expressed as an I-phase (In-phase) element and a Q-phase (Quadrature-phase) element, and the constellation mapper 604140 may delay only the Q-phase element by an arbitrary value. Thereafter, the constellation mapper 604140 may use the In-phase element and the delayed Q-phase element, so as to remap the demultiplexed PLP data to a new constellation.

The cell interleaver 604150 may perform interleaving in cell units on the PLP data mapped or remapped to the constellation, and the time interleaver 604160 may perform interleaving on the cell-interleaved PLP data in time units, so as to output the time-interleaved PLP data to the frame builder. In this case, the time interleaver 604160 may perform interleaving by using 2 FEC blocks. By performing this procedure, since the cells configuring a pair in the frame builder, which will be described later on, may each be generated from a different FEC block, the receiver may ensure diversity so as to enhance the receiving performance.

An MISO encoder 604170 may perform MISO encoding on the time-interleaved PLP data using an MISO encoding matrix and output MISO PLP data in two paths STX_k and STX_k+1. As a consequence, transmit diversity can be achieved. In an embodiment of an MISO encoding method according to the present invention, an Orthogonal Space-Time Block Code (OSTBC)/Orthogonal Space Frequency Block Code/Alamouti code (OSFBC) may be included.

The second BICM encoding block 604200 includes an FEC encoder 604210, a bit interleaver 604220, a second demux 604230, a first constellation mapper 604240-1 and a second constellation mapper 604240-2, a first cell interleaver 604250-1, a second cell interleaver 604250-2, a first time interleaver 614260-1, a second time interleaver 614260-2, and an MIMO encoder 604270.

The FEC encoder 604210 and the bit interleaver 604510 perform the same functions as the FEC encoder 604110 and the bit interleaver 604120 of the MISO method.

The second demux 604230 may perform the same functions as the first demux 604130 of the MISO method and may additionally perform demultiplexing on the PLP data, so as to output the demultiplexed PLP data through 2 input paths, which are required for the MIMO transmission. In this case, the transmission characteristics of the data being transmitted through each input path may be different from one another. Accordingly, the second demux may assign the bit-interleaved PLP data to each input path at random.

The first constellation mapper 604240-1 and the second constellation mapper 604240-2 may perform the same functions as the constellation mapper 604140 of the MISO method.

According to an embodiment of the present invention, the first cell interleaver 604250-1 and the second cell interleaver 604250-2 may perform cell interleaving only on the PLP data corresponding to half the size of an FEC block, among the PLP data inputted through each path. Accordingly, the cell interleaving process performed by the first cell interleaver 604250-1 and the second cell interleaver 604250-2 may have the same effect as the interleaving procedure performed by the cell interleaver 604140 of the MISO method. Additionally, the first cell interleaver 604250-1 and the second cell interleaver 604250-2 are advantageous in that additional memory are not assigned (or allocated) to the first cell interleaver 604250-1 and the second cell interleaver 604250-2, in order to process the data of multiple paths, and that cell interleaving may be performed by using the memory settings of the cell interleaver 604140.

The first time interleaver 614260-1 and the second time interleaver 614260-1 perform the same functions as the time interleaver 604160 of the MISO method. Also, the first time interleaver 614260-1 and the second time interleaver 614260-2 may perform time interleaving on the PLP data being inputted through each path by using the same method, or may perform time interleaving by using different methods.

An MISO encoder 604270 may perform MIMO encoding on the 2-path time-interleaved PLP data using an MIMO encoding matrix and output MIMO PLP data in two paths STX_m and STX_m+1. The MIMO encoding matrix according to the present invention may include spatial multiplexing, a Golden Code (GC), a full-rate full diversity code, a linear dispersion code, etc.

L1-signaling information may include L1-presignaling information and L1-post signaling information. The MISO scheme may be applied independently to each of the L1-presignaling information and the L1-post signaling information.

Accordingly, the third BICM encoding block 604300 may include a first encoding block 604400 for processing L1-presignaling information and a second encoding block 604500 for processing L1-post-signaling information.

The first encoding block 604400 may include an FEC encoder 604410, a constellation mapper 604420, a cell interleaver 604430, a time interleaver 604440, and an MISO encoder 604450. The second encoding block 604500 may include an FEC encoder 604510, a bit interleaver 604520, a demux 604530, a constellation mapper 604540, a cell interleaver 604550, a time interleaver 604560, and an MISO encoder 604570.

The L1-presignaling information may include information needed to decode the L1-post signaling information, and the L1-post signaling information may include information needed for the receiver to recover data transmitted from the transmitter.

That is, the receiver may need to decode the L1-presignaling information fast and accurately in order to decode the L1-signaling information and data. Therefore, the L1-presignaling information is not subject to bit interleaving and demultiplexing so that the receiver may fast decode the L1-presignaling information in an embodiment of the present invention.

Each block of the first and second encoding blocks 604400 and 604500 is the same as its counter part of the first BICM encoding block 604100 in terms of function and thus its detailed description will not be provided herein.

Eventually, the first encoding block 604400 for processing the L1-presignaling information may perform MISO encoding on the L1-presignaling information and thus output the L1-presignaling data in two paths STX_pre and STX_pre+1. The second encoding block 604500 for processing the L1-post signaling information may perform MISO encoding on the L1-post signaling information and thus output the L1-post signaling data in two paths STX_post and STX_post+1.

For the convenience' sake of description, the paths STX_k, STX_m, STX_pre, and STX_post are collectively referred to as a first path and the paths STX_k+1, STX_m+1, STX_pre+1, and STX_post+1 are collectively referred to as a second path in the present invention.

Figure 12:
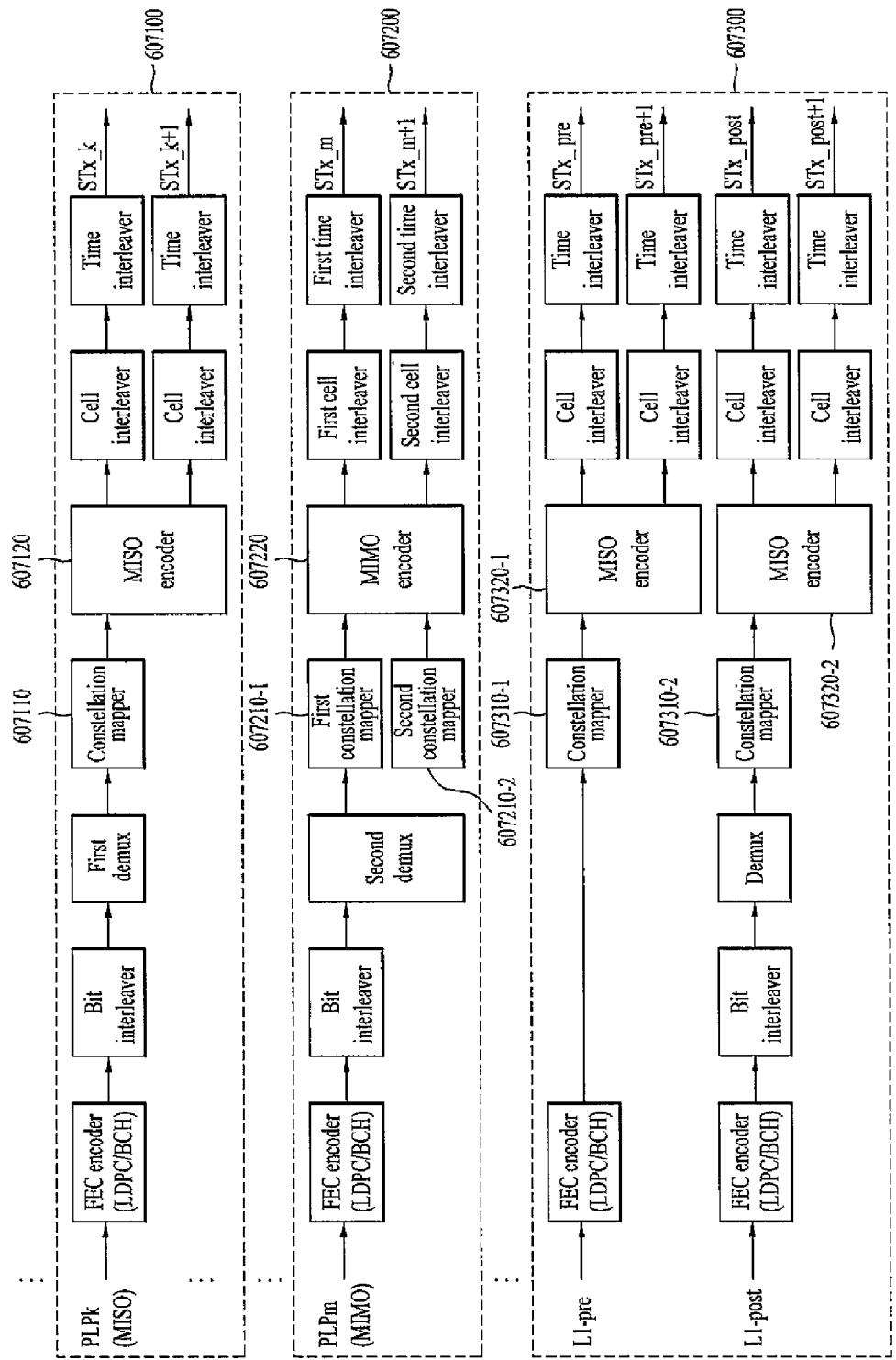
FIG. 12 illustrates a block diagram showing a BICM module according to another embodiment of the present invention.

FIG. 12 is a block diagram of a BICM module according to another embodiment of the present invention.

The BICM module illustrated in FIG. 12 is the aforedescribed BICM module according to the second embodiment. The BICM module may perform bit interleaving and error-correction encoding on a plurality of input-processed PLP data, input-processed L1-presignaling information, and input-processed L1-post signaling information.

The BICM encoder according to the second embodiment of the present invention may apply the MISO scheme or the MIMO scheme independently to every PLP data.

As illustrated in FIG. 12, the BICM encoder may include a first BICM encoding block 607100 for processing PLP data in MISO, a second BICM encoding block 607200 for processing PLP data in MIMO, and a third BICM encoding block 607300 for processing signaling information in MISO.

The BICM encoding blocks of FIG. 12 according to the second embodiment operate in the same manner as the BICM encoding blocks of FIG. 11 according to the first embodiment and thus their detailed description is not provided herein. However, the BICM encoding blocks according to the second embodiment are different from the BICM encoding blocks according to the first embodiment in that MISO encoders 607120, 607320-1, and 607320-2 and an MIMO encoder 607220 of the BICM encoding blocks are positioned at the rear ends of constellation mappers 607110, 607210-1, 607210-2, 607310-1, and 607310-2.

The PLP data or the signaling data may be processed on a symbol basis after constellation mapping. Therefore, cell interleavers, time interleaves, MISO encoders, and MIMO encoders included in the BICM encoding blocks illustrated in FIG. 11 according to the first embodiment or the BICM encoding blocks illustrated in FIG. 12 according to the second embodiment may process input data on a symbol basis. The broadcast signal receiver may perform BICM decoding on received data by reversely performing the BICM encoding of the BICM encoding blocks according to the first embodiment or the second embodiment. In addition, MISO decoders, an MIMO decoder, time interleavers, and cell deinterleavers of the broadcast signal receiver may process received data on a symbol basis.

However, the BICM decoder of the broadcast signal receiver according to the first embodiment first performs MISO decoding or MIMO decoding on each set of data and, then, outputs the data processed with MISO decoding or MIMO decoding in bit units. At this point, the data being outputted from the MISO decoder or the MIMO decoder correspond to bit-unit likelihood (or probability) information. Accordingly, hereinafter, the BICM decoder of the broadcast signal receiver may perform time deinterleaving and cell deinterleaving procedures. However, since data that are outputted in bit units are being inputted, information of symbol-unit data is also required. Therefore, since the broadcast signal receiver is required to store information on symbol mapping of the input bits, which is required for the deinterleaving procedures, the complexity level in the memory of the broadcast signal receiver may be increased.

In the BICM encoder of the second embodiment as shown in FIG. 12, MISO encoders 607100, 607300, 607400 and MIMO encoder 607200 are located at the end of the constellation mapper. Therefore, the BICM decoder of the broadcast signal receiver according to the second embodiment may perform MISO/MIMO decoding after performing both time deinterleaving and cell deinterleaving in symbol units. Accordingly, the complexity level of the memory included in the broadcast signal receiver of the first embodiment may be decreased as compared to the broadcast signal receiver of the first embodiment.

Figure 13:
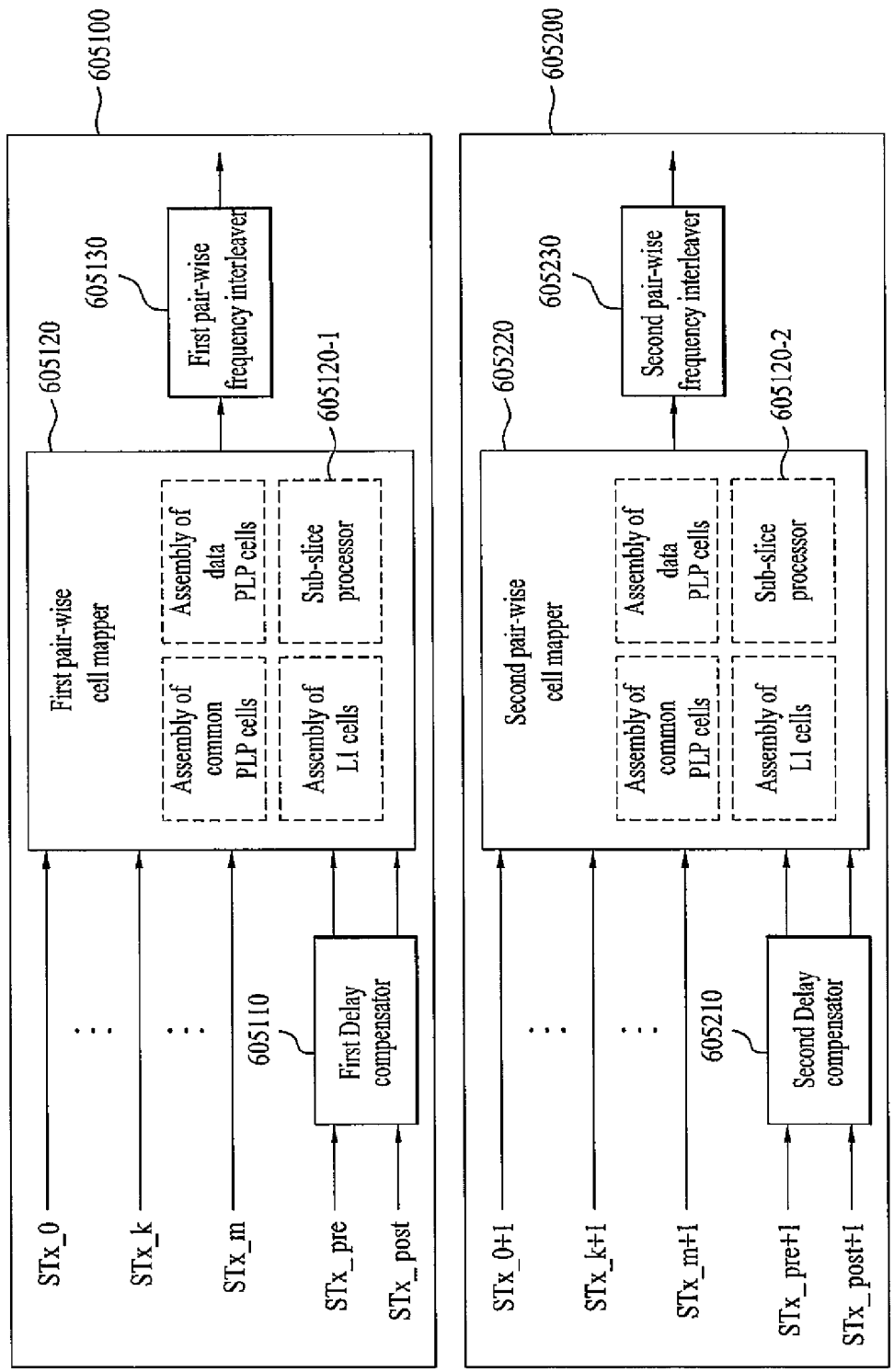
FIG. 13 illustrates a block diagram showing a frame builder according to an embodiment of the present invention.

FIG. 13 is a block diagram of a frame builder according to an embodiment of the present invention.

The frame builder illustrated in FIG. 13 is applicable to both the first and second embodiments and the following description is given in the context of the first embodiment.

As described before, the first BICM encoding block 604100 may output MISO PLP data in the two paths STX_k and STX_k+1 and the second BICM encoding block 604200 may output MIMO PLP data in the two paths STX_m and STX_m+1. The third BICM encoding block 604300 may output each of L1-presignaling information and L1-post signaling information in the two paths STX_pre and STX_pre+1 or STX_post and STX_post+1.

Each data is input to the frame builder. In this case, the frame builder may receive BICM encoder output data in the first path being the paths STX_0 to STX_post and in the second path being the paths STX_0+1 to STX_post+1, as illustrated in FIG. 13. The data received through the first path may be transmitted through a first antenna Tx_1 and the data received through the second path may be transmitted through a second antenna Tx_2.

As illustrated in FIG. 13, the frame builder according to the first embodiment of the present invention may include a first frame building block 605100 for processing the data received through the first path and a second frame building block 605200 for processing the data received through the second path. The first frame building block 605100 may include a first delay compensator 605110, a first pair-wise cell mapper 605120, and a first pair-wise frequency interleaver 605130. The second frame building block 605200 may include a second delay compensator 605210, a second pair-wise cell mapper 605220, and a second pair-wise frequency interleaver 605230.

The first pair-wise cell mapper 605120 and the first pair-wise frequency interleaver 605130 and the second pair-wise cell mapper 605220 and the second pair-wise frequency interleaver 605230 may be identically operated with respect to each of the first path and the second path and may also be independently operated.

Hereinafter, the data processing method of the blocks included in each of the first frame building block 605100 and the second frame building block 605200 will be described in detail.

The first delay compensator 605110 and the second delay compensator 605210 compensates for both the delay by one transmission frame applied to the L1-pre-signaling data or L1-post-signaling data and the delay caused by the encoding process of the BICM module. The L1 signaling information may include the information on the current transmission frame as well as the information on the next transmission frame. Therefore, during the above-described input processing procedure, the L1 signaling information is delayed by one frame as compared to the PLP data, which are currently being inputted. By performing this procedure, one transmission frame may be capable of transmitting the L1 signaling information including information on the current transmission frame and information on the next transmission frame.

The first pair-wise cell mapper 605120 and the second pair-wise cell mapper 605220 map respectively map the symbol unit PLP data and the L1 signaling data, which are inputted through each path, in cell units to the subcarrier of the OFDM symbol within the transmission frame.

In this case, the PLP data being inputted through each path may include common PLP data and MISO-MIMO-encoded PLP data. And, a sub-slice processor modules 605120-1~2 may perform sub-slicing on the PLP data cells and map the sub-sliced PLP data cells to the transmission frame, so as to gain diversity.

Additionally, the first pair-wise cell mapper 605120 and the second pair-wise cell mapper 605220 may pair 2 consecutive input cells and may map the paired cells to the transmission frame.

In order to increase the MISO signal recovery performance of the receiver, when performing MISO encoding, the MISO transmission channel is required to ensure coherence between the channels. Accordingly, in order to ensure coherence between the channels, the first pair-wise cell mapper 605120 and the second pair-wise cell mapper 605220 may respectively pair cells, which are generated from the same PLP data, and may map the paired cells to the subcarrier of the OFDM modulation, thereby maximizing the coherence between the channels.

Moreover, as described above, when bit interleaving or time interleaving is performed by the bit interleaver 604120 and the time interleaver 604160 by using two FEC blocks, since the two input cells that are grouped to form a pair may be generated from different FEC blocks, the receiver may be capable of ensuring diversity and may gain high reception performance. The first pair-wise frequency interleaver 605130 and the second pair-wise frequency interleaver 605230 may perform frequency interleaving in cell units on the data being inputted through each path. Then, the first pair-wise frequency interleaver 605130 and the second pair-wise frequency interleaver 605230 may output the frequency interleaved data to the OFDM generator through each path.

In this case, the first pair-wise frequency interleaver 605130 and the second pair-wise frequency interleaver 605230 may group 2 consecutive input cells in pairs and may process each cell pair as a single interleaving unit, thereby performing frequency interleaving. This is for maximizing the coherence between the channels.

FIG. 14 illustrates a block diagram showing a broadcast signal receiving apparatus according to an embodiment of the present invention.

In the present invention, the broadcast signal receiving apparatus may be referred to as a broadcast signal receiver or a receiver.

The broadcast signal receiving apparatus according to the present invention may include an OFDM demodulator 138100, a frame demapper 138200, a BICM decoder 138300, and an output processor 138400. The OFDM demodulator 138100, the frame demapper 138200, the BICM decoder 138300, and the output processor 138400 illustrated in FIG. 14 may perform the operations of the OFDM generator

10040, the frame builder 100300, the BICM module 100200, and the input-preprocessor 100100 in a reverse order.

The frame demapper 138200 may also be referred to as a frame parser. The OFDM demodulator 138100 converts time domain signals to frequency domain signals. Herein, the time domain signals correspond to signals being received through multiple reception antennae and then being converted to digital signals. Among the signals being converted to frequency domain signals, the frame demapper 138200 outputs the PLPs designated to required services. The BICM decider 138300 corrects errors that occur due to the transmission channel, and the output processor 138300 performs procedures required for generating an output TS or IP or GS stream.

Figure 15:
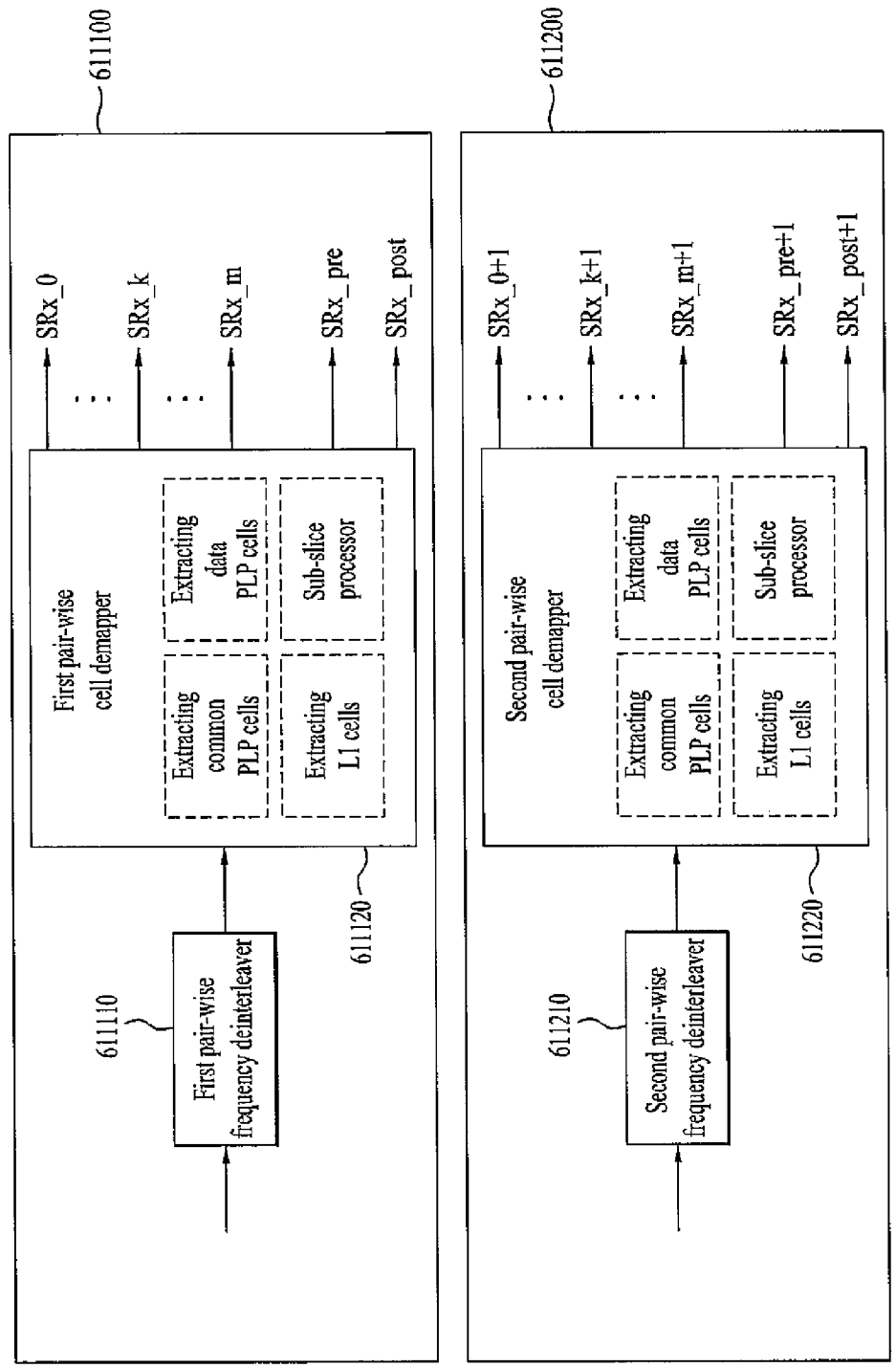
FIG. 15 illustrates a block diagram showing a frame demapper according to an embodiment of the present invention.

FIG. 15 is a block diagram of a frame demapper according to an embodiment of the present invention.

The frame demapper illustrated in FIG. 15 is applicable to both the afore-described first and second embodiments. The frame demapper may perform the operation of the frame builder illustrated in FIG. 13 in a reverse order. The following description will be given in the context of the first embodiment.

Referring to FIG. 15, the frame demapper according to the first embodiment of the present invention may include a first frame demapping block 611100 for processing data received through the first path and a second frame demapping block 611200 for processing data received through the second path. The first frame demapping block 611100 may include a first pair-wise frequency deinterleaver 611110 and a first pair-wise cell demapper 611120, and the second frame demapping block 611200 may include a second pair-wise frequency deinterleaver 611210 and a second pair-wise cell demapper 611220.

The first pair-wise frequency deinterleaver 611110 and the first pair-wise cell demapper 611120 may operate independently in the same manner with respect to the first path as the second pair-wise frequency deinterleaver 611210 and the second pair-wise cell demapper 611220 operate with respect to the second path.

Methods for processing data in blocks included in the first and second frame demapping blocks 611100 and 611200 will be described below.

The first and second pair-wise frequency deinterleavers 611110 and 611210 may deinterleave the data received through the first and second paths on a cell basis in the frequency domain. In this case, the first and second pair-wise frequency deinterleavers 611110 and 611210 may perform frequency deinterleaving by pairing two consecutive cells and using the pair as one deinterleaving unit. The deinterleaving is the reverse operation of the interleaving performed in the transmitter. The frequency-deinterleaved data is recovered in the original data order and then output.

The first and second pair-wise cell demappers 611120 and 611220 may extract common PLP data, PLP data, and L1-signaling information on a cell basis from the deinterleaved data. The extracted PLP data may include MISO PLP data to be processed in MISO and MIMO PLP data to be processed in MIMO. The extracted L1-signaling data may include information about a current transmission frame and the following transmission frame. In addition, if the transmitter performs subslicing on the PLP data, the first and second pair-wise cell demappers 611120 and 611220 may generate one stream by merging sliced PLP data.

The first and second pair-wise cell demappers 611120 and 611220 may extract two consecutive cells as a pair.

The extracted data, that is, data output through the first path may be input to the BICM decoder through paths SRx_0 to SRx_post and data output through the second path may be input to the BICM decoder through paths SRx_0+1 to SRx_post+1.

Figure 16:
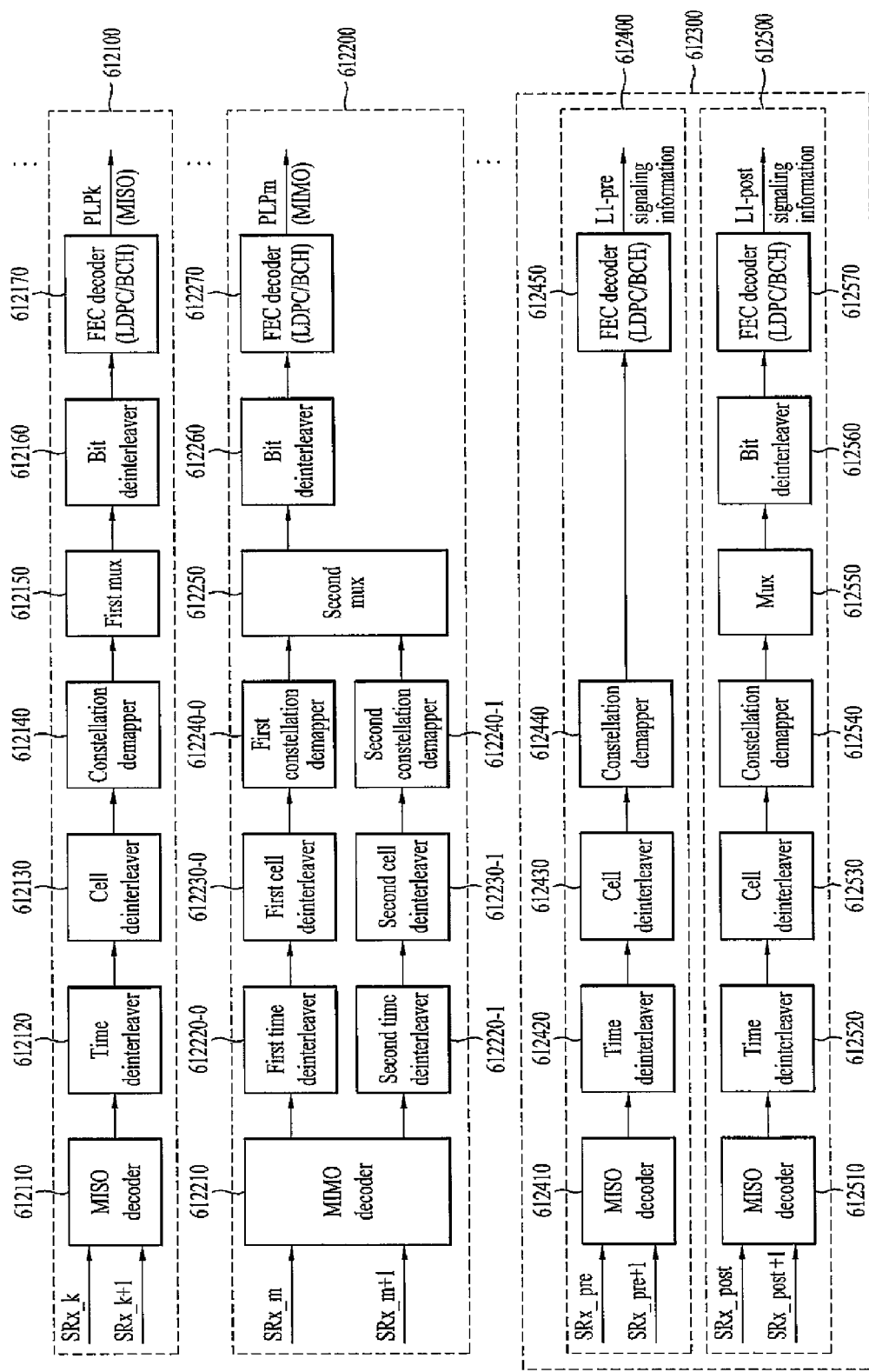
FIG. 16 illustrates a block diagram showing a BICM decoder according to an embodiment of the present invention.

FIG. 16 is a block diagram of a BICM decoder according to an embodiment of the present invention.

The BICM decoder according to the first embodiment of the present invention may receive the data output through the first path from the frame demapper through the paths SRx_0 to SRx_post and may receive the data output through the second path from the frame demapper through the paths SRx_0+1 to SRx_post+1. Then the BICM decoder may perform BICM decoding on the received data.

Further, the BICM decoder according to the first embodiment of the present invention may apply the MISO scheme or MIMO scheme dependently to the data received through each path.

That is, the BICM decoder of FIG. 13 may include a first BICM decoding block 612100 for receiving MISO PLP data to be MISO-processed through two paths SRx_k and SRx_k+1 and processing the MISO PLP data, a second BICM decoding block 612200 for receiving MIMO PLP data to be MIMO-processed through two paths SRx_m and SRx_m+1 and processing the MIMO PLP data, and a third BICM decoding block 612300 for receiving L1-signaling data to be MISO-processed through four paths SRx_pre, SRx_pre+1, SRx_post, and SRx_post+1 and processing the L1-signaling data.

The BICM decoder according to the first embodiment of the present invention may perform the operation of the BICM encoder of FIG. 11 according to the first embodiment of the present invention in a reverse order.

Now a description will be given of a method for processing data in each block.

The first BICM decoding block 612100 may include an MISO decoder 612110, a time deinterleaver 612120, a cell deinterleaver 612130, a constellation demapper 612140, a first MUX 612150, a bit deinterleaver 612160, and an FEC decoder 612170.

The MISO decoder 612110 may perform MISO decoding on MISO PLP data. The MISO decoder 612110 of the present invention may perform 4 different operations. Each operation will hereinafter be described.

First of all, when the channel estimation modules 610800-1-2 included in the OFDM demodulator do not perform channel equalization, the MISO decoder 612110 may apply a channel estimation effect on all reference points that can be transmitted, thereby being capable of calculating an LLR value. Accordingly, the same effect as channel equalization may be gained.

Secondly, the MISO decoder 612110 may perform the following operations in accordance with the operations of the constellation mapper, which is included in the BICM encoder of the broadcast signal transmitter. When the constellation mapper, which is included in the BICM encoder of the broadcast signal transmitter, rotates the constellation by a predetermined angle, and delays only the Q-phase element of the constellation by an arbitrary value, the MISO decoder 612110 may delay only the I-phase element of the constellation by an arbitrary value and may calculate the 2D-LLR value based upon the constellation rotation angle.

According to another embodiment of the present invention, when the constellation mapper, which is included in the BICM encoder of the broadcast signal transmitter, does not rotate the constellation, and does not delayed only the Q-phase element of the constellation by the arbitrary value, the MISO decoder 612110 may be capable of calculating the 2D-LLR value based upon a normal QAM.

Thirdly, the MISO decoder 612110 may select a decoding matrix, so that an inverse process of the MISO encoder, which is included in the BICM encoder of the broadcast signal transmitter, can be performed in accordance with the encoding matrix used by the MISO encoder. And, then, the MISO decoder 612110 may perform MISO decoding.

Finally, the MISO decoder 612110 may merge signals, which are received through 2 reception antennae. The signal merging method according to the present invention may include maximum ratio combining, equal gain combining, selective combining, and so on. In this case, the MISO decoder 612110 may maximize the SNR of the merged signal, so as to gain a diversity effect.

Additionally, the MISO decoder 612110 may perform MISO decoding on a signal, which is processed with signal merging. Then, after performing MISO decoding on the input of the two antennae, the MISO decoder 612110 may merge the MISO decoded signals.

The time deinterleaver 612120 performs deinterleaving in a time domain on the MISO-decoded data so as to recover the data to the initial position, and the cell deinterleaver 612130 may perform deinterleaving on the time-deinterleaved data in cell units.

The constellation demapper 612140 may perform the following functions in accordance with the operations of the MISO decoder 612110.

First of all, in case the MISO decoder 612110 performs only MISO-decoding without directly outputting the LLR value, the constellation demapper 612140 may calculate the LLR value. More specifically, a detailed description will hereinafter be made. When constellation rotation and Q-phase element delay are performed by the constellation demapper, which is included in the BICM encoder of the broadcast signal transmitting apparatus, the constellation demapper 612140 may first delay an I-phase element and may then calculate the LLR value. If the constellation demapper, which is included in the BICM encoder of the broadcast signal transmitting apparatus, does not perform constellation rotation and Q-phase element delay, the constellation demapper 612140 may calculate an LLR value based upon a normal QAM standard.

The method for calculating the LLR value may include a method for calculating a 2-D LLR and a method for calculating a 1-D LLR value. In case of calculating the 1-D LLR value, any one of the input to the first path and the input to the second path is performed, so as to reduce the complexity in the LLR calculation.

The first mux 612150 may recover the demapped data to a bit stream format.

The bit deinterleaver 612160 performs deinterleaving on the inputted bit stream, and the FEC decoder 612170 performs FEC-decoding on the data processed with deinterleaving, so as to perform error correction over the transmission channel, thereby outputting the MISO PLP data.

The second BICM decoding block 612200 may include an MIMO decoder 612210, a first time deinterleaver 612220-0 and a second time deinterleaver 612220-1, a first cell deinterleaver 612230-0 and a second cell deinterleaver 612230-1, a first constellation demapper 612240-0 and a second constellation demapper 612240-1, a second mux 612250, a bit deinterleaver 612260, and an FEC decoder 612270.

The MIMO decoder 612210 may perform MIMO decoding on the MIMO PLP data received through the two paths SRx_m and SRx_m+1. The MIMO decoder 612210 may perform the other operations except for the fourth operation, that is, signal combining among four operations of the MISO decoder 612110 in the same manner as the MISO decoder 612110.

The first time deinterleaver 612220-0 and the second time deinterleaver 612220-1 may perform deinterleaving in a time domain on the MIMO decoded data in cell units, so as to recover data by the initial (or original) data order. In this case, the first cell deinterleaver 612230-0 and the second cell deinterleaver 612230-1 may perform cell deinterleaving only on the data corresponding to half the size of a cell included in an FEC block, among the data being inputted through each path. Eventually, the cell deinterleaving performed by the first cell deinterleaver 612230-0 and the second cell deinterleaver 612230-1 may have the same effect as the deinterleaving performed by the MISO type cell deinterleaver 612130 by using one FEC block.

The first constellation demapper 612240-0, the second constellation demapper 612240-1, the second mux 612250, the bit deinterleaver 612260, and the FEC decoder 612270 may perform the same functions as the MISO method.

The third BICM decoding block 612300 includes a first decoding block 612400 for processing L1-pre-signaling data and a second decoding block 612500 for processing L1-post-signaling data.

The first decoding block 612400 may include an MIMO decoder 612410, a time deinterleaver 612420, a cell deinterleaver 612430, a constellation demapper 612440, and an FEC decoder 612450, and the second decoding block 612500 may include an MIMO decoder 612510 a time deinterleaver 612520, a cell deinterleaver 612530, a constellation demapper 612540, a mux 612550, a bit deinterleaver 612560, and an FEC decoder 612570.

Hereinafter, since the functions of each block included in the first decoding block 612400 and the second decoding block 612500 are identical to the respective blocks included in the first BICM decoding block 612100, a detailed description of the same will be omitted.

Eventually, the first BICM decoding block 612100 may output the BICM-decoded MISO PLP data to the output processor, and the second BICM decoding block 612200 may output the BICM-decoded MIMO PLP data to the output processor. Also, the first decoding block 612400 included in the third BICM decoding block 612300 may perform MISO decoding on L1-pre-signaling data to output L1-pre-signaling information, and the second decoding block 612500 of the third BICM decoding block 612300 may perform MISO decoding on L1-post-signaling data to output single L1-post-signaling information.

Figure 17:
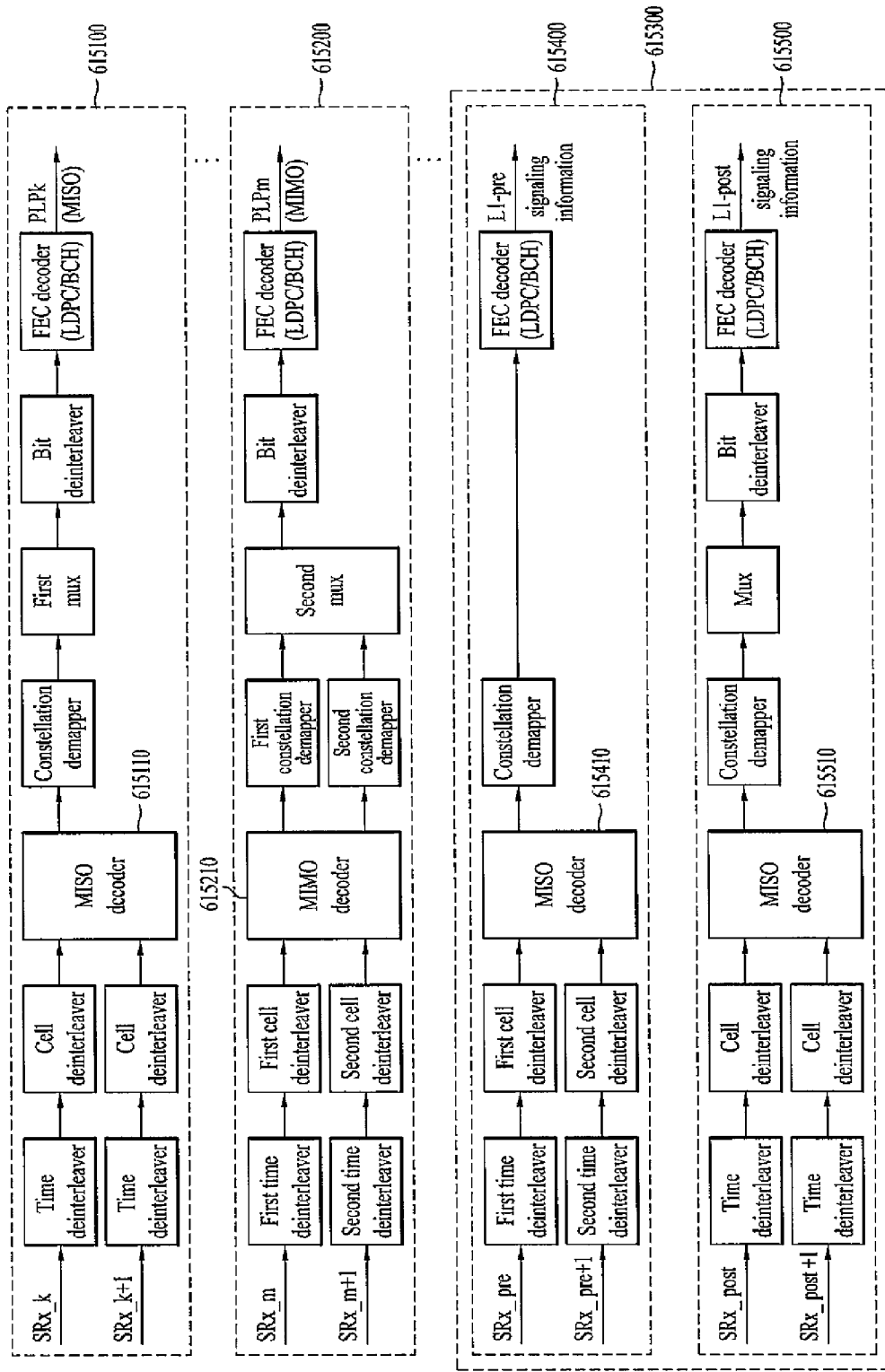
FIG. 17 illustrates a block diagram showing a BICM decoder according to another embodiment of the present invention.

FIG. 17 illustrates a block diagram showing a BICM decoder according to another embodiment of the present invention.

The BICM decoder according to a second embodiment of the present invention receives data SRx_0 to SRx_post output through the first path from the frame demapper and data SRx_0+1 to SRx_post+1 output through the second path from the frame demapper. Furthermore, the BICM decoder according to a second embodiment of the present invention may apply independently the MISO method or the MIMO method on the data being inputted from each path.

That is, the BICM decoder of FIG. 17 includes a first BICM decoding block 615100 receiving MISO PLP data to which the MISO method is applied from 2 paths (SRx_k, SRx_k+1) and processing the received MISO PLP data, a second BICM decoding block 615200 receiving MIMO PLP data to which the MIMO method is applied from 2 paths (SRx_m, SRx_m+1) and processing the received MIMO PLP data, and a third BICM decoding block 615300 receiving L1 signaling data from 4 paths (SRx_pre, SRx_pre+1, SRx_post, SRx_post+1) and processing the received L1 signaling data.

Moreover, the third BICM decoding block 615300 may include a first decoding block 615400 for processing L1-pre-signaling data and a second decoding block 615500 for processing L1-post-signaling data.

In addition, the BICM decoder according to a second embodiment of the present invention may perform inverse operation processes of the BICM encoder according to the second embodiment shown in FIG. 14.

The BICM decoding blocks of FIG. 17 according to the second embodiment operate in the same manner as the BICM decoding blocks of FIG. 16 according to the first embodiment and thus they will not be described in detail. However, the BICM decoder according to the second embodiment differs from the BICM decoder according to the first embodiment in that MISO decoders 615110, 615410, and 615510 and an MIMO decoder 615210 are disposed at the rear end of cell deinterleavers.

As described before with reference to FIG. 12, because the BICM decoder according to the second embodiment performs MISO/MIMO decoding after performing time deinterleaving and cell deinterleaving on a symbol basis, the memory complexity of the broadcast signal receiver can be reduced.

Consequently, the first BICM decoding block 615100 may output the BICM-decoded MISO PLP data to the output processor and the second BICM decoding block 615200 may output the BICM-decoded MIMO PLP data to the output processor. The first decoding block 615400 of the third BICM decoding block 615300 may output L1 -presignaling information by performing MISO decoding on the L1-presignaling data. The second decoding block 615500 of the third BICM decoding block 615300 may output L1 -post signaling information by performing MISO decoding on the L1-post signaling data.

Hereinafter, a signaling method of the signaling method according to the present invention will be described in detail. The signal frame according to the present invention may be divided into a preamble region and a data region, and the preamble region may be configured of a P1 symbol and one or more P2 symbols, and the data region may be configured of multiple data symbols. At this point, the preamble region may further include an AP1 symbol after the P1 symbol. And, in this case, the P1 symbol and the AP1 symbol may be consecutively transmitted.

Herein, the P1 symbol transmits P1 signaling information, the AP1 symbol transmits AP1 signaling information, and the one or more P2 symbol each transmits L1 signaling information and signaling information included in the common PLP (i.e., L2 signaling information). The signaling information being included in the common PLP may be transmitted through a data symbol. Therefore, in light of a signal frame over a physical layer, the preamble region may include a P1 signaling information region to which the P1 signaling information is signaled, an L1 signaling information region to which the L1 signaling information is signaled, and an entire portion or a partial portion of a common PLP region to which the L2 signaling information is signaled. Herein, the common PLP region may also be referred to as an L2 signaling information region and the common PLP may be included in the L2 signaling information region. If a signal frame includes an AP1 symbol, the preamble region includes the P1 signaling information region, the AP1 signaling information region, the L1 signaling information region, and an entire portion or a partial portion of the common PLP region.

The L1 signaling information includes L1-pre-signaling information and L1-post-signaling information. The L1-post-signaling information then includes Configurable L1 -post-signaling information, Dynamic L1-post-signaling information, Extension L1-post-signaling information, and CRC information, and may further include L1 padding data.

FIG. 18 illustrates an exemplary syntax structure of P1 signaling information according to an embodiment of the present invention.

According to the embodiment of the present invention, in FIG. 18, the P1 signaling information is assigned with 7 bits and includes a 3-bit S1 field and a 4-bit S2 field. In the S2 field, among the 4 bits, the first 3 bits are described as S2 field1 and the 1 bit is described as S2 field2.

The S1 field signals a preamble format. For example, when the S1 field value is equal to 000, this indicates that the preamble corresponds to a T2 preamble, and that data are transmitted in an SISO format (T2_SISO). When the S1 field value is equal to 001, this indicates that the preamble corresponds to a T2 preamble, and that data are transmitted in an MISO format (T2_MISO). When the S1 field value is equal to 010, this indicates that the preamble corresponds to a non-T2 preamble.

The S2 field signals FFT size information. According to the embodiment of the present invention, the FFT size may correspond to 1 k, 2 k, 4 k, 8 k, 16 k, and the GI size may correspond to 1/128, 1/32, 1/16, 19/256, 1/8, 19/128, 1/4. The FFT size signifies a number of subcarriers configuring a single OFDM symbol. When the S2 filed2 value is equal to 0, this indicates that, in the current transmission, all preambles are being transmitted as the same type, and when the field value is equal to 1, this indicates that the preambles are each transmitted as different types.

FIG. 19 illustrates an exemplary syntax structure of AP1 signaling information according to an embodiment of the present invention.

According to the embodiment of the present invention, in FIG. 19, the AP1 signaling information is assigned with 7 bits and includes a 4-bit PILOT_PATTERN field and a 3-bit L1_PRE_SPREAD_LENGTH field.

The PILOT_PATTERN field indicates a pilot pattern of the corresponding signal frame. In the present invention, by transmitting pilot pattern information through the AP1 symbol, even when the P2 symbol is not transmitted, and even when the L1 signaling information is spread to data symbols of the data region, the receiver may be aware of the pilot pattern prior to decoding the L1 signaling information of the data region.

The L1_PRE_SPREAD_LENGTH field indicates a length of a section within the data region in which the L1-pre-signaling information is spread. More specifically, among the data symbols of the signal frame, this field indicates a number of data symbols included in a section to which the L1-pre-signaling information is being spread. In the present invention, the section to which the L1-pre-signaling information is being spread will be referred to as an L1 pre spread section. If the L1_PRE_SPREAD_LENGTH field value is equal to '000', this indicates that the L1 signaling information is not spread in the data region of the corresponding signal frame.

In FIG. 19, since the fields included in the AP1 signaling information and significance of the values of each field are merely examples given to facilitate the understanding of the present invention, and since the fields that can be included in the AP1 signaling information and the significance of the respective field values may be easily modified by anyone skilled in the art, the present invention will not be limited only to the examples given herein.

FIG. 20 illustrates an exemplary syntax structure of L1-pre-signaling information according to an embodiment of the present invention.

The L1-pre-signaling information includes information required for decoding the L1-post-signaling information.

The fields being included in the L1-pre-signaling information of FIG. 20 will hereinafter be described in detail.

A TYPE field may be assigned with 8 bits and may indicate the type of an input stream being transmitted in a super frame. More specifically, the input stream may correspond to TS, GS, TS+GS, IP, and so on, and such identification may use the TYPE field.

A BWT_EXT field is assigned with 1 bit and may indicate whether or not a bandwidth extension of an OFDM symbol is to be performed.

An S1 field is assigned with 3 bits and performs the same role as the S1 field included in the P1 signaling information of FIG. 18. An S2 field is assigned with 4 bits and performs the same role as the S2 field included in the P1 signaling information of FIG. 18. According to the embodiment of the present invention, an L1_REPETITION_FLAG field is assigned with 1 bit and may indicate whether or not L1-post-signaling information related to the current frame is signaled to the P2 symbol. If the L1 signaling information of the next signal frame is configured to have a structure to which the data symbols of the current signal frame are spread, the L1_REPETITION_FLAG field may also be used in order to indicate whether or not the L1 signaling information of the next signal frame has been spread to the current signal frame. For example, when the L1_REPETITION_FLAG field is equal to 1, this indicates that the L1 signaling information has been spread to the current signal frame, and when the corresponding field is equal to 0, this indicates that the L1 signaling information has not been spread to the current signal frame.

A GUARD_INTERVAL field is assigned with 3 bits and indicates a GI size of the current transmission frame. The GI size indicates an occupation ratio of the GI within a single OFDM symbol. Accordingly, the OFDM symbol length may vary depending upon the FFT size and the GI size.

A PAPR field is assigned with 4 bits and indicates a PAPR reduction method. The PAPR method used in the present invention may correspond to an ACE method or a TR method.

An L1_MOD field is assigned with 4 bits and may indicate a QAM modulation type of the L1-post-signaling information.

An L1_COD field is assigned with 2 bits and may indicate a code rate of the L1-post-signaling information.

An L1_FEC_TYPE field is assigned with 2 bits and may indicate an FEC type of the L1-post-signaling information.

An L1_POST_SIZE field is assigned with 18 bits and may indicate the size of the coded and modulated L1-post-signaling information.

An L1_POST_INFO_SIZE field is assigned with 18 bits and may indicate the size of the L1-post-signaling information in bit units.

A PILOT_PATTERN field is assigned with 4 bits and may indicate a distributed pilot pattern that is inserted in the current signal frame.

A TX_ID_AVAILABILITY field is assigned with 8 bits and may indicate a transmitting apparatus identification capability within the current geographical cell range.

A CELL_ID field is assigned with 16 bits and may indicate an identifier identifying a geographical cell within a network for mobile broadcasting (NGH).

A NETWORK_ID field is assigned with 16 bits and may indicate an identifier identifying the current network.

A SYSTEM_ID field is assigned with 16 bits and may indicate an identifier identifying the system.

A NUM_NGH_FRAMES field is assigned with 8 bits and may indicate a number of NGH frame within the current super frame.

A NUM_T2_FRAMES field is assigned with 8 bits and may indicate a number of T2 frame within the current super frame. This field is useful for determining the super frame structure and may be used for calculating the information for directly hopping to the next NGH frame.

A L1_POST_SPREAD_LENGTH field is assigned with 12 bits and may indicate the length of a section within the data region to which the L1-post-signaling information is being spread. More specifically, among the data symbols of the signal frame, this field may indicate the number of data symbols being included in the section to which the L1-post-signaling information is being spread. In the present invention, the section to which the L1-post-signaling information is being spread will be referred to as an L1 post spread section. If all of the L1_POST_SPREAD_LENGTH field value is equal to 0, this signifies that the L1-post-signaling information is not spread to the data region of the corresponding signal frame.

A NUM_DATA_SYMBOLS field is assigned with 12 bits and may indicate a number of data symbols included in the current signal frame, with the exception for the P1, AP1, P2 symbols.

A NUM_MISO_SYMBOLS field is assigned with 12 bits and may indicate a number of MISO symbols among the diverse data symbols.

An MIMO_SYMBOL_INTERVAL field is assigned with 12 bits and may indicate a number of MISO symbols between two MIMO symbol parts.

An MIMO_SYMBOL_LENGTH field is assigned with 12 bits and may indicate a number of MIMO symbols in one MIMO symbol part.

A REGEN_FLAG field is assigned with 3 bits and may indicate and may indicate a number of signal regeneration performed by the repeater.

An L1_POST_EXTENSION field is assigned with 1 bit and may indicate whether or not an extension field exits in the L1-post-signaling information.

A NUM_RF field is assigned with 3 bits and may indicate a number of RFs within the current system.

A CURRENT_RF_IDX field is assigned with 3 bits and may indicate an index of the current RF channel.

A RESERVED field is assigned with 10 bits and corresponds to a field that is reserved for future usage.

A CRC-32 field is assigned with 32 bits and may indicate a CRC error extraction code of the 32 bits.

In FIG. 20, since the fields included in the L1-pre-signaling information and significance of the values of each field are merely examples given to facilitate the understanding of the present invention, and since the fields that can be included in the L1-pre-signaling information and the significance of the respective field values may be easily modified by anyone skilled in the art, the present invention will not be limited only to the examples given herein.

FIG. 21 illustrates an exemplary syntax structure of configurable L1-post-signaling information according to an embodiment of the present invention.

The configurable L1-post-signaling information may include parameters required by the receiver for decoding a PLP and, more particularly, configurable L1-post-signaling information may include diverse information that can be equally applied during a signal frame.

The fields being included in the configurable L1-post-signaling information of FIG. 21 will hereinafter be described in detail.

A SUB_SLICES_PER_FRAME field is assigned with 15 bits and may indicate a number of sub-slices included in a signal frame.

A NUM_PLP field is assigned with 8 bits and may indicate a number of PLPs within the current super frame.

A NUM_AUX field is assigned with 4 bits and may indicate a number of auxiliary streams.

An AUX_CONFIG_RFU field is assigned with 8 bits and corresponds to a region reserved for a future usage.

Subsequently, a "for loop" (hereinafter referred to as a frequency loop), which is repeated as many times as the number of RFs within the current system, is signaled. The NUM_RF field is signaled to the L1-pre-signaling information.

Hereinafter, fields being included in the frequency loop will be described in detail.

An RF_IDX field is assigned with 3 bits and may indicate an index of each frequency within an RF channel.

A FREQUENCY field is assigned with 32 bits and may indicate a center frequency of the RF channel.

An FEF_TYPE field, an FEF_LENGTH field, and an FEF_INTERVAL field, which are shown below, correspond to fields that are used only when the LSB of the S2 field is equal to 1, i.e., when the S2 field is expressed as S2='xxx1'.

The FEF_TYPE field is assigned with 4 bits and may indicate an FEF (Future extension frame) type.

The FEF_LENGTH field is assigned with 22 bits and may indicate a number of elementary periods of a related FEF part.

The FEF_INTERVAL field is assigned with 8 bits and may indicate a number of T2 frames existing between two FRF parts.

A NEXT_NGH_SUPERFRAME field is assigned with 8 bits and may indicate a number of super frames existing between the current super frame and the next super frame, which includes the next NGH frame.

A RESERVED_2 field is assigned with 32 bits and corresponds to a field that is reserved for a future usage.

Subsequently, a "for loop" (hereinafter referred to as an auxiliary stream loop), which is repeated as many times as the number of auxiliary streams (NUM_AUX field value-1), is signaled, a 32-bit AUX_RFU field, which is reserved for a future usage, is included herein.

Subsequently, a "for loop" (hereinafter referred to as a PLP loop), which is repeated as many times as the number of PLPs within the current super frame (NUM_PLP field value-1), is signaled.

Hereinafter, fields being included in the PLP loop will be described in detail.

A PLP_ID field is assigned with 8 bits and may indicate an identifier identifying the corresponding PLP.

A PLP_TYPE field is assigned with 3 bits and may indicate whether the corresponding PLP corresponds to a common PLP, a Type1 data PLP, or a Type2 data PLP. Additionally, the PLP_TYPE field may indicate whether the corresponding PLP corresponds to a PLP being included in a plurality of PLP groups, or to a group PLP being included in a single PLP group.

A PLP_PAYLOAD_TYPE field is assigned with 5 bits and may indicate the type of a PLP payload. More specifically, the data included in the payload of the PLP may correspond to GFPS, GCS, GSE, TS, IP, and so on, and such identification may use the PLP_PAYLOAD_TYPE field.

The PLP_PROFILE field is assigned with 2 bits and may indicate a profile of the corresponding PLP. More specifically, this field indicates whether the corresponding field is a mandatory (or required) PLP or an optional (or selective) PLP. For example, when the PLP of the video data is identified as a PLP for transmitting a base layer and a PLP for transmitting an enhancement layer, the PLP transmitting the base layer becomes the mandatory PLP, and the PLP transmitting the enhancement layer becomes the optional PLP. Additionally, the common PLP corresponds to a mandatory PLP. More specifically, depending upon the receiver characteristic, such as a mobile receiver, a fixed-type receiver, and so on, the receiver may use the PLP_PROFILE field so as to verify by which receiver the component of the broadcast service being transmitted to the current PLP may be used, and depending upon the receiver characteristic, the receiver may determine whether or not to receive the current PLP.

An FF_FLAG field is assigned with 1 bit and, when 2 or more RF channels are being used, this field may indicate a fixed frequency mode.

A FIRST_RF_IDX field is assigned with 3 bits and may indicate an RF index of a first signal frame of the corresponding PLP.

A FIRST_FRAME_IDX field is assigned with 8 bits and may indicate a frame index of the first signal frame of the corresponding PLP.

A PLP_GROUP_ID field is assigned with 8 bits and may indicate an identifier identifying a PLP group related to the corresponding PLP.

A PLP_COD field is assigned with 3 bits and may indicate the code rate of the corresponding PLP. In the present invention, any one of the code rates of 1/4, 1/3, 2/5, 1/2, 3/5, 2/3, 3/4, 4/5, 5/6 may be used in the corresponding PLP.

A PLP_MOD field is assigned with 3 bits and may indicate a constellation size (i.e., modulation format) of the corresponding PLP. In the present invention, any one of the modulation formats (or modulations types) of BPSK, QPSK, 16QAM, 64QAM, 256QAM may be used.

A PLP_MIMO_TYPE field is assigned with 2 bits and may indicate whether the corresponding PLP corresponds to an MIMO type or an MISO type.

For example, a PLP_MOD field value, i.e., the constellation size may be decided by a combination with the PLP_MIMO_TYPE field. If the PLP_MIMO_TYPE field value indicates the MISO, the PLP_MOD field may be used for symbol re-mapping. If the PLP_MIMO_TYPE field value indicates the MIMO, after performing MIMO processing, the PLP_MOD field may be interpreted as a constellation size having a spectrum effect, as a result of the MIMO processing.

A PLP_ROTATION field is assigned with 1 bit and may indicate whether or not constellation rotation and re-mapping of the PLP has been used.

A PLP_FEC_TYPE field is assigned with 2 bits and may indicate an FEC type of the corresponding PLP.

A PLP_NUM_BLOCKS_MAX field is assigned with 10 bits and may indicate a maximum number of PLPs included in the FEC blocks.

A FRAME_INTERVAL field is assigned with 8 bits and may indicate a T2 frame interval within a super frame, when inter-frame interleaving is applied.

A TIME_IL_LENGTH field is assigned with 8 bits and may indicate a time interleaver length (or depth).

A TIME_IL_TYPE field is assigned with 1 bit and may indicate the time interleaver type.

An IN_BAND_FLAG field is assigned with 1 bit and may indicate whether or not in-band signaling exists.

A RESERVED_1 field is assigned with 16 bits and corresponds to a field that is reserved in the PLP loop for a future usage.

The PLP loop may further include a PLP_COMPONENT_TYPE field. The PLP_COMPONENT_TYPE field is assigned with 8 bits and may indicate the type of data (or service component) being transmitted through the corresponding PLP. Therefore, based upon the PLP_COMPONENT_TYPE field, the receiver may be capable of determining whether the type of the component being transmitted through the corresponding PLP corresponds to base layer video component, an enhancement layer video component, an audio component, or a data component.

According to an embodiment of the present invention, the PLP group may also be referred to as an LLP (Link-Layer-Pipe), and the PLP_GROUP_ID field may also be referred to as an LLP_ID field. Most particularly, an NIT, which is to be described later on, includes a PLP_GROUP_ID field, which is identical to the PLP_GROUP_ID field included in the L1 signaling information. And, the NIT may also include a transport_stream_id field for identifying a transmission stream related to the PLP group. Therefore, by using the NIT, the receiver may be capable of knowing to which PLP group a specific stream is related. More specifically, in order to simultaneously decode streams (e.g., TSs) being transmitted through PLPs having the same PLP_GROUP_ID, the streams that are indicated by the transport_stream_id field of the NIT may be merged, thereby being capable of recovering a single service stream.

If the broadcast signal is transmitted in an IP format, the receiver may use the PLP_GROUP_ID field, so as to locate and find the service components related to a single service. And, by merging such service components, a single service may be recovered. Accordingly, the receiver should be capable of simultaneously receiving PLPs having the same PLP_GROUP_ID.

In FIG. 21, since the fields included in the configurable L1-post-signaling information and significance of the values of each field are merely examples given to facilitate the understanding of the present invention, and since the fields that can be included in the configurable L1-post-signaling information and the significance of the respective field values may be easily modified by anyone skilled in the art, the present invention will not be limited only to the examples given herein.

FIG. 22 illustrates an exemplary syntax structure of dynamic L1-post-signaling information according to an embodiment of the present invention.

The dynamic L1-post-signaling information may include parameters required by the receiver for decoding a PLP and, more particularly, the dynamic L1-post-signaling information may include characteristic information corresponding to a signal frame that is currently being transmitted. Additionally, the dynamic L1-post-signaling information may also be signaled to an in-band, so that that the receiver can efficiently process slicing.

The fields being included in the dynamic L1-post-signaling information of FIG. 22 will hereinafter be described in detail.

A FRAME_IDX field is assigned with 8 bits and may indicate an index of a current signal frame within the super frame. For example, an index of the first signal frame within the super frame may be set to 0.

A SUB_SLICE_INTERVAL field is assigned with 22 bits and may indicate a number of OFDM cell existing between two sub-slices within the same PLP.

A TYPE_2_START field is assigned with 22 bits and may indicate a starting position among the OFDM cells of the Type2 data PLPs.

An L1_CHANGE_COUNTER field is assigned with 8 bits and may indicate a number of super frame that remain before the L1 configuration (e.g., contents of the fields included in the L1 pre signaling or content of a configurable part in the L1 post signaling).

A START_RF_IDX field is assigned with 3 bits and may indicate a start RF index of a next signal frame.

A RESERVED_1 field is assigned with 8 bits and corresponds to a field that is reserved for a future usage.

A NEXT_NGH_FRAME field is assigned with 8 bits and corresponds to a field that is used only when the LSB of the S2 field is equal to 1, i.e., when the S2 field is expressed as S2='xxx1'. A NEXT_NGH_SUPERFRAME field indicates a number of T2 or FEF frames existing between the first T2 frame within the next super frame, which includes an NGH frame, and the next NGH frame. The NEXT_NGH_FRAME field and the NEXT_NGH_SUPERFRAME field may be used by the receiver for calculating a hopping amount for hopping to the next NGH frame. More specifically, the NEXT_NGH_FRAME field and the NEXT_NGH_SUPERFRAME field provide an efficient hopping mechanism, when a large number of T2 frames are mixed with the FEF, and when not all of the FEFs are used only for the NGH frames. Most particularly, the receiver may perform hopping to the next NGH frame without having to detect the P1 signaling information of all signal frames existing in the super frame and to decode the detected P1 signaling information.

Subsequently, a "for loop" (hereinafter referred to as a PLP loop), which is repeated as many times as the number of PLPs existing within the current super frame (NUM_PLP field value-1), is signaled.

A PLP_ID field, a PLP_START field, and a PLP_NUM_BLOCKS field are included in the PLP loop. And, each field will hereinafter be described in detail.

The PLP_ID field is assigned with 8 bits and may indicate an identifier identifying a PLP.

The PLP_START field is assigned with 22 bits and may indicate a starting position of OFDM cells of the current PLP.

The PLP_NUM_BLOCKS field is assigned with 10 bits and may indicate a number of FEC blocks related to the current PLP.

A RESERVED_2 field is assigned with 8 bits and corresponds to a field included in the PLP loop that is reserved for a future usage.

A RESERVED_3 field is assigned with 8 bits and corresponds to a field that is reserved for a future usage.

Field included in an auxiliary stream loop will hereinafter be described.

Subsequently, a "for loop" (hereinafter referred to as an auxiliary stream loop), which is repeated as many times as the number of auxiliary streams (NUM_AUX field value-1), is signaled, and a 48-bit AUX_RFU field is included herein for a future usage.

In FIG. 22, since the fields included in the dynamic L1-post-signaling information and significance of the values of each field are merely examples given to facilitate the understanding of the present invention, and since the fields that can be included in the dynamic L1-post-signaling information and the significance of the respective field values may be easily modified by anyone skilled in the art, the present invention will not be limited only to the examples given herein.

Meanwhile, the present invention may signal a PLP or a correlation between a PLP and service components, by using at least one of the PLP_GROUP_ID field, the PLP_TYPE field, and the PLP_COMPONENT_TYPE field of the PLP loop within the configurable L1-post-signaling information. Additionally, the present invention may also know the operation characteristics, such as the mobile performance and data communication characteristics, of the PLP by using the PLP_COD field and the PLP_MOD field.

Hereinafter, when a broadcast signal is a IP format, a signaling method for signaling a PLP or a correlation between a PLP and service components, by using the PLP_GROUP_ID field, the PLP_TYPE field, and the PLP_COMPONENT_TYPE field, will be described in detail.

More specifically, when a broadcast signal is transmitted in an IP format according to an embodiment of the present invention, the receiver may merge components being transmitted by the PLPs included in the same PLP group, by using a correlation between a service and a PLP, which transmits the components included in the service and then the receiver may recover single service.

The signaling of L1 signaling information, L2 signaling information, PAT/PMT, and so on, respective to the correlation between the PLPs, IP streams, the service, and the components according to an embodiment of the present invention may be performed by the input pre-processor 100000 or input processor 100100 of the broadcast signal transmitting apparatus (or transmitter), or may be performed by the BICM module 100200.

The input pre-processor shown in FIG. 8 may perform signaling of the L1 signaling information and L2 signaling information, and may generate PLPS including ESG, provider information, bootstrap information, and so on, and component PLPs configuring a service. In this case, the L2 signaling information may an IP information table.

According to yet another embodiment of the present invention, signaling of the L1 signaling information, shown in FIG. 20 to FIG. 22, may be performed by an L1 signaling generator included in the input processor or an L1 signaling generator included in the BICM module.

At this point, PLPs generated from the input pre-processor may be encoded by using the MISO method and then transmitted, or may be encoded by using the MIMO method and then transmitted. In the present invention, the PLP data being transmitted by using the MISO method may be referred to as MISO PLP data, and the PLP data being transmitted by using the MIMO method may be referred to as MIMO PLP data.

Meanwhile, according to an embodiment of the present invention, in the broadcast signal receiving apparatus (also referred to as a receiver), any one of the frame demapper, the BICM decoder, and the output processor may perform decoding on a PLP, a TS (or an IP stream), a service, L1/L2 signaling information to which the correlation between the components is signaled, PAT/PMT or ESG, provider information, bootstrap information, and so on.

Figure 23:
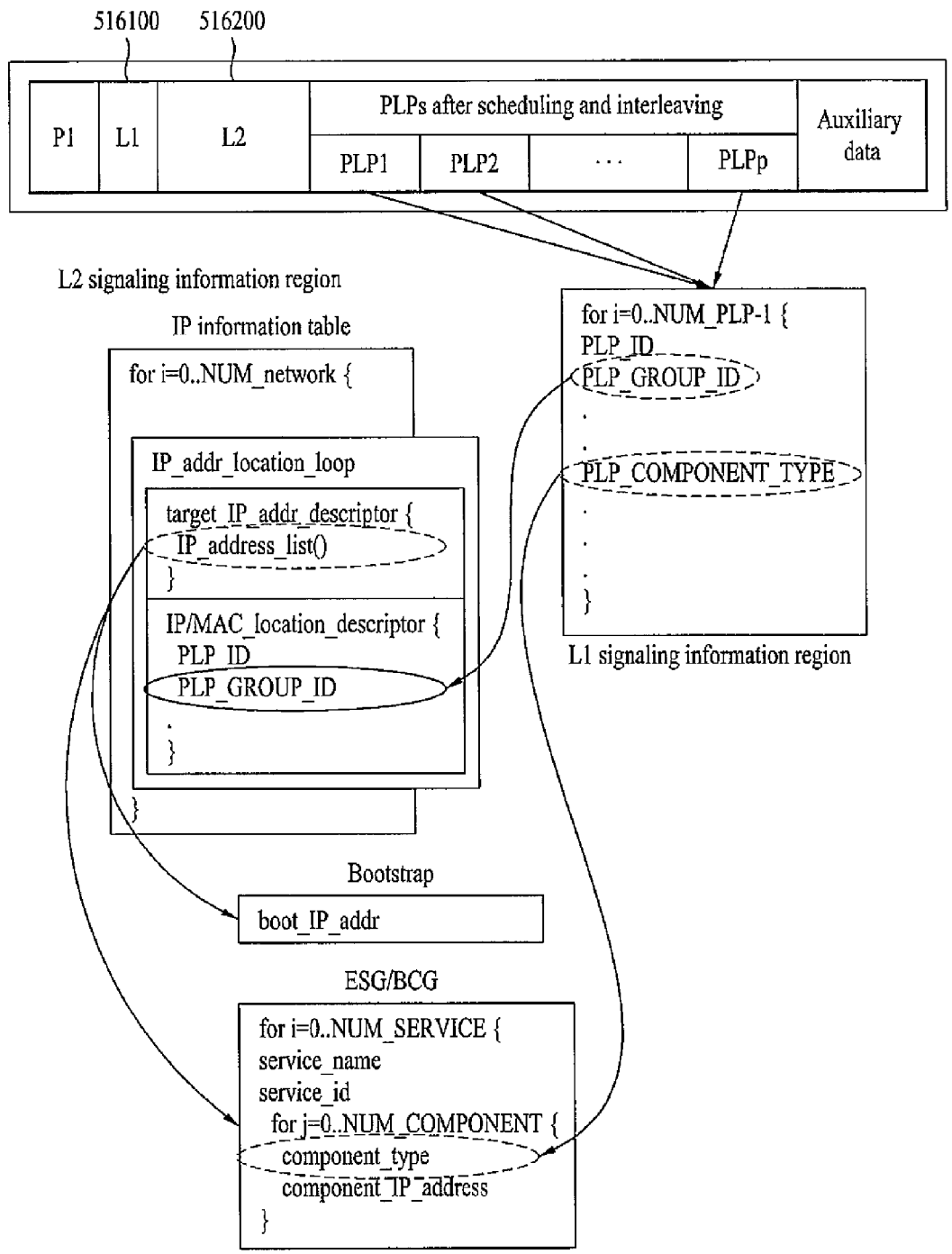
FIG. 23 illustrates a conceptual diagram of a correlation between a service and a PLP according to an embodiment of the present invention.

FIG. 23 illustrates a conceptual diagram of a correlation between a service and a PLP group according to an embodiment of the present invention.

In case of transmitting a broadcast signal of a IP format as shown in FIG. 23, the receiver may acquire information on a service IP address, a component type included in a PLP and a component address, and merge PLPs being included in the same PLP group, thereby recovering a transport stream. As shown in FIG. 23, the L1 signaling information region 516100 according to an embodiment of the present invention may include information related to each of the multiple PLPs, i.e., a PLP_GROUP ID field, a PLP_ID field, and so on. Also, the L2 signaling information region 516200 may include an IP information table, and the IP information table may include a IP_address_list( ) field and a descriptor. The IP_address_list( ) field may include IP address information for receiving a Bootstrap, and the descriptor may include the same PLP_GROUP_ID field and PLP_ID field that are included in the L1 signaling information region 516100.

Since the IP_address_list( ) field and the descriptor form a pair, by using this pair, the receiver may be capable of knowing which PLP group is correlated to a specific IP stream. Thereafter, the receiver may use the IP_address_list( ) field, so as to receive Bootstrap information. Herein, the bootstrap information includes a boot_IP_address field. And, by using the boot_IP_address field, the receiver may acquire an IP address that can receiver (or acquire) a service guide information or broadcast content guide information.

Subsequently, by using the received bootstrap information, the receiver may receiver service guide information, such as ESG (Electronic Service Guide)/BCG (Broadcast Contents Guide). The service guide information or broadcast contents guide information may be transmitted through an interactive channel and may be received through an IP stream, which is included in a specific PLP. This may vary depending upon the intentions of the system designer. The receiver may use the service_id field, the component_type field, and the component_IP_address field, which are included in the ESG/BCG, so as to decode a desired (or wanted) service and service components.

Eventually, by using the component_IP_address included in the ESG/BCG, or by using the boot_IP_address field of the bootstrap, the receiver may acquire an IP address for each service and service components. And, by using the IP_address_list( ) field and the PLP_GROUP_ID field of the IP information table, the receiver may be capable of knowing which IP stream/packet is correlated to the PLP group. Thereafter, the receiver may merge the service components that are included in a PLP having the same PLP_GROUP_ID field included in the L1 signaling information region 516100, so as to recover a service.

Hereinafter, the L1 signaling information, the IP information table, a bootstrap, and an ESG/BCG will be described in detail.

The L1 signaling information may include the same fields included in the L1 signaling information, which is described in FIG. 20 to FIG. 22. And, the receiver may use the PLP_COMPONENT_TYPE field so as to determine whether or not the L1 signaling information is matched with the component_type field included in the ESG/BCG.

The IP information table corresponds to a table include IP-related information, i.e., information on an IP address and so on. Herein, the receiver may be capable of knowing how the IP stream is being transmitted from the IP information table through the transport stream.

The IP information table may include an IP_addr_location loop, and the IP_addr_location loop may include a target_IP_add_descriptor( ) and an IP/MAC_location_descriptor.

The target_IP_add_descriptor( ) may include an IP_address_list( ) field, and the IP_address_list( ) field may include information related to the IP address. According to the embodiment of the present invention, the present invention includes an IP address/port field. Depending upon the number of ports, a plurality of the IP address/port fields may be included. The IP/MAC_location_descriptor may also be referred to as an IP/MAC_location_information field, which may be used for connecting the PLP_COMPONENT_TYPE field included in the L1 signaling information to the IP stream. The IP/MAC_location_descriptor may include the same PLP_ID field and PLP_GROUP_ID field as the PLP_ID field and the PLP_GROUP_ID field, which are included in the L1 signaling information.

Hereinafter, each field included in the bootstrap and ESG/BCG shown in FIG. 23 will be described in detail.

Herein, the Bootstrap may include a boot_IP_addr field, and the boot_IP_addr field may identify a booting address of the IP.

The ESG/BCG may include a NUM_SERVICE loop. Herein, the NUM_SERVICE loop may include a respective service_name field, service_id field, and a NUM_COMPONENT loop for each of the multiple services.

The service_name field may be used for indicating the name of each service, and the service_id field may be used for identifying each service.

The NUM_COMPONENT loop corresponds to a loop include information on the multiple components, which are included in a service. Herein, the NUM_COMPONENT loop may include a component_type field and a component_IP_address field.

The component_type field may be used for identifying component types of the service. And, examples of the components according to the present invention may include a video component of the base layer, a video component of the enhancement layer, audio components, data components, and so on. Also, the component_type field may be matched with the PLP_COMPONENT_TYPE field, which is included in the L1 signaling information.

The component_IP_address field may identify the IP address of each component.

FIG. 24 illustrates an exemplary IP/MAC_location_descriptor according to an embodiment of the present invention.

As shown in FIG. 24, the IP/MAC_location_descriptor according to an embodiment of the present invention may include a PLP_ID field and a PLP_GROUP_ID field. Since the description of each field is identical to the PLP_ID field and the PLP_GROUP_ID field included in the L1 signaling information, detailed description of the same will be omitted for simplicity.

Figure 25:
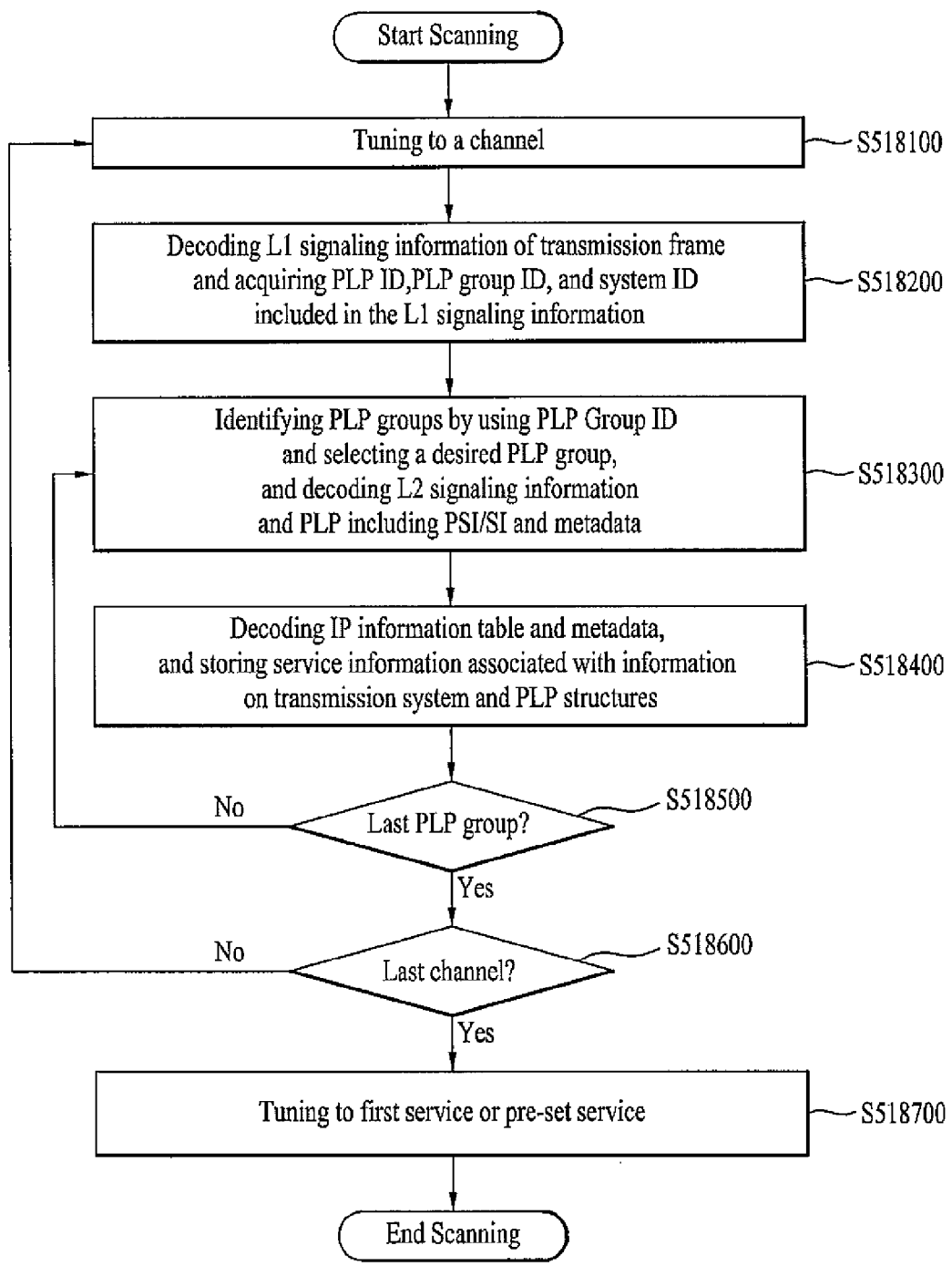
FIG. 25 illustrates a flow chart showing the process steps of a service scanning method of the receiver according to an embodiment of the present invention.

FIG. 25 illustrates a flow chart showing the process steps of a service scanning method of the receiver according to an embodiment of the present invention.

The receiver tunes to receive an IP type broadcast signal (S518100). In this case, in order to receive a service desired by the user, the receiver requires information on the service included in the transmission frame, which is being transmitted through the respective channel. Although this process step is not shown in the drawing, this process step may be performed by the tuner of the receiver and may be modified or varied in accordance with the intentions of the system designer.

Then, the receiver may decode the L1 signaling information included in the transmission frame, so as to acquire a PLP ID and a PLP Group ID (S518200). Thereafter, the receiver may identify the PLP groups by using the decoded PLP group ID so as to select a desired PLP group, and the receiver may then decode the L2 signaling information and the PLP including the PSI/SI and metadata (S518300).

The receiver may decode the IP information table included in the decoded L2 signaling information, and the receiver may also decode the metadata included in the PLP (S518400). Additionally, the receiver may acquire service information associated with information on the transmitting system and PLP structures, thereby being capable of storing the acquired service information (S518400). The service information according to the present invention may include a service IP address, a component IP address, and so on. Subsequently, the receiver may determine whether or not the currently selected PLP group corresponds to the last PLP group (S518500).

Based upon the determined result, when it is determined that the selected PLP group does not correspond to the last PLP group, the receiver may return to the process step S518300, so as to select the next PLP group. Alternatively, when it is determined that the selected PLP group corresponds to the last PLP group, the receiver may determine whether or not the current channel corresponds to the last channel (S518600).

Then, based upon the determined result, when it is determined that the current channel does not correspond to the last channel, the receiver may return to the process step S518100, so as to tune to the next channel. And, alternatively, when it is determined that the current channel corresponds to the last channel, the receiver may use the stored service information so as to tune to a first service or a pre-set service (S518700).

In an embodiment of the present invention, if a broadcast signal is configured in an IP format, a broadcast service is transmitted in one of two schemes, Open Mobile Alliance-BroadCAST (OMA-BCAST) or DVB-Internet Protocol DataCasting (DVB-IPDC).

A BCAST standardization work under development in the OMA standardization organization is a system technology supporting a broadcast service that a subgroup of the Browser and Contents (BAC) Working Group (WG) is working on. OMA-BCAST supports a broadcast service, an interactive service, and a hybrid service. The OMA-BCAST standard provides a service management framework for providing an IP-based multicast broadcast service.

DVB-IPDC is a system technology for transmitting an IP-based mobile TV service. DVB-IPDC may support a system structure including DVB PSI/SI signaling, an ESG, Content Delivery Protocols (CDPs), etc.

The above-described two schemes support a broadcast service through an ESG and invoke a physical layer by a Session Description Protocol (SDP).

The SDP is a protocol for transmitting multi-media session information such as media details, a transmission address, metadata of other sessions, etc. during initialization for delivering a plurality of multimedia over the Internet. The SDP is an Internet Engineering Task Force (IETF) standard table. Session information is largely divided into a single session description, zero or more time descriptions, and zero or more media descriptions, expressed in text. The single session description may include a protocol version, a session Identifier (ID), a session name, session attributes, etc. The time description may include the active time and repetition number of the session. The media description may include a medium name and IP address, connection information such as a port number, medium features, etc.

If SVC is used for an NGH broadcast service in the present invention, SVC information is transmitted by the session attribute information or media feature information of the SDP in an embodiment. Accordingly, the session attribute information or media feature information may include SVC codec information of the broadcast service. If a medium included in the session corresponds to an enhancement layer of the broadcast service, the session attribute information or media feature information may include information about a base layer.

Each broadcast service may be identified by an IP address, a service component such as video/audio may be identified by a TCP/UDP port number, and the base layer and enhancement layer of SVC may also be identified by TCP/UDP numbers. Each PLP included in a signal frame may be identified by PLP_ID, LLP_ID, etc.

Figure 26:
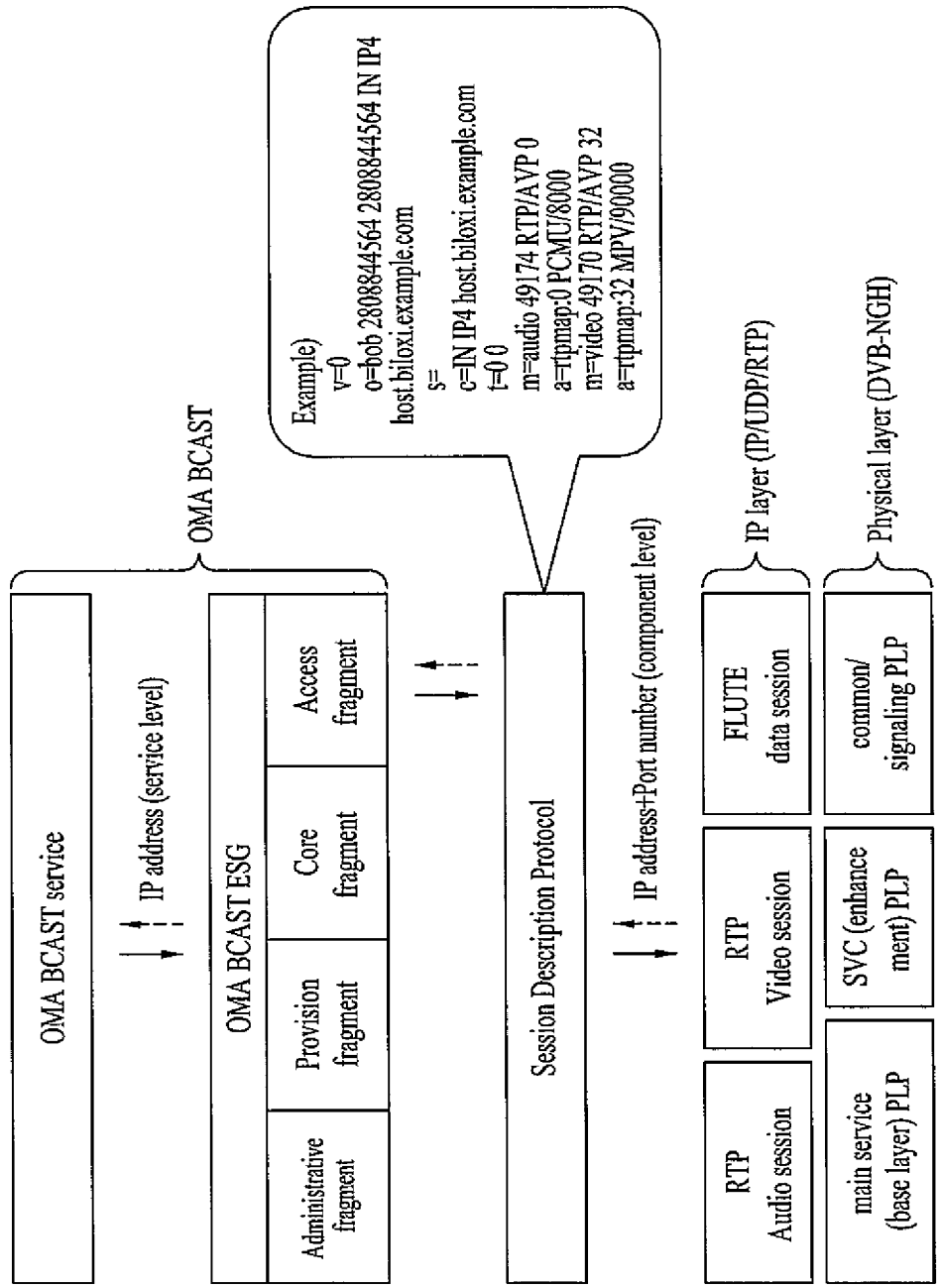
FIG. 26 illustrates a conceptual diagram showing NGH broadcast service signaling in the case of OMA-BCAST according to an embodiment of the present invention.

FIG. 26 is a conceptual view illustrating NGH broadcast service signaling in the case of OMA-BCAST according to an embodiment of the present invention.

A transmitter may transmit information related to an OMA-BCAST broadcast service, that is, a service IP address, etc. by an OMA-BCAST ESG.

The OMA-BCAST ESG may include an administrative fragment, a provision fragment, a core fragment, and an access fragment.

The administrative fragment may include information about the structure and acquisition of the OMA-BCAST ESG.

The provision fragment may include information about purchase of services that users can buy.

The core fragment may include information about a service provided to users, for example, a conventional TV channel, metadata of content, and scheduling information about content of the service.

The access fragment may include information about access to a service or content. Particularly, the access fragment may indicate a specific SDP.

The SDP may include a Real-time Transport Protocol (RTP) audio session, an RTP video session, and a FLUTE data session.

The sessions of an exemplary SDP illustrated in FIG. 26 will be described below in brief.

V represents the protocol version of a session, o represents a session ID, s represents a session name, c indicates connection information, t represents the active time of the session, m represents a media type and IP address, and a indicates media features.

In an IP layer, the audio and video components of a broadcast service may be encapsulated into RTP audio and video sessions, for transmission, while L2 signaling information may be transmitted in a FLUTE data session.

A signal frame may include a common/signaling PLP, a base-layer PLP carrying a base layer, and an enhancement PLP carrying an enhancement layer. The common/signaling PLP may include an L1 signaling region and an L2 signaling region according to the present invention.

The base-layer PLP may deliver data corresponding to the base layer from among the audio and video components encapsulated in the RTP audio and video sessions, and the enhancement PLP may deliver video data corresponding to the enhancement layer from among the video data encapsulated in the RTP video session.

A receiver may decode the signal frame and acquire an IP information table, etc. from the decoded common/signaling PLP, and the IP addresses of a bootstrap and an ESG from the IP information table. Then the receiver may receive the ESG using the acquired IP addresses of the bootstrap and the ESG.

The receiver is now capable of accessing the access fragment of the ESG and acquiring the IP address and port number of a service by a specific SDP indicated by the access fragment of the ESG. In addition, the receiver may acquire information about the purchase of each service from a purchase/bundle fragment or a provision fragment and may select an intended service.

The SDP may provide the IP address, component port number, and SVC information of each service.

The receiver may acquire the IP address and component port number of each service and SVC information from the SDP and may selectively decode the base-layer PLP or the enhancement PLP using the information.

Figure 27:
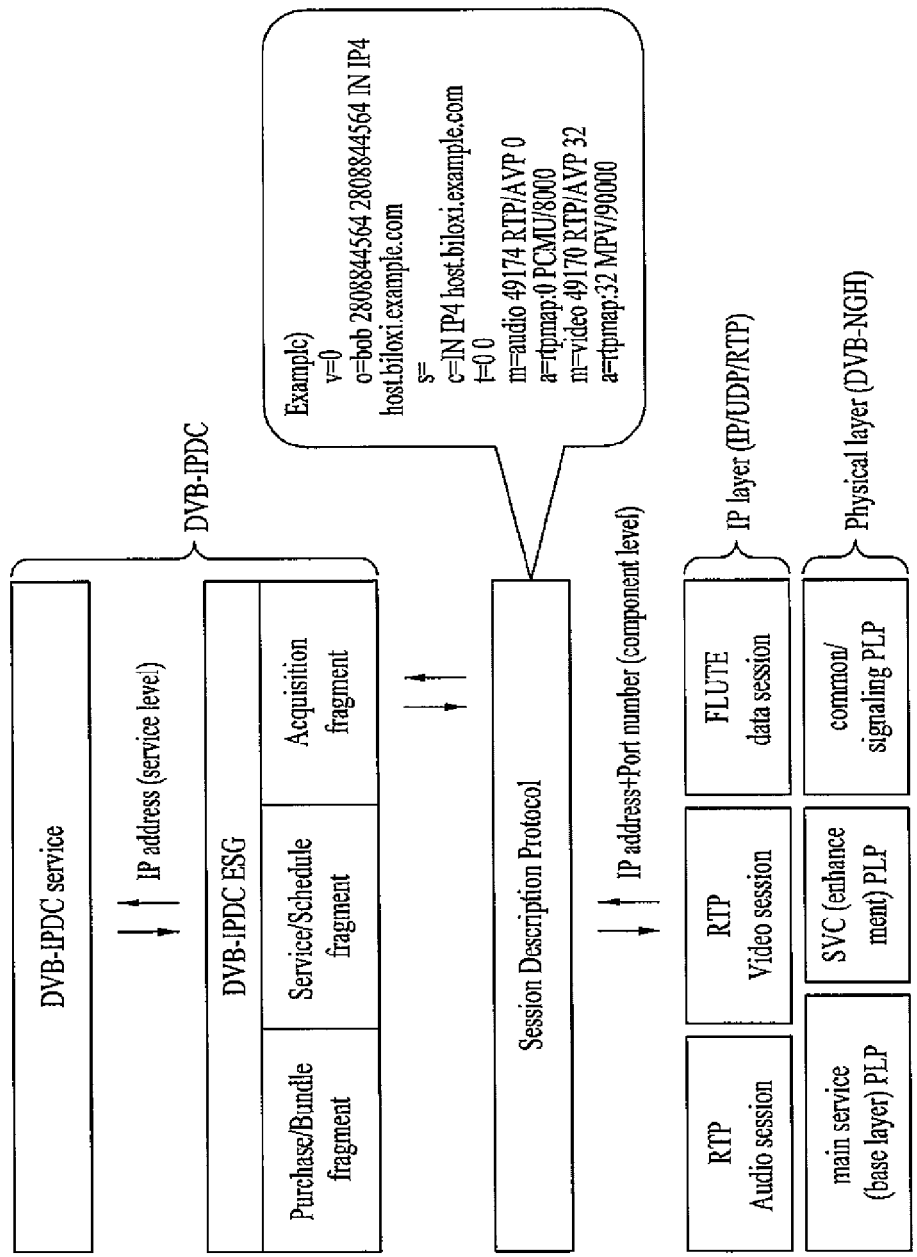
FIG. 27 illustrates a conceptual diagram showing NGH broadcast service signaling in the case of DVB-IPDC according to an embodiment of the present invention.

FIG. 27 is a conceptual view illustrating NGH broadcast service signaling in the case of DVB-IPDC according to an embodiment of the present invention.

A transmitter may transmit information related to a DVB-IPDC broadcast service, that is, a service IP address, etc. in a DVB-IPDC ESG. The DVB-IPDC ESG is the same as the OMA-BCAST ESG illustrated in FIG. 26 except that the former includes a purchase/bundle fragment, a service/schedule fragment, and an acquisition fragment.

The purchase/bundle fragment is identical to the provision fragment described with reference to FIG. 26, the service/schedule fragment is identical to the core fragment described with reference to FIG. 26, and the acquisition fragment is identical to the access fragment described with reference to FIG. 26. Thus, a detailed description of the purchase/bundle fragment, the service/schedule fragment, and the acquisition fragment is not provided herein.

Figure 28:
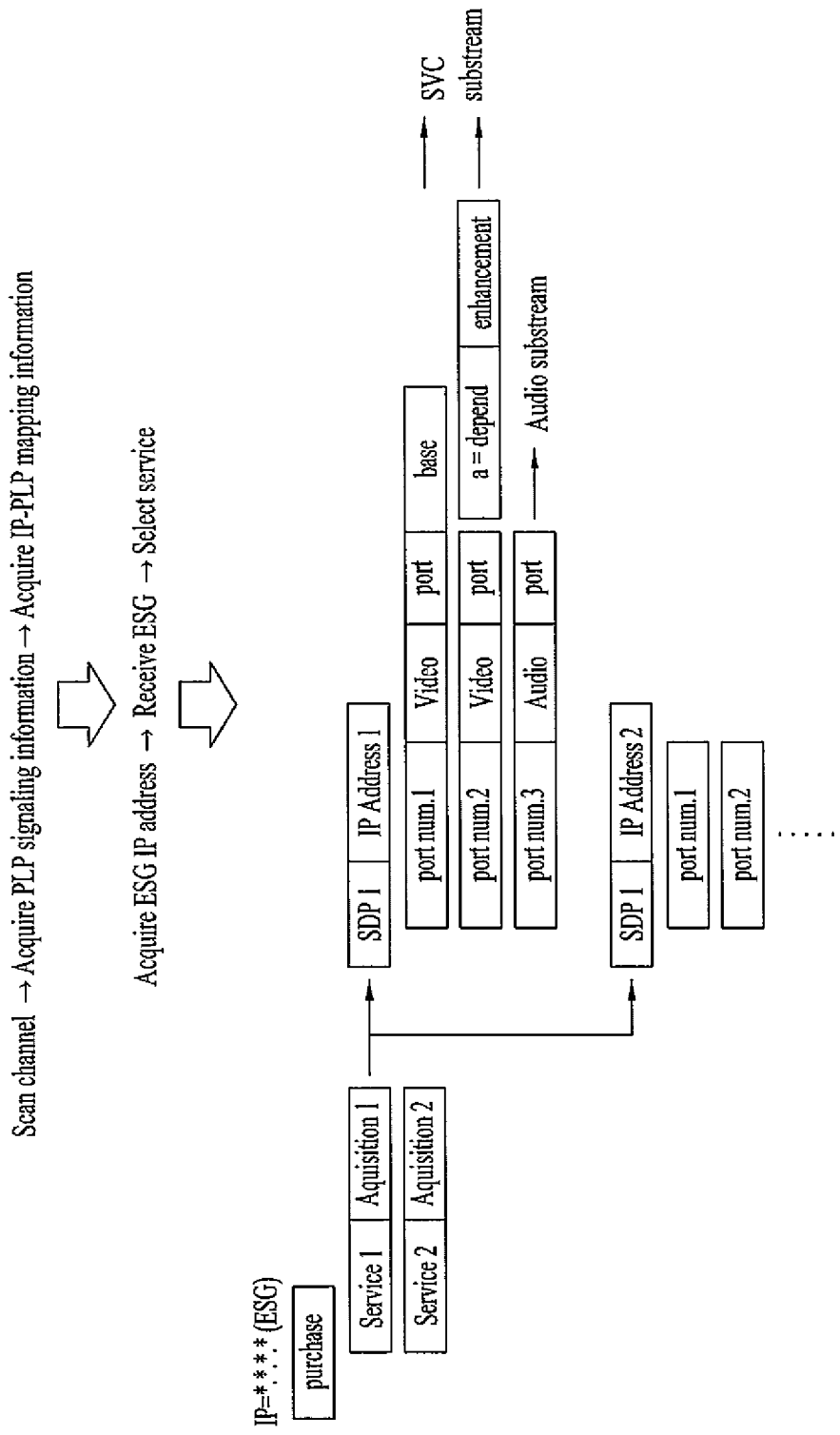
FIG. 28 illustrates a conceptual diagram showing an operation for recovering an SVC substream using an ESG and an SDP according to an embodiment of the present invention.

FIG. 28 is a conceptual view illustrating an operation for recovering an SVC substream using an ESG and an SDP according to an embodiment of the present invention.

As described before with reference to FIG. 27, the receiver may scan a channel and decode a signal frame, thereby acquiring IP-PLP mapping information. Then the receiver may acquire the IP address of an ESG from an IP information table by decoding an L2 signaling information region. As described before, the ESG may be received on an interactive channel or in an IP stream included in a specific PLP. The receiver may select a service from the received ESG.

FIG. 28 illustrates an operation for recovering an SVC substream using an ESG and an SDP.

The receiver may acquire information about the purchase of broadcast service 1 from a provision fragment or a purchase/bundle fragment of the received ESG. The receiver may acquire the IP address of broadcast service 1 by SDP 1 indicated by an access fragment or an acquisition fragment of the ESG and may acquire port number 1, port number 2, and SVC information of a video included in broadcast service 1, thereby recovering an SVC sub stream.

In this case, the IP address of each service, the port numbers of components in each service, and IP-PLP mapping information for connecting to a PLP carrying each service component are needed for the receiver to select a PLP carrying an intended component and decode the PLP. The IP-PLP mapping information may be transmitted in the L1 signaling information region, L2 signaling information region, or common PLP of a signal frame, depending on the designer's intention.

If the IP-PLP mapping information is transmitted in the L2 signaling information region or the common PLP, it may be transmitted in IP/MAC_location_descriptor of the IP information table, as described with reference to FIGS. 24 and 25.

Or the IP-PLP mapping information may be transmitted through an independent session in an IP layer.

FIGS. 29 and 30 illustrate formats of IP-PLP mapping information.

The IP-PLP mapping information may be configured in one of a binary data format, a TS private packet format, and an XML format, depending on the designer's intention.

If the IP-PLP mapping information is configured in the TS private packet format, it may be transmitted in IP/MAC_location_descriptor of the IP information table.

As described with reference to FIG. 24, the IP information table may include an IP_address_list( ) field and descriptor. The IP_address_list( ) field may include IP address information by which to receive bootstrap information and an ESG in an embodiment. The descriptor may include a system_ID field, a PLP_ID field, a PLP_GROUP_ID field, etc. Since the IP_address_list( ) field and descriptor are paired, the receiver may determine from the pair what PLP group is associated with a specific IP stream.

FIG. 29 illustrates the syntax of a binary data format including IP-PLP mapping information according to an embodiment of the present invention.

Referring to FIG. 29, the syntax of the binary data format may include a "for loop" for an IP_FORMAT field, a NUM_PLP_IP_PAIR field, and a NUM_PLP_IP_PAIR field. The "for loop" for the NUM_PLP_IP_PAIR field may include IP-PLP mapping information such as a PLP ID, the IP address of a broadcast service, and the port number of a broadcast service transmitted in the PLP. Each field will be described below briefly.

IP_FORMAT may indicate a format type.

NUM_PLP_IP_PAIR may indicate the number of pieces of IP-PLP mapping information.

The "for loop" for the NUM_PLP_IP_PAIR field may include the IP-PLP mapping information and may be iterated as many times as the number of pieces of IP-PLP mapping information indicated by the NUM_PLP_IP_PAIR field.

Specifically, the "for loop" for the NUM_PLP_IP_PAIR field may include a NUM_IP_PORT_ADDR field, a "for loop" for the NUM_IP_PORT_ADDR field, and a PLP_ID field.

The NUM_IP_PORT_ADDR field may indicate the number of the port addresses of components transmitted in a PLP.

The "for loop" for the NUM_IP_PORT_ADDR field may include an IP_ADDRESS field and a PORT_NUMBER field and may be iterated as many times as the number of the port addresses of components of a broadcast service indicated by the NUM_IP_PORT_ADDR field.

The IP_ADDRESS field may indicate the IP address of a broadcast service. The PORT_NUMBER field may indicate the port number of a broadcast service component. The PLP_ID field may identify a PLP.

Therefore, the receiver may determine a format type from the IP_FORMAT field and identify a PLP associated with a specific IP stream from the NUM_PLP_IP_PAIR field and the "for loop" for the NUM_PLP_IP_PAIR field.

FIG. 30 illustrates the syntax of an XML format including IP-PLP mapping information according to an embodiment of the present invention.

In this case, while the XML syntax may be transmitted as it is, it may also be compressed to a Binary format for Metadata/GNU ZIP (BiM/GZIP) prior to transmission.

Referring to FIG. 30, the XML syntax may include an IP_FORMAT tag and a PLP_IP_PAIR tag. The PLP_IP_PAIR tag may include a plurality of IP_PORT tags and PLP_ID tags.

The contents of each tag are identical to the contents of its counterpart illustrated in FIG. 29 and thus a detailed description of each tag will not be provided herein.

The receiver may identify the current version of the XML syntax from the IP_FORMAT tag and determine what PLP is associated with a specific IP stream from the PLP_ID tags and IP_PORT tags defined under the PLP_IP_PAIR tag.

Figure 31:
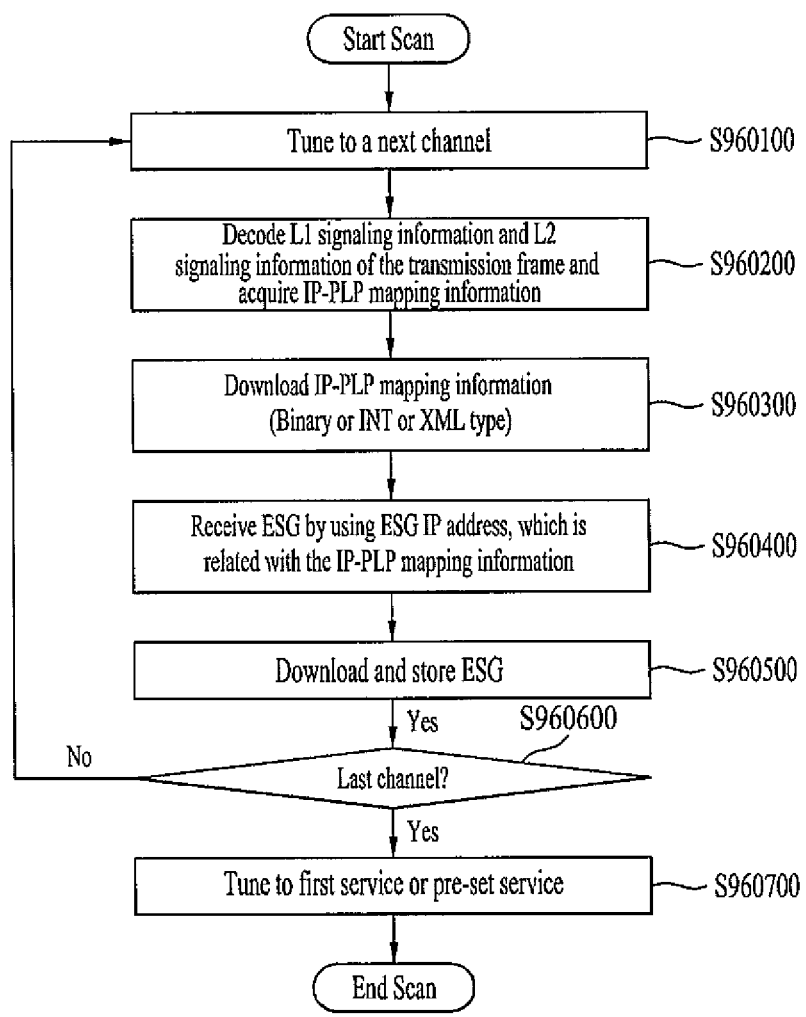
FIG. 31 illustrates a flowchart showing a channel scanning method according to an embodiment of the present invention.

FIG. 31 is a flowchart illustrating a channel scanning method according to an embodiment of the present invention.

The receiver receives a broadcast signal of an IP format on a specific channel by tuning to the specific channel (S960100). To receive a desired service, a user needs information about services included in a transmission frame transmitted on a channel. While this operation is not shown in FIG. 31, the tuner of the receiver may perform this operation depending on the designer's intention.

The receiver may acquire IP-PLP mapping information by decoding L1 signaling information and L2 signaling information included in a transmission frame (S960200). As described before, the IP-PLP mapping information may be transmitted in the L1 signaling information or the L2 signaling information, or through an independent session in an IP layer depending on the designer's intention.

Then the receiver downloads the acquired IP-PLP mapping information (S960300). As described before, the IP-PLP mapping information may be configured in one of the binary data format, the TS private packet format, and the XML format depending on the designer's intention.

The receiver may acquire an ESG IP address related to the IP-PLP mapping information from the decoded L1 signaling information and L2 signaling information and receive an ESG using the ESG IP address (S960400). As described above, the ESG may be received on an interactive channel or in an IP stream included in a specific PLP.

The receiver downloads the received ESG and stores the ESG (S960500).

The receiver may determine whether the current channel is the last channel (S960600).

If the current channel is not the last channel, the receiver may return to step S960100 and tune to the next channel. On the other hand, if the current channel is the last channel, the receiver may tune to a first service or a preset service using the stored service information (S960700).

As described above, if a broadcast signal has the IP format, each service is provided through an ESG and the afore-described OMA-BCAST and DVB-IPDC may invoke a physical layer by an SDP. In this case, a bootstrap IP address with which to receive a bootstrap may exist inside the receiver and the bootstrap may include signaling information about an ESG, for example, an ESG IP address. The bootstrap and the ESG may be received in specific PLPs using their IP addresses. Accordingly, the receiver should acquire signaling information about the bootstrap and the ESG rapidly to start a service. If it takes a long time to acquire the signaling information about the bootstrap and the ESG, the service start may be delayed. In this context, there exists a need for a signaling method that enables a receiver to fast acquire a bootstrap and an ESG.

Now a description will be given of two signaling methods that enable a receiver to fast acquire signaling information about a bootstrap and an ESG.

In an embodiment, signaling information about a bootstrap and an ESG is transmitted in an L1 signaling information region.

In another embodiment, signaling information about a bootstrap and an ESG is transmitted in a common PLP.

Hereinafter, signaling information about a bootstrap and an ESG will be referred to as bootstrap signaling information and ESG signaling information.

Because both the L1 signaling information region and the common PLP reside at the start of a signal frame, the receiver may acquire bootstrap and ESG signaling information rapidly by receiving and decoding the L1 signaling information region or the common PLP. The common PLP may also be called a signaling PLP depending on the designer's intention in the present invention. The signaling PLP may be PLP data in a data region, which may vary depending on the designer's intention.

Further, a PLP carrying bootstrap and ESG signaling information may be called a dedicated PLP. The concept of the dedicated PLP may cover the common PLP or PLP data depending on the designer's intention. The dedicated PLP may be positioned at the end of a P1 signaling information region. If the dedicated PLP does not include the L1 signaling information region, the dedicated PLP may be disposed at the end of the L1 signaling information region depending on the designer's intention.

According to the present invention, both the bootstrap signaling information and the ESG signaling information or only the bootstrap signaling information may be transmitted in the L1 signaling information or the common PLP. In the latter case, the ESG signaling information may be transmitted in a bootstrap, depending on the designer's intention.

Figure 32:
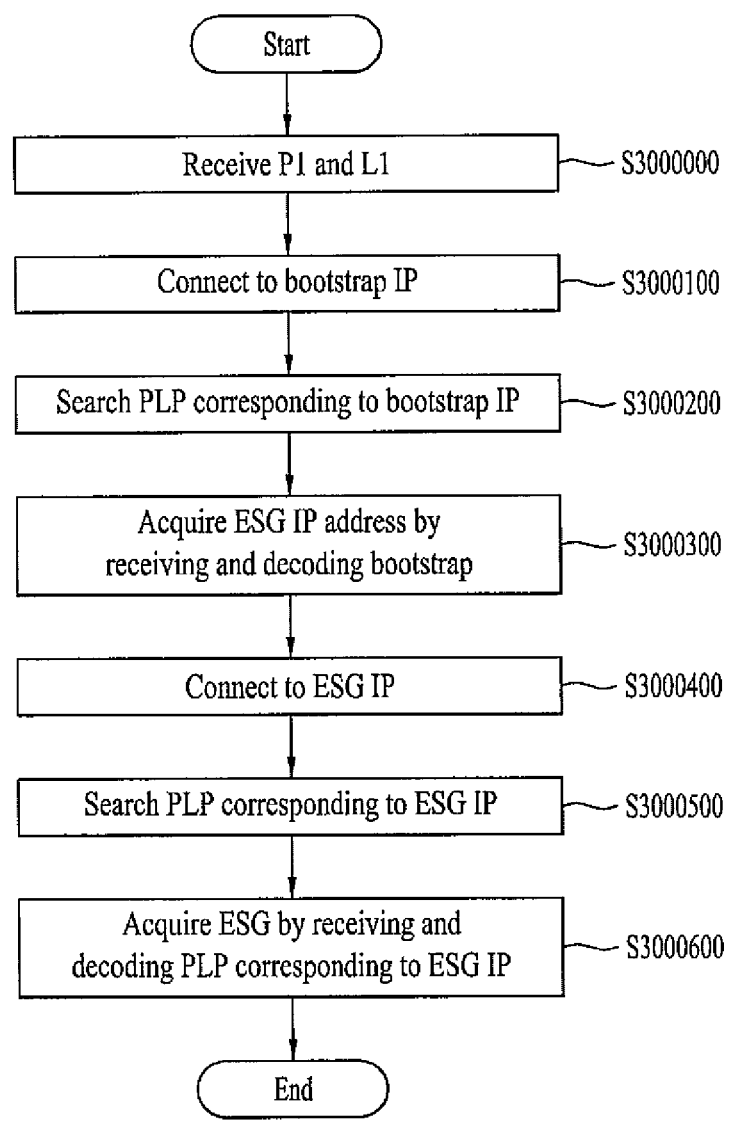
FIG. 32 illustrates a flowchart showing a boot-up service according to an embodiment of the present invention.

FIG. 32 is a flowchart illustrating a boot-up service according to an embodiment of the present invention.

After tuning to a current received channel, the receiver may receive a P1 signaling information region and an L1 signaling information region (S3000000). As described before, a bootstrap IP address may be preserved in the receiver. Accordingly, the receiver may connect to a bootstrap IP using the bootstrap IP address (S3000100).

The receiver may detect a PLP corresponding to the bootstrap IP (S3000200). As described before, bootstrap signaling information may be transmitted in the L1 signaling information region or a common PLP depending on the designer's intention. Thus the receiver may detect the PLP corresponding to the bootstrap IP using the bootstrap signaling information transmitted in the L1 signaling information region.

Then the receiver may receive and decode the bootstrap and acquire an ESG IP address from the decoded bootstrap (S3000300). As described before with reference to FIG. 23, the bootstrap may include ESG signaling information. Or the ESG signaling information may be transmitted together with the bootstrap signaling information in the L1 signaling information region or the common PLP. In this case, the ESG signaling information may be acquired from the L1 signaling information region or the common PLP. Or after the bootstrap is received, the ESG signaling information may be acquired from the bootstrap, which will be described later in detail.

The receiver may connect to an ESG IP using the ESG IP address (S3000400).

Further the receiver may detect a PLP corresponding to the ESG IP (S3000500).

The receiver may receive and decode the PLP, thus acquiring the ESG (S3000600).

FIG. 33 illustrates the syntax structure of an L1 signaling information region according to an embodiment of the present invention.

As described before, bootstrap and ESG signaling information may be transmitted in the L1 signaling information region according to the first embodiment of the present invention.

FIG. 33 illustrates the syntax of the bootstrap and ESG signaling information transmitted in the L1 signaling information region. In an embodiment of the present invention, this syntax is added to the syntax of the L1 signaling information region illustrated in FIG. 21. As described before, the ESG signaling information may be transmitted in a bootstrap, not in the L1 signaling information region, depending on the designer's intention.

Referring to FIG. 33, the bootstrap and ESG signaling information may further include a PLP_BOOT field, a FLAG_ESG_PRE_INFO field, a NUM_ESG field, and a "for loop" for the NUM_ESG field.

Each field will be described below.

The PLP_BOOT field is an 8-bit field that may indicate a PLP carrying full information about a bootstrap. In this case, the PLP indicated by the PLP_BOOT field may carry an IP packet stream, including information for delivering an ESG by a file delivery protocol and details about an ESG provider. The PLP indicated by the PLP_BOOT field may be the aforedescribed dedicated PLP.

The FLAG_ESG_PRE_INFO field is a 1-bit field that may indicate whether the ESG signaling information is transmitted in the L1 signaling information region. In this case, the receiver may acquire the ESG signaling information along with the bootstrap signaling information in the L1 signaling information region. On the other hand, if the ESG signaling information is not transmitted in the L1 signaling information region, the receiver may acquire the ESG signaling information in other PLP data.

The NUM_ESG field indicates an ESG type. If a plurality of ESG providers exist, there may be a plurality of ESGs.

In the case of a plurality of ESGs, a "for loop" may be used to provide information about each ESG. The "for loop" may include a PROVIDER_ID field, a VERSION field, an IP_ADDRESS field, a PORT_NUMBER field, a SESSION_ID field, and a PLP_ID field. These fields will be described below.

The PROVIDER_ID field is a 16-bit field that may identify an ESG provider.

The VERSION field is an 8-bit field that may indicate the version of ESG connection information.

The IP_ADDRESS field is a 32-bit or 48-bit field that may indicate the IP address of an ESG.

The PORT_NUMBER field is a 16-bit field that may indicate the port number of the ESG.

The SESSION_ID field is a 16-bit field that may indicate the session ID of the ESG.

The PLP_ID field is an 8-bit field that may indicate a PLP carrying the ESG.

Hence, the receiver may detect a PLP corresponding to the bootstrap IP address preserved in the receiver, using the PLP_BOOT field. The receiver may determine the presence or absence of the ESG signaling information in the current L1 signaling information region using the FLAG_ESG_PRE_INFO field. In the absence of the ESG signaling information in the L1 signaling information region, the receiver may receive the bootstrap by receiving and decoding the PLP indicated by the PLP_BOOT field. After decoding the received bootstrap and acquiring the ESG signaling information from the decoded bootstrap, the receiver may detect a PLP carrying an ESG and receive the ESG in the PLP.

On the contrary, in the presence of the ESG signaling information in the L1 signaling information region, the receiver may receive the ESG signaling information in the L1 signaling information region and detect a PLP corresponding to an ESG IP address. Subsequently, the receiver may receive and decode the PLP, thereby receiving the ESG.

As described before, bootstrap and ESG signaling information may be transmitted in a common PLP according to the second embodiment of the present invention. In this case, the bootstrap and ESG signaling information may be configured in one of the binary data format, the PST/SI data format, and the XML data format depending on the designer's intention.

Bootstrap and ESG signaling information configured in each format will be described below. Depending on the designer's intention, the ESG signaling information may not be added and instead, it may be transmitted in a bootstrap.

FIG. 34 illustrates the syntax of a binary data format including bootstrap and ESG signaling information according to an embodiment of the present invention.

The bootstrap and ESG signaling information illustrated in FIG. 34 may be included in the syntax of the binary data format including IP-PLP mapping information illustrated in FIG. 29.

Referring to FIG. 34, the bootstrap and ESG signaling information may further include a PLP_BOOT field, a FLAG_ESG_PRE_INFO field, a NUM_ESG field, and a "for loop" for the NUM_ESG field.

The description of FIG. 33 may be referred to for each field and the receiver also operates in the same manner as described with reference to FIG. 33. Thus, a detailed description of the above fields and a related operation of the receiver will not be provided herein.

FIG. 35 illustrates the syntax of a PSI/SI data format including bootstrap and ESG signaling information according to an embodiment of the present invention.

The syntax of the PSI/SI data format illustrated in FIG. 35 may be included as a simple bootstrap descriptor in the IP information table described with reference to FIG. 23.

Referring to FIG. 35, the syntax of the PSI/SI data format including bootstrap and ESG signaling information may include a descriptor tag field, a descriptor length field, a bootstrap_PLP field, an ESG_info_flag field, an IPv6_flag field, and a reserved field.

Each field will be described below.

The descriptor tag field is an 8-bit field that may identify the descriptor.

The descriptor length field is an 8-bit field that may indicate the length of the descriptor.

The bootstrap_PLP field is an 8-bit field identical to the PLP_BOOT field illustrated in FIG. 33, although their names are different.

The ESG_info_flag field is a 1-bit field identical to the FLAG_ESG_PRE_INFO field illustrated in FIG. 33, although their names are different. That is, the ESG_info_flag field may indicate whether ESG signaling information is included in the current descriptor.

The IPv6_flag field is a 1-bit field that may indicate IP version 6. IP version 6 is the official standard of the IETF, also called IP next generation (IPng).

The reserved field is a 6-bit field reserved for future use for another field.

If the ESG_info_flag field indicates the presence of ESG signaling information, the NUM_ESG field and the "for loop" for providing information about each ESG may exist, as described before with reference to FIG. 33. Thus a detailed description of the NUM_ESG field and the "for loop" will not be provided herein.

Therefore, the receiver may detect a PLP corresponding to the bootstrap IP address preserved in the receiver using the bootstrap_PLP field. The receiver may determine from the FLAG_infor_flag field whether the ESG signaling information is transmitted in the current common PLP. If the ESG signaling information is not transmitted in the common PLP, the receiver may receive and decode a PLP indicated by the bootstrap_PLP field and thus receive a bootstrap. After acquiring ESG signaling information by decoding the received bootstrap, the receiver may detect a PLP carrying an ESG and thus receive the ESG.

On the contrary, if the ESG signaling information is transmitted in the common PLP, the receiver may acquire the ESG signaling information from the common PLP and thus detect a PLP corresponding to an ESG IP address. Then the receiver may receive and decode the PLP, thereby receiving an ESG.

FIG. 36 illustrates the syntax of an XML data format including bootstrap and ESG signaling information according to an embodiment of the present invention.

Because the XML data format can be extended freely, information about the address of a bootstrap, information about an ESG provider, etc. may be added, extended, or deleted.

Referring to FIG. 36, the XML syntax may include a BOOT_PLP_INFO tag and the BOOT_PLP_INFO tag may include a BOOTSTRAP_INFO tag and an ESG_PRE_INFO tag. The contents of each tag are identical to those of its counterpart illustrated in FIGS. 33, 34 and 35 and thus a detailed description of each tag is not provided herein. A PROVIDER_NAME tag included in the ESG_PRE_INFO tag is newly added and will be described below.

The PROVIDER_NAME tag indicates the name of an ESG provider. In FIG. 36, the ESG provider is shown as LG U+ myLGTV ESG in an embodiment of the present invention.

Referring to FIG. 36, the BOOTSTRAP_INFO tag and the ESG_PRE_INFO tag have the same PLP_ID, 0X01. Hence, it is noted from FIG. 36 that a bootstrap and an ESG are transmitted in the same PLP, PLP 1.

That is, the receiver may acquire the IP addresses of a bootstrap and an ESG from the XML syntax, receive and decode PLP 1 corresponding to the IP addresses of the bootstrap and the ESG, and acquire the bootstrap and the ESG from PLP 1.

Figure 37:
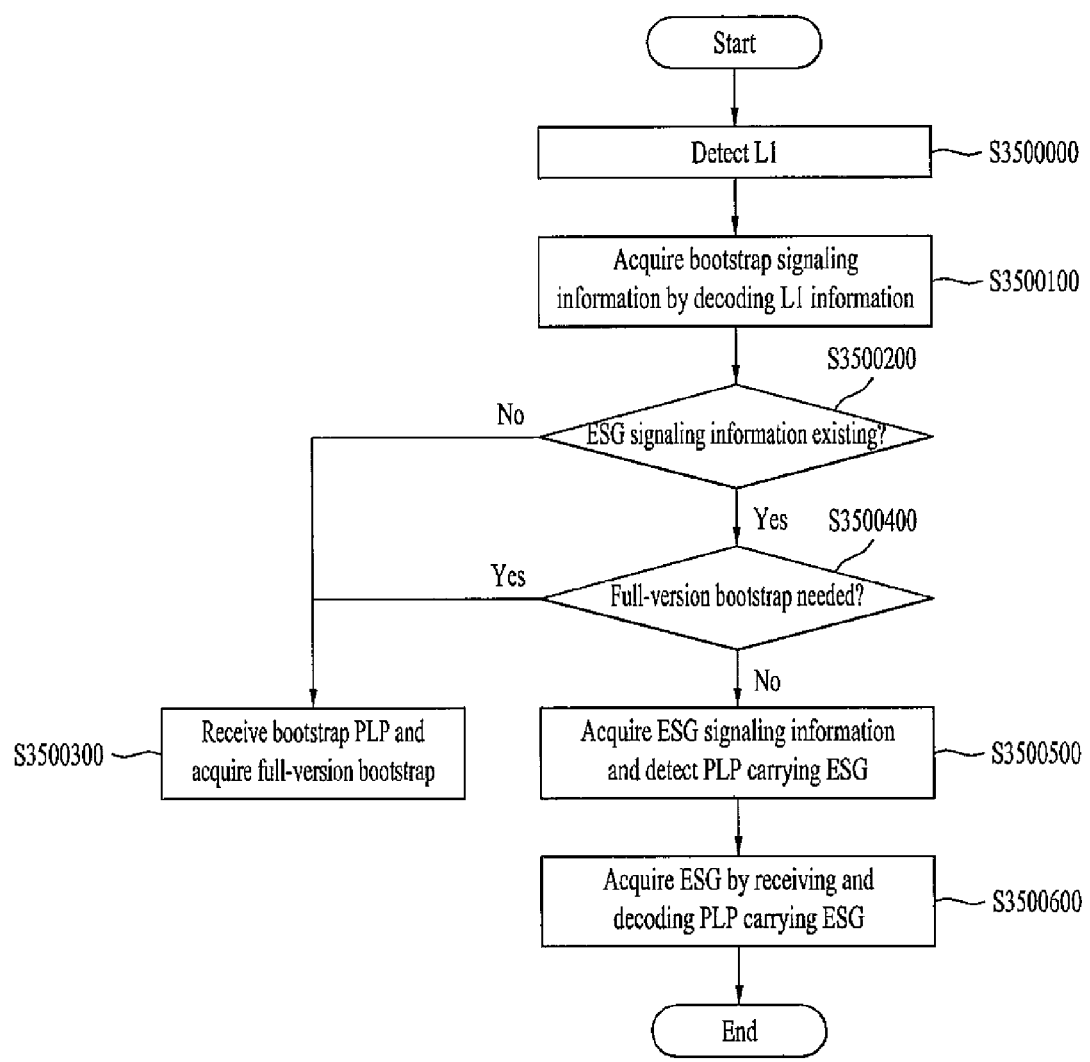
FIG. 37 illustrates a flowchart showing an operation for starting a service according to a first embodiment of the present invention.

FIG. 37 is a flowchart illustrating an operation for starting a service according to the first embodiment of the present invention.

The receiver may detect an L1 signaling information region by decoding a P1 signaling information region (S3500000). P1 signaling information transmitted in the P1 signaling information region is used to detect a signal frame and may include tuning information and information for identifying a preamble itself. The L1 signaling information region may reside at the end of the P1 signaling information region in the signal frame.

The receiver may decode L1 signaling information included in the detected L1 signaling information region and acquire bootstrap signaling information from the decoded L1 signaling information (S3500100).

As described before with reference to FIG. 33, bootstrap and ESG signaling information may be added to the syntax of the L1 signaling information region described with reference to FIG. 21. Depending on the designer's intention, the ESG signaling information may not be added and instead, it may be transmitted in a bootstrap.

Therefore, the receiver determines whether ESG signaling information is transmitted in the current L1 signaling information region, that is, ESG signaling information is present in the current L1 signaling information region (S3500200).

In the absence of ESG signaling information, the receiver may receive a bootstrap PLP using the bootstrap signaling information and acquire a full-version bootstrap (S3500300).

On the contrary, in the presence of ESG signaling information, the receiver may determine whether the full-version bootstrap information is needed (S3500400). It may occur that an ESG cannot be received due to lack of information included the current ESG signaling information. In this case, the receiver may need to receive the full-version bootstrap and use ESG signaling information included in the bootstrap.

If determining that the full-version bootstrap is needed, the receiver may return to step S3500300. Thus the receiver may receive a PLP carrying the bootstrap and acquire the bootstrap. Then the receiver may receive and decode a PLP carrying an ESG using the ESG signaling information included in the bootstrap, thereby acquiring the ESG (S3500600).

On the other hand, if determining that the full-version bootstrap is not needed, the receiver may acquire the ESG signaling information included in the L1 signaling information region and detect a PLP carrying an ESG using the ESG signaling information (S3500500). Specifically, the receiver may identify the PLP carrying the ESG using PLP_ID included in the ESG signaling information, as described before with reference to FIG. 33. Subsequently, the receiver may acquire the ESG by receiving and decoding the PLP carrying the ESG (S3500600).

Figure 38:
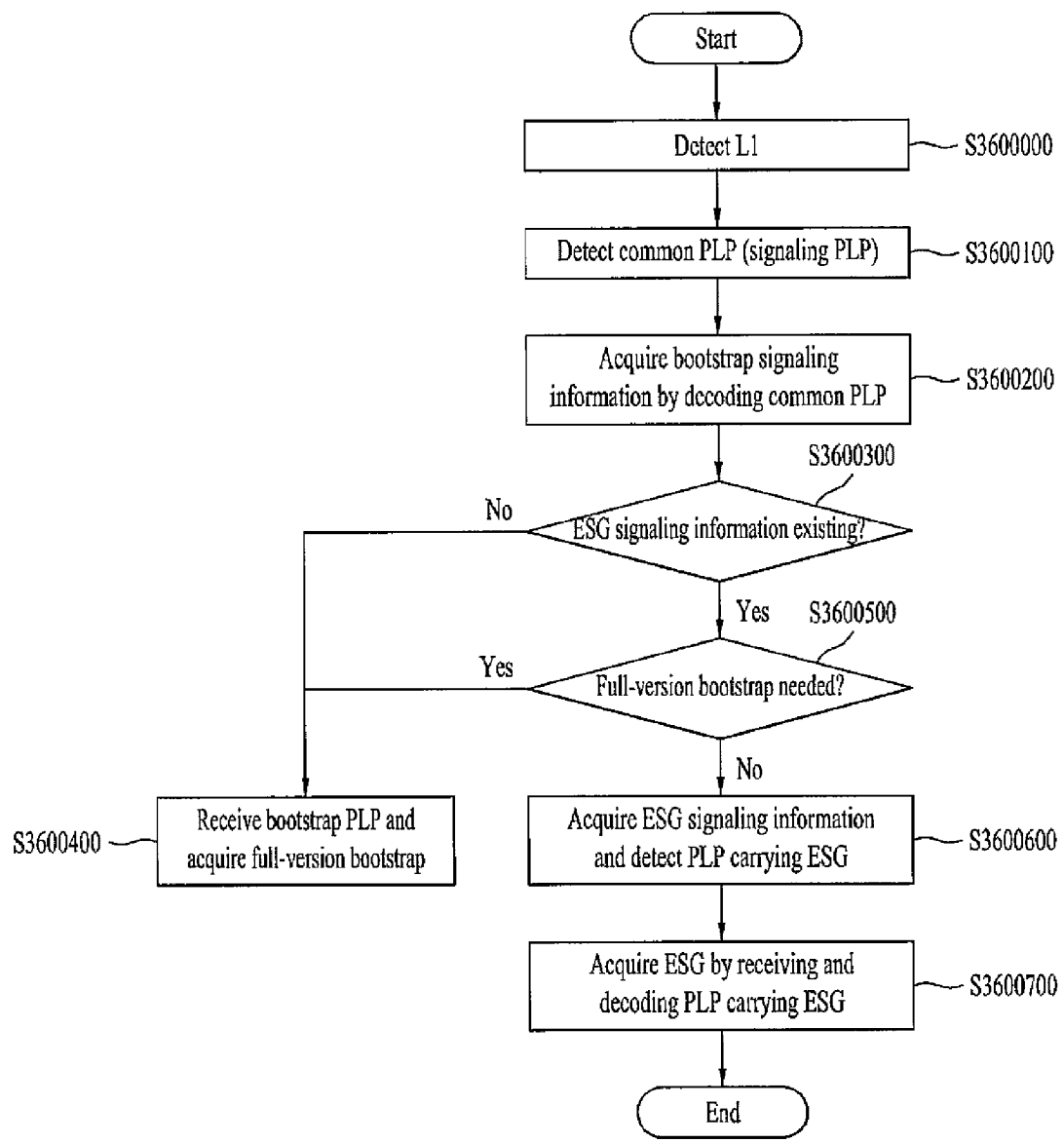
FIG. 38 illustrates a flowchart showing an operation for starting a service according to a second embodiment of the present invention.

FIG. 38 is a flowchart illustrating an operation for starting a service according to the second embodiment of the present invention.

The receiver may detect an L1 signaling information region by decoding a P1 signaling information region (S3600000). P1 signaling information transmitted in the P1 signaling information region is used to detect a signal frame and may include tuning information and information for identifying a preamble itself, as described before. The L1 signaling information region may reside at rear end of the P1 signaling information region in the signal frame.

The receiver may detect a common PLP using L1 signaling information included in the decoded L1 signaling information region (S3600100). The common PLP may reside at the end of the L1 signaling information region and may include L2 signaling information.

The receiver may decode the common PLP and acquire bootstrap signaling information (S3600200).

As described before, the common PLP may deliver bootstrap and ESG signaling information or only the bootstrap signaling information depending on the designer's intention according to the second embodiment of the present invention.

Therefore, the receiver determines whether ESG signaling information is transmitted in the current common PLP, that is, ESG signaling information is present in the current common PLP (S35004\300).

In the absence of ESG signaling information, the receiver may receive a bootstrap PLP using the bootstrap signaling information and acquire a full-version bootstrap (S3500400).

In the presence of ESG signaling information, the receiver may determine whether full-version bootstrap information is needed (S3500500). It may occur that an ESG cannot be received due to lack of information included the current ESG signaling information. In this case, the receiver may need to receive the full-version bootstrap and use ESG signaling information included in the bootstrap.

If determining that the full-version bootstrap is needed, the receiver may return to step S3500400. Thus the receiver may receive a PLP carrying the bootstrap and acquire the full-version bootstrap. Then the receiver may receive and decode a PLP carrying an ESG using the ESG signaling information included in the bootstrap, thereby acquiring the ESG (S3500700).

On the other hand, if determining that the full-version bootstrap is not needed, the receiver may acquire the ESG signaling information included in the L1 signaling information region and detect the PLP carrying the ESG using the ESG signaling information (S3500600). Specifically, the receiver may identify the PLP carrying the ESG using PLP_ID described before with reference to FIGS. 34, 35 and 36. Subsequently, the receiver may acquire the ESG by receiving and decoding the PLP carrying the ESG (S3500700).

Figure 39:
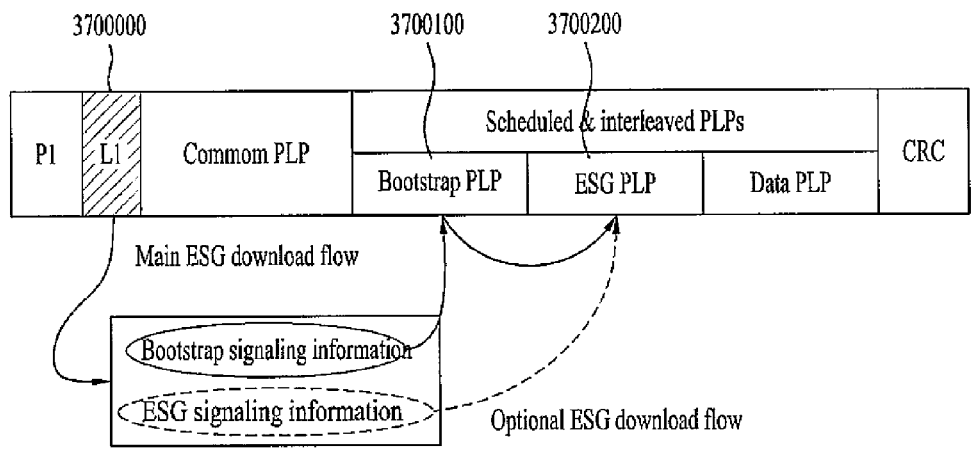
FIG. 39 illustrates a conceptual diagram showing a structure of a signal frame and an operation for receiving a bootstrap and an ESG according to a first embodiment of the present invention.

FIG. 39 is a conceptual view illustrating the structure of a signal frame and an operation for receiving a bootstrap and an ESG according to the first embodiment of the present invention.

In accordance with the first embodiment of the present invention, bootstrap signaling information and ESG signaling information may be transmitted together in an L1 signaling information region 3700000 of a signal frame. Depending on the designer's intention, only the bootstrap signaling information may be transmitted in the L1 signaling information region 3700000. A bootstrap may include the ESG signaling information.

In FIG. 39, a solid line denotes an operation of the receiver in the case where the ESG signaling information is not transmitted along with the bootstrap signaling information, and a broken line denotes an operation of the receiver in the case where the ESG signaling information is transmitted along with the bootstrap signaling information.

The operations of the receiver will be described respectively.

In the case where only the bootstrap signaling information such as bootstrap PLP information is transmitted in the L1 signaling information region 3700000, the receiver may decode the L1 signaling information region 3700000 and acquire the bootstrap PLP information. Subsequently, the receiver may acquire a bootstrap by receiving and decoding a PLP 3700100 carrying the bootstrap using the bootstrap PLP information. The receiver may receive a PLP 3700200 carrying an ESG using ESG signaling information included in the bootstrap and thus may acquire the ESG.

In the case where the bootstrap signaling information and the ESG signaling information are transmitted together in the L1 signaling information region 3700000, the receiver may acquire bootstrap PLP information and ESG PLP information by decoding the L1 signaling information region 3700000. Subsequently, the receiver may receive the bootstrap by receiving and decoding the PLP 3700100 carrying the bootstrap using the bootstrap PLP information. The receiver may also acquire the ESG by receiving and decoding the PLP 3700200 carrying the ESG using the ESG PLP information. As described before, the receiver may acquire the ESG by additionally using ESG signaling information included in the bootstrap.

Figure 40:
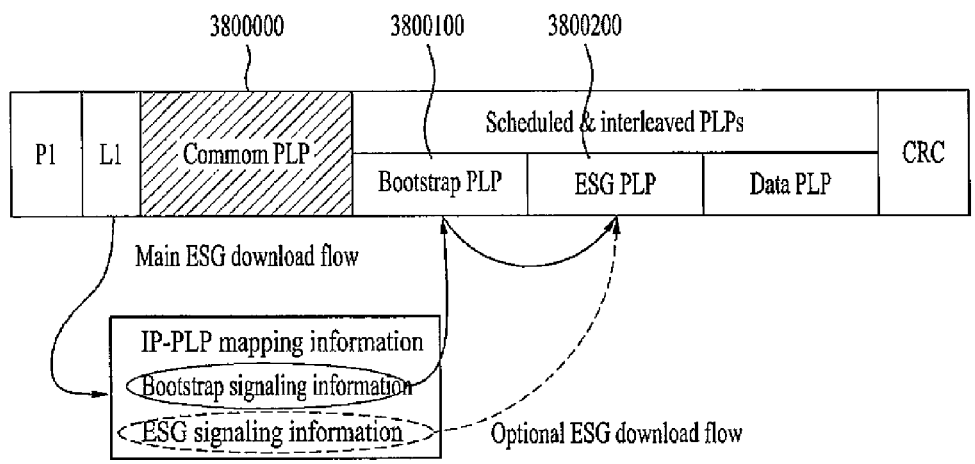
FIG. 40 illustrates a conceptual diagram showing a structure of a signal frame and an operation for receiving a bootstrap and an ESG according to a second embodiment of the present invention.

FIG. 40 is a conceptual view illustrating the structure of a signal frame and an operation for receiving a bootstrap and an ESG according to the second embodiment of the present invention.

In accordance with the second embodiment of the present invention, bootstrap signaling information and ESG signaling information may be transmitted together in a common PLP 3800000 of a signal frame. Depending on the designer's intention, only the bootstrap signaling information may be transmitted in the common PLP 3800000. A bootstrap may include the ESG signaling information.

In FIG. 40, a solid line denotes an operation of the receiver in the case where the ESG signaling information is not transmitted along with the bootstrap signaling information, and a broken line denotes an operation of the receiver in the case where the ESG signaling information is transmitted along with the bootstrap signaling information.

The operations of the receiver will be described respectively.

In the case where only the bootstrap signaling information is transmitted in the common PLP 3800000, the receiver may decode the common PLP 3800000 and acquire the bootstrap PLP information. Subsequently, the receiver may acquire a bootstrap by receiving and decoding a PLP 3800100 carrying the bootstrap using the bootstrap PLP information. The receiver may receive a PLP 3800200 carrying an ESG using ESG signaling information included in the bootstrap and thus acquire the ESG.

In the case where the bootstrap signaling information and the ESG signaling information are transmitted together in the common PLP 3800000, the receiver may acquire bootstrap PLP information and ESG PLP information by decoding the common PLP 3800000. Subsequently, the receiver may receive the bootstrap by receiving and decoding the PLP 3800100 carrying the bootstrap using the bootstrap PLP information. The receiver may also acquire the ESG by receiving and decoding the PLP 3800200 carrying the ESG using the ESG PLP information. As described fore, the receiver may acquire the ESG by additionally using ESG signaling information included in the bootstrap.

Figures 41, 42:
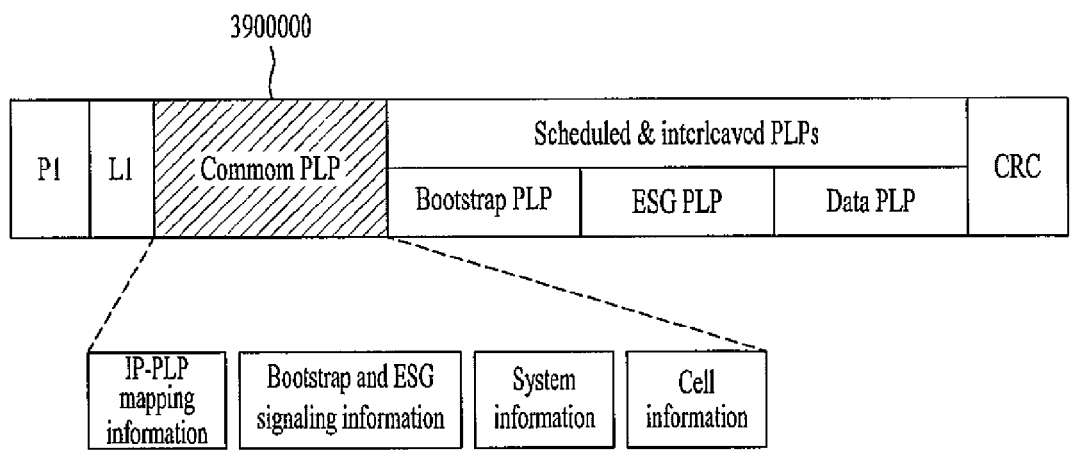
FIG. 41 illustrates a structure of a common PLP according to a second embodiment of the present invention.
FIG. 42 illustrates a syntax of system information according to an embodiment of the present invention.

FIG. 41 illustrates the structure of a common PLP according to the second embodiment of the present invention.

A common PLP 3900000 according to the present invention may include IP-PLP mapping information and bootstrap and ESG signaling information, as described before. In this case, the data format of system information and cell information may be determined according to the data format of the common PLP. That is, as described before, if the IP-PLP mapping information and the bootstrap and ESG signaling information are configured in one of the binary, PSI/SI and XML data format, they may be expressed according to the data format.

In the present invention, the IP-PLP mapping information, the system information, and the cell information may be referred to as L2 information.

FIG. 42 illustrates the syntax of system information according to an embodiment of the present invention.

System information included in a common PLP according to the embodiment of the present invention may include a SISO/MISO field, a BANDWIDTH field, a GUARD_INTERVAL field, and an FFT_SIZE field. The fields will be described below.

The SISO/MISO field is a 2-bit field indicating a SISO/MISO mode supported by each PLP. In an embodiment of the present invention, if the SISO/MISO field is 0X00, this indicates SISO/SIMO and if the SISO/MISO field is 0X01, this indicates MISO/MIMO.

The BANDWIDTH field is a 4-bit field that may indicate the bandwidth of a broadcast signal.

The GUARD_INTERVAL field is a 3-bit field identical to the GUARD_INTERVAL field described with reference to FIG. 16.

The FFT_SIZE field is a 3-bit field that may indicate an FFT size and a transmission mode.

Figures 43, 44:
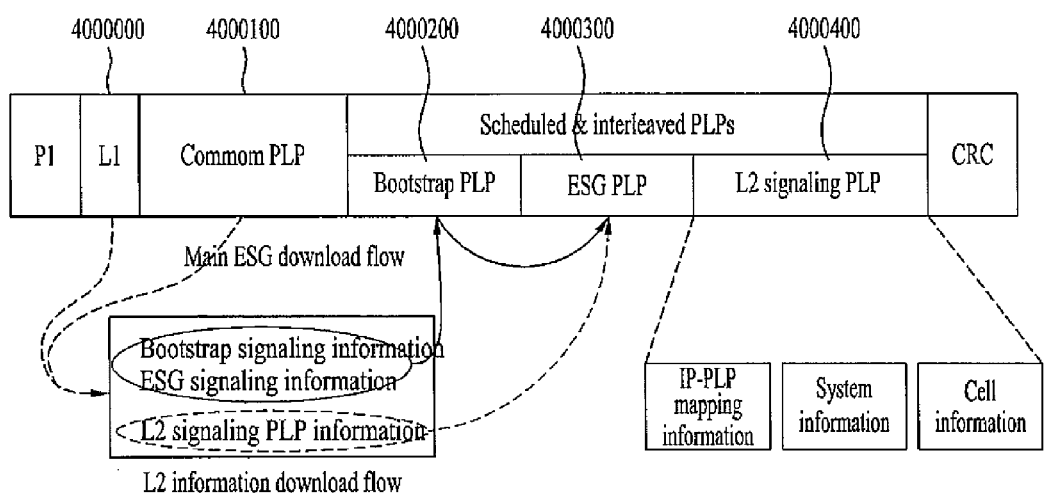
FIG. 43 illustrates a syntax of cell information according to an embodiment of the present invention.
FIG. 44 illustrates a conceptual diagram showing a structure of a signal frame and a method for signaling L2 signaling information according to an embodiment of the present invention.

FIG. 43 illustrates the syntax of cell information according to an embodiment of the present invention.

Cell information included in a common PLP according to the embodiment of the present invention may include a NUM_CELL field and a "for loop" for the NUM_CELL field.

NUM_CELL is a 16-bit field that may indicate the total number of cells to which a broadcast signal is transmitted.

The "for loop" for the NUM_CELL field is iterated as many times as the number of cells, including fields indicating corresponding information for each cell. Specifically, the "for loop" may include a CELL_ID field, a CENTRE_FREQUENCY field, a NUM_SUBCELL field, and a "for loop" for the NUM_SUBCELL field. These fields will be described below.

The CELL_ID field is an 8-bit field that may indicate a unique cell defining a broadcast signal transmission zone.

The CENTRE_FREQUENCY field may indicate the reception frequency of each cell.

The NUM_SUBCELL field is an 8-bit field that may indicate the number of subcells included in each cell.

The "for loop" for the NUM_SUBCELL field is iterated as many times as the number of subcells, including fields indicating corresponding information for each subcell. Specifically, the "for loop" for the NUM_SUBCELL field may include a CELL_ID_EXTENSION field and a TRANSPOSER_FREQUENCY field. These fields will be described.

The CELL_ID_EXTENSION field may identify each subcell.

The TRANSPOSER_FREQUENCY field indicates a transposer frequency used in a subcell.

As described above, while the IP-PLP mapping information, the system information, and the cell information, that is, the L2 information may be transmitted in the common PLP, it may be transmitted in PLP data depending on the designer's intention. In this case, the receiver needs signaling information about the L2 information in order to receive a PLP carrying the L2 information. In the present invention, the signaling information about the L2 information may be referred to as L2 signaling information.

In an embodiment of the present invention, a bootstrap and L2 information may be transmitted in the same PLP depending on the designer's intention. This PLP may be referred to as a dedicated PLP.

Now a description will be given of a method for signaling L2 signaling information. The method for signaling L2 signaling information is applicable to both of the first and second embodiments of the present invention.

FIG. 44 is a conceptual diagram illustrating the structure of a signal frame and a method for signaling L2 signaling information according to an embodiment of the present invention.

Referring to FIG. 44, L2 signaling information may be transmitted together with bootstrap and ESG signaling information in an L1 signaling information region 4000000 or a common PLP 4000100.

If the L2 signaling information and the bootstrap and ESG signaling information are transmitted together in the L1 signaling information region 4000000, the receiver may acquire the bootstrap and ESG signaling information and the L2 signaling information by receiving and decoding the L1 signaling information region 4000000.

Subsequently, the receiver may acquire a bootstrap by receiving and decoding a PLP 4000200 carrying the bootstrap using the bootstrap signaling information. In addition, the receiver may acquire an ESG by receiving and decoding a PLP 4000300 carrying the ESG using the ESG signaling information. As described before, the receiver may acquire the ESG using ESG signaling information included in the bootstrap depending on the designer's intention.

The receiver may acquire the L2 information by receiving and decoding a PLP 4000400 carrying the L2 information using the L2 signaling information. In this case, the L2 information is configured in the form of a file and may be received by a file delivery protocol such as FLUTE, etc.

If the L2 signaling information and the bootstrap and ESG signaling information are transmitted together in a common PLP 4000100, the receiver may receive the common PLP 4000100 by receiving and decoding the L1 signaling information region 4000000 and may acquire the bootstrap and ESG signaling information and the L2 signaling information by receiving and decoding the common PLP 4000100.

Subsequently, the receiver may acquire the bootstrap by receiving and decoding the PLP 4000200 carrying the bootstrap using the bootstrap signaling information. In addition, the receiver may acquire the ESG by receiving and decoding the PLP 4000300 carrying the ESG using the ESG signaling information. As described before, the receiver may acquire the ESG using ESG signaling information included in the bootstrap depending on the designer's intention.

The receiver may acquire the L2 information by receiving and decoding the PLP 4000400 carrying the L2 information using the L2 signaling information. In this case, the L2 information is configured in the form of a file and may be received by a file delivery protocol such as FLUTE, etc.

FIG. 45 illustrates the syntax of L2 signaling information according to an embodiment of the present invention.

Referring to FIG. 45, the L2 signaling information may be added to the syntaxes of bootstrap and ESG signaling information according to the first and second embodiments of the present invention. The L2 signaling information may include an L2_IP_ADDRESS field, an L2_PORT_NUMBER field, an L2_SESSION_ID field, and an L2_PLP field. Fields other than the L2 signaling information illustrated in FIG. 41 are identical to the fields described with reference to FIG. 33 and thus a detailed description of the other fields will not be provided herein. The fields of the L2 signaling information will be described below.

The L2_IP_ADDRESS field is a 32-bit or 48-bit field that may indicate the IP address of the L2 information.

The L2_PORT_NUMBER field is a 16-bit field that may indicate the port number of the L2 information.

The L2_SESSION_ID field is a 16-bit field that may identify the session of the L2 information.

The L2_PLP field is an 8-bit field that may identify a PLP carrying the L2 information.

Therefore, the receiver may identify a PLP carrying the L2 information from the L2_PLP field and may receive the L2 information using the L2_IP_ADDRESS field, the L2_PORT_NUMBER field, and the L2_SESSION_ID field.

Figure 46:
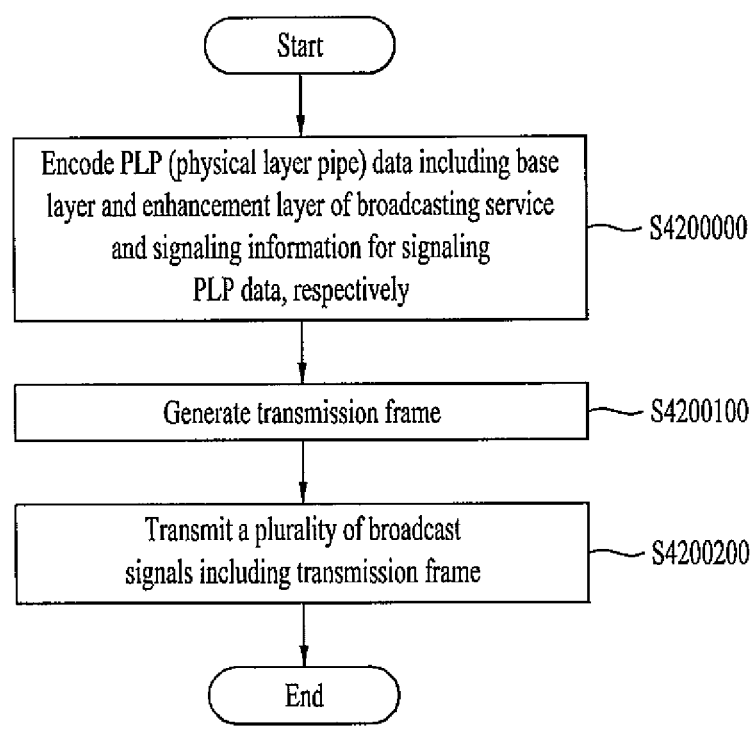
FIG. 46 illustrates a flowchart showing a method for transmitting a broadcast signal according to an embodiment of the present invention.

FIG. 46 is a flowchart illustrating a method for transmitting a broadcast signal according to an embodiment of the present invention.

As described before with reference to FIG. 6, the BICM module 100200 according to the embodiment of the present invention may encode PLP data including a base layer and an enhancement layer of a broadcast service and signaling information for signaling the PLP data, respectively (S4200000).

The frame builder 100300 may generate a transmission frame (S4200100). As described before, the transmission frame may include a preamble and a plurality of PLPs. The preamble may include a P1 signaling information region and an L1 signaling information region. The preamble may or may not include a common PLP, depending on the designer's intention. The plurality of PLPs may correspond to the afore-described data region.

In accordance with the first embodiment of the present invention, bootstrap and ESG signaling information may be transmitted in the L1 signaling information region, whereas in accordance with the second embodiment of the present invention, bootstrap and ESG signaling information may be transmitted in the common PLP. In the second embodiment, the bootstrap and ESG signaling information may be configured in one of the binary data format, the PST/SI data format, and the XML data form a depending on the designer's intention.

As described before, a bootstrap and an ESG may be transmitted in at least one of the plurality of PLPs included in the data region. Therefore, the bootstrap and ESG signaling information may include identification information for identifying PLPs carrying the bootstrap and the ESG, that is, PLP_IDs, as described with reference to FIGS. 33 to 36. The bootstrap signaling information and the ESG signaling information or only the bootstrap signaling information may be transmitted together in the L1 signaling information or the common PLP. In the latter case, the receiver may acquire the ESG signaling information by receiving the bootstrap, which may depend on the designer's intention.

When the bootstrap and ESG signaling information is transmitted in the common PLP according to the second embodiment of the present invention, the common PLP may also deliver L2 information such as IP-PLP mapping information, system information, and cell information. Or the L2 information may be transmitted in a PLP of the data region. In this case, L2 signaling information for signaling the L2 information may be transmitted along with the bootstrap and ESG signaling information as described with reference to FIGS. 44 and 45.

Then the OFDM generator 100400 may transmit a plurality of broadcast signals including the generated transmission frame (S4200200).

Figure 47:
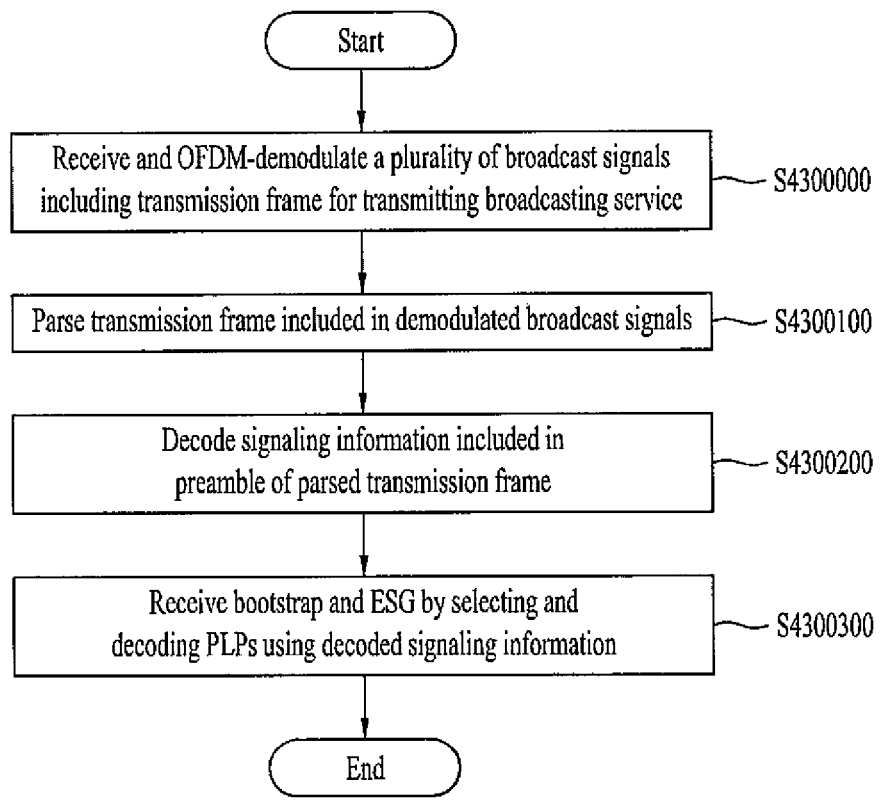
FIG. 47 illustrates a flowchart showing a method for receiving a broadcast signal according to an embodiment of the present invention.

FIG. 47 is a flowchart illustrating a method for receiving a broadcast signal according to an embodiment of the present invention.

As described before, the OFDM demodulator 138100 according to the embodiment of the present invention may receive a plurality of broadcast signals including a transmission frame for providing a broadcast service and may OFDM-demodulate the broadcast signals (S4300000).

The frame demapper 138200 according to the embodiment of the present invention may parse the transmission frame included in the demodulated broadcast signals (S4300100). As described before, the transmission frame may include a preamble and a plurality of PLPs. The preamble may include a P1 signaling information region and an L1 signaling information region. The preamble may or may not include a common PLP, depending on the designer's intention. The plurality of PLPs may correspond to the afore-described data region.

Then the first decoder 612300 may decode the signaling information included in the preamble of the parsed transmission frame (S4300200).

In accordance with the first embodiment of the present invention, bootstrap and ESG signaling information may be transmitted in the L1 signaling information region, whereas in accordance with the second embodiment of the present invention, bootstrap and ESG signaling information may be transmitted in the common PLP. In the second embodiment, the bootstrap and ESG signaling information may be configured in one of the binary data format, the PST/SI data format, and the XML data form a depending on the designer's intention.

As described before, a bootstrap and an ESG may be transmitted in at least one of the plurality of PLPs included in the data region. Therefore, the bootstrap and ESG signaling information may include identification information for identifying PLPs carrying the bootstrap and the ESG, that is, PLP_IDs, as described with reference to FIGS. 33 to 36.

The bootstrap signaling information and the ESG signaling information or only the bootstrap signaling information may be transmitted together in the L1 signaling information or the common PLP. In the latter case, the receiver may acquire the ESG signaling information by receiving the bootstrap, which may depend on the designer's intention.

When the bootstrap and ESG signaling information is transmitted in the common PLP according to the second embodiment of the present invention, the common PLP may also deliver L2 information such as IP-PLP mapping information, system information, and cell information. Or the L2 information may be transmitted in a PLP of the data region. In this case, L2 signaling information for signaling the L2 information may be transmitted along with the bootstrap and ESG signaling information as described with reference to FIGS. 44 and 45.

Then the second decoders 612100 and 612200 may receive a bootstrap and an ESG by selecting and decoding PLPs using the decoded signaling information (S4300300).

In accordance with the first embodiment of the present invention as described above, the receiver may identify PLPs carrying a bootstrap and an ESG using a PLP_BOOT field and a PLP_ID field described before with reference to FIG. 29. In accordance with the second embodiment of the present invention as described above, the receiver may identify PLPs carrying a bootstrap and an ESG using a PLP_BOOT field (or a bootstrap_PLP field) and a PLP_ID field described before with reference to FIGS. 34, 35 and 36. Then the receiver may receive the bootstrap and the ESG by decoding the respective PLPs.

Hereinafter, different embodiments are disclosed. Afterwards, the embodiments are described using different terms that correspond to the above-used terms but have the same meanings. For example, the term, DP (data pipe), are used in same meanings as the term, PLP (physical layer pipe) that are already used above.

As a transmission data unit in physical layer, the term, DP (data pipe), and the term, PLP (physical layer pipe), may have the same meanings. As one example, the terms, "data PLP" as is used above, hereinafter, correspond to the terms, "PLP (physical layer pipe) that carries service data".

Thus, the type1 data PLP and type2 data PLP correspond to the type 1 DP and type 2 DP.

And, the terms, "L1 signaling information" are used in the same meaning as the terms, "physical layer signaling data (PLS data)". Because the physical layer may be called as L1 layer in this art, the two terms may be used as an identical concept.

As an example of the above terms, the terms, "L1-pre-signaling information" may be called "PLS-pre information" hereinafter and the two terms means a physical signaling data part which carries basic information about the transmitting system as well as the parameters needed to decode another physical signaling part following L1-pre-signaling information (or PLS-pre information).

Similarly, the terms "L1-post configurable signaling information" as are used above may be used as the term, "static PLS signaling data" that means that remains static for the duration of a frame or a group of frames. And the terms "dynamic L1-post signaling" may be called as the terms, "dynamic PLS signaling data" that may dynamically change frame-by-frame.

And, the above-used terms, "signaling information" and the terms, "AP1 signaling information" may correspond to a preamble part that will be explained hereinafter.

Accordingly, for example, the terms, "L1_MOD field" may also be a piece of information on modulation of the PLS data.

Figure 48:
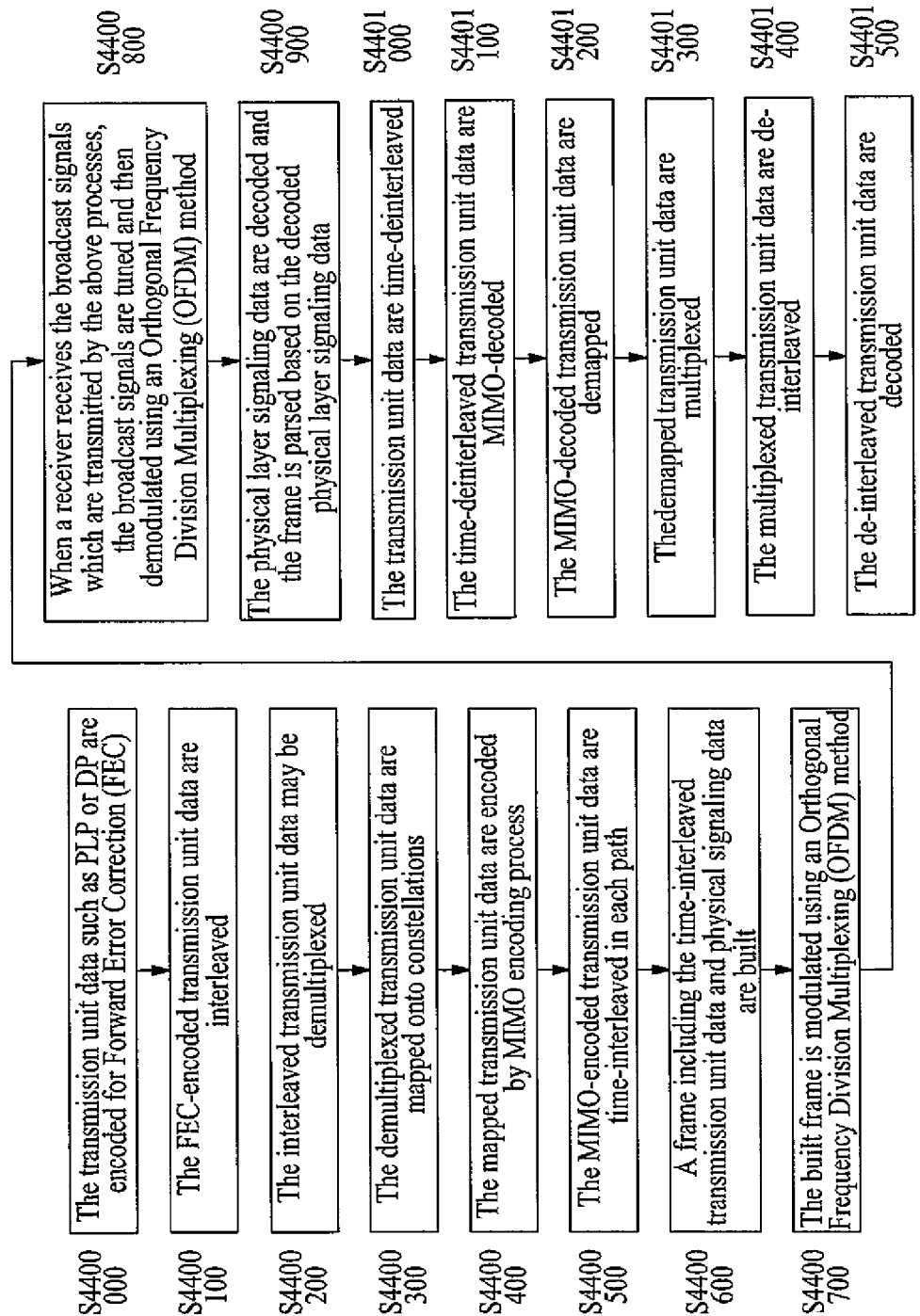
FIG. 48 illustrates a flowchart showing a method for transmitting a broadcast signal according to an embodiment of the present invention.

FIG. 48 illustrates a flowchart showing a method for transmitting a broadcast signal according to an embodiment of the present invention. This process is also disclosed in the embodiment of FIG. 12 and will be also described in FIGS. 53 to 55.

The transmission unit data such as PLP or DP may be processed and transmitted through an input processor, a BICM module, a frame builder, and an OFDM generator as FIG. 6 discloses Herein, the transmission unit data carry broadcast service data. In details, the process is described below.

The transmission unit data such as PLP or DP are encoded for Forward Error Correction (FEC) (S4400000). When the LDPC encoding is used for the FEC, a set of LPDC-encoded bits of the transmission data may be output by this process. This process may be performed in the embodiment of FIG. 12 and will be described in FIG. 53.

The FEC-encoded transmission unit data are interleaved (S4400100). The interleaving may be performed in bit-level of the FEC-encoded transmission unit data.

The interleaved transmission unit data may be demultiplexed (S4400200). In order to enhance the performance of the FEC encoding, the order of the bit-interleaved transmission unit data may be different from the order of the bits to be mapped in accordance with a symbol-mapping method and/or a code rate.

The demultiplexed transmission unit data are mapped onto constellations (S4400300). In this process, one of variety of symbol-mapping methods may be used. When the transmission unit data are mapped onto constellations, the cell which is modulation value that is carried by one carrier of the OFDM transmission are outputted.

The mapped transmission unit data are encoded by MIMO encoding process (S4400400). By transmitting a broadcast signal including the transmission unit data through a plurality of antennas, several types of MIMO encodings may be applied to the transmission unit data in this stage. This process may be performed in the embodiment of FIG. 12 and will be described in FIG. 53.

The MIMO-encoded transmission unit data are time-interleaved in each path (S4400500). The detailed embodiments of the time interleaving will be described in FIGS. 66 to 89.

A frame including the time-interleaved transmission unit data and physical signaling data are built (S4400600). As described, the physical signaling data (L1 signaling information) may include two parts. The first part carries basic information about the system as well as the parameters needed to decode the second part. The second part carries more detailed physical signaling data about the transmission system and the PLPs or DPs. FIGS. 20 to 22 discloses about the detailed information for the physical signaling data. For example, the physical signaling data includes information on which type of MIMO encoding process is applied to an associated transmission unit data which is also described in FIG. 21.

Additionally, when the frame is built, the physical signaling data are delayed. The detailed description for the delay is disclosed in FIG. 13 and by this process, the physical signaling data may be aligned in time with the corresponding transmission unit data at the transmitter end.

The built frame is modulated using an Orthogonal Frequency Division Multiplexing (OFDM) method (S4400700). This process may be performed in the embodiment of FIG. 12 and will be described in FIG. 53.

As described in FIG. 13, the transmission unit data may be interleaved in frequency direction, and the frequency-interleaving may be operated on a single OFDM symbol basis, providing frequency diversity by randomly interleaving the cells of the transmission unit data.

When a receiver receives the broadcast signals which are transmitted by the above processes, the broadcast signals are tuned and then demodulated using an Orthogonal Frequency Division Multiplexing (OFDM) method (S4400800). At the time of receiving the signals, the receiver may use multiple antennas.

The physical layer signaling data are decoded and the frame is parsed based on the decoded physical layer signaling data (S4400900). FIGS. 20 to 22 discloses about the detailed information for the physical signaling data. The physical signaling data may include information on which type of MIMO encoding process is applied to an associated transmission unit data which is described in FIG. 21.

Before parsing the frame, the transmission unit data may be frequency-deintelreaved.

The transmission unit data are time-deinterleaved (S4401000). The detailed time interleaving and de-interleaving are described in FIGS. 66 to 89.

The time-deinterleaved transmission unit data are MIMO-decoded (S4401100). When a receiver detects information on which type of MIMO encoding process is applied to an associated transmission unit data in the physical layer signaling data, the receiver can perform on MIMO-decoding the associated transmission unit data.

The MIMO-decoded transmission unit data are demapped (S4401200).

The demapped transmission unit data are multiplexed (S4401300). At the stage, the bits of the transmission unit data may be reordered.

The multiplexed transmission unit data are de-interleaved (S4401400).

The de-interleaved transmission unit data are decoded (S4401500). For example, the transmission unit data are FEC-decoded based on a LDPC encoding method and the receiver can detect the code rate and FEC-type information in the physical layer signaling data which is described in FIGS. 20 to 22.

This embodiment of receiving the broadcast data may follow the embodiments in FIGS. 14 to FIG. 17, and it will be described in FIGS. 55 to 63 as well.

The present invention provides apparatuses and methods for transmitting and receiving broadcast signals for future broadcast services. Future broadcast services according to an embodiment of the present invention include a terrestrial broadcast service, a mobile broadcast service, a UHDTV service, etc. The apparatuses and methods for transmitting according to an embodiment of the present invention may be categorized into a base profile for the terrestrial broadcast service, a handheld profile for the mobile broadcast service and an advanced profile for the UHDTV service. In this case, the base profile can be used as a profile for both the terrestrial broadcast service and the mobile broadcast service. That is, the base profile can be used to define a concept of a profile which includes the mobile profile. This can be changed according to intention of the designer.

The present invention may process broadcast signals for the future broadcast services through non-MIMO (Multiple Input Multiple Output) or MIMO according to one embodiment. A non-MIMO scheme according to an embodiment of the present invention may include a MISO (Multiple Input Single Output) scheme, a SISO (Single Input Single Output) scheme, etc.

While MISO or MIMO uses two antennas in the following for convenience of description, the present invention is applicable to systems using two or more antennas.

Figure 49:
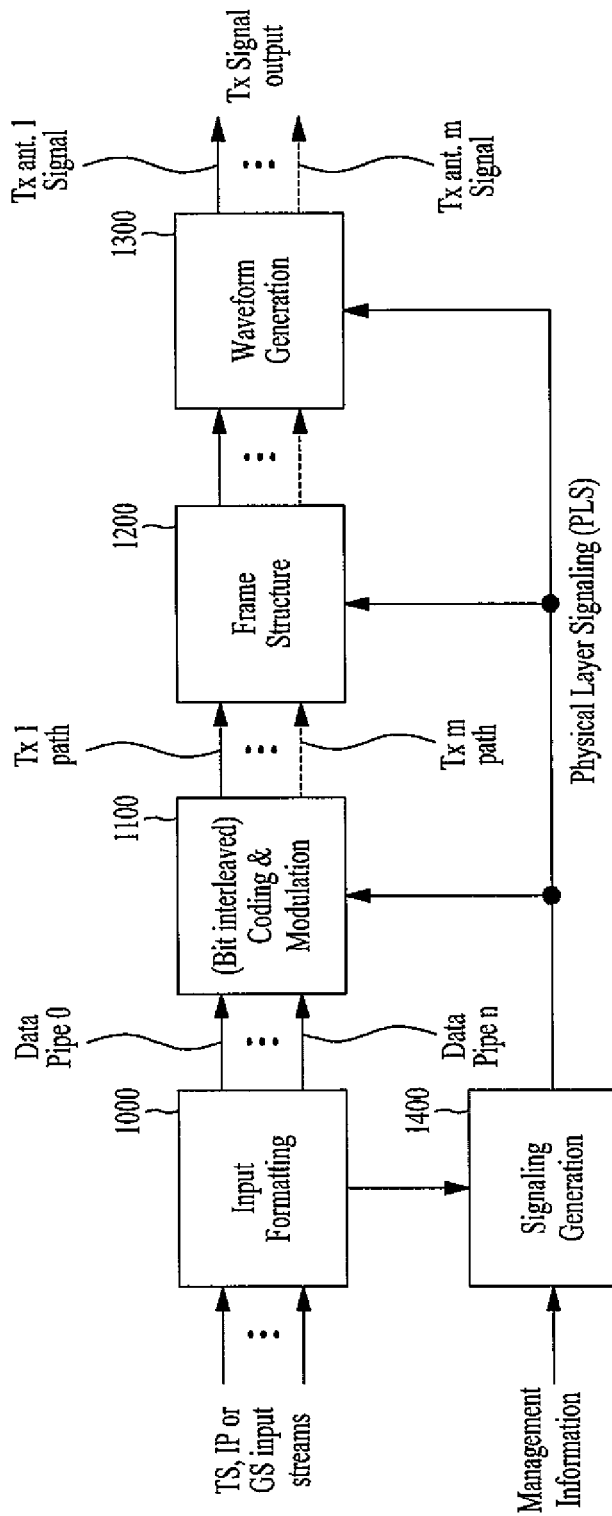
FIG. 49 illustrates a structure of an apparatus for transmitting broadcast signals for future broadcast services according to an embodiment of the present invention.

FIG. 49 illustrates a structure of an apparatus for transmitting broadcast signals for future broadcast services according to an embodiment of the present invention.

The apparatus for transmitting broadcast signals for future broadcast services according to an embodiment of the present invention can include an input formatting module 1000, a coding & modulation module 1100, a frame structure module 1200, a waveform generation module 1300 and a signaling generation module 1400. A description will be given of the operation of each module of the apparatus for transmitting broadcast signals.

Referring to FIG. 49, the apparatus for transmitting broadcast signals for future broadcast services according to an embodiment of the present invention can receive MPEG-TSs, IP streams (v4/v6) and generic streams (GSs) as an input signal. In addition, the apparatus for transmitting broadcast signals can receive management information about the configuration of each stream constituting the input signal and generate a final physical layer signal with reference to the received management information.

The input formatting module 1000 according to an embodiment of the present invention can classify the input streams on the basis of a standard for coding and modulation or services or service components and output the input streams as a plurality of logical data pipes (or data pipes or DP data). The data pipe is a logical channel in the physical layer that carries service data or related metadata, which may carry one or multiple service(s) or service component(s). In addition, data transmitted through each data pipe may be called DP data.

In addition, the input formatting module 1000 according to an embodiment of the present invention can divide each data pipe into blocks necessary to perform coding and modulation and carry out processes necessary to increase transmission efficiency or to perform scheduling. Details of operations of the input formatting module 1000 will be described later.

The coding & modulation module 1100 according to an embodiment of the present invention can perform forward error correction (FEC) encoding on each data pipe received from the input formatting module 1000 such that an apparatus for receiving broadcast signals can correct an error that may be generated on a transmission channel. In addition, the coding & modulation module 1100 according to an embodiment of the present invention can convert FEC output bit data to symbol data and interleave the symbol data to correct burst error caused by a channel. As shown in FIG. 49, the coding & modulation module 1100 according to an embodiment of the present invention can divide the processed data such that the divided data can be output through data paths for respective antenna outputs in order to transmit the data through two or more Tx antennas.

The frame structure module 1200 according to an embodiment of the present invention can map the data output from the coding & modulation module 1100 to signal frames. The frame structure module 1200 according to an embodiment of the present invention can perform mapping using scheduling information output from the input formatting module 1000 and interleave data in the signal frames in order to obtain additional diversity gain.

The waveform generation module 1300 according to an embodiment of the present invention can convert the signal frames output from the frame structure module 1200 into a signal for transmission. In this case, the waveform generation module 1300 according to an embodiment of the present invention can insert a preamble signal (or preamble) into the signal for detection of the transmission apparatus and insert a reference signal for estimating a transmission channel to compensate for distortion into the signal. In addition, the waveform generation module 1300 according to an embodiment of the present invention can provide a guard interval and insert a specific sequence into the same in order to offset the influence of channel delay spread due to multi-path reception. Additionally, the waveform generation module 1300 according to an embodiment of the present invention can perform a procedure necessary for efficient transmission in consideration of signal characteristics such as a peak-to-average power ratio of the output signal.

The signaling generation module 1400 according to an embodiment of the present invention generates final physical layer signaling information using the input management information and information generated by the input formatting module 1000, coding & modulation module 1100 and frame structure module 1200. Accordingly, a reception apparatus according to an embodiment of the present invention can decode a received signal by decoding the signaling information.

As described above, the apparatus for transmitting broadcast signals for future broadcast services according to one embodiment of the present invention can provide terrestrial broadcast service, mobile broadcast service, UHDTV service, etc. Accordingly, the apparatus for transmitting broadcast signals for future broadcast services according to one embodiment of the present invention can multiplex signals for different services in the time domain and transmit the same.

Figure 50:
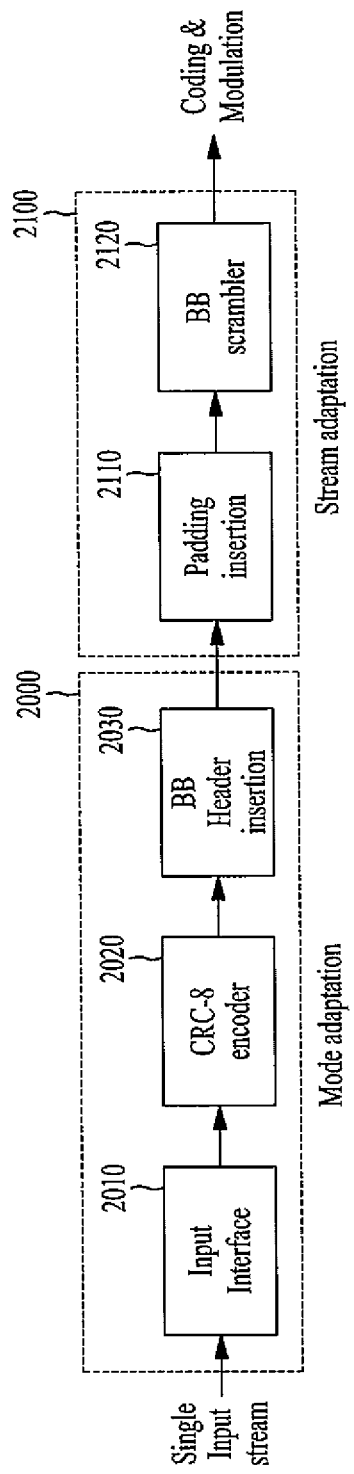
FIG. 50 illustrates an input formatting module according to an embodiment of the present invention.
Figure 51:
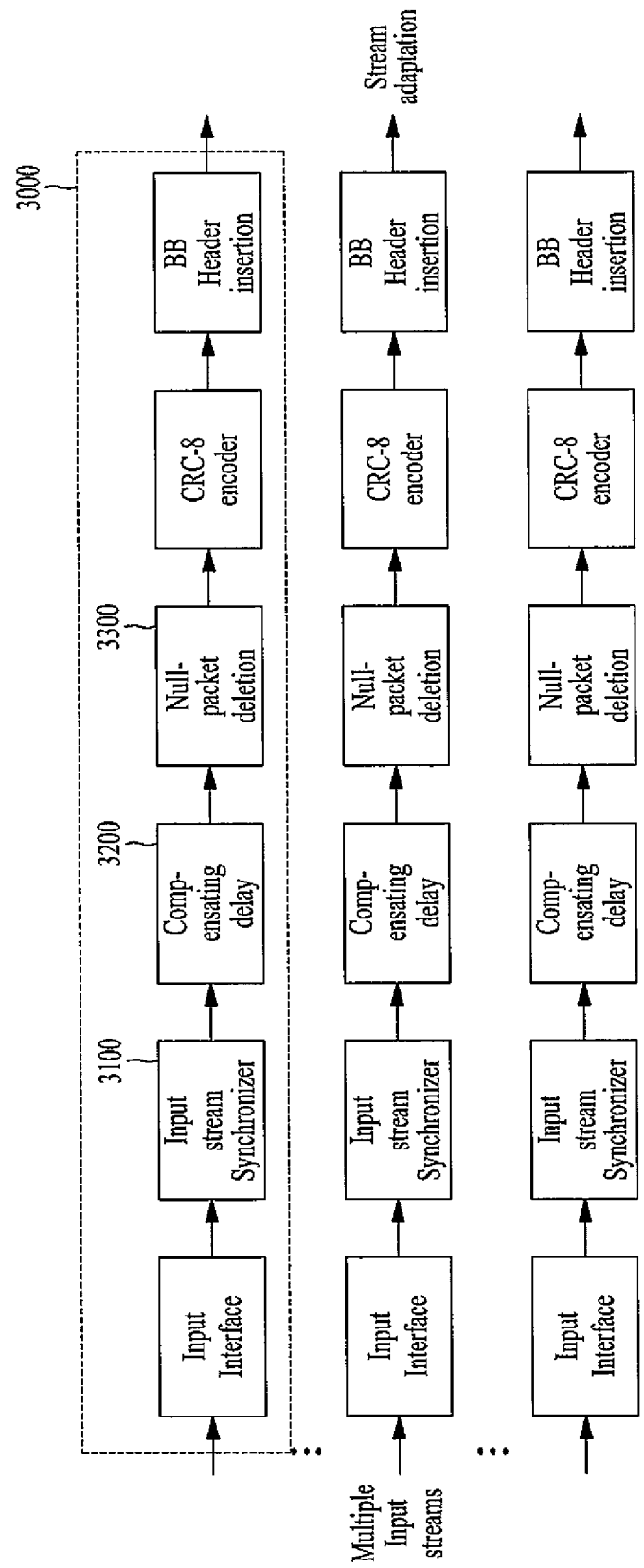
FIG. 51 illustrates an input formatting module according to another embodiment of the present invention.
Figure 52:
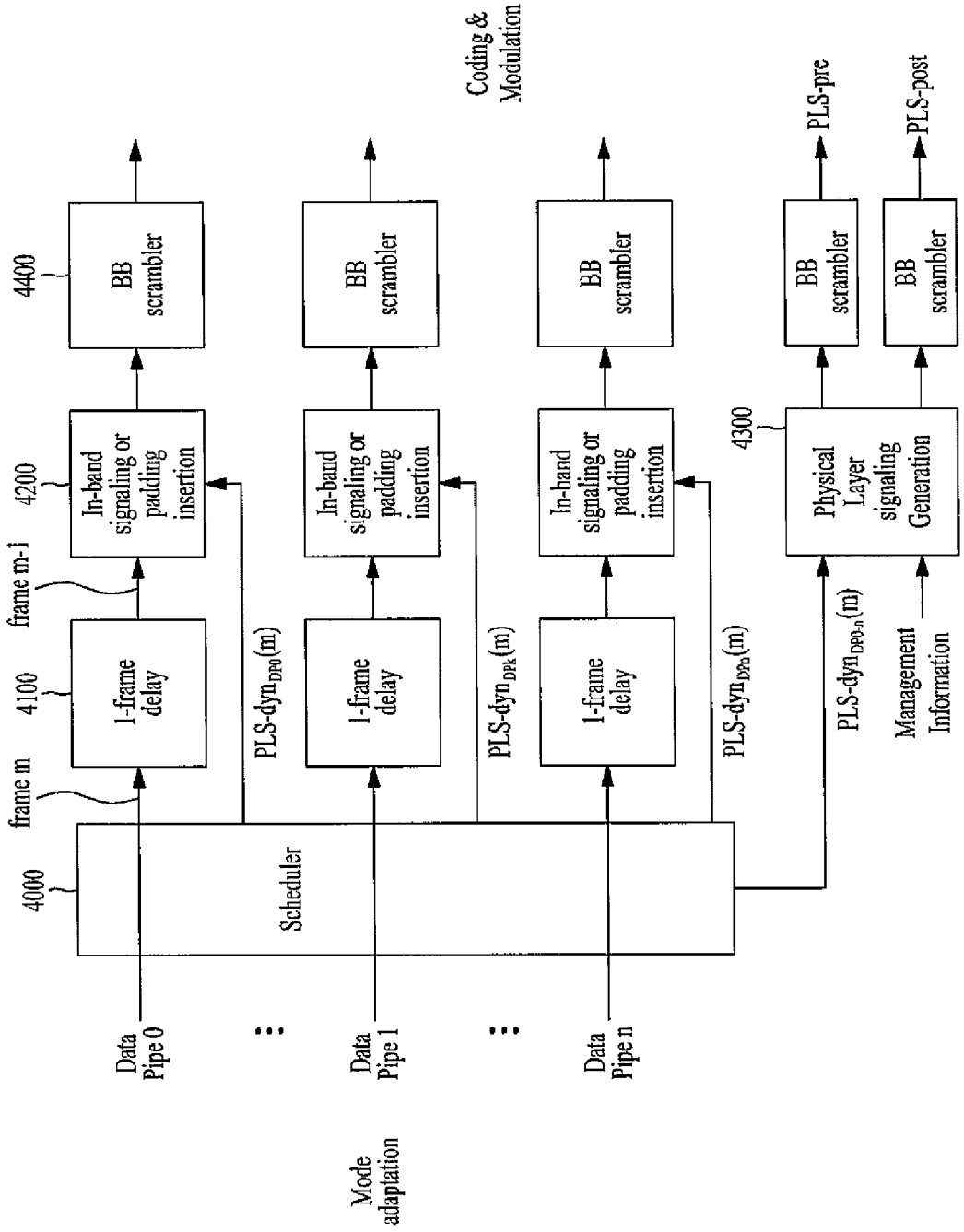
FIG. 52 illustrates an input formatting module according to another embodiment of the present invention.

FIGS. 50, 51 and 52 illustrate the input formatting module 1000 according to embodiments of the present invention. A description will be given of each figure.

FIG. 50 illustrates an input formatting module according to one embodiment of the present invention. FIG. 50 shows an input formatting module when the input signal is a single input stream.

Referring to FIG. 50, the input formatting module according to one embodiment of the present invention can include a mode adaptation module 2000 and a stream adaptation module 2100.

As shown in FIG. 50, the mode adaptation module 2000 can include an input interface block 2010, a CRC-8 encoder block 2020 and a BB header insertion block 2030. Description will be given of each block of the mode adaptation module 2000.

The input interface block 2010 can divide the single input stream input thereto into data pieces each having the length of a baseband (BB) frame used for FEC (BCH/LDPC) which will be performed later and output the data pieces.

The CRC-8 encoder block 2020 can perform CRC encoding on BB frame data to add redundancy data thereto.

The BB header insertion block 2030 can insert, into the BB frame data, a header including information such as mode adaptation type (TS/GS/IP), a user packet length, a data field length, user packet sync byte, start address of user packet sync byte in data field, a high efficiency mode indicator, an input stream synchronization field, etc.

As shown in FIG. 50, the stream adaptation module 2100 can include a padding insertion block 2110 and a BB scrambler block 2120. Description will be given of each block of the stream adaptation module 2100.

If data received from the mode adaptation module 2000 has a length shorter than an input data length necessary for FEC encoding, the padding insertion block 2110 can insert a padding bit into the data such that the data has the input data length and output the data including the padding bit.

The BB scrambler block 2120 can randomize the input bit stream by performing an XOR operation on the input bit stream and a pseudo random binary sequence (PRBS).

The above-described blocks may be omitted or replaced by blocks having similar or identical functions.

As shown in FIG. 50, the input formatting module can finally output data pipes to the coding & modulation module.

FIG. 51 illustrates an input formatting module according to another embodiment of the present invention. FIG. 51 shows a mode adaptation module 3000 of the input formatting module when the input signal corresponds to multiple input streams.

The mode adaptation module 3000 of the input formatting module for processing the multiple input streams can independently process the multiple input streams.

Referring to FIG. 51, the mode adaptation module 3000 for respectively processing the multiple input streams can include input interface blocks, input stream synchronizer blocks 3100, compensating delay blocks 3200, null packet deletion blocks 3300, CRC-8 encoder blocks and BB header insertion blocks. Description will be given of each block of the mode adaptation module 3000.

Operations of the input interface block, CRC-8 encoder block and BB header insertion block correspond to those of the input interface block, CRC-8 encoder block and BB header insertion block described with reference to FIG. 50 and thus description thereof is omitted.

The input stream synchronizer block 3100 can transmit input stream clock reference (ISCR) information to generate timing information necessary for the apparatus for receiving broadcast signals to restore the TSs or GSs.

The compensating delay block 3200 can delay input data and output the delayed input data such that the apparatus for receiving broadcast signals can synchronize the input data if a delay is generated between data pipes according to processing of data including the timing information by the transmission apparatus.

The null packet deletion block 3300 can delete unnecessarily transmitted input null packets from the input data, insert the number of deleted null packets into the input data based on positions in which the null packets are deleted and transmit the input data.

The above-described blocks may be omitted or replaced by blocks having similar or identical functions.

FIG. 52 illustrates an input formatting module according to another embodiment of the present invention.

Specifically, FIG. 52 illustrates a stream adaptation module of the input formatting module when the input signal corresponds to multiple input streams.

The stream adaptation module of the input formatting module when the input signal corresponds to multiple input streams can include a scheduler 4000, a 1-frame delay block 4100, an in-band signaling or padding insertion block 4200, a physical layer signaling generation block 4300 and a BB scrambler block 4400. Description will be given of each block of the stream adaptation module.

The scheduler 4000 can perform scheduling for a MIMO system using multiple antennas having dual polarity. In addition, the scheduler 4000 can generate parameters for use in signal processing blocks for antenna paths, such as a bit-to-cell demux block, a cell interleaver block, a time interleaver block, etc. included in the coding & modulation module illustrated in FIG. 49.

The 1-frame delay block 4100 can delay the input data by one transmission frame such that scheduling information about the next frame can be transmitted through the current frame for in-band signaling information to be inserted into the data pipes.

The in-band signaling or padding insertion block 4200 can insert undelayed physical layer signaling (PLS)-dynamic signaling information into the data delayed by one transmission frame. In this case, the in-band signaling or padding insertion block 4200 can insert a padding bit when a space for padding is present or insert in-band signaling information into the padding space. In addition, the scheduler 4000 can output physical layer signaling-dynamic signaling information about the current frame separately from in-band signaling information. Accordingly, a cell mapper, which will be described later, can map input cells according to scheduling information output from the scheduler 4000.

The physical layer signaling generation block 4300 can generate physical layer signaling data which will be transmitted through a preamble symbol of a transmission frame or spread and transmitted through a data symbol other than the in-band signaling information. In this case, the physical layer signaling data according to an embodiment of the present invention can be referred to as signaling information. Furthermore, the physical layer signaling data according to an embodiment of the present invention can be divided into PLS-pre information and PLS-post information. The PLS-pre information can include parameters necessary to encode the PLS-post information and static PLS signaling data and the PLS-post information can include parameters necessary to encode the data pipes. The parameters necessary to encode the data pipes can be classified into static PLS signaling data and dynamic PLS signaling data. The static PLS signaling data is a parameter commonly applicable to all frames included in a super-frame and can be changed on a super-frame basis. The dynamic PLS signaling data is a parameter differently applicable to respective frames included in a super-frame and can be changed on a frame-by-frame basis. Accordingly, the reception apparatus can acquire the PLS-post information by decoding the PLS-pre information and decode desired data pipes by decoding the PLS-post information.

The BB scrambler block 4400 can generate a pseudo-random binary sequence (PRBS) and perform an XOR operation on the PRBS and the input bit streams to decrease the peak-to-average power ratio (PAPR) of the output signal of the waveform generation block. As shown in FIG. 52, scrambling of the BB scrambler block 4400 is applicable to both data pipes and physical layer signaling information.

The above-described blocks may be omitted or replaced by blocks having similar or identical functions according to designer.

As shown in FIG. 52, the stream adaptation module can finally output the data pipes to the coding & modulation module.

Figure 53:
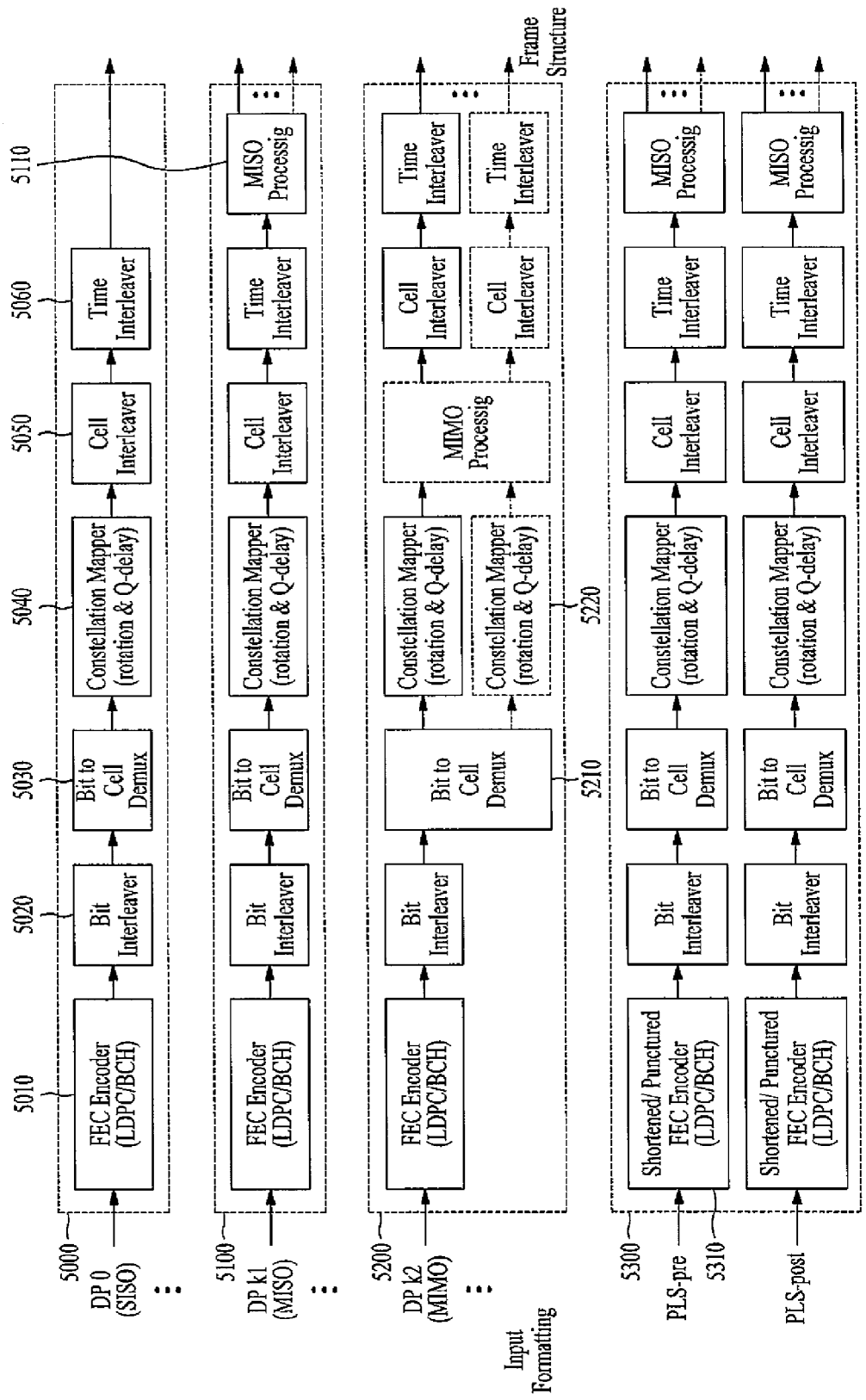
FIG. 53 illustrates a coding & modulation module according to an embodiment of the present invention.

FIG. 53 illustrates a coding & modulation module according to an embodiment of the present invention.

The coding & modulation module shown in FIG. 53 corresponds to an embodiment of the coding & modulation module illustrated in FIG. 49.

As described above, the apparatus for transmitting broadcast signals for future broadcast services according to an embodiment of the present invention can provide a terrestrial broadcast service, mobile broadcast service, UHDTV service, etc.

Since QoS (quality of service) depends on characteristics of a service provided by the apparatus for transmitting broadcast signals for future broadcast services according to an embodiment of the present invention, data corresponding to respective services needs to be processed through different schemes. Accordingly, the coding & modulation module according to an embodiment of the present invention can independently process data pipes input thereto by independently applying SISO, MISO and MIMO schemes to the data pipes respectively corresponding to data paths. Consequently, the apparatus for transmitting broadcast signals for future broadcast services according to an embodiment of the present invention can control QoS for each service or service component transmitted through each data pipe.

Accordingly, the coding & modulation module according to an embodiment of the present invention can include a first block 5000 for SISO, a second block 5100 for MISO, a third block 5200 for MIMO and a fourth block 5300 for processing the PLS-pre/PLS-post information. The coding & modulation module illustrated in FIG. 53 is an exemplary and may include only the first block 5000 and the fourth block 5300, the second block 5100 and the fourth block 5300 or the third block 5200 and the fourth block 5300 according to design. That is, the coding & modulation module can include blocks for processing data pipes equally or differently according to design.

A description will be given of each block of the coding & modulation module.

The first block 5000 processes an input data pipe according to SISO and can include an FEC encoder block 5010, a bit interleaver block 5020, a bit-to-cell demux block 5030, a constellation mapper block 5040, a cell interleaver block 5050 and a time interleaver block 5060.

The FEC encoder block 5010 can perform BCH encoding and LDPC encoding on the input data pipe to add redundancy thereto such that the reception apparatus can correct an error generated on a transmission channel.

The bit interleaver block 5020 can interleave bit streams of the FEC-encoded data pipe according to an interleaving rule such that the bit streams have robustness against burst error that may be generated on the transmission channel. Accordingly, when deep fading or erasure is applied to QAM symbols, errors can be prevented from being generated in consecutive bits from among all codeword bits since interleaved bits are mapped to the QAM symbols.

The bit-to-cell demux block 5030 can determine the order of input bit streams such that each bit in an FEC block can be transmitted with appropriate robustness in consideration of both the order of input bit streams and a constellation mapping rule.

In addition, the bit interleaver block 5020 is located between the FEC encoder block 5010 and the constellation mapper block 5040 and can connect output bits of LDPC encoding performed by the FEC encoder block 5010 to bit positions having different reliability values and optimal values of the constellation mapper in consideration of LDPC decoding of the apparatus for receiving broadcast signals. Accordingly, the bit-to-cell demux block 5030 can be replaced by a block having a similar or equal function.

The constellation mapper block 5040 can map a bit word input thereto to one constellation. In this case, the constellation mapper block 5040 can additionally perform rotation & Q-delay. That is, the constellation mapper block 5040 can rotate input constellations according to a rotation angle, divide the constellations into an in-phase component and a quadrature-phase component and delay only the quadrature-phase component by an arbitrary value. Then, the constellation mapper block 5040 can remap the constellations to new constellations using a paired in-phase component and quadrature-phase component.

In addition, the constellation mapper block 5040 can move constellation points on a two-dimensional plane in order to find optimal constellation points. Through this process, capacity of the coding & modulation module 1100 can be optimized. Furthermore, the constellation mapper block 5040 can perform the above-described operation using IQ-balanced constellation points and rotation. The constellation mapper block 5040 can be replaced by a block having a similar or equal function.

The cell interleaver block 5050 can randomly interleave cells corresponding to one FEC block and output the interleaved cells such that cells corresponding to respective FEC blocks can be output in different orders.

The time interleaver block 5060 can interleave cells belonging to a plurality of FEC blocks and output the interleaved cells. Accordingly, the cells corresponding to the FEC blocks are dispersed and transmitted in a period corresponding to a time interleaving depth and thus diversity gain can be obtained.

The second block 5100 processes an input data pipe according to MISO and can include the FEC encoder block, bit interleaver block, bit-to-cell demux block, constellation mapper block, cell interleaver block and time interleaver block in the same manner as the first block 5000. However, the second block 5100 is distinguished from the first block 5000 in that the second block 5100 further includes a MISO processing block 5110. The second block 5100 performs the same procedure including the input operation to the time interleaver operation as those of the first block 5000 and thus description of the corresponding blocks is omitted.

The MISO processing block 5110 can encode input cells according to a MISO encoding matrix providing transmit diversity and output MISO-processed data through two paths. MISO processing according to one embodiment of the present invention can include OSTBC (orthogonal space time block coding)/OSFBC (orthogonal space frequency block coding, Alamouti coding).

The third block 5200 processes an input data pipe according to MIMO and can include the FEC encoder block, bit interleaver block, bit-to-cell demux block, constellation mapper block, cell interleaver block and time interleaver block in the same manner as the second block 5100, as shown in FIG. 53. However, the data processing procedure of the third block 5200 is different from that of the second block 5100 since the third block 5200 includes a MIMO processing block 5220.

That is, in the third block 5200, basic roles of the FEC encoder block and the bit interleaver block are identical to those of the first and second blocks 5000 and 5100 although functions thereof may be different from those of the first and second blocks 5000 and 5100.

The bit-to-cell demux block 5210 can generate as many output bit streams as input bit streams of MIMO processing and output the output bit streams through MIMO paths for MIMO processing. In this case, the bit-to-cell demux block 5210 can be designed to optimize the decoding performance of the reception apparatus in consideration of characteristics of LDPC and MIMO processing.

Basic roles of the constellation mapper block, cell interleaver block and time interleaver block are identical to those of the first and second blocks 5000 and 5100 although functions thereof may be different from those of the first and second blocks 5000 and 5100. As shown in FIG. 53, as many constellation mapper blocks, cell interleaver blocks and time interleaver blocks as the number of MIMO paths for MIMO processing can be present. In this case, the constellation mapper blocks, cell interleaver blocks and time interleaver blocks can operate equally or independently for data input through the respective paths.

The MIMO processing block 5220 can perform MIMO processing on two input cells using a MIMO encoding matrix and output the MIMO-processed data through two paths. The MIMO encoding matrix according to an embodiment of the present invention can include spatial multiplexing, Golden code, full-rate full diversity code, linear dispersion code, etc.

The fourth block 5300 processes the PLS-pre/PLS-post information and can perform SISO or MISO processing.

The basic roles of the bit interleaver block, bit-to-cell demux block, constellation mapper block, cell interleaver block, time interleaver block and MISO processing block included in the fourth block 5300 correspond to those of the second block 5100 although functions thereof may be different from those of the second block 5100.

A shortened/punctured FEC encoder block 5310 included in the fourth block 5300 can process PLS data using an FEC encoding scheme for a PLS path provided for a case in which the length of input data is shorter than a length necessary to perform FEC encoding. Specifically, the shortened/punctured FEC encoder block 5310 can perform BCH encoding on input bit streams, pad 0s corresponding to a desired input bit stream length necessary for normal LDPC encoding, carry out LDPC encoding and then remove the padded 0s to puncture parity bits such that an effective code rate becomes equal to or lower than the data pipe rate.

The blocks included in the first block 5000 to fourth block 5300 may be omitted or replaced by blocks having similar or identical functions according to design.

As illustrated in FIG. 53, the coding & modulation module can output the data pipes (or DP data), PLS-pre information and PLS-post information processed for the respective paths to the frame structure module.

Figure 54:
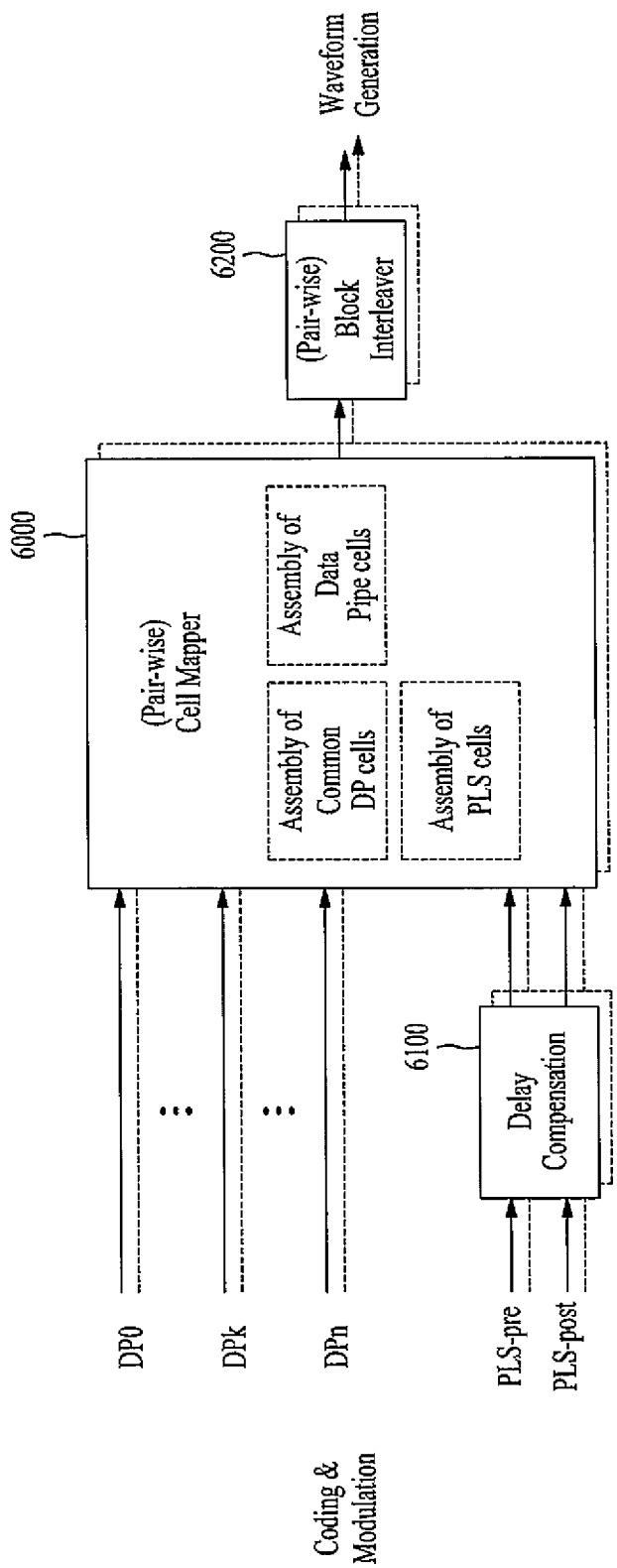
FIG. 54 illustrates a frame structure module according to an embodiment of the present invention.

FIG. 54 illustrates a frame structure module according to one embodiment of the present invention.

The frame structure module shown in FIG. 54 corresponds to an embodiment of the frame structure module 1200 illustrated in FIG. 49.

The frame structure module according to one embodiment of the present invention can include at least one cell-mapper 6000, at least one delay compensation module 6100 and at least one block interleaver 6200. The number of cell mappers 6000, delay compensation modules 6100 and block interleavers 6200 can be changed. A description will be given of each module of the frame structure block.

The cell-mapper 6000 can allocate cells corresponding to SISO-, MISO- or MIMO-processed data pipes output from the coding & modulation module, cells corresponding to common data commonly applicable to the data pipes and cells corresponding to the PLS-pre/PLS-post information to signal frames according to scheduling information. The common data refers to signaling information commonly applied to all or some data pipes and can be transmitted through a specific data pipe. The data pipe through which the common data is transmitted can be referred to as a common data pipe and can be changed according to design.

When the apparatus for transmitting broadcast signals according to an embodiment of the present invention uses two output antennas and Alamouti coding is used for MISO processing, the cell-mapper 6000 can perform pair-wise cell mapping in order to maintain orthogonality according to Alamouti encoding. That is, the cell-mapper 6000 can process two consecutive cells of the input cells as one unit and map the unit to a frame. Accordingly, paired cells in an input path corresponding to an output path of each antenna can be allocated to neighboring positions in a transmission frame.

The delay compensation block 6100 can obtain PLS data corresponding to the current transmission frame by delaying input PLS data cells for the next transmission frame by one frame. In this case, the PLS data corresponding to the current frame can be transmitted through a preamble part in the current signal frame and PLS data corresponding to the next signal frame can be transmitted through a preamble part in the current signal frame or in-band signaling in each data pipe of the current signal frame. This can be changed by the designer.

The block interleaver 6200 can obtain additional diversity gain by interleaving cells in a transport block corresponding to the unit of a signal frame. In addition, the block interleaver 6200 can perform interleaving by processing two consecutive cells of the input cells as one unit when the above-described pair-wise cell mapping is performed. Accordingly, cells output from the block interleaver 6200 can be two consecutive identical cells.

When pair-wise mapping and pair-wise interleaving are performed, at least one cell mapper and at least one block interleaver can operate equally or independently for data input through the paths.

The above-described blocks may be omitted or replaced by blocks having similar or identical functions according to design.

As illustrated in FIG. 54, the frame structure module can output at least one signal frame to the waveform generation module.

Figure 55:
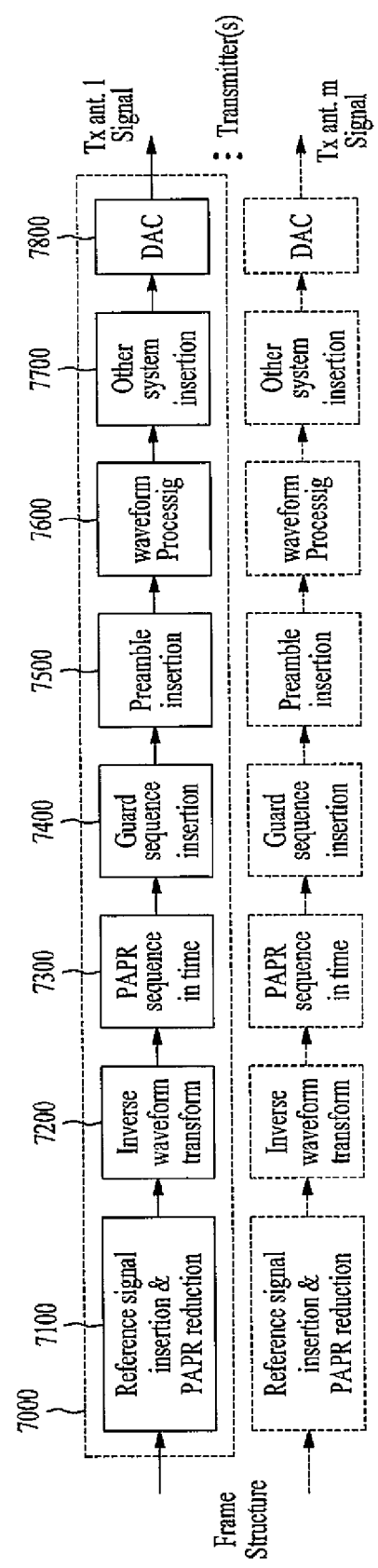
FIG. 55 illustrates a waveform generation module according to an embodiment of the present invention.

FIG. 55 illustrates a waveform generation module according to an embodiment of the present invention.

The waveform generation module illustrated in FIG. 55 corresponds to an embodiment of the waveform generation module 1300 described with reference to FIG. 49.

The waveform generation module according to an embodiment of the present invention can modulate and transmit as many signal frames as the number of antennas for receiving and outputting signal frames output from the frame structure module illustrated in FIG. 54.

Specifically, the waveform generation module illustrated in FIG. 55 is an embodiment of a waveform generation module of an apparatus for transmitting broadcast signals using m Tx antennas and can include m processing blocks for modulating and outputting frames corresponding to m paths. The m processing blocks can perform the same processing procedure. A description will be given of operation of the first processing block 7000 from among the m processing blocks.

The first processing block 7000 can include a reference signal & PAPR reduction block 7100, an inverse waveform transform block 7200, a PAPR reduction in time block 7300, a guard sequence insertion block 7400, a preamble insertion block 7500, a waveform processing block 7600, other system insertion block 7700 and a DAC (digital analog converter) block 7800.

The reference signal insertion & PAPR reduction block 7100 can insert a reference signal into a predetermined position of each signal block and apply a PAPR reduction scheme to reduce a PAPR in the time domain. If a broadcast transmission/reception system according to an embodiment of the present invention corresponds to an OFDM system, the reference signal insertion & PAPR reduction block 7100 can use a method of reserving some active subcarriers rather than using the same. In addition, the reference signal insertion & PAPR reduction block 7100 may not use the PAPR reduction scheme as an optional feature according to broadcast transmission/reception system.

The inverse waveform transform block 7200 can transform an input signal in a manner of improving transmission efficiency and flexibility in consideration of transmission channel characteristics and system architecture. If the broadcast transmission/reception system according to an embodiment of the present invention corresponds to an OFDM system, the inverse waveform transform block 7200 can employ a method of transforming a frequency domain signal into a time domain signal through inverse FFT operation. If the broadcast transmission/reception system according to an embodiment of the present invention corresponds to a single carrier system, the inverse waveform transform block 7200 may not be used in the waveform generation module.

The PAPR reduction in time block 7300 can use a method for reducing PAPR of an input signal in the time domain. If the broadcast transmission/reception system according to an embodiment of the present invention corresponds to an OFDM system, the PAPR reduction in time block 7300 may use a method of simply clipping peak amplitude. Furthermore, the PAPR reduction in time block 7300 may not be used in the broadcast transmission/reception system according to an embodiment of the present invention since it is an optional feature.

The guard sequence insertion block 7400 can provide a guard interval between neighboring signal blocks and insert a specific sequence into the guard interval as necessary in order to minimize the influence of delay spread of a transmission channel. Accordingly, the reception apparatus can easily perform synchronization or channel estimation. If the broadcast transmission/reception system according to an embodiment of the present invention corresponds to an OFDM system, the guard sequence insertion block 7400 may insert a cyclic prefix into a guard interval of an OFDM symbol.

The preamble insertion block 7500 can insert a signal of a known type (e.g. the preamble or preamble symbol) agreed upon between the transmission apparatus and the reception apparatus into a transmission signal such that the reception apparatus can rapidly and efficiently detect a target system signal. If the broadcast transmission/reception system according to an embodiment of the present invention corresponds to an OFDM system, the preamble insertion block 7500 can define a signal frame composed of a plurality of OFDM symbols and insert a preamble symbol into the beginning of each signal frame. That is, the preamble carries basic PLS data and is located in the beginning of a signal frame.

The waveform processing block 7600 can perform waveform processing on an input baseband signal such that the input baseband signal meets channel transmission characteristics. The waveform processing block 7600 may use a method of performing square-root-raised cosine (SRRC) filtering to obtain a standard for out-of-band emission of a transmission signal. If the broadcast transmission/reception system according to an embodiment of the present invention corresponds to a multi-carrier system, the waveform processing block 7600 may not be used.

The other system insertion block 7700 can multiplex signals of a plurality of broadcast transmission/reception systems in the time domain such that data of two or more different broadcast transmission/reception systems providing broadcast services can be simultaneously transmitted in the same RF signal bandwidth. In this case, the two or more different broadcast transmission/reception systems refer to systems providing different broadcast services. The different broadcast services may refer to a terrestrial broadcast service, mobile broadcast service, etc. Data related to respective broadcast services can be transmitted through different frames.

The DAC block 7800 can convert an input digital signal into an analog signal and output the analog signal. The signal output from the DAC block 7800 can be transmitted through m output antennas. A Tx antenna according to an embodiment of the present invention can have vertical or horizontal polarity.

The above-described blocks may be omitted or replaced by blocks having similar or identical functions according to design.

Figure 56:
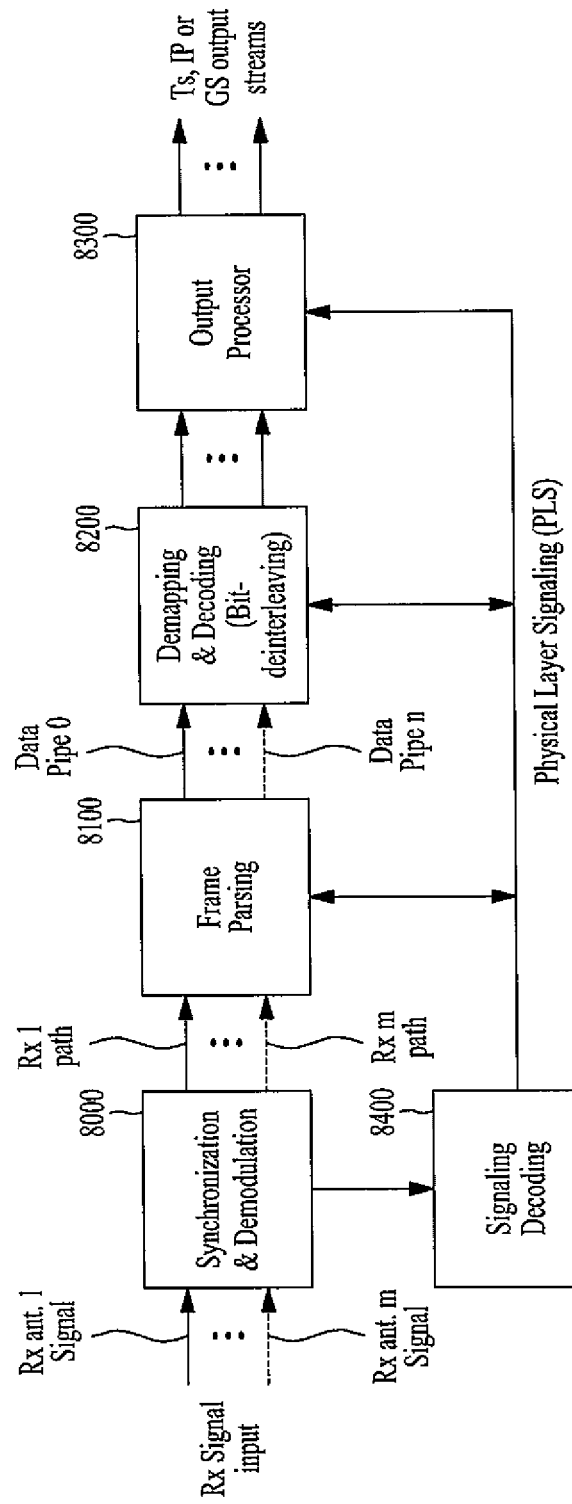
FIG. 56 illustrates a structure of an apparatus for receiving broadcast signals for future broadcast services according to an embodiment of the present invention.

FIG. 56 illustrates a structure of an apparatus for receiving broadcast signals for future broadcast services according to an embodiment of the present invention.

The apparatus for receiving broadcast signals for future broadcast services according to an embodiment of the present invention can correspond to the apparatus for transmitting broadcast signals for future broadcast services, described with reference to FIG. 49. The apparatus for receiving broadcast signals for future broadcast services according to an embodiment of the present invention can include a synchronization & demodulation module 8000, a frame parsing module 8100, a demapping & decoding module 8200, an output processor 8300 and a signaling decoding module 8400. A description will be given of operation of each module of the apparatus for receiving broadcast signals.

The synchronization & demodulation module 8000 can receive input signals through m Rx antennas, perform signal detection and synchronization with respect to a system corresponding to the apparatus for receiving broadcast signals and carry out demodulation corresponding to a reverse procedure of the procedure performed by the apparatus for transmitting broadcast signals.

The frame parsing module 8100 can parse input signal frames and extract data through which a service selected by a user is transmitted. If the apparatus for transmitting broadcast signals performs interleaving, the frame parsing module 8100 can carry out deinterleaving corresponding to a reverse procedure of interleaving. In this case, the positions of a signal and data that need to be extracted can be obtained by decoding data output from the signaling decoding module 8400 to restore scheduling information generated by the apparatus for transmitting broadcast signals.

The demapping & decoding module 8200 can convert the input signals into bit domain data and then deinterleave the same as necessary. The demapping & decoding module 8200 can perform demapping for mapping applied for transmission efficiency and correct an error generated on a transmission channel through decoding. In this case, the demapping & decoding module 8200 can obtain transmission parameters necessary for demapping and decoding by decoding the data output from the signaling decoding module 8400.

The output processor 8300 can perform reverse procedures of various compression/signal processing procedures which are applied by the apparatus for transmitting broadcast signals to improve transmission efficiency. In this case, the output processor 8300 can acquire necessary control information from data output from the signaling decoding module 8400. The output of the output processor 8300 corresponds to a signal input to the apparatus for transmitting broadcast signals and may be MPEG-TSs, IP streams (v4 or v6) and generic streams.

The signaling decoding module 8400 can obtain PLS information from the signal demodulated by the synchronization & demodulation module 8000. As described above, the frame parsing module 8100, demapping & decoding module 8200 and output processor 8300 can execute functions thereof using the data output from the signaling decoding module 8400.

Figure 57:
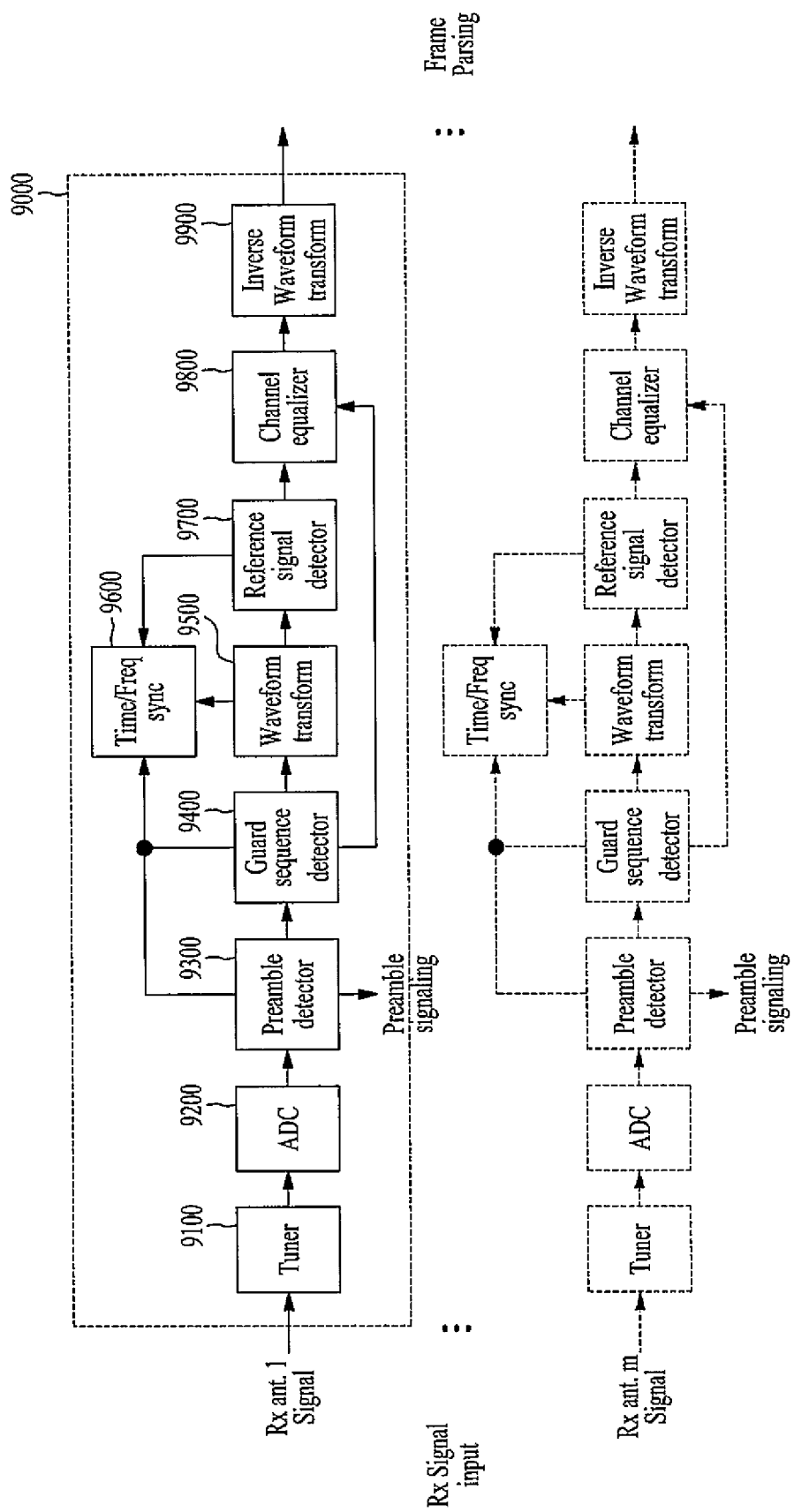
FIG. 57 illustrates a synchronization & demodulation module according to an embodiment of the present invention.

FIG. 57 illustrates a synchronization & demodulation module according to an embodiment of the present invention.

The synchronization & demodulation module shown in FIG. 57 corresponds to an embodiment of the synchronization & demodulation module described with reference to FIG. 56. The synchronization & demodulation module shown in FIG. 57 can perform a reverse operation of the operation of the waveform generation module illustrated in FIG. 55.

As shown in FIG. 57, the synchronization & demodulation module according to an embodiment of the present invention corresponds to a synchronization & demodulation module of an apparatus for receiving broadcast signals using m Rx antennas and can include m processing blocks for demodulating signals respectively input through m paths. The m processing blocks can perform the same processing procedure. A description will be given of operation of the first processing block 9000 from among the m processing blocks.

The first processing block 9000 can include a tuner 9100, an ADC block 9200, a preamble detector 9300, a guard sequence detector 9400, a waveform transform block 9500, a time/frequency synchronization block 9600, a reference signal detector 9700, a channel equalizer 9800 and an inverse waveform transform block 9900.

The tuner 9100 can select a desired frequency band, compensate for the magnitude of a received signal and output the compensated signal to the ADC block 9200.

The ADC block 9200 can convert the signal output from the tuner 9100 into a digital signal.

The preamble detector 9300 can detect a preamble (or preamble signal or preamble symbol) in order to check whether or not the digital signal is a signal of the system corresponding to the apparatus for receiving broadcast signals. In this case, the preamble detector 9300 can decode basic transmission parameters received through the preamble.

The guard sequence detector 9400 can detect a guard sequence in the digital signal. The time/frequency synchronization block 9600 can perform time/frequency synchronization using the detected guard sequence and the channel equalizer 9800 can estimate a channel through a received/restored sequence using the detected guard sequence.

The waveform transform block 9500 can perform a reverse operation of inverse waveform transform when the apparatus for transmitting broadcast signals has performed inverse waveform transform. When the broadcast transmission/reception system according to one embodiment of the present invention is a multi-carrier system, the waveform transform block 9500 can perform FFT. Furthermore, when the broadcast transmission/reception system according to an embodiment of the present invention is a single carrier system, the waveform transform block 9500 may not be used if a received time domain signal is processed in the frequency domain or processed in the time domain.

The time/frequency synchronization block 9600 can receive output data of the preamble detector 9300, guard sequence detector 9400 and reference signal detector 9700 and perform time synchronization and carrier frequency synchronization including guard sequence detection and block window positioning on a detected signal. Here, the time/frequency synchronization block 9600 can feed back the output signal of the waveform transform block 9500 for frequency synchronization.

The reference signal detector 9700 can detect a received reference signal. Accordingly, the apparatus for receiving broadcast signals according to an embodiment of the present invention can perform synchronization or channel estimation.

The channel equalizer 9800 can estimate a transmission channel from each Tx antenna to each Rx antenna from the guard sequence or reference signal and perform channel equalization for received data using the estimated channel.

The inverse waveform transform block 9900 may restore the original received data domain when the waveform transform block 9500 performs waveform transform for efficient synchronization and channel estimation/equalization. If the broadcast transmission/reception system according to an embodiment of the present invention is a single carrier system, the waveform transform block 9500 can perform FFT in order to carry out synchronization/channel estimation/equalization in the frequency domain and the inverse waveform transform block 9900 can perform IFFT on the channel-equalized signal to restore transmitted data symbols. If the broadcast transmission/reception system according to an embodiment of the present invention is a multi-carrier system, the inverse waveform transform block 9900 may not be used.

The above-described blocks may be omitted or replaced by blocks having similar or identical functions according to design.

Figure 58:
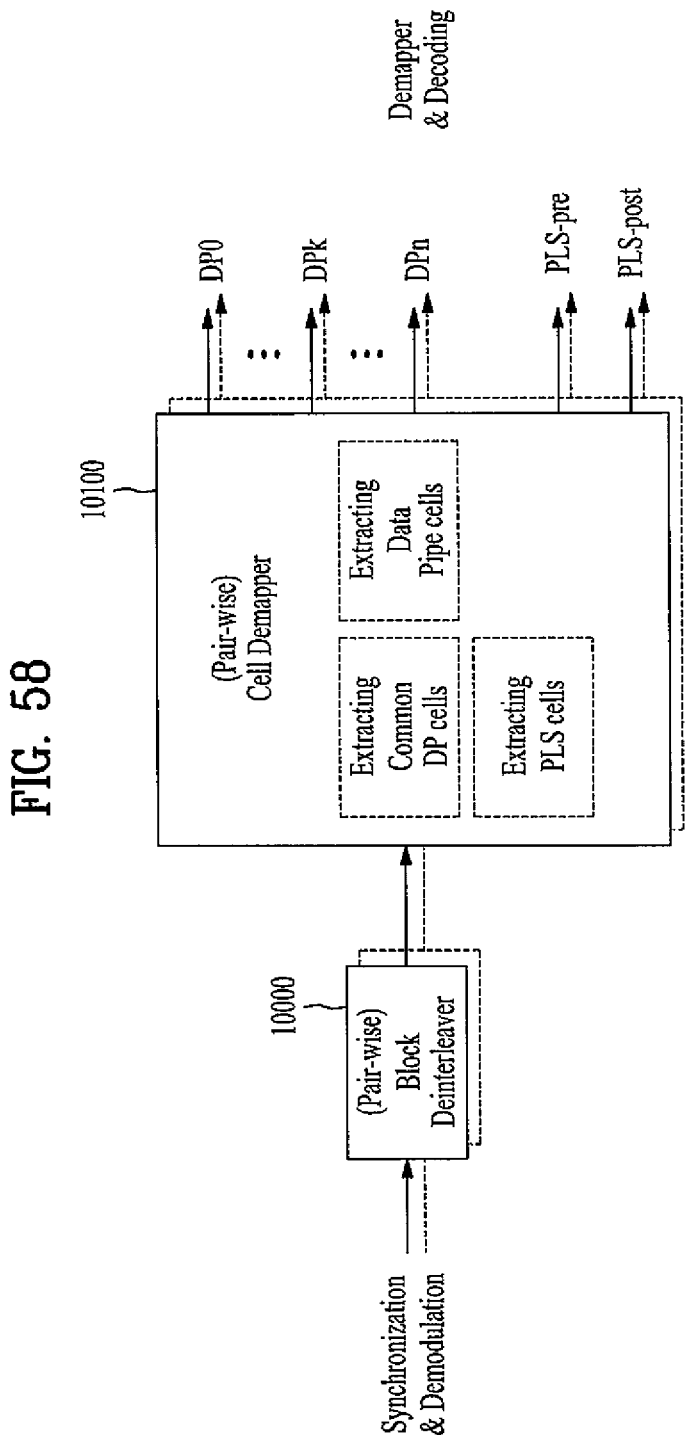
FIG. 58 illustrates a frame parsing module according to an embodiment of the present invention.

FIG. 58 illustrates a frame parsing module according to an embodiment of the present invention.

The frame parsing module illustrated in FIG. 58 corresponds to an embodiment of the frame parsing module described with reference to FIG. 56. The frame parsing module shown in FIG. 58 can perform a reverse operation of the operation of the frame structure module illustrated in FIG. 54.

As shown in FIG. 58, the frame parsing module according to an embodiment of the present invention can include at least one block deinterleaver 10000 and at least one cell demapper 10100.

The block deinterleaver 10000 can deinterleave data input through data paths of the m Rx antennas and processed by the synchronization & demodulation module on a signal block basis. In this case, if the apparatus for transmitting broadcast signals performs pair-wise interleaving as illustrated in FIG. 56, the block deinterleaver 10000 can process two consecutive pieces of data as a pair for each input path. Accordingly, the block interleaver 10000 can output two consecutive pieces of data even when deinterleaving has been performed. Furthermore, the block deinterleaver 10000 can perform a reverse operation of the interleaving operation performed by the apparatus for transmitting broadcast signals to output data in the original order.

The cell demapper 10100 can extract cells corresponding to common data, cells corresponding to data pipes and cells corresponding to PLS data from received signal frames. The cell demapper 10100 can merge data distributed and transmitted and output the same as a stream as necessary. When two consecutive pieces of cell input data are processed as a pair and mapped in the apparatus for transmitting broadcast signals, as shown in FIG. 54, the cell demapper 10100 can perform pair-wise cell demapping for processing two consecutive input cells as one unit as a reverse procedure of the mapping operation of the apparatus for transmitting broadcast signals.

In addition, the cell demapper 10100 can extract PLS signaling data received through the current frame as PLS-pre & PLS-post data and output the PLS-pre & PLS-post data.

The above-described blocks may be omitted or replaced by blocks having similar or identical functions according to design.

Figure 59:
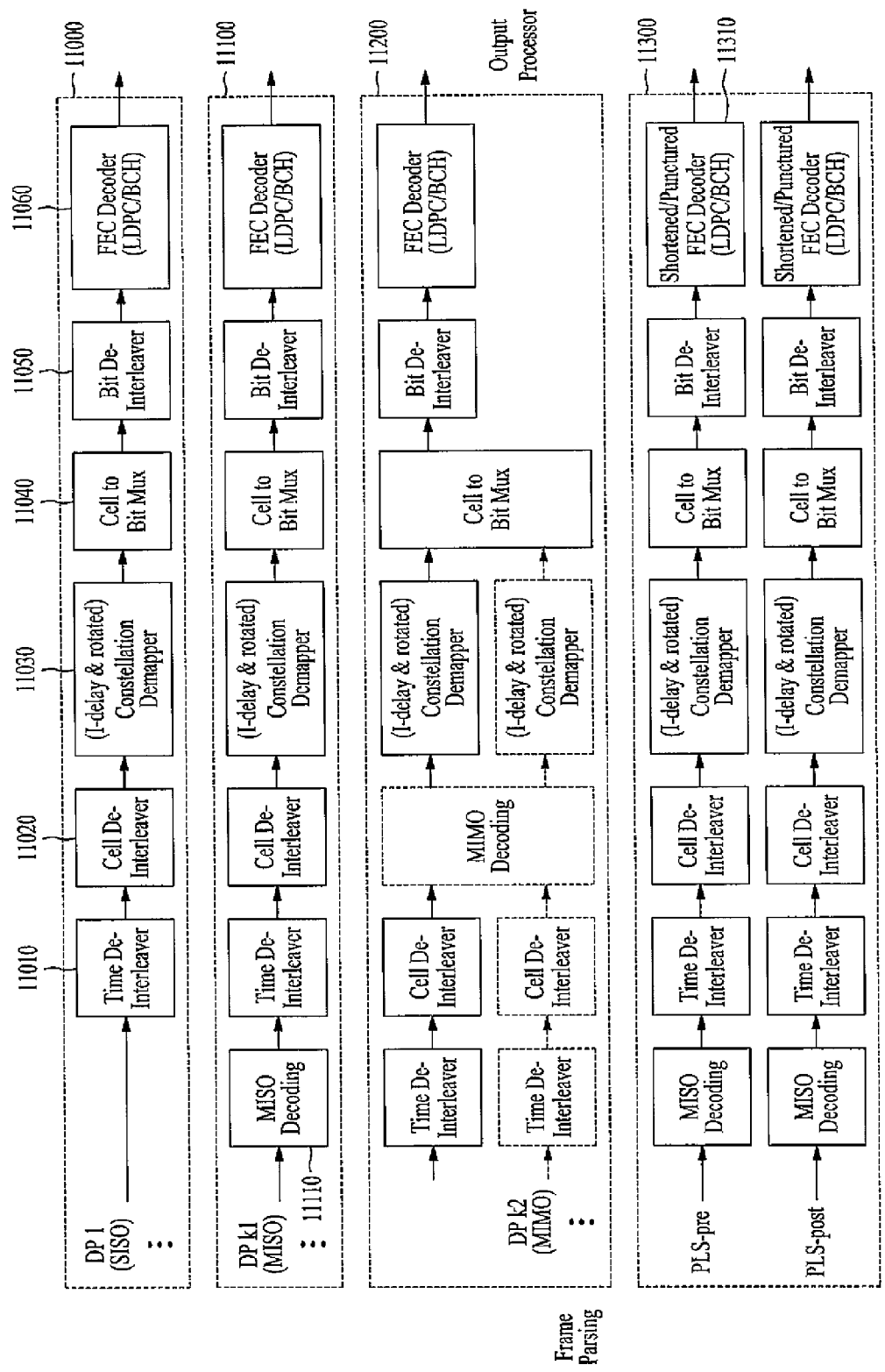
FIG. 59 illustrates a demapping & decoding module according to an embodiment of the present invention.

FIG. 59 illustrates a demapping & decoding module according to an embodiment of the present invention.

The demapping & decoding module shown in FIG. 59 corresponds to an embodiment of the demapping & decoding module illustrated in FIG. 56. The demapping & decoding module shown in FIG. 59 can perform a reverse operation of the operation of the coding & modulation module illustrated in FIG. 53.

The coding & modulation module of the apparatus for transmitting broadcast signals according to an embodiment of the present invention can process input data pipes by independently applying SISO, MISO and MIMO thereto for respective paths, as described above. Accordingly, the demapping & decoding module illustrated in FIG. 59 can include blocks for processing data output from the frame parsing module according to SISO, MISO and MIMO in response to the apparatus for transmitting broadcast signals.

As shown in FIG. 59, the demapping & decoding module according to an embodiment of the present invention can include a first block 11000 for SISO, a second block 11100 for MISO, a third block 11200 for MIMO and a fourth block 11300 for processing the PLS-pre/PLS-post information. The demapping & decoding module shown in FIG. 11 is exemplary and may include only the first block 11000 and the fourth block 11300, only the second block 11100 and the fourth block 11300 or only the third block 11200 and the fourth block 11300 according to design. That is, the demapping & decoding module can include blocks for processing data pipes equally or differently according to design.

A description will be given of each block of the demapping & decoding module.

The first block 11000 processes an input data pipe according to SISO and can include a time deinterleaver block 11010, a cell deinterleaver block 11020, a constellation demapper block 11030, a cell-to-bit mux block 11040, a bit deinterleaver block 11050 and an FEC decoder block 11060.

The time deinterleaver block 11010 can perform a reverse process of the process performed by the time interleaver block 5060 illustrated in FIG. 53. That is, the time deinterleaver block 11010 can deinterleave input symbols interleaved in the time domain into original positions thereof.

The cell deinterleaver block 11020 can perform a reverse process of the process performed by the cell interleaver block 5050 illustrated in FIG. 53. That is, the cell deinterleaver block 11020 can deinterleave positions of cells spread in one FEC block into original positions thereof.

The constellation demapper block 11030 can perform a reverse process of the process performed by the constellation mapper block 5040 illustrated in FIG. 53. That is, the constellation demapper block 11030 can demap a symbol domain input signal to bit domain data. In addition, the constellation demapper block 11030 may perform hard decision and output decided bit data. Furthermore, the constellation demapper block 11030 may output a log-likelihood ratio (LLR) of each bit, which corresponds to a soft decision value or probability value. If the apparatus for transmitting broadcast signals applies a rotated constellation in order to obtain additional diversity gain, the constellation demapper block 11030 can perform 2-dimensional LLR demapping corresponding to the rotated constellation. Here, the constellation demapper block 11030 can calculate the LLR such that a delay applied by the apparatus for transmitting broadcast signals to the I or Q component can be compensated.

The cell-to-bit mux block 11040 can perform a reverse process of the process performed by the bit-to-cell demux block 5030 illustrated in FIG. 53. That is, the cell-to-bit mux block 11040 can restore bit data mapped by the bit-to-cell demux block 5030 to the original bit streams.

The bit deinterleaver block 11050 can perform a reverse process of the process performed by the bit interleaver 5020 illustrated in FIG. 53. That is, the bit deinterleaver block 11050 can deinterleave the bit streams output from the cell-to-bit mux block 11040 in the original order.

The FEC decoder block 11060 can perform a reverse process of the process performed by the FEC encoder block 5010 illustrated in FIG. 53. That is, the FEC decoder block 11060 can correct an error generated on a transmission channel by performing LDPC decoding and BCH decoding.

The second block 11100 processes an input data pipe according to MISO and can include the time deinterleaver block, cell deinterleaver block, constellation demapper block, cell-to-bit mux block, bit deinterleaver block and FEC decoder block in the same manner as the first block 11000, as shown in FIG. 59. However, the second block 11100 is distinguished from the first block 11000 in that the second block 11100 further includes a MISO decoding block 11110. The second block 11100 performs the same procedure including time deinterleaving operation to outputting operation as the first block 11000 and thus description of the corresponding blocks is omitted.

The MISO decoding block 11110 can perform a reverse operation of the operation of the MISO processing block 5110 illustrated in FIG. 53. If the broadcast transmission/reception system according to an embodiment of the present invention uses STBC, the MISO decoding block 11110 can perform Alamouti decoding.

The third block 11200 processes an input data pipe according to MIMO and can include the time deinterleaver block, cell deinterleaver block, constellation demapper block, cell-to-bit mux block, bit deinterleaver block and FEC decoder block in the same manner as the second block 11100, as shown in FIG. 59. However, the third block 11200 is distinguished from the second block 11100 in that the third block 11200 further includes a MIMO decoding block 11210. The basic roles of the time deinterleaver block, cell deinterleaver block, constellation demapper block, cell-to-bit mux block and bit deinterleaver block included in the third block 11200 are identical to those of the corresponding blocks included in the first and second blocks 11000 and 11100 although functions thereof may be different from the first and second blocks 11000 and 11100.

The MIMO decoding block 11210 can receive output data of the cell deinterleaver for input signals of the m Rx antennas and perform MIMO decoding as a reverse operation of the operation of the MIMO processing block 5220 illustrated in FIG. 53. The MIMO decoding block 11210 can perform maximum likelihood decoding to obtain optimal decoding performance or carry out sphere decoding with reduced complexity. Otherwise, the MIMO decoding block 11210 can achieve improved decoding performance by performing MMSE detection or carrying out iterative decoding with MMSE detection.

The fourth block 11300 processes the PLS-pre/PLS-post information and can perform SISO or MISO decoding. The fourth block 11300 can carry out a reverse process of the process performed by the fourth block 5300 described with reference to FIG. 53.

The basic roles of the time deinterleaver block, cell deinterleaver block, constellation demapper block, cell-to-bit mux block and bit deinterleaver block included in the fourth block 11300 are identical to those of the corresponding blocks of the first, second and third blocks 11000, 11100 and 11200 although functions thereof may be different from the first, second and third blocks 11000, 11100 and 11200.

The shortened/punctured FEC decoder 11310 included in the fourth block 11300 can perform a reverse process of the process performed by the shortened/punctured FEC encoder block 5310 described with reference to FIG. 53. That is, the shortened/punctured FEC decoder 11310 can perform de-shortening and de-puncturing on data shortened/punctured according to PLS data length and then carry out FEC decoding thereon. In this case, the FEC decoder used for data pipes can also be used for PLS. Accordingly, additional FEC decoder hardware for the PLS only is not needed and thus system design is simplified and efficient coding is achieved.

The above-described blocks may be omitted or replaced by blocks having similar or identical functions according to design.

The demapping & decoding module according to an embodiment of the present invention can output data pipes and PLS information processed for the respective paths to the output processor, as illustrated in FIG. 59.

Figure 60:
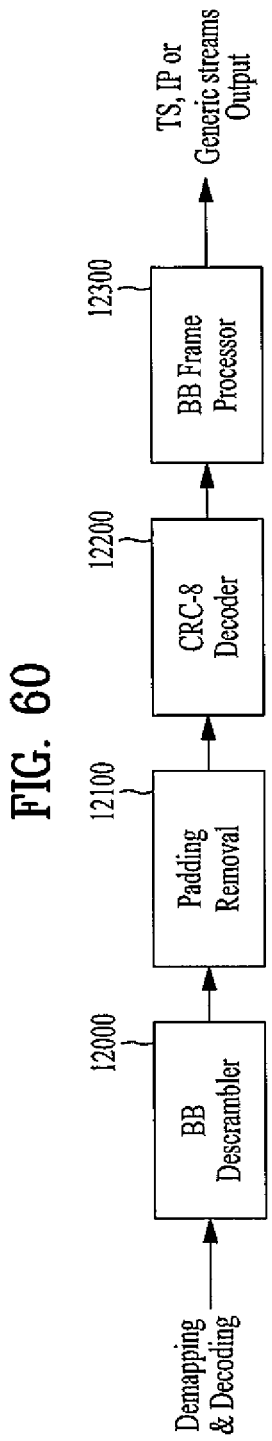
FIG. 60 illustrates an output processor according to an embodiment of the present invention.
Figure 61:
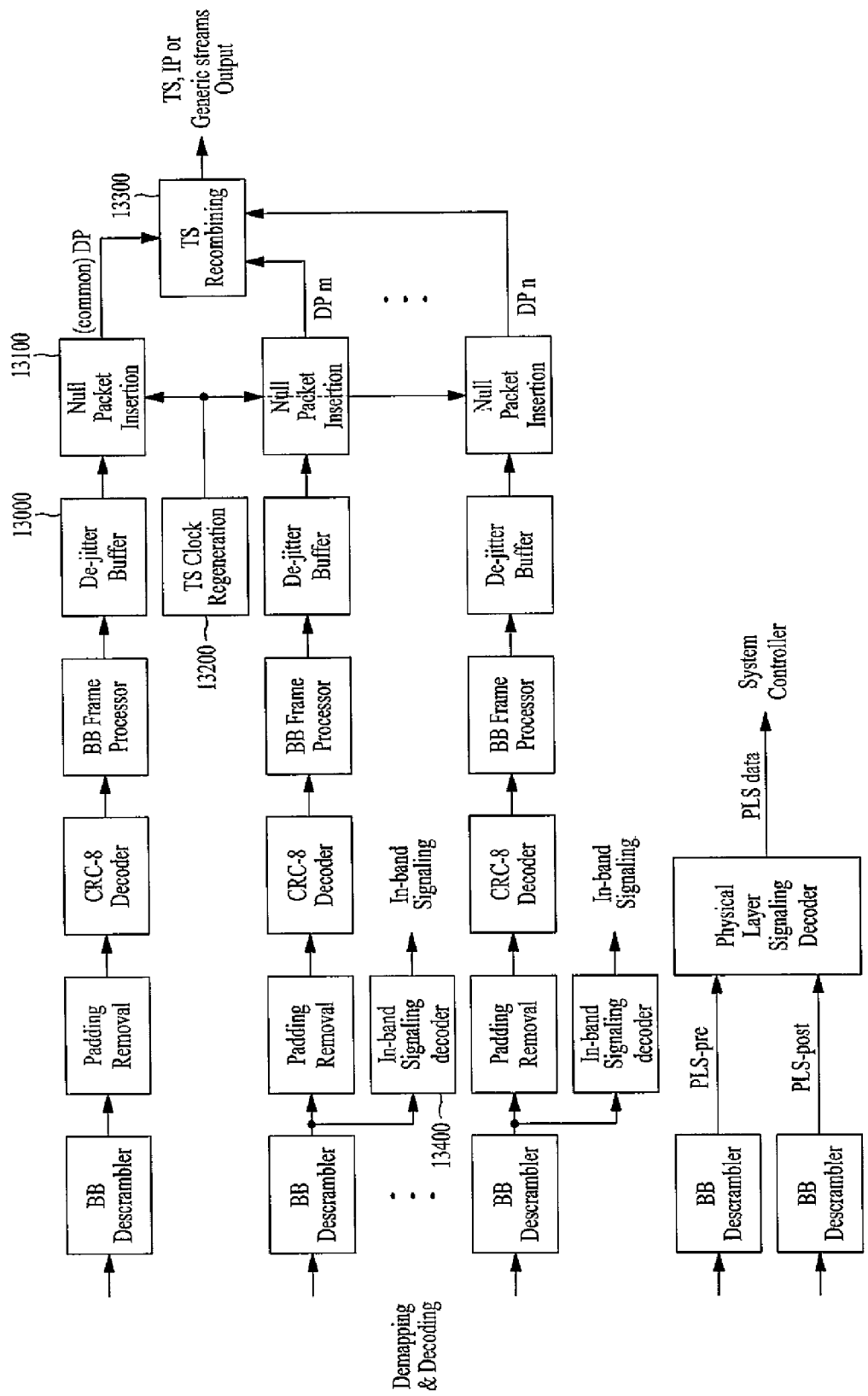
FIG. 61 illustrates an output processor according to another embodiment of the present invention.

FIGS. 60 and 61 illustrate output processors according to embodiments of the present invention.

FIG. 60 illustrates an output processor according to an embodiment of the present invention. The output processor illustrated in FIG. 60 corresponds to an embodiment of the output processor illustrated in FIG. 56. The output processor illustrated in FIG. 60 receives a single data pipe output from the demapping & decoding module and outputs a single output stream. The output processor can perform a reverse operation of the operation of the input formatting module illustrated in FIG. 50.

The output processor shown in FIG. 60 can include a BB scrambler block 12000, a padding removal block 12100, a CRC-8 decoder block 12200 and a BB frame processor block 12300.

The BB scrambler block 12000 can descramble an input bit stream by generating the same PRBS as that used in the apparatus for transmitting broadcast signals for the input bit stream and carrying out an XOR operation on the PRBS and the bit stream.

The padding removal block 12100 can remove padding bits inserted by the apparatus for transmitting broadcast signals as necessary.

The CRC-8 decoder block 12200 can check a block error by performing CRC decoding on the bit stream received from the padding removal block 12100.

The BB frame processor block 12300 can decode information transmitted through a BB frame header and restore MPEG-TSs, IP streams (v4 or v6) or generic streams using the decoded information.

The above-described blocks may be omitted or replaced by blocks having similar or identical functions according to design.

FIG. 61 illustrates an output processor according to another embodiment of the present invention. The output processor shown in FIG. 61 corresponds to an embodiment of the output processor illustrated in FIG. 56. The output processor shown in FIG. 61 receives multiple data pipes output from the demapping & decoding module. Decoding multiple data pipes can include a process of merging common data commonly applicable to a plurality of data pipes and data pipes related thereto and decoding the same or a process of simultaneously decoding a plurality of services or service components (including a scalable video service) by the apparatus for receiving broadcast signals.

The output processor shown in FIG. 61 can include a BB descrambler block, a padding removal block, a CRC-8 decoder block and a BB frame processor block as the output processor illustrated in FIG. 60. The basic roles of these blocks correspond to those of the blocks described with reference to FIG. 60 although operations thereof may differ from those of the blocks illustrated in FIG. 60.

A de-jitter buffer block 13000 included in the output processor shown in FIG. 61 can compensate for a delay, inserted by the apparatus for transmitting broadcast signals for synchronization of multiple data pipes, according to a restored TTO (time to output) parameter.

A null packet insertion block 13100 can restore a null packet removed from a stream with reference to a restored DNP (deleted null packet) and output common data.

A TS clock regeneration block 13200 can restore time synchronization of output packets based on ISCR (input stream time reference) information.

A TS recombining block 13300 can recombine the common data and data pipes related thereto, output from the null packet insertion block 13100, to restore the original MPEG-TSs, IP streams (v4 or v6) or generic streams. The TTO, DNT and ISCR information can be obtained through the BB frame header.

An in-band signaling decoding block 13400 can decode and output in-band physical layer signaling information transmitted through a padding bit field in each FEC frame of a data pipe.

The output processor shown in FIG. 61 can BB-descramble the PLS-pre information and PLS-post information respectively input through a PLS-pre path and a PLS-post path and decode the descrambled data to restore the original PLS data. The restored PLS data is delivered to a system controller included in the apparatus for receiving broadcast signals. The system controller can provide parameters necessary for the synchronization & demodulation module, frame parsing module, demapping & decoding module and output processor module of the apparatus for receiving broadcast signals.

The above-described blocks may be omitted or replaced by blocks having similar r identical functions according to design.

Figure 62:
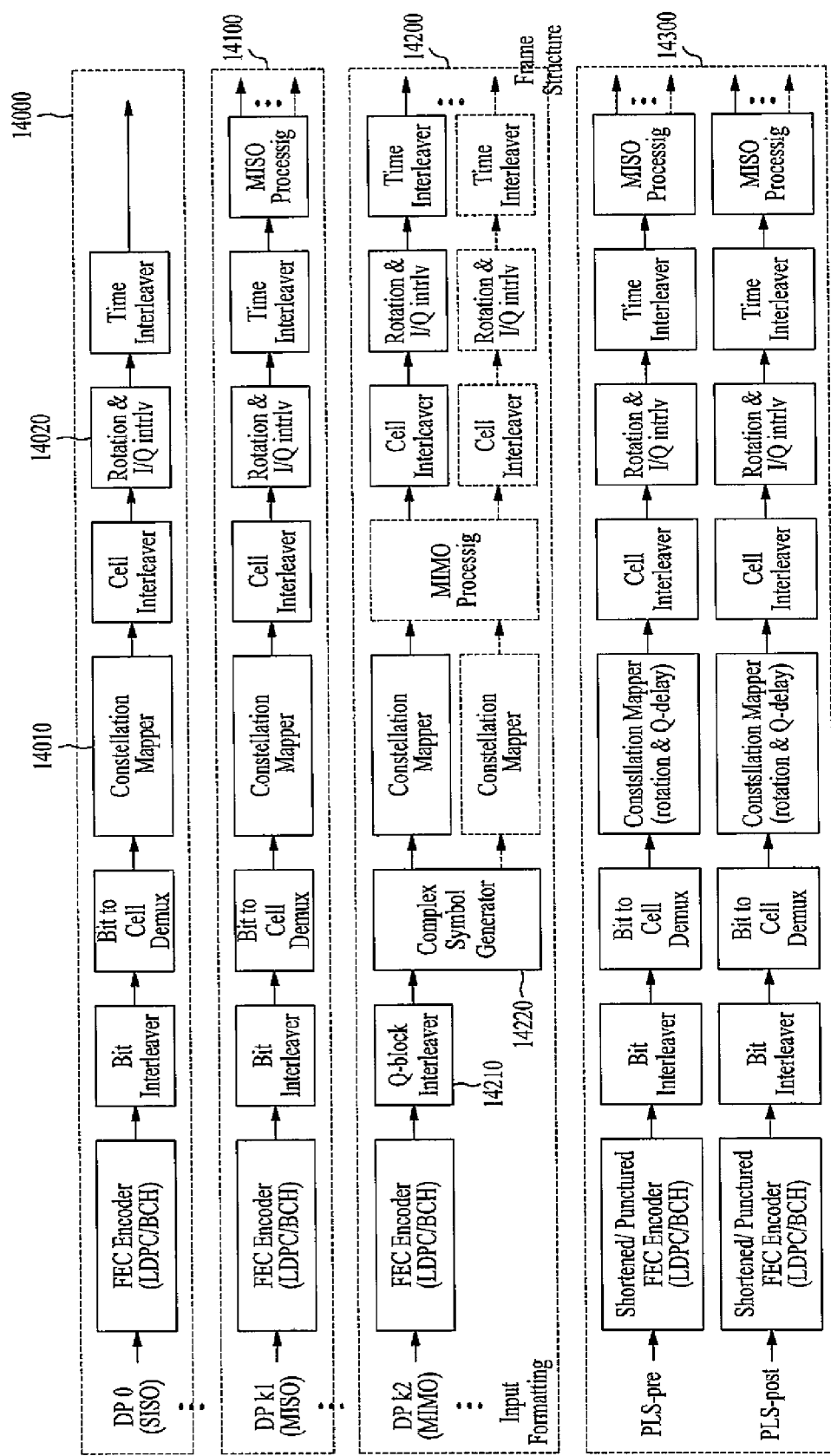
FIG. 62 illustrates a coding & modulation module according to another embodiment of the present invention.

FIG. 62 illustrates a coding & modulation module according to another embodiment of the present invention.

The coding & modulation module shown in FIG. 62 corresponds to another embodiment of the coding & modulation module illustrated in FIGS. 49 to 53.

To control QoS for each service or service component transmitted through each data pipe, as described above with reference to FIG. 53, the coding & modulation module shown in FIG. 62 can include a first block 14000 for SISO, a second block 14100 for MISO, a third block 14200 for MIMO and a fourth block 14300 for processing the PLS-pre/PLS-post information. In addition, the coding & modulation module can include blocks for processing data pipes equally or differently according to the design. The first to fourth blocks 14000 to 14300 shown in FIG. 62 are similar to the first to fourth blocks 5000 to 5300 illustrated in FIG. 53.

However, the first to fourth blocks 14000 to 14300 shown in FIG. 62 are distinguished from the first to fourth blocks 5000 to 5300 illustrated in FIG. 53 in that a constellation mapper 14010 included in the first to fourth blocks 14000 to 14300 has a function different from the first to fourth blocks 5000 to 5300 illustrated in FIG. 53, a rotation & I/Q interleaver block 14020 is present between the cell interleaver and the time interleaver of the first to fourth blocks 14000 to 14300 illustrated in FIG. 62 and the third block 14200 for MIMO has a configuration different from the third block 5200 for MIMO illustrated in FIG. 53. The following description focuses on these differences between the first to fourth blocks 14000 to 14300 shown in FIG. 62 and the first to fourth blocks 5000 to 5300 illustrated in FIG. 53.

The constellation mapper block 14010 shown in FIG. 62 can map an input bit word to a complex symbol. However, the constellation mapper block 14010 may not perform constellation rotation, differently from the constellation mapper block shown in FIG. 53. The constellation mapper block 14010 shown in FIG. 62 is commonly applicable to the first, second and third blocks 14000, 14100 and 14200, as described above.

The rotation & I/Q interleaver block 14020 can independently interleave in-phase and quadrature-phase components of each complex symbol of cell-interleaved data output from the cell interleaver and output the in-phase and quadrature-phase components on a symbol-by-symbol basis. The number of number of input data pieces and output data pieces of the rotation & I/Q interleaver block 14020 is two or more which can be changed by the designer. In addition, the rotation & I/Q interleaver block 14020 may not interleave the in-phase component.

The rotation & I/Q interleaver block 14020 is commonly applicable to the first to fourth blocks 14000 to 14300, as described above. In this case, whether or not the rotation & I/Q interleaver block 14020 is applied to the fourth block 14300 for processing the PLS-pre/post information can be signaled through the above-described preamble.

The third block 14200 for MIMO can include a Q-block interleaver block 14210 and a complex symbol generator block 14220, as illustrated in FIG. 62.

The Q-block interleaver block 14210 can permute a parity part of an FEC-encoded FEC block received from the FEC encoder. Accordingly, a parity part of an LDPC H matrix can be made into a cyclic structure like an information part. The Q-block interleaver block 14210 can permute the order of output bit blocks having Q size of the LDPC H matrix and then perform row-column block interleaving to generate final bit streams.

The complex symbol generator block 14220 receives the bit streams output from the Q-block interleaver block 14210, maps the bit streams to complex symbols and outputs the complex symbols. In this case, the complex symbol generator block 14220 can output the complex symbols through at least two paths. This can be modified by the designer.

The above-described blocks may be omitted or replaced by blocks having similar or identical functions according to design.

The coding & modulation module according to another embodiment of the present invention, illustrated in FIG. 62, can output data pipes, PLS-pre information and PLS-post information processed for respective paths to the frame structure module.

Figure 63:
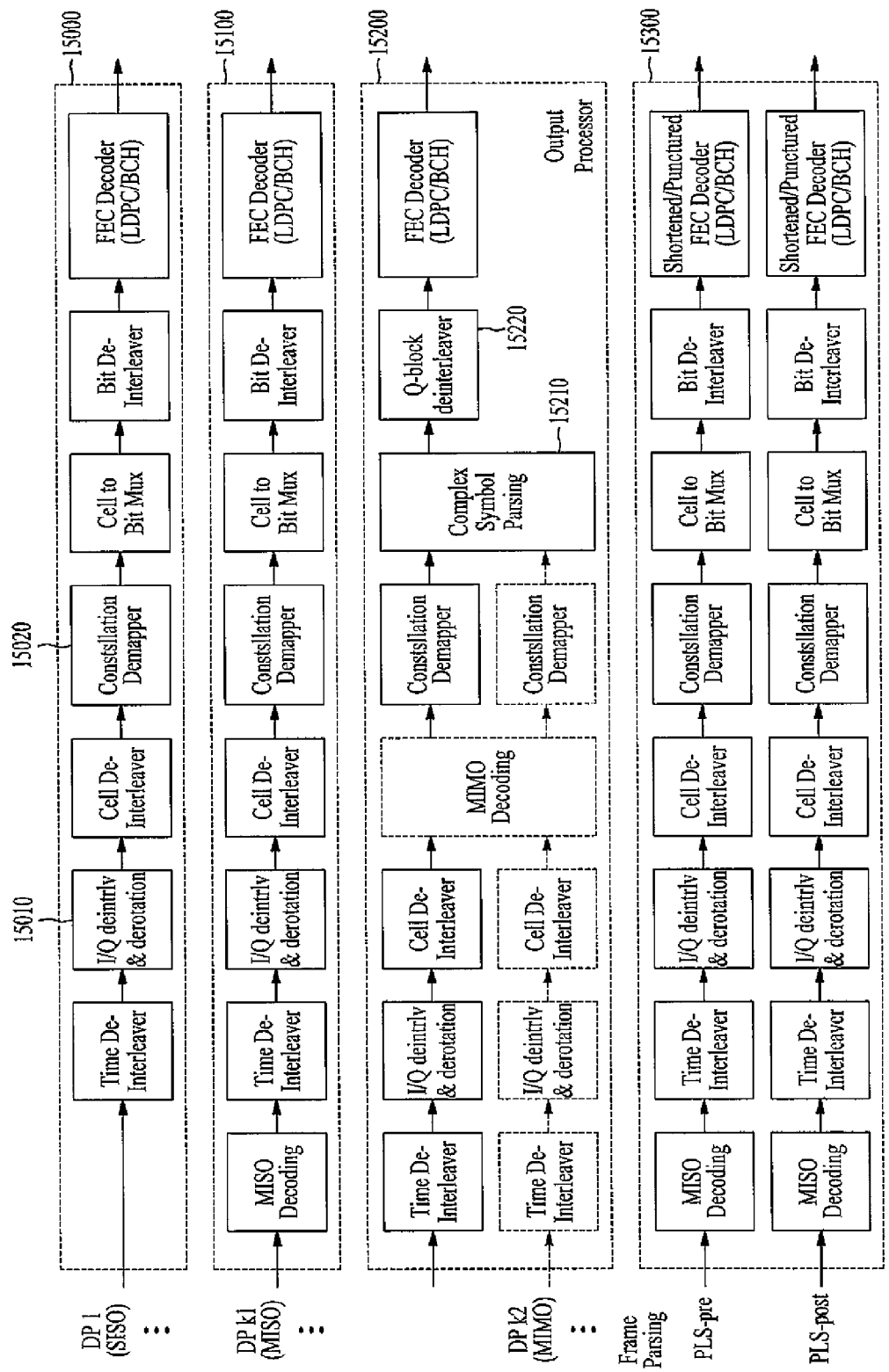
FIG. 63 illustrates a demapping & decoding module according to another embodiment of the present invention.

FIG. 63 illustrates a demapping & decoding module according to another embodiment of the present invention.

The demapping & decoding module shown in FIG. 63 corresponds to another embodiment of the demapping & decoding module illustrated in FIG. 59. The demapping & decoding module shown in FIG. 63 can perform a reverse operation of the operation of the coding & modulation module illustrated in FIG. 62.

As shown in FIG. 63, the demapping & decoding module according to another embodiment of the present invention can include a first block 15000 for SISO, a second block 11100 for MISO, a third block 15200 for MIMO and a fourth block 14300 for processing the PLS-pre/PLS-post information. In addition, the demapping & decoding module can include blocks for processing data pipes equally or differently according to design. The first to fourth blocks 15000 to 15300 shown in FIG. 63 are similar to the first to fourth blocks 11000 to 11300 illustrated in FIG. 59.

However, the first to fourth blocks 15000 to 15300 shown in FIG. 63 are distinguished from the first to fourth blocks 11000 to 11300 illustrated in FIG. 59 in that an I/Q deinterleaver and derotation block 15010 is present between the time interleaver and the cell deinterleaver of the first to fourth blocks 15000 to 15300, a constellation mapper 15010 included in the first to fourth blocks 15000 to 15300 has a function different from the first to fourth blocks 11000 to 11300 illustrated in FIG. 59 and the third block 15200 for MIMO has a configuration different from the third block 11200 for MIMO illustrated in FIG. 59. The following description focuses on these differences between the first to fourth blocks 15000 to 15300 shown in FIG. 63 and the first to fourth blocks 11000 to 11300 illustrated in FIG. 59.

The I/Q deinterleaver & derotation block 15010 can perform a reverse process of the process performed by the rotation & I/Q interleaver block 14020 illustrated in FIG. 62. That is, the I/Q deinterleaver & derotation block 15010 can deinterleave I and Q components I/Q-interleaved and transmitted by the apparatus for transmitting broadcast signals and derotate complex symbols having the restored I and Q components.

The I/Q deinterleaver & derotation block 15010 is commonly applicable to the first to fourth blocks 15000 to 15300, as described above. In this case, whether or not the I/Q deinterleaver & derotation block 15010 is applied to the fourth block 15300 for processing the PLS-pre/post information can be signaled through the above-described preamble.

The constellation demapper block 15020 can perform a reverse process of the process performed by the constellation mapper block 14010 illustrated in FIG. 62. That is, the constellation demapper block 15020 can demap cell-deinterleaved data without performing derotation.

The third block 15200 for MIMO can include a complex symbol parsing block 15210 and a Q-block deinterleaver block 15220, as shown in FIG. 63.

The complex symbol parsing block 15210 can perform a reverse process of the process performed by the complex symbol generator block 14220 illustrated in FIG. 62. That is, the complex symbol parsing block 15210 can parse complex data symbols and demap the same to bit data. In this case, the complex symbol parsing block 15210 can receive complex data symbols through at least two paths.

The Q-block deinterleaver block 15220 can perform a reverse process of the process carried out by the Q-block interleaver block 14210 illustrated in FIG. 62. That is, the Q-block deinterleaver block 15220 can restore Q size blocks according to row-column deinterleaving, restore the order of permuted blocks to the original order and then restore positions of parity bits to original positions according to parity deinterleaving.

The above-described blocks may be omitted or replaced by blocks having similar or identical functions according to design.

As illustrated in FIG. 63, the demapping & decoding module according to another embodiment of the present invention can output data pipes and PLS information processed for respective paths to the output processor.

As described above, the apparatus and method for transmitting broadcast signals according to an embodiment of the present invention can multiplex signals of different broadcast transmission/reception systems within the same RF channel and transmit the multiplexed signals and the apparatus and method for receiving broadcast signals according to an embodiment of the present invention can process the signals in response to the broadcast signal transmission operation. Accordingly, it is possible to provide a flexible broadcast transmission and reception system.

Figure 64:
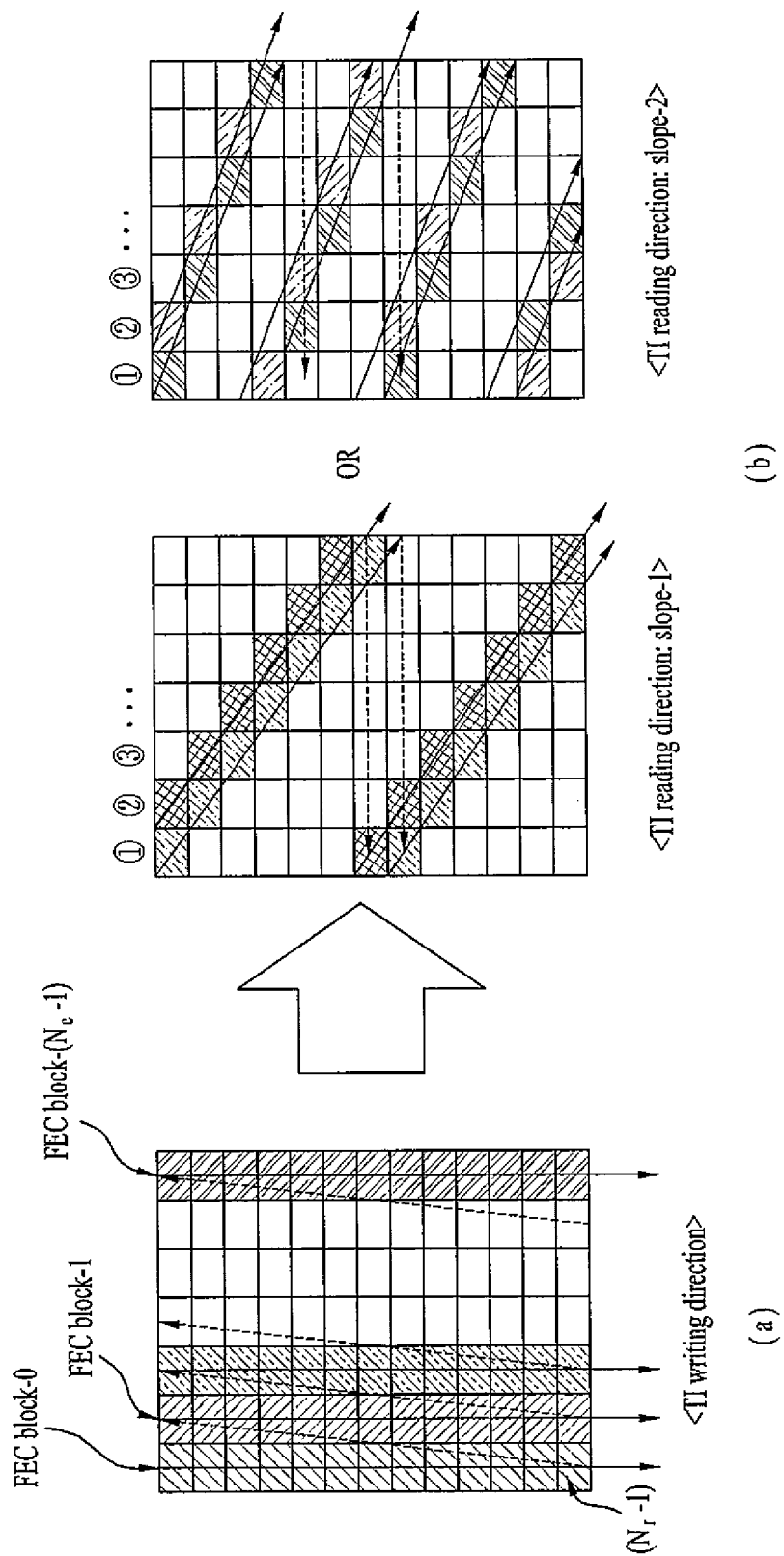
FIG. 64 illustrates a time interleaving process according to an embodiment of the present invention.

FIG. 64 illustrates a time interleaving process according to an embodiment of the present invention.

As described above, a timer interleaver (or time interleaver block) included in a broadcast signal transmitter according to an embodiment of the present invention interleaves cells belonging to a plurality of FEC blocks in the time domain and outputs the interleaved cells.

TI group is a unit over which dynamic capacity allocation for a particular DP is carried out, made up of an integer, dynamically varying number of FEC blocks. Time interleaving block (TI block) is a set of cells within which time interleaving is carried out, corresponding to one use of the time interleaver memory. FEC block may be a set of encoded bits of a DP data or a set of number of cells carrying all the encoded bits.

Each TI group is either mapped directly onto one frame or spread over multiple frames. Each TI group is also divided into more than one TI blocks, where each TI block corresponds to one usage of time interleaver memory. The TI blocks within the TI group may contain slightly different numbers of FECBLOCKs.

The cells of the FEC blocks are transmitted being distributed in a specific period corresponding to a time interleaving depth through time interleaving, and thus diversity gain can be obtained. The time interleaver according to an embodiment of the present invention operates at the DP level.

In addition, the time interleaver according to an embodiment of the present invention can perform time interleaving including a writing operation of sequentially arranging different input FEC blocks in a predetermined memory and a diagonal reading operation of interleaving the FEC blocks in a diagonal direction. In particular, the time interleaver according to an embodiment of the present invention can change the size of a diagonal slope of a reading direction and perform time interleaving while reading different FEC blocks in a diagonal direction. That is, the time interleaver according to an embodiment of the present invention can change a TI reading pattern. Time interleaving according to an embodiment of the present invention may be referred to as diagonal-type time interleaving or diagonal-type TI or flexible diagonal-type time interleaving or flexible diagonal-type TI.

Typically, the time interleaver will also act as a buffer for DP data prior to the process of frame building. This is achieved by means of two memory banks for each DP. The first TI-block is written to the first bank. The second TI-block is written to the second bank while the first bank is being read from and so on.

The name of a device which performs time interleaving or the location or function of the device may be changed according to designer.

A TI block according to an embodiment may be composed of N, FEC blocks and the length of an FEC block may be assumed to be $N_r \times 1$. Accordingly, a TI memory according to an embodiment of the present invention can have a size corresponding to an $N_r \times N_c$ matrix. In addition, the depth of time interleaving according to an embodiment of the present invention corresponds to the FEC block length. FIG. 64(*a*) shows a writing direction of time interleaving according to an embodiment of the present invention and FIG. 64(*b*) shows a reading direction of time interleaving according to an embodiment of the present invention.

Specifically, the broadcast signal transmitter according to an embodiment of the present invention can sequentially write input FEC blocks column-wise in a TI memory having a size of $N_r \times N_c$ (column-wise writing), as shown in FIG. 64(*a*). The first FECBLOCK 0 is written column-wise into the first column of the TI memory, and the second FECBLOCK 1 is written in the next column, and so on. The broadcast signal transmitter according to an embodiment of the present invention can read the FEC blocks written column-wise in a diagonal direction, as shown in FIG. 64(*b*). In this case, the broadcast signal transmitter according to an embodiment of the present invention can perform diagonal reading for one period. In particular, in this case, as shown in FIG. 64(*b*), the diagonal slope of the TI reading direction may be differently set for respective TI blocks or super frame units.

That is, during diagonal-wise reading from the first row (rightwards along the row beginning with the left-most column) to the last row, $N_r$ cells are read out as shown in FIG. 64(*b*).

In particular, in this case, as shown in FIG. 64(*b*), the diagonal slope of the TI reading direction may be differently set for respective TI blocks or super frame units. FIG. 64 illustrates the case in which the diagonal slope of the TDI writing direction is a diagonal slope-1 or a diagonal slope-2.

When the diagonal slope of the TI reading direction is a diagonal slope-1, since the diagonal reading process of the first period starts at (0,0) of the memory matrix and is performed until the cell of the lowest row is read, cells within different FEC blocks can be uniformly interleaved. Diagonal reading of the next periods can be performed in order of ①, ② and ③ in FIG. 64(*b*).

In addition, when the diagonal slope of the TI reading direction is the slope-2, the TI diagonal reading can be performed from a memory matrix (0,0) for a first period according to the diagonal slope of the TI reading direction until cells contained in a specific FEC block are read according to a specific shifting value. This can be changed according to intention of the designer.

Figure 65:
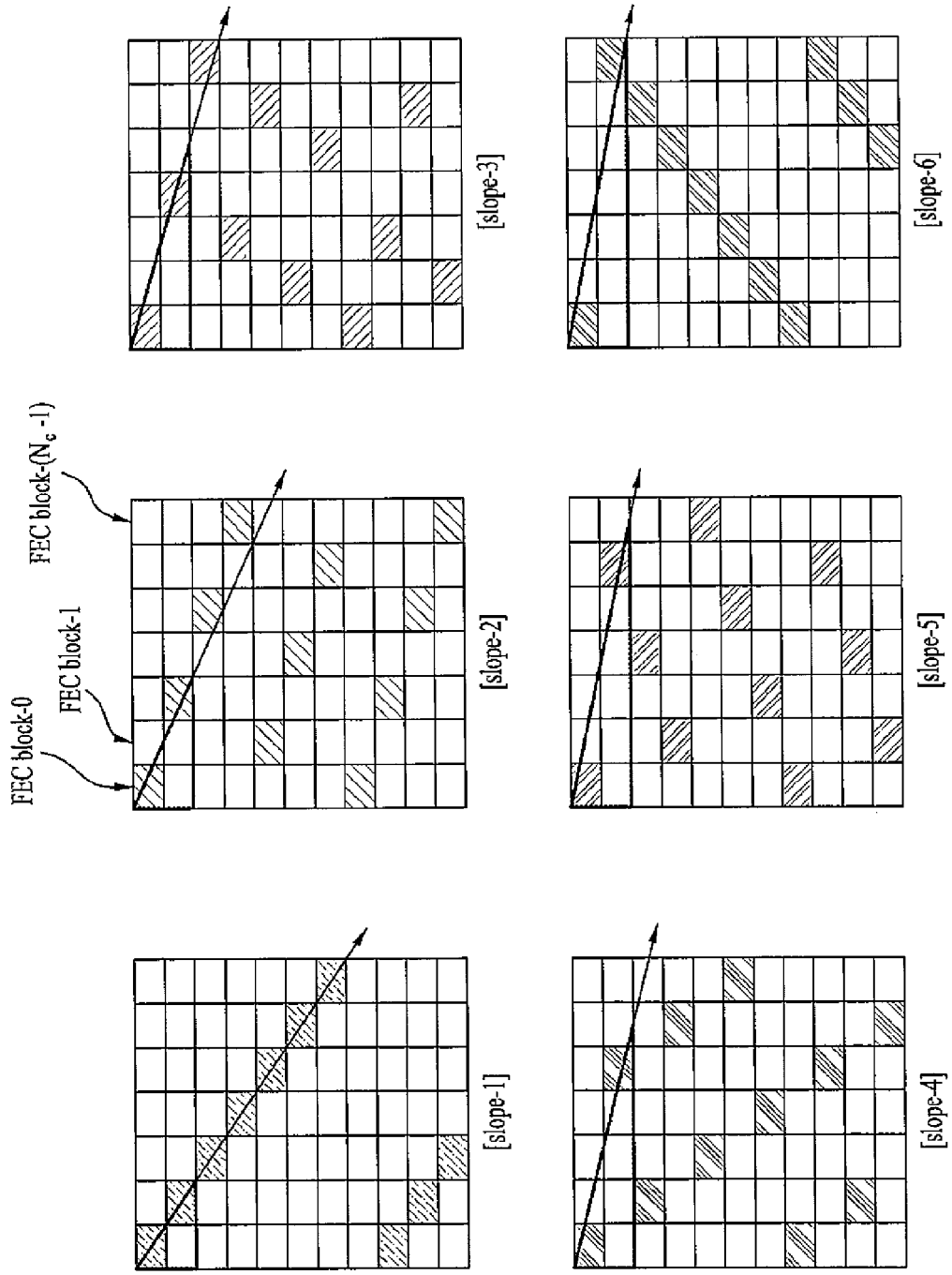
FIG. 65 illustrates diagonal slopes according to an embodiment of the present invention.

FIG. 65 illustrates diagonal slopes according to an embodiment of the present invention.

FIG. 65 illustrates a diagonal slope-1 to a diagonal slope-6 when the size of $N_c$ of a TI block is 7 and the size of $N_r$ is 11 according to an embodiment of the present invention. The size of the diagonal slope according to an embodiment of the present invention can be changed according to intention of the designer.

The t time interleaver according to an embodiment of the present invention can change the size of the diagonal slope of the TI reading according to the size of a maximum TI memory size and change a TI reading pattern. The TI reading pattern can be changed in a superframe unit as a set of signal frames that are consecutively transmitted in a time axis and information about the TI reading pattern may be transmitted through the aforementioned static PLS signaling data.

Figure 66:
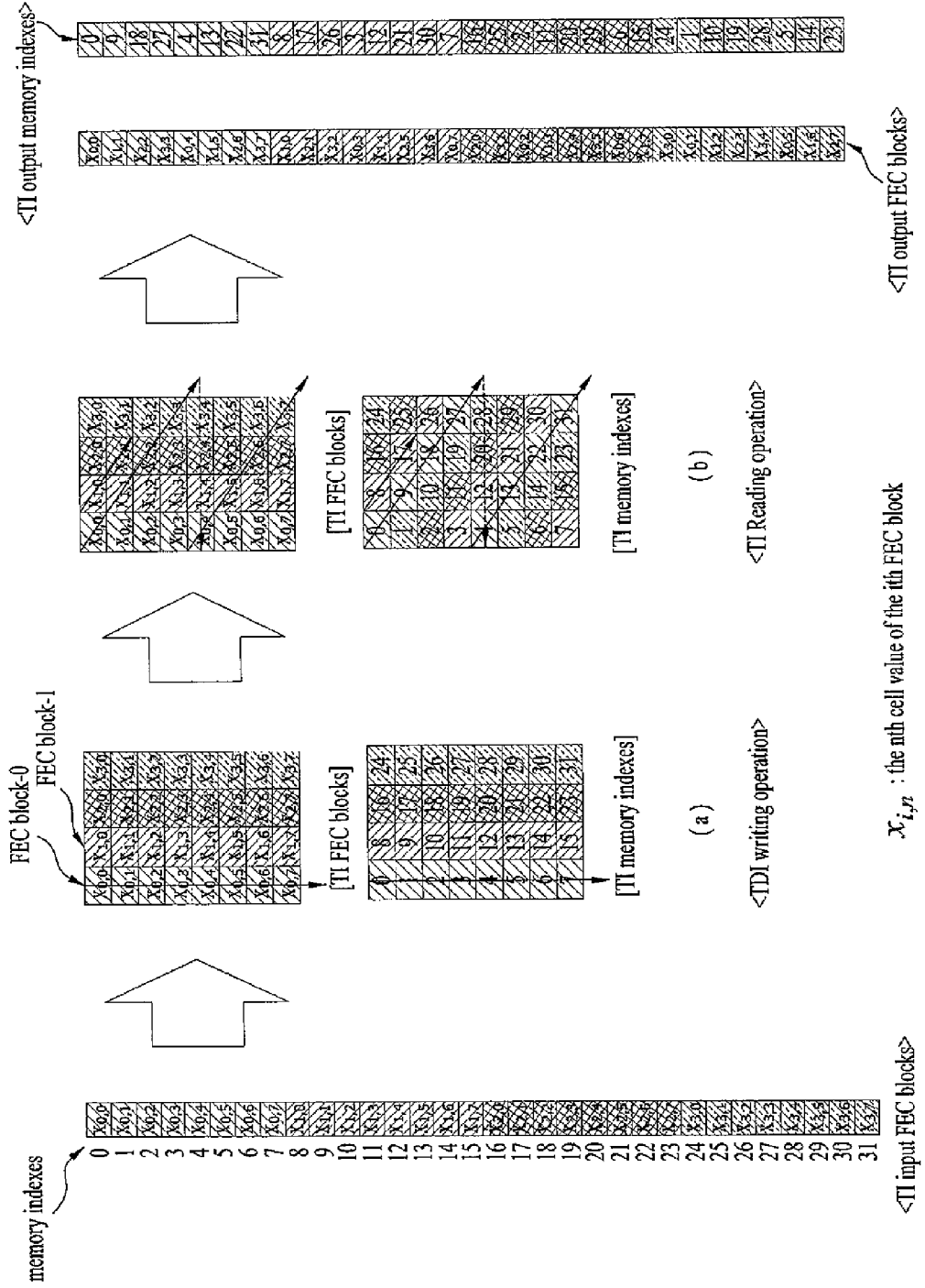
FIG. 66 illustrates a time interleaving process according to another embodiment of the present invention.

FIG. 66 illustrates a time interleaving process according to another embodiment of the present invention.

FIG. 66 shows another embodiment of the aforementioned writing operation and reading operation of the diagonal-type TI.

One TI block according to an embodiment of the present invention includes 4 FEC blocks each of which may be composed of 8 cells. Accordingly, the TI memory has a size corresponding to an 8×4 (or 32×1) matrix and the column length and row length of the TI memory respectively correspond to the FEC block length (or time interleaving depth) and the number of FECs.

TI input FEC blocks shown in the left part of FIG. 66 are FEC blocks sequentially input to the time interleaver.

TI FEC blocks shown in the middle of FIG. 66 show n-th cell values of an i-th FEC block stored in the TI memory and TI memory indexes indicate the order of cells of FEC blocks stored in the TI memory.

FIG. 66(a) illustrates TI writing operation. As described above, sequentially input FEC blocks can be sequentially written column-wise into the TI memory. Accordingly, cells of the FEC blocks are sequentially stored and written with TI memory indexes.

FIG. 66(b) illustrates TI reading operation. As shown in FIG. 66(b), cell values stored in the TI memory can be diagonally read and output in the order of memory indexes 0, 9, 18, 27, . . . . Moreover a position of cell to start diagonal-wise reading or diagonal-wise reading pattern may be changed according to designer.

TI output FEC blocks shown in the right part of FIG. 66 sequentially indicate cell values output through diagonal-type TI according to an embodiment of the present invention. TI output memory indexes correspond to the cell values output through diagonal-type TI.

Consequently, the time interleaver according to an embodiment of the present invention can perform diagonal-type TI by sequentially generating TI output memory indexes for sequentially input FEC blocks.

FIG. 66 illustrates an operation of a time interleaver of the diagonal slope-1 of the TI reading described with reference to FIG. 65. The aforementioned operation can also be applied in the same way to the slops of the remaining TI readings shown in FIG. 65.

Figure 67:
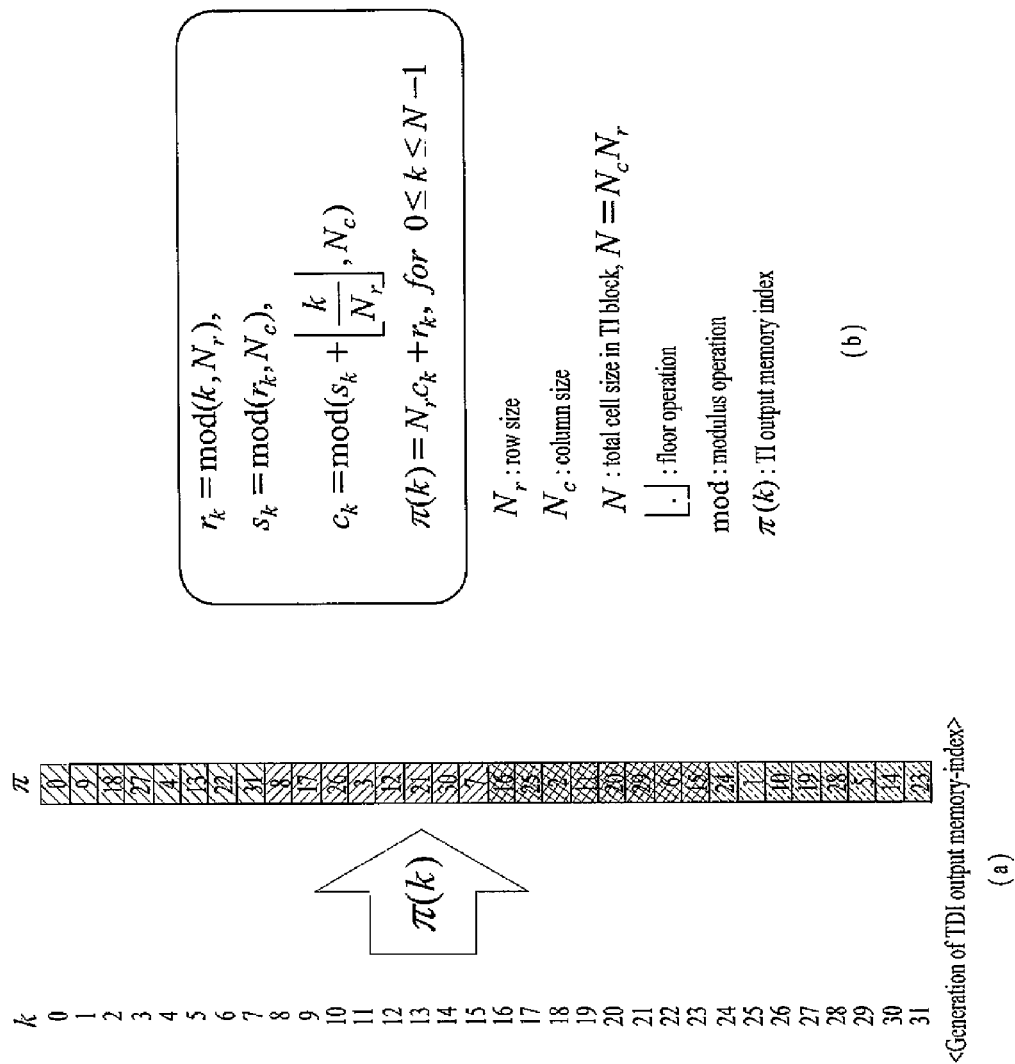
FIG. 67 illustrates a process of generating TI output memory indexes according to an embodiment of the present invention.

FIG. 67 illustrates a process of generating TI output memory indexes according to an embodiment of the present invention.

As described above, the time interleaver according to an embodiment of the present invention can perform diagonal-type TI by sequentially generating TI output memory index values for sequentially input FEC blocks.

FIG. 67(a) illustrates a process of generating diagonal-type TI memory indexes for the above-described sequentially input FEC blocks and FIG. 67(b) shows equations representing the memory index generation process.

Equation 2 below represents a process for generation of a memory index for the diagonal-type TI when the slope values of the various TI readings described with reference to FIG. 65 are set.

$$r_k = \mathrm{mod}(k, N_r),$$
$$t_k = \mathrm{mod}(S_T \times r_k, N_c), 1 \leq S_T < N_c$$
$$c_k = \mathrm{mod}\left(t_k + \left\lfloor \frac{k}{N_r} \right\rfloor, N_c\right)$$
$$\pi(k) = N_r c_k + r_k, \text{ for } 0 \leq k \leq N-1$$

[Equation 2]

$S_T$: diagonal slope for use in interleaving (constant value)
$N_r$: row size
$N_c$: column size
N: total cell size in TI block, $N=N_c N_r$
$\lfloor \cdot \rfloor$: floor operation
mod: modulo operation
$\pi(k)$: TI output memory index A time deinterleaver (or time deinterleaver block) included in a broadcast signal receiver according to an embodiment of the present invention can perform inverse processing of the aforementioned diagonal-type TI. That is, the time deinterleaver according to an embodiment of the present invention can perform time deinterleaving by receiving FEC blocks on which diagonal-type TI has been performed, writing the FEC blocks diagonal-wise in a TI memory and then sequentially reading the FEC blocks. Time deinterleaving according to an embodiment of the present invention may be referred to as diagonal-type TDI or diagonal-type time deinterleaving or flexible diagonal-type time deinterleaving or flexible diagonal-type TDI. The name of a device performing time deinterleaving or the location or function of the device may be changed according to designer.

Figure 68:
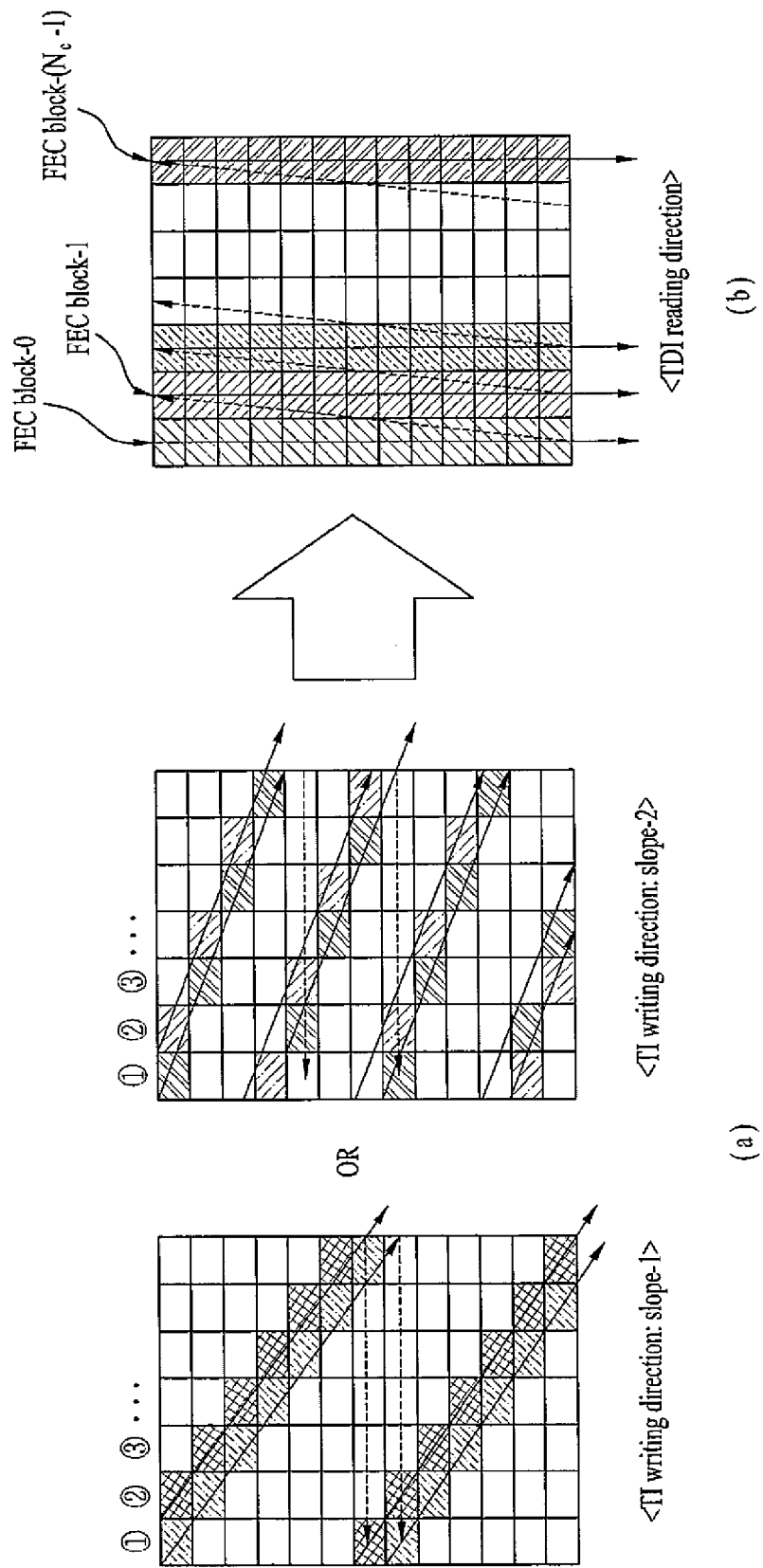
FIG. 68 illustrates a time deinterleaving process according to an embodiment of the present invention.

FIG. 68 illustrates a time deinterleaving process according to an embodiment of the present invention.

The time deinterleaving process shown in FIG. 68 corresponds to inverse processing of the time interleaving process shown in FIG. 64.

FIG. 68(a) shows a writing direction of time deinterleaving according to an embodiment of the present invention and FIG. 68(b) shows a reading direction of time deinterleaving according to an embodiment of the present invention.

Specifically, the time deinterleaver according to an embodiment of the present invention can receive FEC blocks on which diagonal-type TI has been performed from a transmitter and diagonally write the FEC blocks into a TDI (time deinterleaver) memory (diagonal-wise writing).

In this case, the time deinterleaver according to an embodiment of the present invention can perform diagonal writing for one period. In particular, in this case, as shown in FIG. 68(a), diagonal slope values of a TDI writing direction may be differently set for respective TDI block and super frame unit. FIG. 68 illustrates the case in which the diagonal slope of the TDI writing direction is a diagonal slope-1 or a diagonal slope-2.

When the diagonal slope of the TDI writing direction is a diagonal slope-1, diagonal reading of the first period starts at (0,0) of the memory matrix and is performed until the cell of the lowest row is read. Diagonal writing of respective periods can be performed in order of ①, ② and ③ in FIG. 68(*b*).

In addition, when the diagonal slope of the TDI writing direction is a diagonal slope-2, the TDI diagonal writing can be performed from a memory matrix (0,0) for a first period until cells contained in a specific FEC block are read according to a specific shifting value. This can be changed according to intention of the designer.

As shown in FIG. 68(*b*), the time deinterleaver according to an embodiment of the present invention can sequentially read diagonally written FEC blocks column-wise (column-wise reading).

Figure 69:
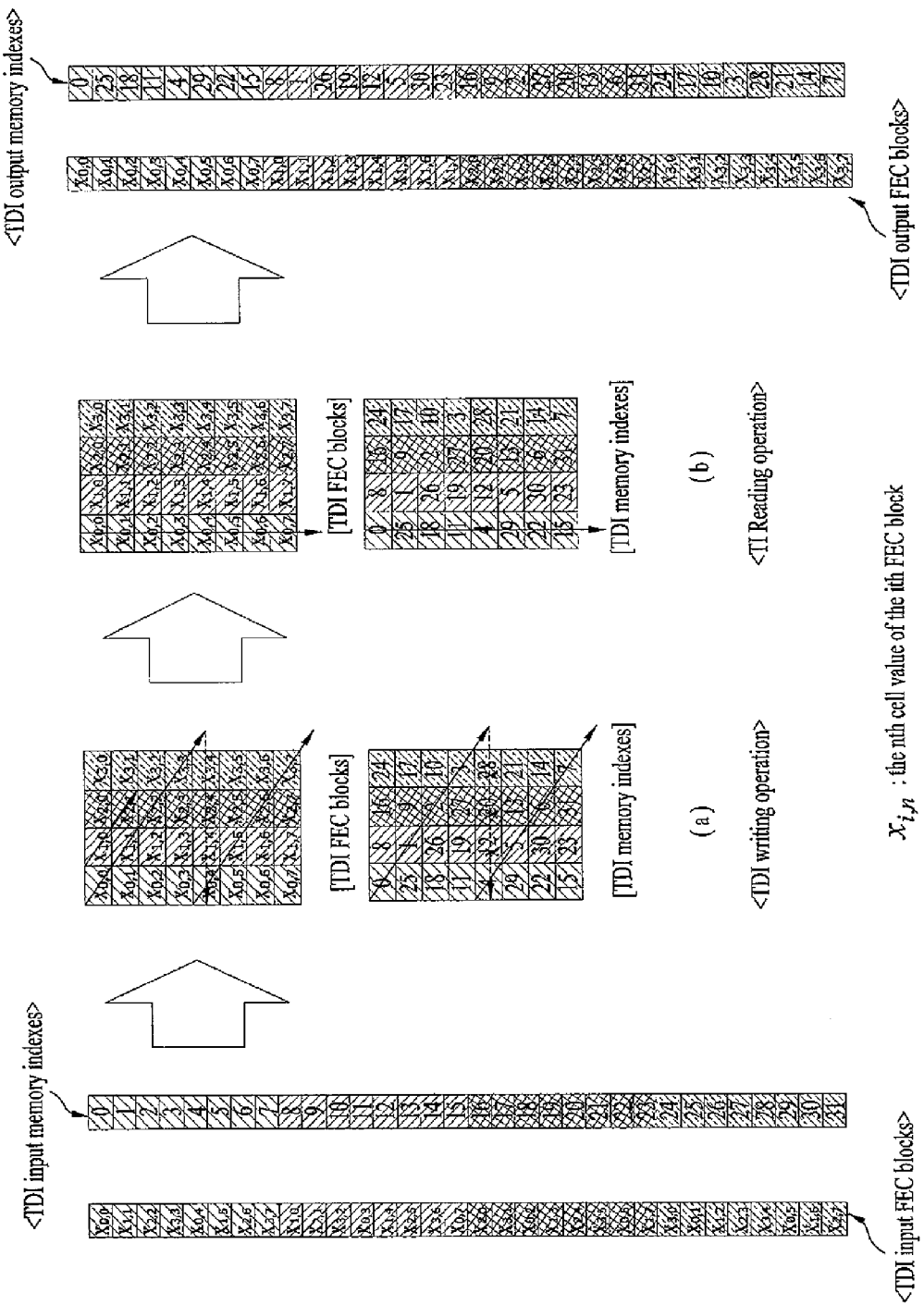
FIG. 69 illustrates a time deinterleaving process according to another embodiment of the present invention.

FIG. 69 illustrates a time deinterleaving process according to another embodiment of the present invention.

The time deinterleaving process shown in FIG. 69 is the inverse of the time interleaving process shown in FIG. 66.

One TI block according to an embodiment of the present invention includes 4 FEC blocks each of which may be composed of 8 cells. Accordingly, the TI memory has a size corresponding to an 8×4 (or 32×1) matrix and the column length and row length of the TI memory respectively correspond to the FEC block length (or time interleaving depth) and the number of FECs.

TDI input FEC blocks shown in the left part of FIG. 69 represent cells of FEC blocks sequentially input to the time deinterleaver and TDI input memory indexes correspond to the cells of the sequentially input FEC blocks.

TDI FEC blocks shown in the middle of FIG. 69 show n-th cell values of an i-th FEC block stored in the TDI memory and TDI memory indexes indicate the order of cells of FEC blocks stored in the TDI memory.

FIG. 69(*a*) illustrates TDI writing operation. As described above, sequentially input FEC blocks can be sequentially written to the TDI memory diagonal-wise. Accordingly, the cells of the input FEC blocks are sequentially stored and written with TDI memory indexes.

FIG. 69(*b*) illustrates TDI reading operation. As shown in FIG. 68(*b*), cell values stored in the TDI memory can be column-wise read and output in the order of memory indexes 0, 1, 2, 3, . . . .

TDI output FEC blocks shown in the right part of FIG. 69 sequentially indicate cell values output through time deinterleaving according to an embodiment of the present invention. TDI output memory indexes correspond to the cell values output through time deinterleaving according to an embodiment of the present invention.

Consequently, the time deinterleaver according to an embodiment of the present invention can perform diagonal-type TDI by sequentially generating TDI output memory index values for sequentially input FEC blocks.

FIG. 69 illustrates an operation of a time deinterleaver corresponding to the diagonal slope-1 described with reference to FIG. 65. The aforementioned time interleaving operation can also be applied to the remaining diagonal slopes shown in FIG. 65.

Figure 70:
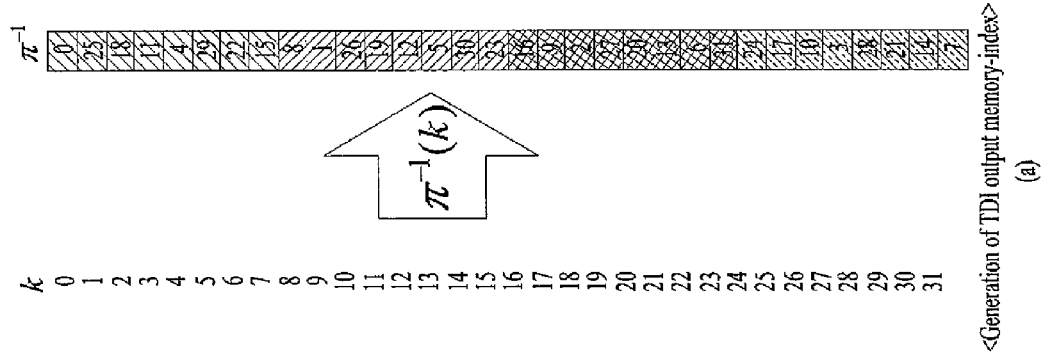
FIG. 70 illustrates a process of generating TDI output memory indexes according to an embodiment of the present invention.

FIG. 70 illustrates a process of generating TDI output memory indexes according to an embodiment of the present invention.

As described above, the time deinterleaver according to an embodiment of the present invention can perform diagonal-type TDI by sequentially generating TDI output memory index values for sequentially input FEC blocks.

FIG. 70(*a*) illustrates a process of generating diagonal-type TDI memory indexes for the above-described sequentially input FEC blocks and FIG. 70(*b*) shows equations representing the memory index generation process.

Equation 3 below represents a process for generation of a TDI output memory index for the diagonal-type TDI when diagonal slope values of the various TI readings described with reference to FIG. 65 are set.

$$S_R = N_c - S_T, 1 \le S_R < N_c \quad \text{[Equation 3]}$$
$$r_k = \mathrm{mod}(k, N_r),$$
$$t_k = \mathrm{mod}(S_R \times r_k, N_c),$$
$$c_k = \mathrm{mod}\left(t_k + \left\lfloor \frac{k}{N_r} \right\rfloor, N_c\right)$$
$$\pi^{-1}(k) = N_r c_k + r_k, \text{ for } 0 \le k \le N - 1$$

$S_T$: diagonal slope for use in interleaving (constant value)
$S_R$: diagonal slope for use in deinterleaving (constant value)
$N_r$: row size
$N_c$: column size
N: total cell size in TI block, $N = N_c N_r$
$\lfloor \bullet \rfloor$: floor operation
mod: modulo operation
$\pi^{-1}(k)$: TI output memory index The broadcast signal transmitter according to an embodiment of the present invention may be a variable data-rate system in which a plurality of FEC blocks is packed and configured as a plurality of TI blocks and transmitted. In this case, TI blocks may have different numbers of FEC blocks included therein.

Figure 71:
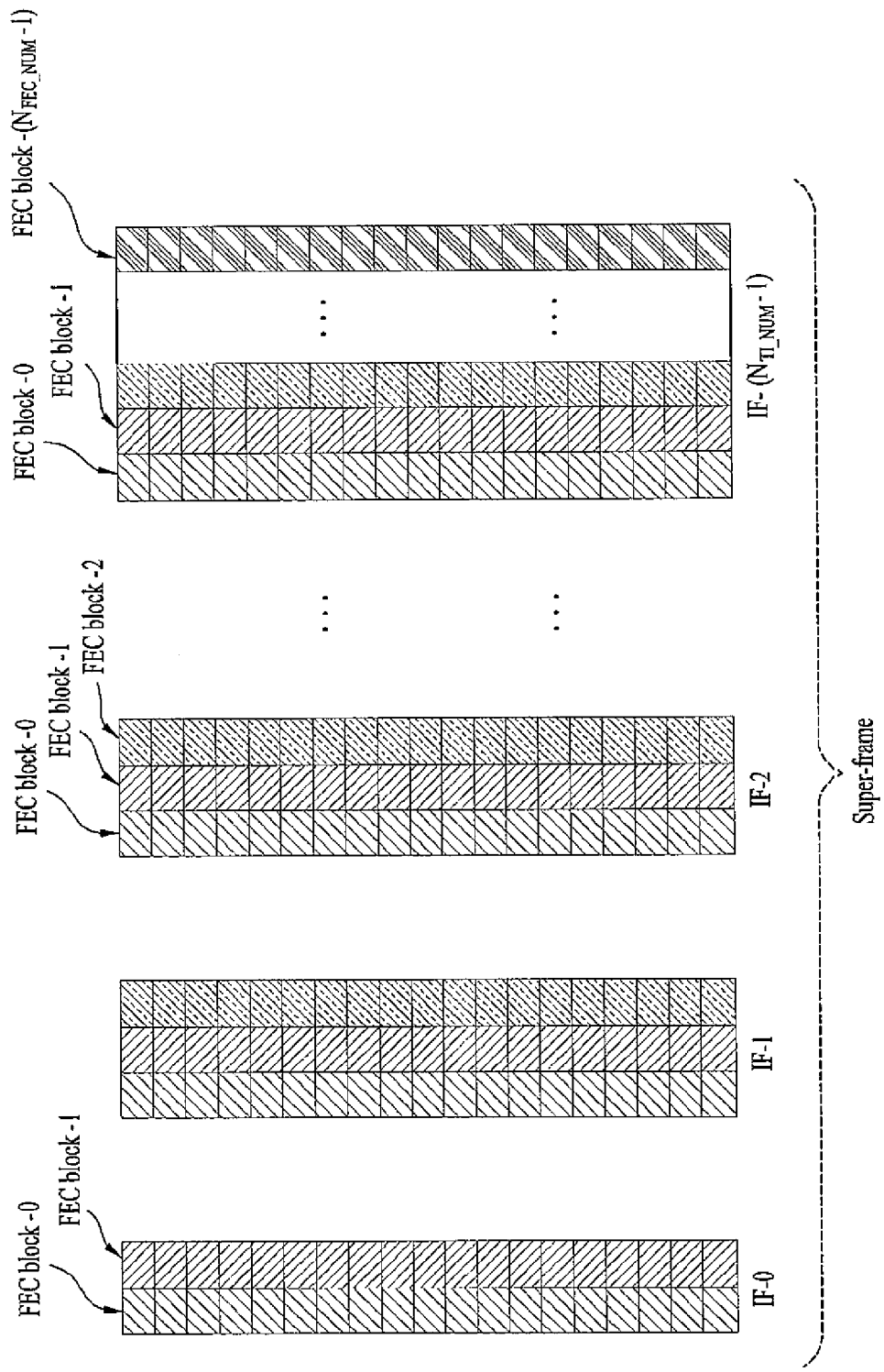
FIG. 71 is a conceptual diagram illustrating a variable data-rate system according to an embodiment of the present invention.

FIG. 71 is a conceptual diagram illustrating a variable data-rate system according to an embodiment of the present invention.

One transmission superframe may include $N_{IF\_NUM}$ interleaving frames (IFs) and each IF may include $N_{FEC\_NUM}$ FEC blocks. In this case, the number of FEC blocks included in each IF may be varied. An IF according to an embodiment of the present invention may be defined as a block for timing interleaving and may be referred to as the aforementioned TI block.

As described above, the variable data-rate system as a broadcast signal transmitter according to an embodiment of the present invention can pack a plurality of FEC blocks as a plurality of IFs and transmit the IFs. In this case, the IFs may have different numbers of FEC blocks included therein.

A description will be given of time interleaving which can be performed in the aforementioned variable data-rate system. This time interleaving process is another embodiment of the above-described time interleaving process and has the advantage that the time interleaving process is applicable to a case in which the broadcast signal receiver has a single memory. Time interleaving according to another embodiment of the present invention may be referred to as the aforementioned diagonal-type TI and may be performed in the time interleaver included in the broadcast signal transmitter according to an embodiment of the present invention. As the inverse process of time interleaving, time deinterleaving may be referred to as diagonal-type TDI and may be performed in the time deinterleaver in the broadcast signal receiver according to an embodiment of the present invention. The name of a device which performs time interleaving or time deinterleaving or the location or function of the device may be changed according to designer. A description will be given of detailed time interleaving and time deinterleaving operations.

When IFs have different numbers of FEC blocks included therein, as described above, different diagonal-type TI methods need to be applied to the respective IFs. However, this scheme has a problem that deinterleaving corresponding to the different diagonal-type TI methods cannot be performed when the broadcast signal receiver uses a single memory.

Accordingly, the broadcast signal transmitter according to the present invention determines a single diagonal-type TI method and equally applies the determined diagonal-type TI method to all IFs according to an embodiment of the present invention. In addition, the broadcast signal transmitter according to an embodiment of the present invention can sequentially deinterleave a plurality of IFs using a single memory.

In this case, the broadcast signal transmitter according to an embodiment of the present invention can determine the diagonal-type TI method applied to all IFs on the basis of a IF including a maximum number of FEC blocks within one signal frame.

Moreover, the broadcast signal transmitter according to an embodiment of the present invention can determine the diagonal-type TI method applied to all IFs on the basis of a IF including a medium number of FEC blocks within one signal frame or an arbitrary IF within one signal frame. It can be determined according to designer.

Here, how the diagonal-type TI method is applied to a IF including a smaller number of FEC blocks, compared to the IF including the maximum number of FEC blocks, may become a problem.

Accordingly, the broadcast signal transmitter may monitor generated memory indexes and determine whether to apply the memory indexes according to an embodiment of the present invention.

Specifically, when the number of generated TI memory indexes exceeds the number of cells in an arbitrary IF, the broadcast signal transmitter virtual FEC blocks can be added (zero padding) and diagonal-type TI can be performed. Since the added virtual FEC blocks include cells having zero value, the broadcast signal transmitter according to the present invention may skip or ignore the added virtual FEC blocks. This operation may be referred to as skip operation. The skip operation will be described in detail later.

Furthermore, in application of the aforementioned diagonal-type TI method to different IFs, the broadcast signal transmitter may sequentially apply the diagonal-type TI method to IFs from a TI block including a small number of FEC blocks in order of the number of FEC blocks according to an embodiment of the present invention.

Accordingly, the broadcast signal receiver according to an embodiment of the present invention can simply operate the single memory, which will be described in detail later.

The following equations represent the aforementioned process of determining a diagonal-type TI method applied to all IFs.

[Equation 4]
$$\text{for } 0 \le j \le N_{IF\_NUM} - 1$$
$$N_r = \max(N_{FEC\_Size,0}, N_{FEC\_Size,0} \ldots, N_{FEC\_Size,N_{IF\_NUM}-1})$$
$$= \max_j(N_{FEC\_Size,j})$$
$$N_c = \max(N_{FEC\_NUM,0}, N_{FEC\_NUM,0} \ldots N_{FEC\_NUM,N_{IF\_NUM}-1})$$
$$= \max_j(N_{FEC\_NUM,j})$$

$N_{IF\_NUM}$: Total number of IFs in a single super-frame
$N_{FEC\_NUM,j}$: Total number of FEC blocks in the jth IF
$N_{FEC\_Size,j}$: FEC block size in the th IF, FIG. 72 illustrates a time interleaving process according to another embodiment of the present invention.

Figure 72:
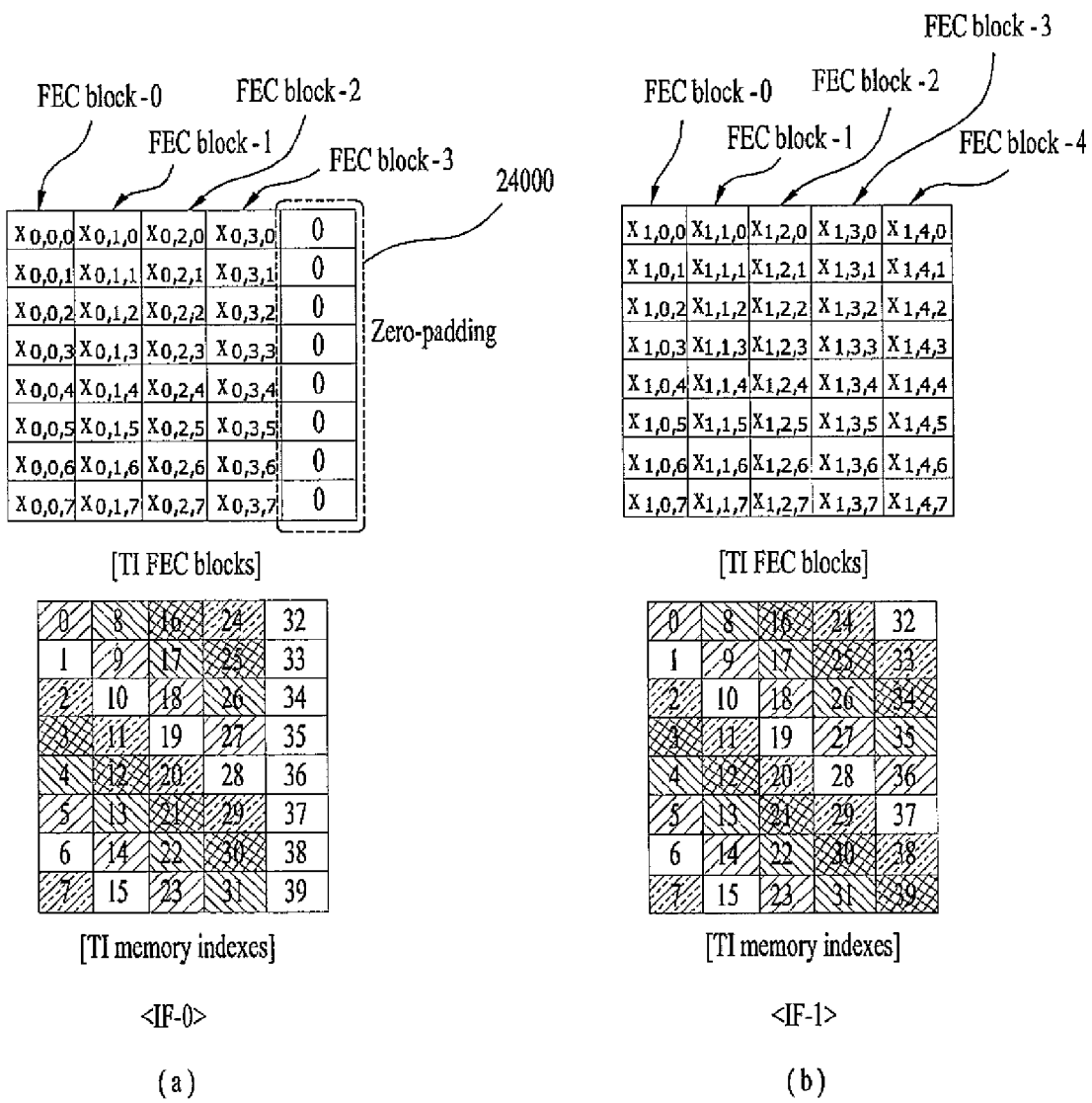
FIG. 72 illustrates a time interleaving process according to another embodiment of the present invention.

FIG. 72 shows an embodiment of applying diagonal-type TI in a variable data-rate system.

FIG. 72(a) illustrates a process of applying diagonal-type TI to IF-0 including 4 FEC blocks and FIG. 72(b) illustrates a process of applying diagonal-type TI to IF-1 including 5 FEC blocks.

TI FEC blocks represent FEC blocks included in each IF and cell values corresponding to the FEC blocks. TI memory indexes indicate memory indexes corresponding to cell values included in IFs.

The IFs are included in one super frame and each FEC block may include 8 cells.

The broadcast signal transmitter according to an embodiment of the present invention can determine a diagonal-type TI method which is equally applied to two IFs. Since the diagonal-type TI method according to an embodiment of the present invention is determined on the basis of a IF including a maximum number of FEC blocks within one frame, as described above, diagonal-type TI is determined based on IF-1 in the case of FIG. 72. Accordingly, the TI memory can have a size corresponding to an 8×5 (40×1) matrix.

As shown in the upper part of FIG. 72(a), the number of FEC blocks included in IF-0 is 4 which is less than the number of FEC blocks included in IF-1. Accordingly, the broadcast signal transmitter according to an embodiment of the present invention can add (pad) a virtual FEC block 23000 having a value of 0 to IF-0 and column-wise write cells corresponding to the virtual FEC block 23000 into the TI memory. The position to which the virtual FEC block is added can be determined according to designer. Therefore, time deinterleaving corresponding to the diagonal-type TI method can be applied to a case in which the broadcast signal receiver uses a single memory.

As shown in the low part of FIG. 72(a), the broadcast signal transmitter according to an embodiment of the present invention can diagonally read cells written in the TI memory. In this case, since the last column corresponds to the virtual FEC block, it is possible to perform reading operation while ignoring the cells corresponding to the virtual FEC block.

The broadcast signal transmitter according to an embodiment of the present invention can perform column-wise writing and diagonal reading for IF-1 according to the aforementioned method, as shown in FIG. 72(b).

As described above, since diagonal-type TI according to an embodiment of the present invention is preferentially applied to a IF including a smaller number of FEC blocks, diagonal-type TI can be applied to IF-1 first in the case of FIG. 72.

FIG. 73 illustrates a process of generating TI output memory indexes according to another embodiment of the present invention.

FIG. 73 shows a process of generating TI output memory indexes for the above-described two IFs (IF-0 and IF-1) and TI output FEC blocks corresponding to TI output memory indexes.

Blocks corresponding to TI output memory indexes represent a process of generating TI output memory indexes and TI output FEC blocks represent cell values of FEC blocks corresponding to the generated TI output memory indexes.

FIG. 73(a) illustrates a process of generating TI output memory indexes of IF-0. As shown in the upper part of FIG. 73(a), when the number of TI memory indexes exceeds the number of cells of IF-0, the broadcast signal transmitter according to an embodiment of the present invention can ignore TI memory indexes 32 to 39 corresponding to cells included in a virtual FEC block (skip operation). Consequently, final output memory indexes for which reading can be performed, except for the skipped TI memory indexes, are generated as shown in FIG. 73(a). Cell values of output FEC blocks corresponding to the final output memory indexes are shown in the lower part of FIG. 73(a).

FIG. 73(b) illustrates a process of generating TI output memory indexes of IF-1. In the case of IF-1, skip operation is not applied. The process corresponds to the aforementioned process.

The following equations represent the output memory index generation process for performing diagonal-type TI applicable in the aforementioned variable data-rate system.

$$\text{for } 0 \leq j \leq N_{IF\_NUM} - 1, 0 \leq k \leq N_r N_c - 1 \quad \text{[Equation 5]}$$

$$C_{cnt,j} = 0$$

$$r_{j,k} = \mod(k, N_r),$$

$$t_{j,k} = \mod(S_T \times r_{j,k}, N_c), 1 \leq S_T < N_c$$

$$c_{j,k} = \mod\left(t_{j,k} + \left\lfloor \frac{k}{N_r} \right\rfloor, N_c\right)$$

$$\theta_j(k) = N_r c_{j,k} + r_{j,k}$$

$$\text{if } \theta_j(k) \leq N_{FEC\_Size,j} N_{FEC\_NUM,j}$$

$$\pi_j(C_{cnt,j}) = \theta_j(k)$$

$$C_{cnt,j} = C_{cnt,j} + 1$$

end end $S_T$: diagonal slope for use in interleaving (constant value)
$C_{cnt,j}$: counter of actual TI output memory-index for the jth TI block
$\theta_j(k)$: temporal TI output memory-index for the jth TI black
$\pi_j(k)$: actual TI output memory-index for the jth Ti block In Equation 5, the "if" statement represents the aforementioned skip operation. In addition, Equation 5 above represents a process for generation of an output memory index for the aforementioned diagonal type TI of the diagonal slope. Accordingly, a diagonal slope value is defined as one variable.

Figure 74:
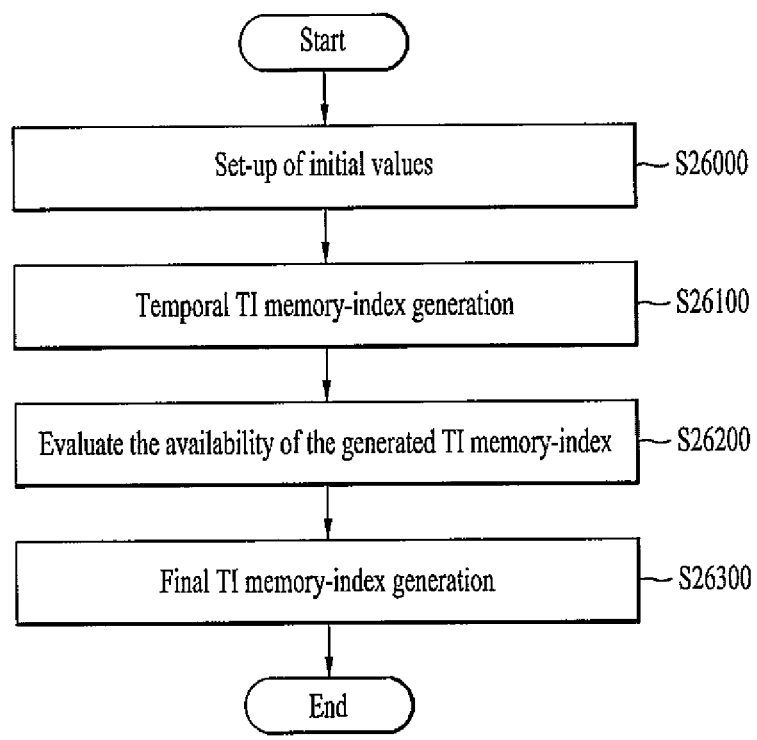
FIG. 74 is a flowchart illustrating a TI memory index generation process according to an embodiment of the present invention.

FIG. 74 is a flowchart illustrating a TI memory index generation process according to an embodiment of the present invention.

As described above, the time interleaver according to an embodiment of the present invention can perform diagonal-type TI by sequentially generating TI output memory indexes for sequentially input FEC blocks.

Referring to FIG. 74, the broadcast signal transmitter according to an embodiment of the present invention may set initial values (S26000). That is, the broadcast signal transmitter according to an embodiment of the present invention can determine a diagonal-type TI method applied to all IFs on the basis of a IF including a maximum number of FEC blocks.

Then, the broadcast signal transmitter according to an embodiment of the present invention may generate temporal TI memory indexes (S26100). That is, the broadcast signal transmitter according to an embodiment of the present invention can add (pad) a virtual FEC block to IFs having numbers of FEC blocks less than a predetermined TI memory index and write cells corresponding to IFs into a TI memory.

The broadcast signal transmitter according to an embodiment of the present invention may evaluate availability of the generated TI memory indexes (S26200). That is, the broadcast signal transmitter according to an embodiment of the present invention can diagonally read the cells written in the TI memory. In this case, cells corresponding to the virtual FEC block can be skipped and reading can be performed.

Then, broadcast signal transmitter according to an embodiment of the present invention may generate final TI memory indexes (S26300).

The flowchart of FIG. 74 corresponds to the process of generating TI output memory indexes, described with reference to FIGS. 71, 72 and 73, and may be modified according to designer.

Figure 75:
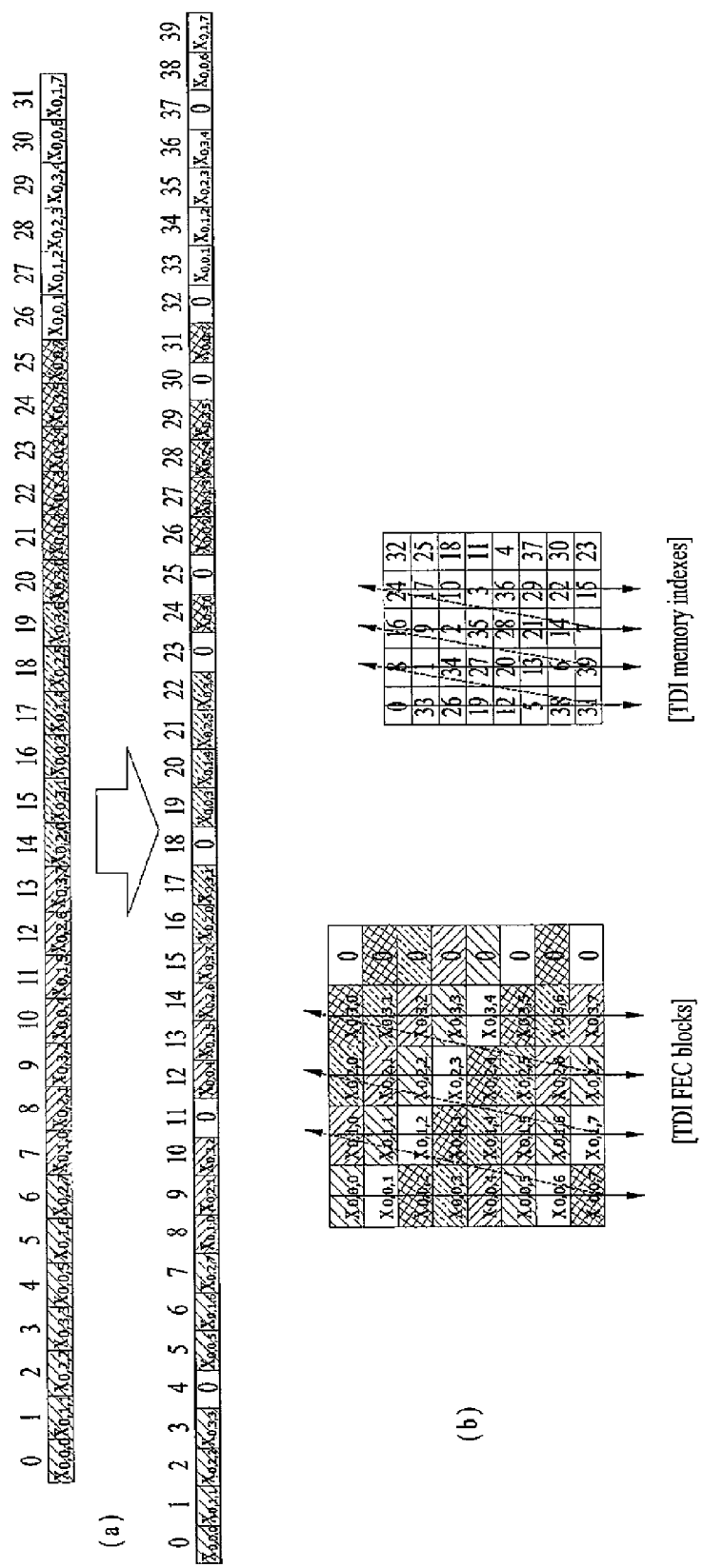
FIG. 75 illustrates a time deinterleaving process according to another embodiment of the present invention.

FIG. 75 illustrates a time deinterleaving process according to another embodiment of the present invention.

The time deinterleaving process shown in FIG. 75 is the inverse of the time interleaving process described with reference to FIGS. 72, 73 and 74.

Particularly, time deinterleaving according to another embodiment of the present invention can be applied to a case in which the broadcast signal receiver uses a single memory.

To achieve such a single-memory approach, the reading and writing operations for the interleaved IFs should be accomplished simultaneously. The TDI procedure can be expressed as a closed-form, which leads to the efficient TDI implementation.

Time deinterleaving according to another embodiment of the present invention may be performed through four steps.

FIG. 75(a) illustrates the first step (step 1) of time deinterleaving. Before TDI processing for IF-0, using TI rule, the cell value corresponding to a memory index ignored during TI processing is set to zero (or an identification value). That is, the blocks shown in the upper part of FIG. 75(a) represent cell values of output FEC blocks corresponding to final output memory indexes of IF-0 and the blocks shown in the lower part of FIG. 75(a) represent cell values of FEC blocks, which are generated by setting cell values corresponding to memory indexes skipped in skip operation to zero.

In the second step (step 2), after step 1, output of step 1 is written to the single-memory of size 8×5. The writing direction is identical to the reading direction in TI processing. The broadcast signal receiver according to an embodiment of the present invention can perform diagonal writing operation as the first inverse process of TI of the transmitter for the first input IF. That is, diagonal writing can be performed in a direction opposite to the direction of diagonal reading performed by the transmitter.

FIG. 75(b) illustrates the third step (step 3) of time deinterleaving.

Blocks corresponding to TDI FEC blocks represent cell values of input FEC blocks. Blocks corresponding to TDI memory indexes represent TDI memory indexes corresponding to cell values of FEC blocks.

After step 2, column-wise reading operation is performed in the same direction as the writing direction in TI processing. At this time, if the reading value is zero (or an identification value), it is ignored (skip operation). This skip operation corresponds to the aforementioned skip operation performed in the broadcast signal transmitter.

The following equations represent the aforementioned TDI memory index generation process.

$$\text{[Equation 6]}$$

$$\text{for } 0 \leq k \leq N_c N_r - 1, 0 \leq j \leq \text{IF\_NUM} - 1$$

$$C_{cnt,j} = 0$$

$$S_{R,j} = \mod(S_{R,j-1} - S_T, N_c), \text{ where } S_{R,0} = N_c - S_T,$$

-continued $r_{j,k} = \mod(k, N_r),$ $t_{j,k} = \mod(S_{R_j} \times r_{j,k}, N_c),$ $c_{j,k} = \mod\left(t_{j,k} + \left\lfloor \frac{k}{N_r} \right\rfloor, N_c\right)$ $\theta_j^{-1}(k) = N_r c_{j,k} + r_{j,k},$ if $M(\theta_j^{-1}(k)) \neq 0$(a value)

$\pi_j^{-1}(C_{cnt,j}) = \theta_j^{-1}(k)$ $C_{cnt,j} = C_{cnt,j} + 1$ end end $C_{cnt,j}$: counter of actual TDI output memory-index for the jth IF $\theta_1^{-1}(k)$: the reserved cell value at $\theta_j^{-1}(k)$, $M(\theta_j^{-1}(k)$: temporal TDI output memory-Index for the jth IF $\pi_j^{-1}(k)$: actual TDI output memory-index for the jth IF The "if" statement in the above equation represents the aforementioned skip operation, that is, the process of ignoring indexes when the indexes corresponding cell values stored in the TDI output memory are 0 (or an arbitrary value indicating that the indexes are forcibly inserted). In addition, Equation 6 above represents a process of generation of a TDI memory index for time interleaving corresponding to the aforementioned diagonal type TI according to a diagonal slope.

Figure 76:
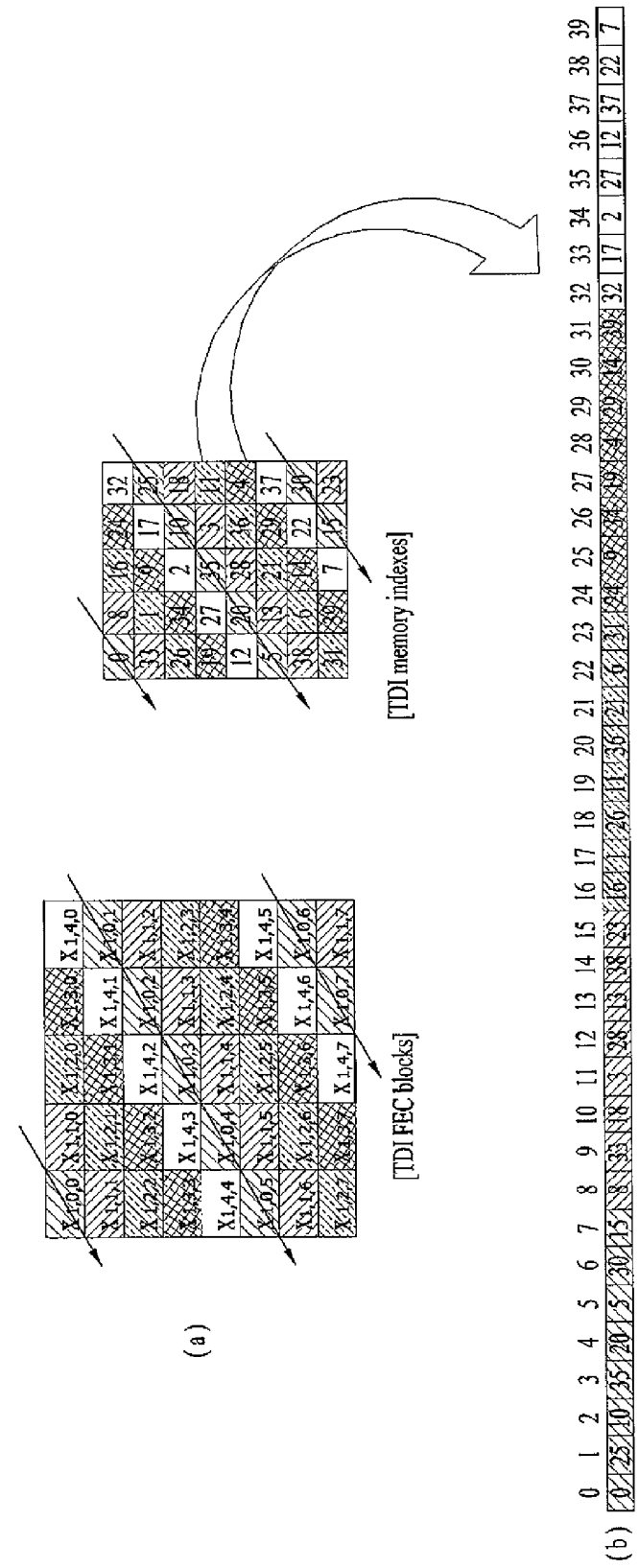
FIG. 76 illustrates a time deinterleaving process according to another embodiment of the present invention.

FIG. 76 illustrates a time deinterleaving process according to another embodiment of the present invention.

As described above, the broadcast signal receiver according to an embodiment of the present invention can perform time deinterleaving using a single memory. Accordingly, the broadcast signal receiver according to an embodiment of the present invention can read IF-0 and write IF-1 simultaneously in the fourth step (step 4).

FIG. 76(*a*) shows TDI FEC blocks of IF-1 written simultaneously with reading of IF-0 and TDI memory indexes. The writing operation can be performed in a direction opposite to the direction of diagonal reading performed in the broadcast signal receiver, as described above.

FIG. 76(*b*) shows output TDI memory indexes according to writing of IF-1. In this case, arrangement of the stored FEC blocks within IF-1 may differ from arrangement of the FEC blocks stored in the TI memory of the broadcast signal transmitter. That is, inverse processes of the writing and reading operations performed in the broadcast signal transmitter may not be equally applied in case of a single memory.

Figure 77:
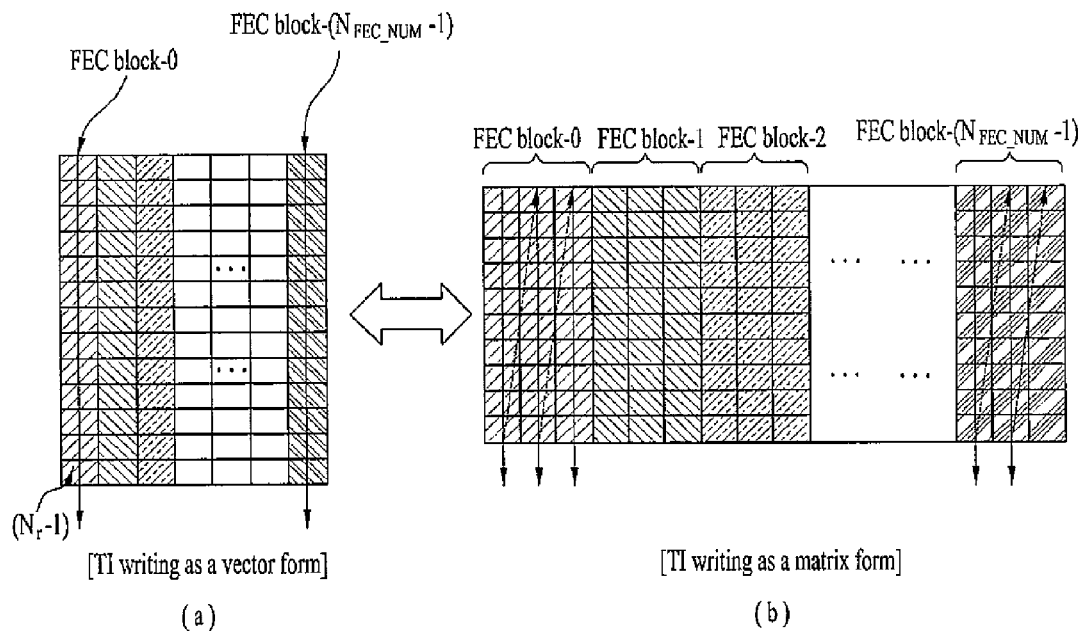
FIG. 77 illustrates a writing method according to an embodiment of the present invention.

FIG. 77 illustrates a writing method according to an embodiment of the present invention.

To prevent a case in which the inverse processes of the writing and reading operations performed in the broadcast signal transmitter cannot be equally applied in case of a single memory, as described above, the present invention provides a method of writing FEC blocks into a TI memory in a matrix form.

The writing method illustrated in FIG. 77 can be equally applied to the aforementioned time interleaving and time deinterleaving processes according to an embodiment of the present invention.

FIG. 77(*a*) illustrates a case in which cells of FEC blocks are written to the memory in a vector form, which corresponds to the aforementioned writing method.

FIG. 77(*b*) illustrates a case in which cells of FEC blocks are written to the memory in a matrix form. That is, the FEC blocks can be written in the form of an m×n matrix.

In this case, the matrix size can be changed according to designer and the inverse processes of the writing and reading processes performed in the broadcast signal transmitter can be equally applied to a case in which the broadcast signal receiver uses a single memory.

Figure 78:
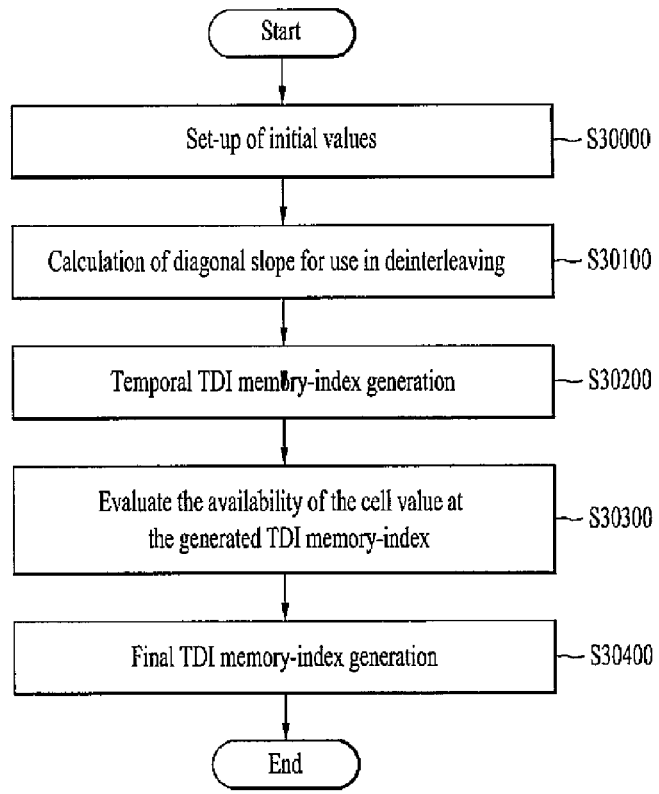
FIG. 78 is a flowchart illustrating a process of generating TDI memory indexes according to an embodiment of the present invention.

FIG. 78 is a flowchart illustrating a process of generating TDI memory indexes according to an embodiment of the present invention.

As described above, the time deinterleaver according to an embodiment of the present invention can perform diagonal-type TI by sequentially generating TI output memory indexes for sequentially input FEC blocks.

As shown in FIG. 78, the broadcast signal receiver according to an embodiment of the present invention may set initial values (S30000). That is, in the broadcast signal receiver according to an embodiment of the present invention, the cell value corresponding to a memory index ignored during TI processing is set to zero (or an identification value) using TI rue before TDI processing for the first IF.

Then the broadcast signal receiver according to an embodiment of the present invention may calculate a diagonal slope to be used for TDI processing (S30100).

Subsequently, the broadcast signal receiver according to an embodiment of the present invention may generate temporal TI memory indexes (S30200). The broadcast signal receiver according to an embodiment of the present invention may perform diagonal writing operation as the first inverse process of TI of the transmitter for the first input IF. Then, the broadcast signal transmitter according to an embodiment of the present invention may evaluate the generated TI memory indexes (S30300). The broadcast signal transmitter according to an embodiment of the present invention may generate final TI memory indexes (S30400).

The flowchart shown in FIG. 78 corresponds to the process of generating TDI output memory indexes, described with reference to FIGS. 75, 76 and 77, and may be changed according to designer.

Figure 79:
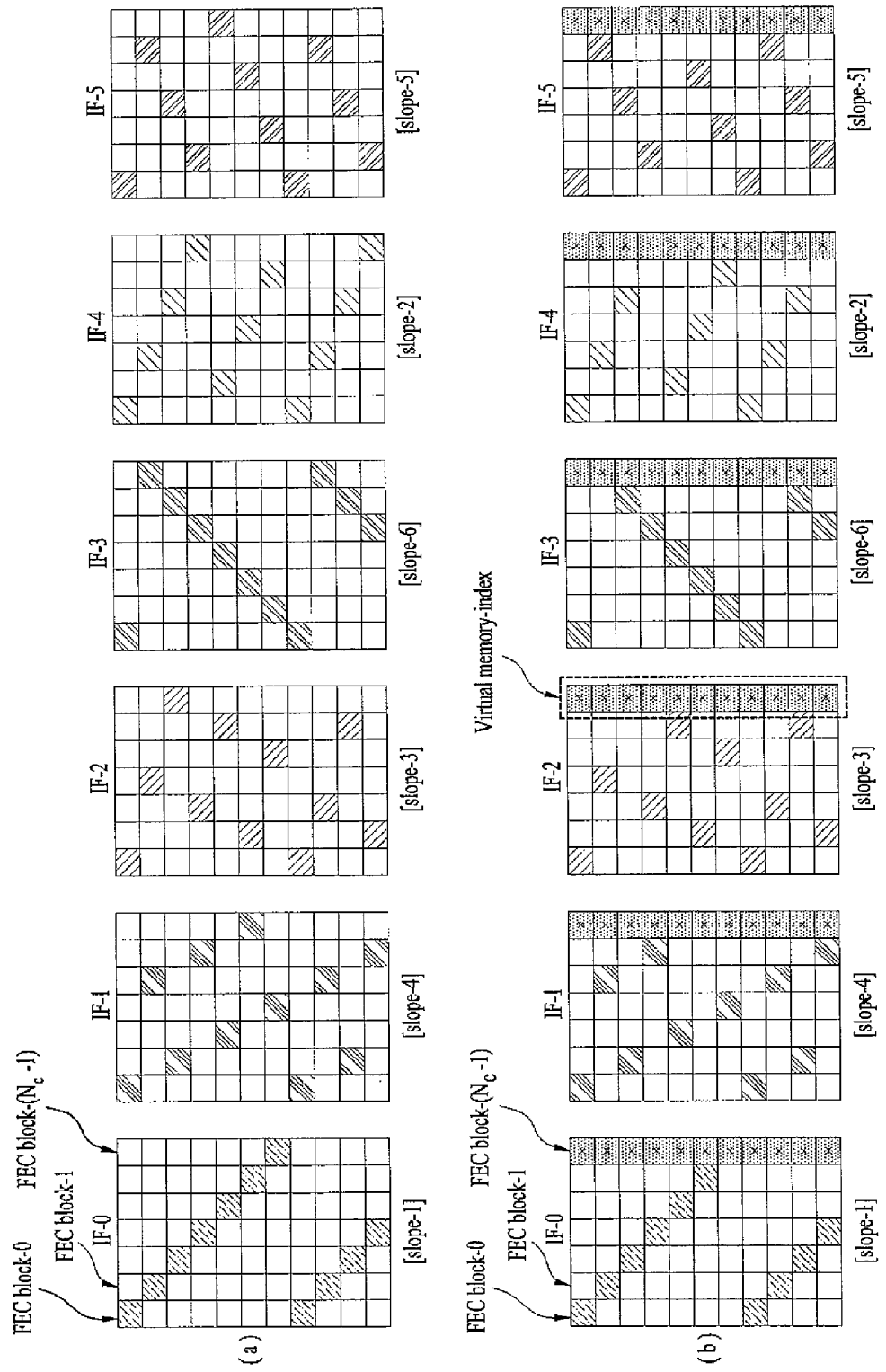
FIG. 79 illustrates IF-by-IF TI pattern variation according to an embodiment of the present invention.

FIG. 79 illustrates IF-by-IF TI pattern variation according to an embodiment of the present invention.

As described above, the broadcast signal transmitter (or a time interleaver) according to an embodiment of the present invention may differently apply a diagonal slope in super-frame units or IF units.

FIG. 79 illustrates an embodiment in which diagonal slopes are differently applied to respective IFs and TI patterns are changed and, that is, an embodiment in which the diagonal slopes are differently applied to the respective IFs according to the cases in which the number of FEC blocks contained in an IF is an even number and an odd number. This is because, when the number of the FEC blocks is an even number, a diagonal slope for reducing an interleaving depth may be present.

FIG. 79 illustrates an embodiment in which the number of IFs included in one superframe is 6 and the length of an FEC block included in each IF, Nr is 11 and, that is, an embodiment in which a diagonal slope is determined to be applied when the number of FEC blocks is 7.

FIG. 79(*a*) illustrates an embodiment in which the number of FEC blocks included in each IF is an odd number, that is, 7. In this case, the time interleaver according to an embodiment of the present invention may randomly select the diagonal slopes (in an order of diagonal slopes 1, 4, 3, 6, 2, and 5) and apply to 6 IFs so as not to repeat the diagonal slopes described with reference to FIG. 65. FIG. 79(*b*) illustrates an embodiment in which the number of FEC blocks included in each IF is an even number, that is, 6 and, that is, an embodiment in which the diagonal slope values described with reference to FIG. 65 is set to be applied to the case in which the number of FEC blocks is 7. In this case, the time interleaver according to an embodiment of the present invention may assume that each IF includes 7 FEC blocks and, that is, add the aforementioned virtual FEC block and apply a random diagonal slope to perform diagonal reading (in an order of diagonal slopes 1, 4, 3, 6, 2, and 5). In this case, as described above, cells of the virtual FEC may be disregarded via a skip operation.

The broadcast signal transmitter according to an embodiment of the present invention may select an IF having a largest number of FEC blocks in one superframe and determine Nc. A process for determination of Nc is the same as in Equation 4 above.

Then the broadcast signal transmitter according to an embodiment of the present invention determines whether the determined Nc is an even or odd number. When the determined Nc is an even number, the broadcast signal transmitter may add the virtual FEC block as described above. Equation 7 below represents a process of achieving an odd number by adding the virtual FEC block when Nc is an even number.

if mod($N_c$,2)=0

$N_c=N_c+1$ elseif mod($N_c$,2)=1

$N_c=N_c$  [Equation 7]

Then the broadcast signal transmitter according to an embodiment of the present invention may sequentially or randomly generate diagonal slopes using various methods. Equation 8 below represents a process of generation of a diagonal slope to be used in each IF using a quadratic polynomial (QP) scheme.

$$H_j = \left(\gamma + q \times \frac{(j+1)(j+2)}{2}\right) \mod N_{Div},$$  [Equation 8]

for $j = 0, \ldots, N_{IF\_NUM} - 1$ if $1 \le H_j < N_c - 1$ $S_{T,j} = H_j$ else $S_{T,j} = \mod(H_j, N_c - 1)$ end $N_{Div}$: division value of QP, $N_{Div}=2^n$, where $\lceil \log_2(N_c/2) \rceil < n \le \lceil \log_2(N_c) \rceil$ q: a relative prime value to $N_{Div}$ γ: an offset value of a QP ⌈•⌉: cell operation The QP scheme may correspond to an embodiment of the present invention and may be replaced with a primitive polynomial (PP) scheme. This can be changed according to intention of the designer.

Equation 9 below represents a process of sequentially generating a diagonal slope.

$S_{T,j} = \mod(j, N_c-1)+1$, for $j=0, \ldots, N_{IF\_NUM}-1$  [Equation 9]

Then the broadcast signal transmitter according to an embodiment of the present invention may perform time interleaving in consideration of variables generated via the processes of Equations 7 to 9 above. In this case, a process of generation of a TI output memory output memory index of the broadcast signal transmitter according to an embodiment of the present invention may be represented according to Equation 5 above. Equation 5 above may include the diagonal slope generated according to Equations 8 and 9 above as a main variable. In addition, the skip operation described with reference to Equation 5 above can be applied irrespective of whether the length of N, is an even or odd number.

The broadcast signal receiver according to an embodiment of the present invention can perform time interleaving so as to correspond to the aforementioned broadcast signal transmitter. In this case, a process of generation of a TDI output memory index of the broadcast signal receiver according to an embodiment of the present invention can be represented according to Equation 6 above. Equation 6 above may include the diagonal slope generated via the generating processes represented according to Equations 8 to 9 as a main variable. In addition, the skip operation described with reference to Equation 6 above can be applied irrespective of whether the length of Nc is an even or odd number.

As described above, the information associated with the TI pattern may be transmitted via the aforementioned static PLS signaling data. Information indicating whether the TI pattern is changed may be represented as TI_Var and may have a one bit size. When TI_Var has a value 0, this means that the TI pattern is not changed. Accordingly, the broadcast signal receiver according to an embodiment of the present invention may determine a variable ST as 1 that is a default value. When TI_Var has a value 1, this means that the TI pattern is changed. In this case, the broadcast signal receiver according to an embodiment of the present invention may determine the variable $S_T$ as $S_{T,j}$.

Hereinafter, a frequency interleaving process according to an embodiment of the present invention will be described.

The aforementioned block interleaver 6200 may interleave cells in a transmission block as a unit of a signal frame to obtain an additional diversity gain. The block interleaver 6200 according to an embodiment of the present invention may be referred to as a frequency interleaver. This can be changed according to intention of the designer. In addition, when the aforementioned pair-wise cell mapping is performed, the block interleaver 6200 may process two consecutive cells in input cells in one unit and perform interleaving. This may be referred to as pair-wise interleaving. Accordingly, the block interleaver 6200 may perform output in a unit of two consecutive cells. In this case, the block interleaver 6200 may operate in the same way or may independently operate with respect to two antenna paths.

The present proposes symbol by symbol frequency interleaving as another embodiment of frequency interleaving performed by the block interleaver 6200. According to the present invention, the symbol by symbol frequency interleaving may be referred to as interleaving or (single or pair-wise) quasi-random frequency interleaving. Unlike the aforementioned pair-wise interleaving, the frequency interleaving according to an embodiment of the present invention may set a seed (or mother interleaving seed) for applying different interleaving methods to each OFDM symbol. The mother interleaving seed is used to generate a different interleaving pattern applied to each OFDM symbol. In this case, interleaving patterns that are differently applied for respective OFDM symbols may be generated by cyclic-shifting a pattern of a mother interleaver. Also, the mother interleaving seed may be determined by using RPI (Relative Prime Interleaving)

method. As such, enhanced frequency diversity may be obtained compared with pair-wise interleaving.

In order to embody the aforementioned frequency interleaving, an embodiment of the present invention provides a method of determining a mother interleaving seed using a randomly pair interleaving (RPI) scheme. In this case, in order to perform the aforementioned frequency interleaving, an initial-offset value of the mother RPI according to an embodiment of the present invention may be randomly determined. Also, the initial-offset value is generated through a quadratic polynomial (QP) or primitive polynomial (PP) method.

The frequency interleaving according to an embodiment of the present invention may preserve a periodic property toward frequency domain, while a random property toward time domain. Also, the frequency interleaving according to an embodiment of the present invention may provide a (pair-wise) deinterleaving using a single-memory at a receiver side.

The frequency interleaving according to an embodiment of the present invention may have the following features for the broadcast signal receiver having a single memory.

The mother interleaving according to an embodiment of the present invention is designed by exploiting RPI with an initial-offset value.

Equation 10 below represents RPI according to an embodiment of the present invention.

$$\pi_j(k) = (\omega(j) + pk) \bmod N_{Cell\_NUM},$$
for $k=0, \ldots, N_{Cell\_NUM}-1, j=0, \ldots, N_{Sym\_NUM}-1$ [Equation 10]

$N_{Cell\_NUM}$: the number of cells $N_{Sym\_NUM}$: the number of OFDM symbols p: a relative prime vale to $N_{Cell\_NUM}$ $\omega(j)$: the initial-offset value for USE in the $j^{th}$ RPI, which is generated by a random generator mod: modulus operation $\pi_j(k)$: interleaver output memory-index (RPI output value) to the $k^{th}$ input cell-index of the OFDM symbol The time interleaver according to an embodiment of the present invention may periodically interleave input OFDM cells using a relative prime value p for N_cell_NUM. The initial-offset value according to an embodiment of the present invention is randomly generated by exploiting a random generator. Also, the initial-offset value is generated through a quadratic polynomial (QP) or primitive polynomial (PP) method. In the PP method, the random generator may be any one of a primitive random binary sequence (PRBS) generator and a pseudo-random noise (PN) generator.

Equation 11 below represents a process of generation of an initial-offset value when the QP method is used. The initial-offset value of the RPI may be applied to each OFDM symbol cell.

$$\omega(j) = \left(\gamma + q \times \frac{j(j+1)}{2}\right) \bmod N_{Div},$$ [Equation 11]

for $j = 0, \ldots, N_{Sym\_NUM} - 1$ $N_{Div}$: division value of QP or PP, $N_{DIV}$, where $\lceil \log_2(N_{Cell\_NUM}/2) \rceil < n \le \lceil \log_2(N_{Cell\_NUM}) \rceil$ q: a relative prime value to $N_{Div}$ γ: an offset value t of a QP

[•]: cell operation

Figure 80:
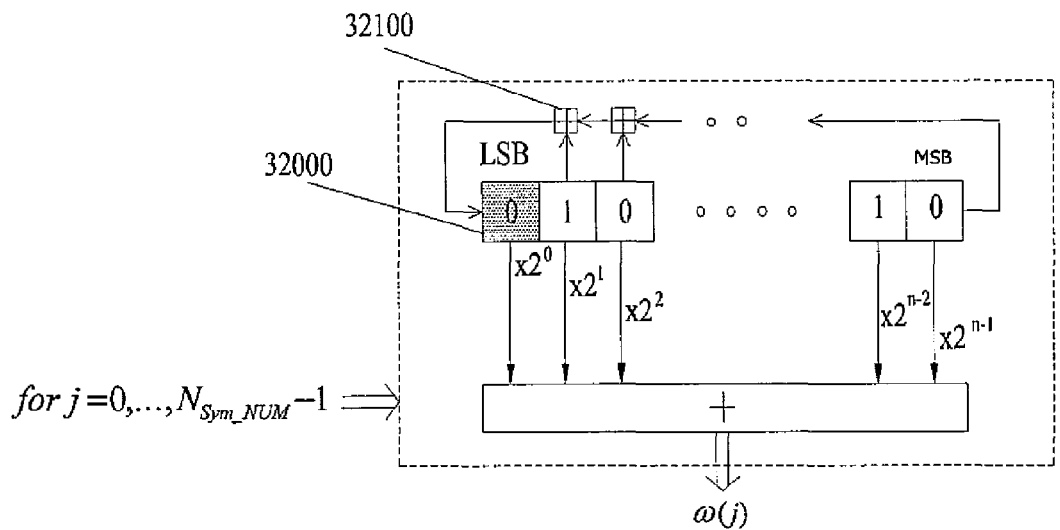
FIG. 80 illustrates a structure of a random generator according to an embodiment of the present invention.

FIG. 80 illustrates a structure of a random generator according to an embodiment of the present invention. FIG. 80 illustrates the case in which the random generator generates an initial-offset value using a PP method.

The random generator according to an embodiment of the present invention may include a register 32000 and an XOR operator 32100. In general, the PP method may randomly output values 1, ..., 2n−1. Accordingly, the random generator according to an embodiment of the present invention may perform a register reset process in order to output $2^n$ symbol indexes including 0 and set a register initial value for a register shifting process.

The random generator according to an embodiment of the present invention may include different registers and XOR operators for respective primitive polynomials for the PP method.

Table 1 below shows primitive polynomials for the aforementioned PP method and a reset value and an initial value for the register reset process and the register shifting process.

TABLE 1

| Order (n) | Primitive polynomial | k = 0 (reset value) | k = 1 (initial value) |
|---|---|---|---|
| 9 | $f(x) = 1 + x^5 + x^9$ | [000000000] | [000010001] |
| 10 | $f(x) = 1 + x^7 + x^{10}$ | [0000000000] | [0000001001] |
| 11 | $f(x) = 1 + x^9 + x^{11}$ | [00000000000] | [00000000101] |
| 12 | $f(x) = 1 + x^6 + x^8 + x^{11} + x^{12}$ | [000000000000] | [000001010011] |
| 13 | $f(x) = 1 + x^2 + x^4 + x^8 + x^9 + x^{11} + x^{12}$ | [0000000000000] | [0101000110011] |
| 14 | $f(x) = 1 + x^2 + x^{12} + x^{13} + x^{14}$ | [00000000000000] | [00100000000111] |
| 15 | $f(x) = 1 + x^{14} + x^{15}$ | [000000000000000] | [000000000000011] |

Table 1 above shows a register reset value and register initial value corresponding to an $n^{th}$ primitive polynomial (n=9, ..., 15). As shown in Table 1 above, k=0 refers to a register reset value and k=1 refers to a register initial value. In addition, $2 \le k \le 2^n - 1$ refers to shifted register values.

Figure 81:
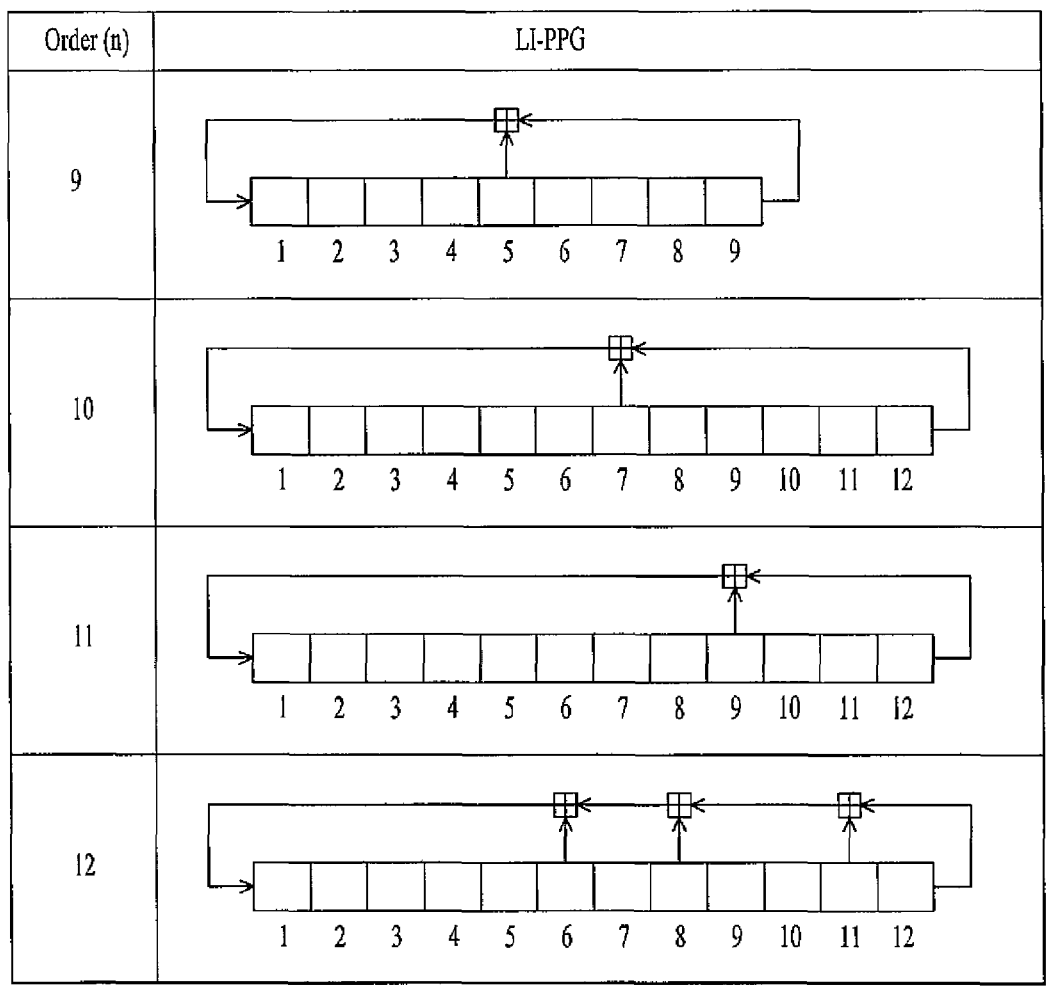
FIG. 81 illustrates a random generator according to an embodiment of the present invention.

FIG. 81 illustrates a random generator according to an embodiment of the present invention.

FIG. 81 illustrates a structure of the random generator when n of the $n^{th}$ primitive polynomial of Table 1 above is 9 to 12.

FIG. 82 illustrates a random generator according to another embodiment of the present invention.

FIG. 82 illustrates a structure of the random generator when n of the $n^{th}$ primitive polynomial of Table 1 above is 13 to 15.

Figure 83:
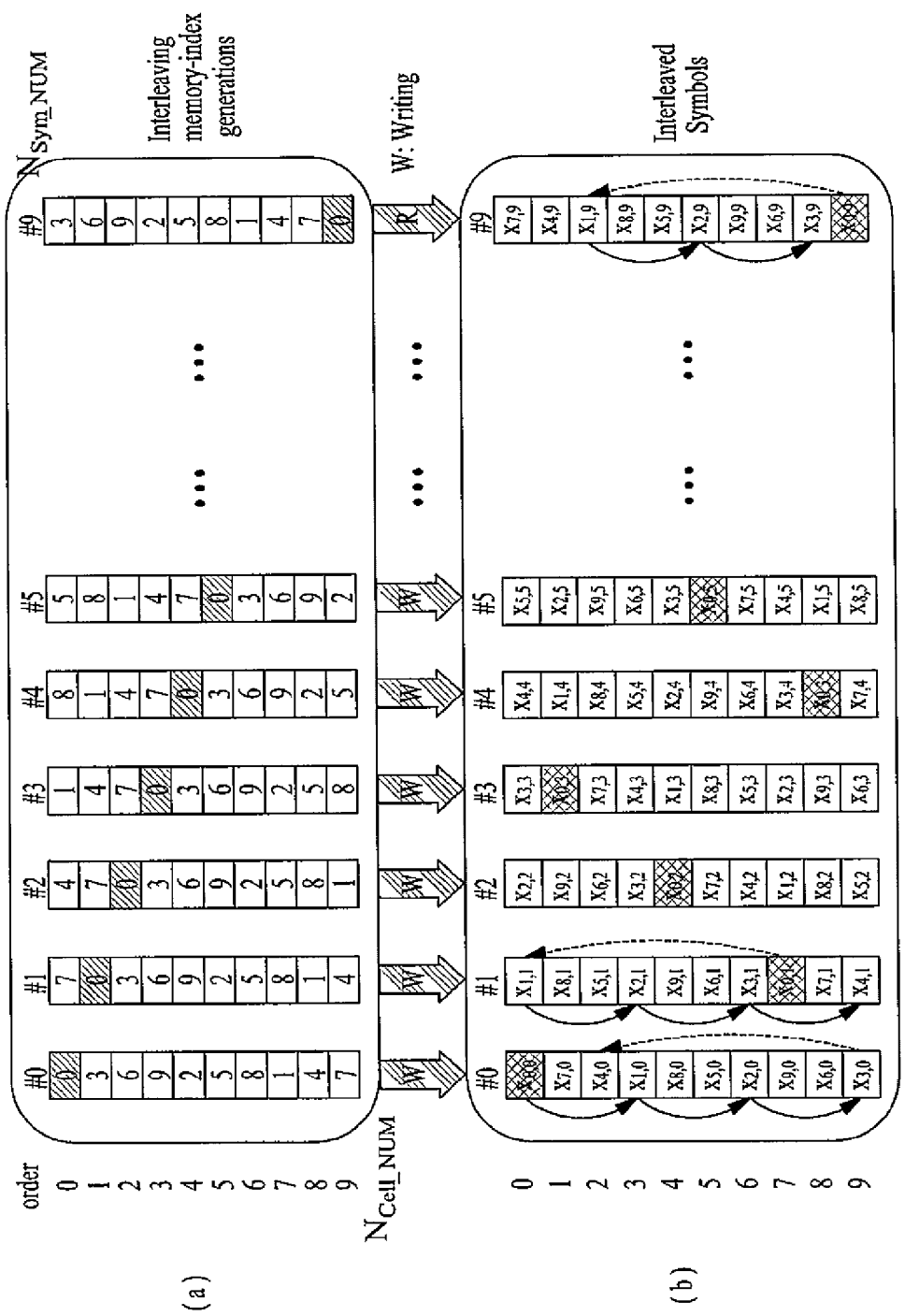
FIG. 83 illustrates a frequency interleaving process according to an embodiment of the present invention.

FIG. 83 illustrates a frequency interleaving process according to an embodiment of the present invention.

FIG. 83 illustrates a frequency interleaving process when a single memory is applied to a broadcast signal receiver, if the number of all symbols is 10, the number of cells included in one symbol is 10, and p is 3, according to an embodiment of the present invention.

FIG. 83(a) illustrates output values of respective symbols, which is output using an RPI method. In particular, a first memory index value of each OFDM symbol, that is, 0, 7, 4, 1, 8 . . . may be set as an initial-offset value generated by the random generator of the aforementioned RPI. A number indicated in the interleaving memory index represents an order in which cells included in each symbol are interleaved and output.

FIG. 83(b) illustrates results obtained by interleaving cells of an input OFDM symbol in a symbol unit using the generated interleaving memory index.

Figure 84:
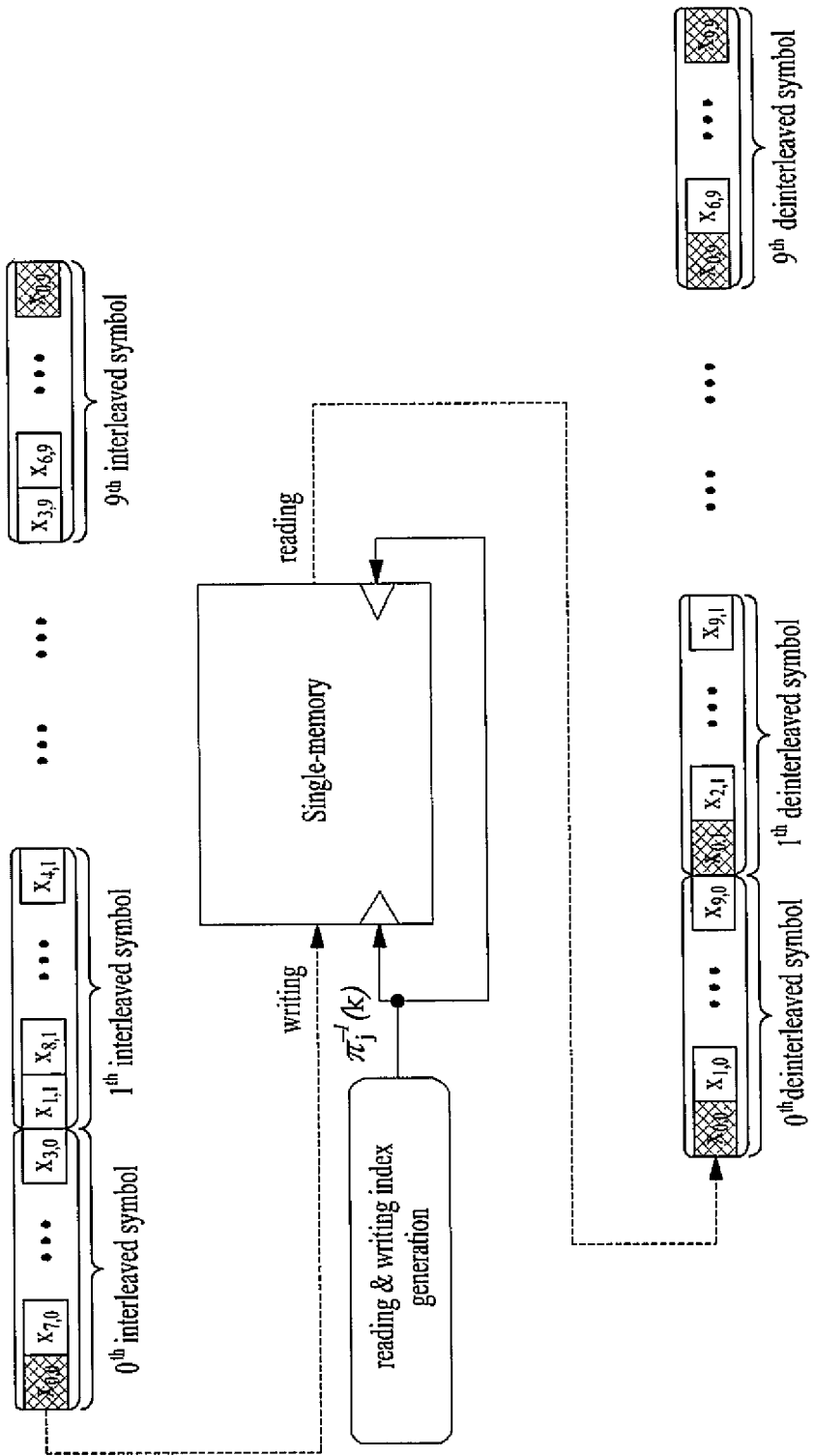
FIG. 84 is a conceptual diagram illustrating a frequency deinterleaving process according to an embodiment of the present invention.

FIG. 84 is a conceptual diagram illustrating a frequency deinterleaving process according to an embodiment of the present invention.

FIG. 84 illustrates a frequency deinterleaving process when a single memory is applied to a broadcast signal receiver and, that is, an embodiment in which the number of cells included in one symbol is 10.

The broadcast signal receiver (or a frame parsing module or a block interleaver) according to an embodiment of the present invention may generate a deinterleaving memory index via a process of sequentially writing symbols interleaved via the aforementioned frequency interleaving in an input order and output deinterleaved symbols via a reading process. In this case, the broadcast signal receiver according to an embodiment of the present invention may perform a process of performing writing on a deinterleaving memory index on which the reading is performed.

Figure 85:
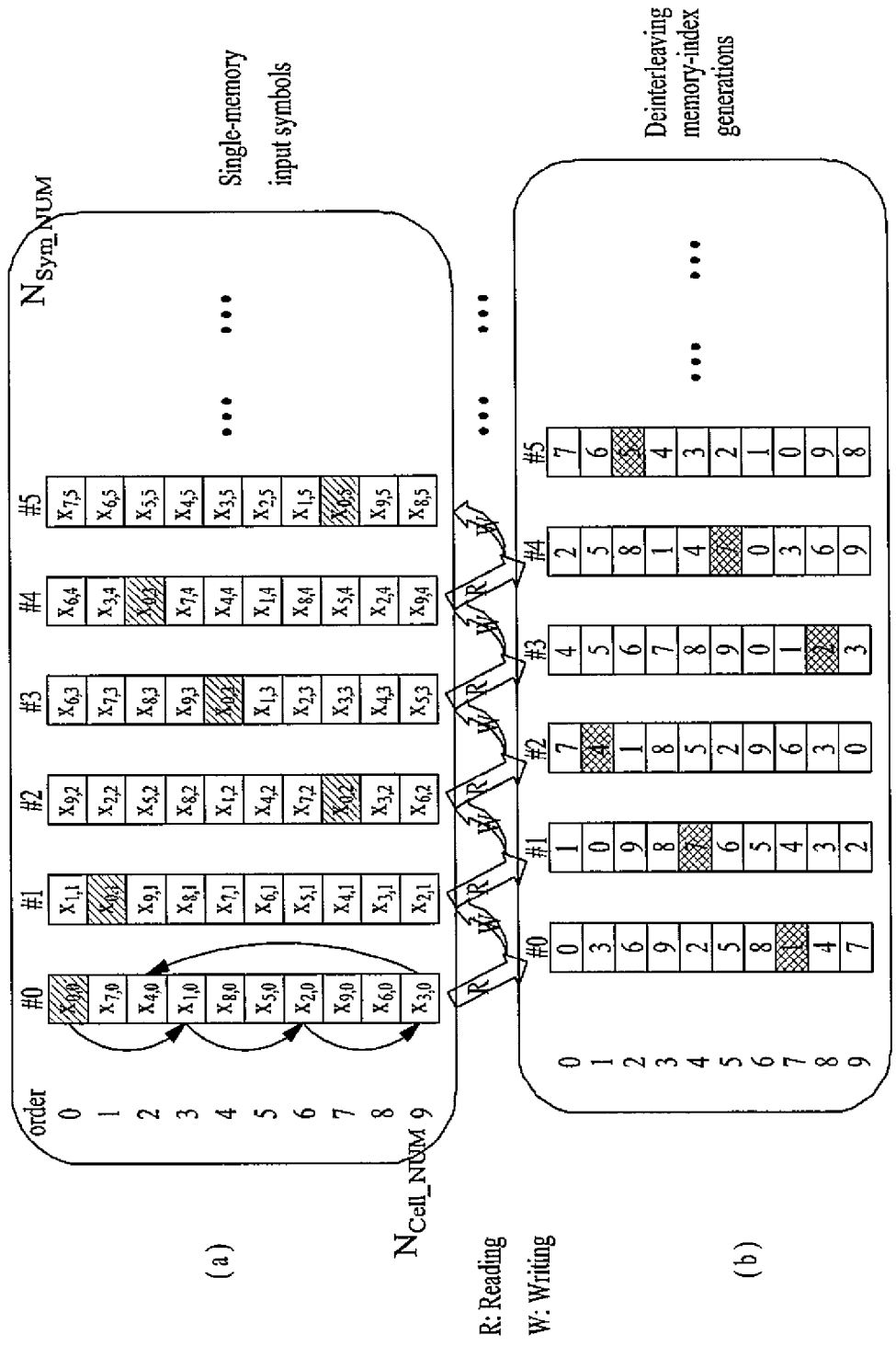
FIG. 85 illustrates a frequency deinterleaving process according to an embodiment of the present invention.

FIG. 85 illustrates a frequency deinterleaving process according to an embodiment of the present invention.

FIG. 85 illustrates a deinterleaving process when the number of all symbols is 10, the number of cells included in one symbol is 10, and p is 3.

FIG. 85(a) illustrates symbols input to a single memory according to an embodiment of the present invention. That is, the single-memory input symbols shown in FIG. 85(a) refer to values stored in the single-memory according to each input symbol. In this case, the values stored in the single-memory according to each input symbol refer to a result obtained by sequentially writing currently input symbol cells while reading a previous symbol.

FIG. 85(b) illustrates a process of generation a deinterleaving memory index.

The deinterleaving memory index is an index used to deinterleave values stored in a single memory, and a number indicated in the deinterleaving memory index refers to an order in which cells included in each symbol are deinterleaved and output.

Hereinafter, the aforementioned frequency deinterleaving process will be described in terms of input symbols #0 and #1 among illustrated symbols.

The broadcast signal receiver according to an embodiment of the present invention sequentially writes input symbol #0 in a single memory. Then the broadcast signal receiver according to an embodiment of the present invention may sequentially generate the aforementioned deinterleaving memory index in an order of 0, 3, 6, 9 . . . in order to deinterleave input symbol #0.

Then the broadcast signal receiver according to an embodiment of the present invention reads input symbol #0 written (or stored) in the single memory according to the generated deinterleaving memory index. The already written values do not have to be stored and thus a newly input symbol #1 may be sequentially re-written.

Then the process of reading input symbol #1 and the process of writing input symbol #1 are completed, the deinterleaving memory index may be generated in order to deinterleave the written input symbol #1. In this case, since the broadcast signal receiver according to an embodiment of the present invention uses a single memory, interleaving cannot be performed using an interleaving pattern applied to each symbol applied in the broadcast signal transmitter. Then deinterleaving processing can be performed on input symbols in the same way.

Figure 86:
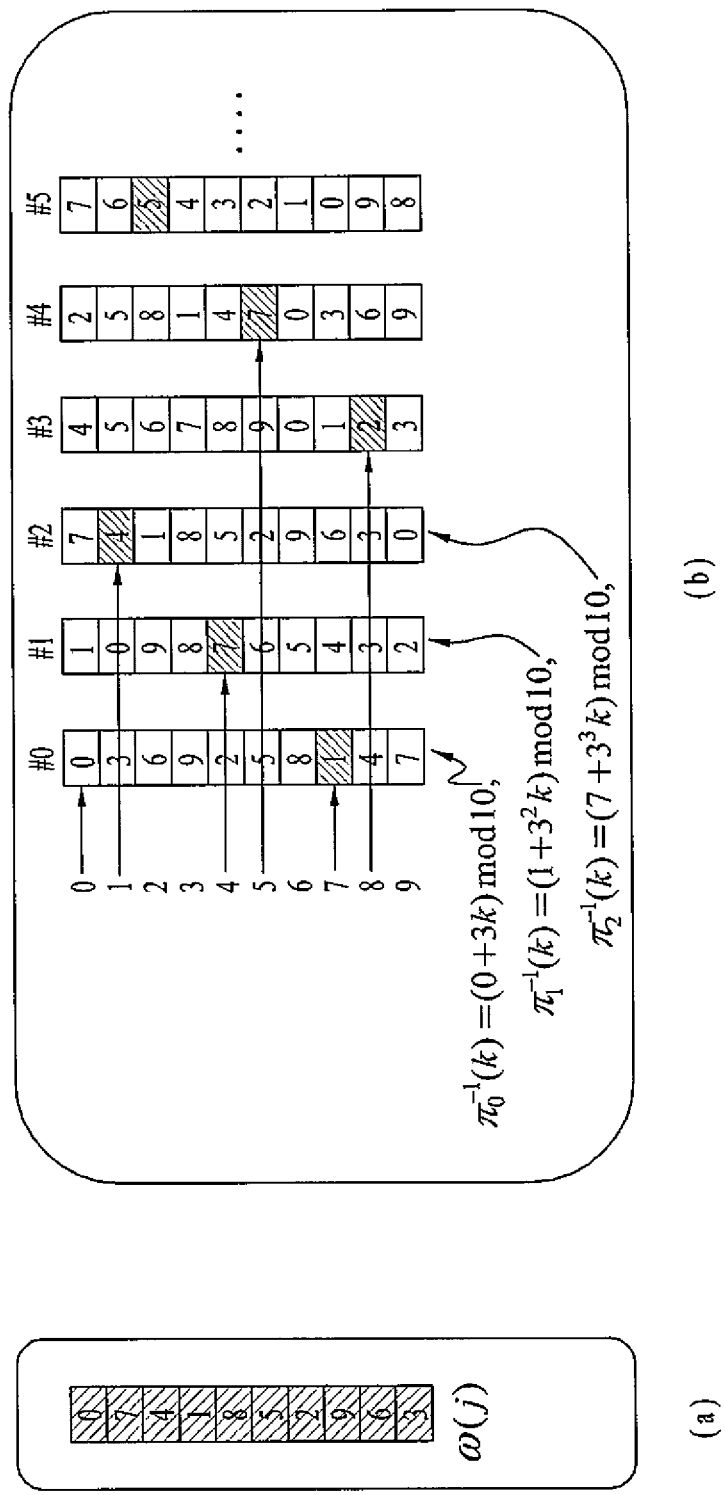
FIG. 86 illustrates a process of generating a deinterleaved memory index according to an embodiment of the present invention.

FIG. 86 illustrates a process of generating a deinterleaved memory index according to an embodiment of the present invention.

In particular, FIG. 86 illustrates a method of generating a new interleaving pattern when interleaving cannot be performed using an interleaving pattern applied to each symbol applied in the broadcast signal transmitter since the broadcast signal receiver according to an embodiment of the present invention users a single memory.

FIG. 86(a) illustrates a deinterleaving memory index of a $j^{th}$ input symbol and FIG. 86(b) illustrates the aforementioned process of generating a deinterleaving memory index together with equations.

As shown in FIG. 86(b), according to an embodiment of the present invention, a variable of RPI of each input symbol is used.

According to an embodiment of the present invention, a process of generating a deinterleaving memory index of input symbol #0 uses p=3 and $I_0$=0 as a variable of RPI like in the broadcast signal transmitter. According to an embodiment of the present invention, in the case of input symbol #1, $p^2$=3×3 and $I_0$=1 may be used as a variable of RPI, and in the case of input symbol #2, $p^3$=3×3×3 and $I_0$=7 may be used as a variable of RPI. In addition, according to an embodiment of the present invention, in the case of input symbol #3, $p^4$=3×3×3×3 and $I_0$=4 may be used as a variable of RPI.

That is, the broadcast signal receiver according to an embodiment of the present invention may change a value p of RPI and an initial offset value for each symbol and may effectively perform deinterleaving in order to deinterleave symbols stored in each single memory. In addition, a value p used in each symbol may be easily induced using exponentiation of p and initial offset values may be sequentially acquired using a mother interleaving seed. Hereinafter, a method of calculating an initial offset value will be described.

According to an embodiment of the present invention, an initial offset value used in input symbol #0 is defined as $I_0$=0. An initial offset value used in input symbol #1 is $I_0$=1 that is the same as a seventh value generated in the deinterleaving memory index generation process of input symbol #0. That is, the broadcast signal receiver according to an embodiment of the present invention may store and use the value in the deinterleaving memory index generation process of input symbol #0.

An initial offset value used in input symbol #2 is $I_0$=7 that is the same as a fourth value generated in the deinterleaving memory index generation process of input symbol #1, and an initial offset value used in input symbol #3 is $I_0$=4 that is the same as a first value generated in the deinterleaving memory index generation process of input symbol #2.

Accordingly, the broadcast signal receiver according to an embodiment of the present invention may store and use a value corresponding to an initial offset value to be used in each symbol in a process of generating a deinterleaving memory index of a previous symbol.

As a result, the aforementioned method may be represented according to Equation 12 below.

$$\pi_j^-(k)=(I_j^{-1}+p^{j+1}k) \bmod N_{Cell\_NUM},$$
$$\text{for } k=0,\ldots,N_{Cell\_NUM}-1, j=0,\ldots,N_{Sym\_NUM}-1$$

where $I_j^{-1}=\pi_{j-1}^{-1}(\omega)(j))$ with $I_0^{-1}=0$ $I_j^{-1}$: the initial-offset value at the $j^{th}$ RPI for the deinterleaving $\pi_j^{-1}(k)$: deinterleaving output memory-index for the $k^{th}$ input cell-index in the $j^{th}$ OFDM symbol $\pi_j^{-}(\omega(j))$: the $\omega(j)$th deinterleaving output memory-index in the $j^{th}$ OFDM symbol In this case, a position of a value corresponding to each initial offset value may be easily induced according to Equation 12 above.

According to an embodiment of the present invention, the broadcast signal transmitter according to an embodiment of the present invention may recognize two adjacent cells as one cell and perform frequency interleaving. This may be referred to as pair-wise interleaving. In this case, since two adjacent cells are considered as one cell and interleaving is performed, it is advantageous that a number of times of generating a memory index may be reduced in half.

Equation 13 below represents the pair-wise RPI.

$$\pi_j(k)=(\omega(j)+pk)\bmod(N_{Cell\_NUM}/2),$$
$$\text{for } k=0,\ldots,N_{Cell\_NUM}/2-1,$$
$$j=0,\ldots,N_{Sym\_NUM}-1 \quad \text{[Equation 13]}$$

Equation 14 below represents a pair-wise deinterleaving method.

$$\pi_j^{-1}(k)=(I_j^{-1}+p^{j+1}k)\bmod(N_{Cell\_NUM}/2),$$
$$\text{for } k=0,\ldots,N_{Cell\_NUM}/2-1,$$
$$j=0,\ldots,N_{Sym\_NUM}-1$$

where $I^{-1}=\pi_{j-1}^{-1}(\omega(j))$ with $I_0^{-1}=0$

Figure 87:
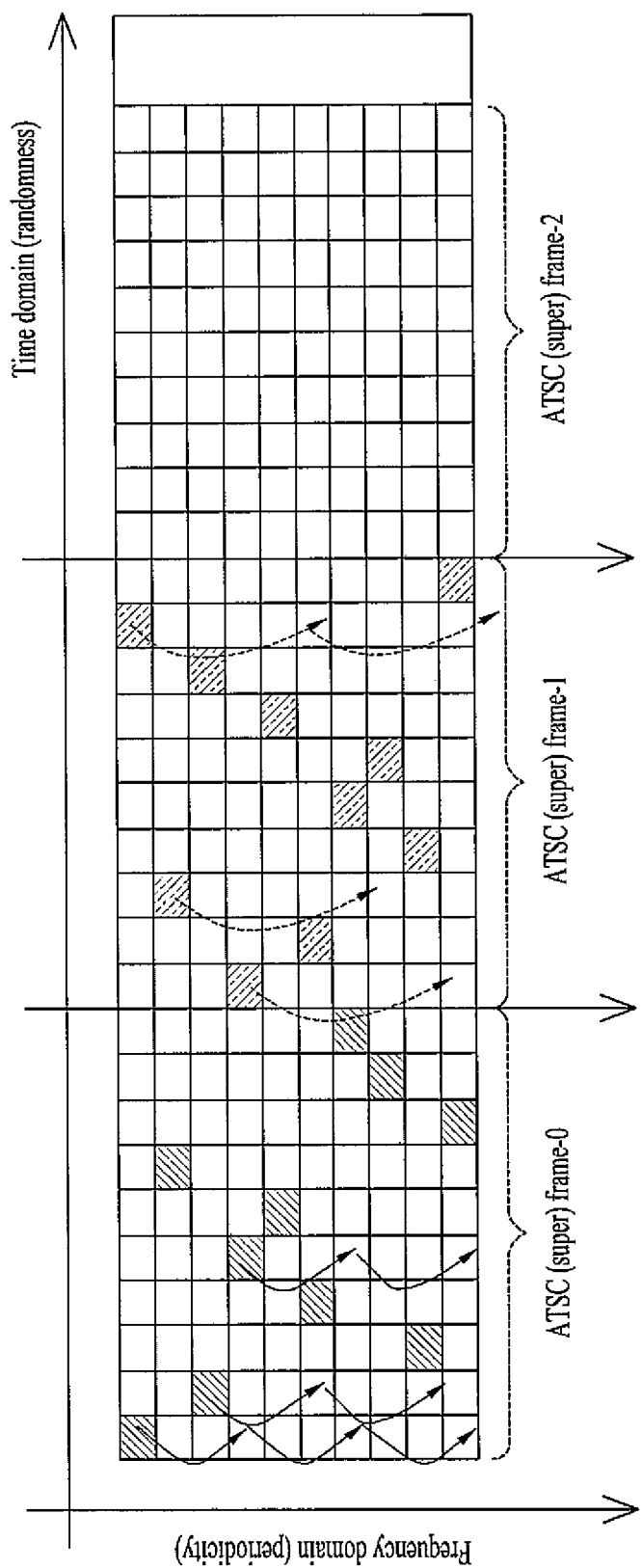
FIG. 87 illustrates a frequency interleaving process according to an embodiment of the present invention.

FIG. 87 illustrates a frequency interleaving process according to an embodiment of the present invention.

FIG. 87 illustrates an interleaving method for improving frequency diversity performance using different relative primes including a plurality of OFDM symbols by the aforementioned frequency interleaver.

That is, as shown in FIG. 87, a relative prime value is changed every frame/super frame so as to further improve a frequency diversity performance, especially avoiding a repeated interleaving pattern.

The apparatus for receiving broadcast signals according to an embodiment of the present invention can output process the decoded DP data. More specifically, the apparatus for receiving broadcast signals according to an embodiment of the present invention can decompress a header in the each of the data packets in the decoded DP data according to a header compression mode and recombine the data packets. Details are as described in FIGS. 64 to 80.

Figure 88:
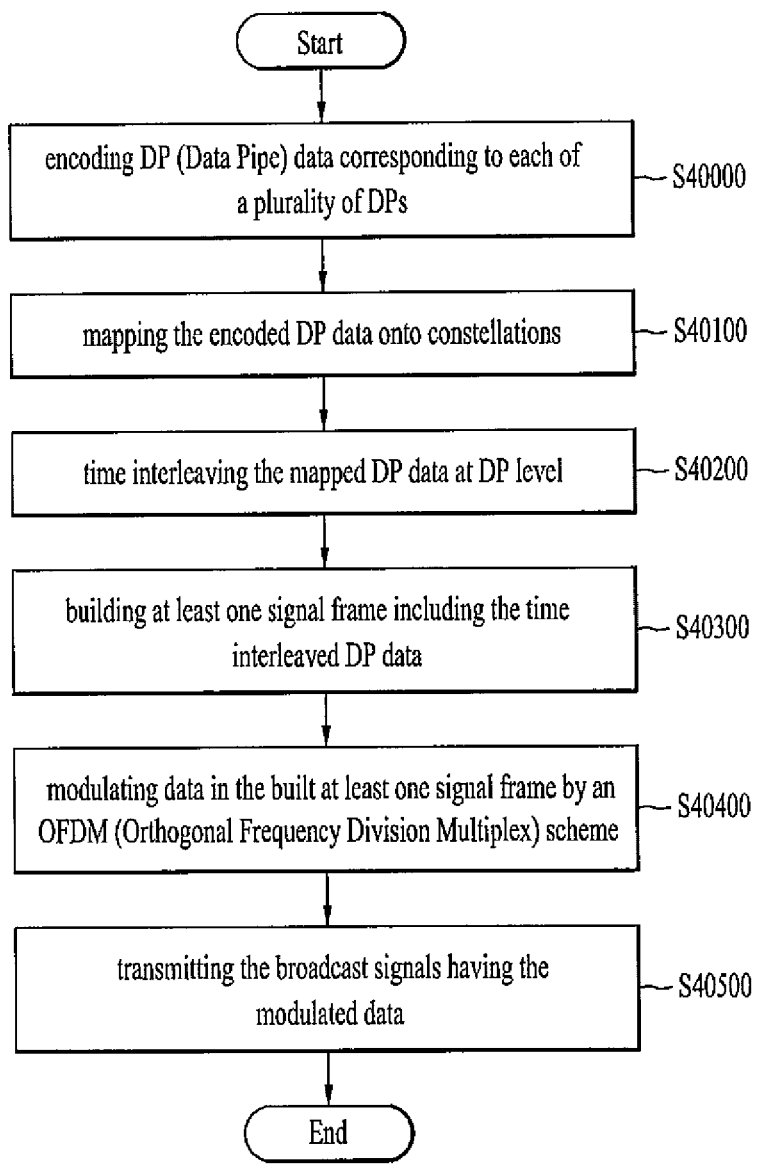
FIG. 88 is a flowchart illustrating a method for transmitting broadcast signals according to an embodiment of the present invention.

FIG. 88 is a flowchart illustrating a method for transmitting broadcast signals according to an embodiment of the present invention.

The apparatus for transmitting broadcast signals according to an embodiment of the present invention can encode data pipe (DP) data corresponding to each of a plurality of DPs (S40000). As described above, a data pipe is a logical channel in the physical layer that carries service data or related metadata, which may carry one or multiple service(s) or service component(s). Data carried on a data pipe can be referred to as DP data. The detailed process of step S40000 is as described in FIG. 49, 53 or 62.

The apparatus for transmitting broadcast signals according to an embodiment of the present invention can map the encoded DP data onto constellations (S40100). The detailed process of this step is as described in FIG. 49, 53 or 62.

Then, the apparatus for transmitting broadcast signals according to an embodiment of the present invention can time-interleave the mapped DP data at DP level (S40200). In addition, the time interleaver according to an embodiment of the present invention can perform time interleaving including a writing operation of sequentially arranging different input FEC blocks in a predetermined memory and a diagonal reading operation of interleaving the FEC blocks in a diagonal direction. In particular, the time interleaver according to an embodiment of the present invention can change the size of a diagonal slope of a reading direction and perform time interleaving while reading different FEC blocks in a diagonal direction. That is, the time interleaver according to an embodiment of the present invention can change a TI reading pattern. In this case, the diagonal reading pattern according to an embodiment of the present invention may be determined according to a maximum number of FEC blocks and be changed by a unit of super frame. As described above, the time interleaving is performed based on a skipping operation. The detailed process of this step is as described in FIGS. 64 to 74 and FIG. 79.

Subsequently, the apparatus for transmitting broadcast signals according to an embodiment of the present invention can build at least on signal frame including the time-interleaved DP data (S40300). The detailed process of this step is as described in FIG. 49 or 54.

The apparatus for transmitting broadcast signals according to an embodiment of the present invention can modulate data included in the built signal frame using an OFDM (Othogonal Frequency Division Multiplexing) scheme (S40400). The detailed process of this step is as described in FIG. 49 or 55.

The apparatus for transmitting broadcast signals according to an embodiment of the present invention can transmit broadcast signals including the signal frame (S40500). The detailed process of this step is as described in FIG. 49 or 55.

Figure 89:
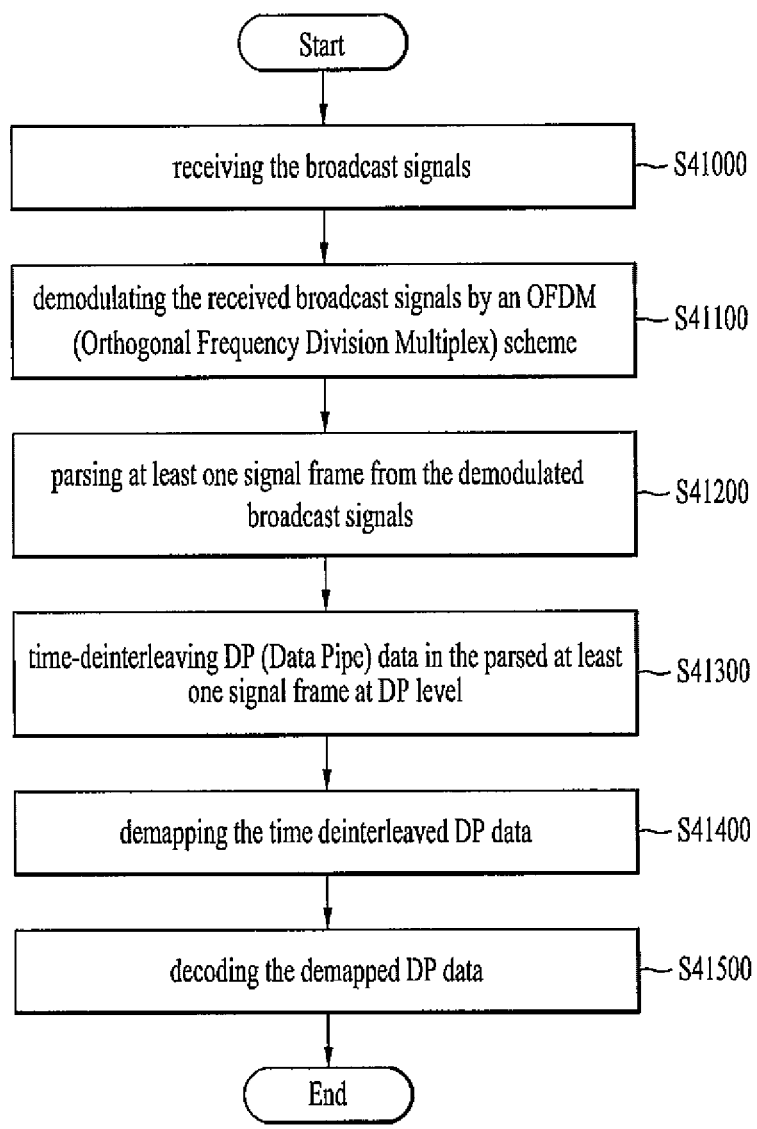
FIG. 89 is a flowchart illustrating a method for receiving broadcast signals according to an embodiment of the present invention.

FIG. 89 is a flowchart illustrating a method for receiving broadcast signals according to an embodiment of the present invention.

The flowchart shown in FIG. 89 corresponds to a reverse process of the broadcast signal transmission method according to an embodiment of the present invention, described with reference to FIG. 88.

The apparatus for receiving broadcast signals according to an embodiment of the present invention can receive broadcast signals (S41000).

The apparatus for receiving broadcast signals according to an embodiment of the present invention can demodulate received broadcast signals using an OFDM (Othogonal Frequency Division Multiplexing) scheme (S41100). Details are as described in FIG. 56 or 57.

The apparatus for receiving broadcast signals according to an embodiment of the present invention can parse at least one signal frame from the demodulated broadcast signals (S41200). Details are as described in FIG. 56 or 58. In this case, the at least one signal frame can include DP data for carrying services or service components.

Subsequently, the apparatus for receiving broadcast signals according to an embodiment of the present invention can time-deinterleave the DP data included in the parsed signal frame at DP level (S41300). As described above, the time deinterleaving is performed based on a skipping operation. A time deinterleaver (or time deinterleaver block) included in a broadcast signal receiver according to an embodiment of the present invention can perform inverse processing of the aforementioned diagonal-type TI. That is, the time deinterleaver according to an embodiment of the present invention can perform time deinterleaving by receiving FEC blocks on which diagonal-type TI has been performed, writing the FEC blocks diagonal-wise in a TI memory and then sequentially reading the FEC blocks. Details are as described in FIGS. 75 to 76 and FIG. 78.

Then, the apparatus for receiving broadcast signals according to an embodiment of the present invention can demap the time-deinterleaved DP data (S41400). Details are as described in FIG. 56 or 59 and FIG. 63.

The apparatus for receiving broadcast signals according to an embodiment of the present invention can decode the demapped DP data (S41500). Details are as described in FIG. 56 or 59 and FIG. 63.

The description of the present invention will not be limited only to the above-described exemplary embodiments of the present invention. And, as it is shown in the appended claims of the present invention, it will be apparent to those skilled in the art that various modifications and variations can be made in the present invention, and that such modifications and variations cover the scope of the present invention.

MODE FOR CARRYING OUT THE PRESENT INVENTION

As described above, the present invention is described with respect to the best mode for carrying out the present invention.

INDUSTRIAL APPLICABILITY

As described above, the present invention may be fully (or entirely) or partially applied to digital broadcast systems.

What is claimed:

1. A method of transmitting broadcast data in a transmitter, the method comprising:
   Forward Error Correction (FEC) encoding transmission unit data that carries broadcast service data;
   interleaving the FEC-encoded transmission unit data;
   demultiplexing the interleaved transmission unit data;
   symbol-mapping the demultiplexed transmission unit data onto constellations;
   MIMO-encoding the mapped transmission unit data;
   time-interleaving the MIMO-encoded transmission unit data;
   building a frame including the time-interleaved transmission unit data and physical signaling data;
   modulating the frame by an Orthogonal Frequency Division Multiplexing (OFDM) method,
   wherein the physical signaling data includes MIMO information on whether the MIMO-encoding is applied or not,
   wherein the physical signaling data further includes modulation information of an associated transmission unit data, and
   wherein when the MIMO-encoding is applied, a constellation size for MIMO is signaled with the modulation information.

2. The method of claim 1, wherein the method further comprising:
   delaying the physical signaling data and output the delayed physical signaling data to the frame.

3. The method of claim 1, wherein the method further comprising:
   frequency-interleaving the transmission unit data in the frame.

4. The method of claim 1, wherein the time interleaving comprising:
   time interleaving the mapped transmission unit data by
   performing a column-wise writing operation by writing FEC blocks of the mapped transmission unit data into a first column to a last column of a time-interleaving (TI) memory and
   performing a diagonal-wise reading operation by reading out cells of the written FEC blocks from the first row to the last row of the TI memory according to a diagonal-wise reading pattern.

5. The method of claim 4, wherein the diagonal-wise reading pattern is defined based on a maximum number of FEC blocks of the transmission unit data within one signal frame.

* * * * *